United States Patent
Harel

(10) Patent No.: US 12,027,975 B2
(45) Date of Patent: Jul. 2, 2024

(54) PACKAGED MODULE WITH SINTERED SWITCH

(71) Applicant: Marel Power Solutions, Inc., Saline, MI (US)

(72) Inventor: Jean-Claude Harel, San Jose, CA (US)

(73) Assignee: Marel Power Solutions

( * ) Notice: Subject to any disclaimer, the term of this patent is extended or adjusted under 35 U.S.C. 154(b) by 406 days.

(21) Appl. No.: 17/191,816

(22) Filed: Mar. 4, 2021

(65) Prior Publication Data
US 2021/0367526 A1  Nov. 25, 2021

Related U.S. Application Data

(60) Provisional application No. 63/136,406, filed on Jan. 12, 2021, provisional application No. 63/044,763,
(Continued)

(51) Int. Cl.
| | |
|---|---|
| *H02M 3/156* | (2006.01) |
| *H01L 21/50* | (2006.01) |
| *H01L 23/02* | (2006.01) |
| *H01L 23/31* | (2006.01) |
| *H02B 1/20* | (2006.01) |
| *H02K 11/33* | (2016.01) |

(Continued)

(52) U.S. Cl.
CPC .......... *H02M 3/1563* (2013.01); *H01L 21/50* (2013.01); *H01L 23/02* (2013.01); *H01L 23/31* (2013.01); *H02B 1/20* (2013.01); *H02K 11/33* (2016.01); *H02M 1/32* (2013.01); *H02M 7/003* (2013.01); *H02M 7/538466* (2013.01); *H05K 7/1432* (2013.01); *H05K 7/209* (2013.01); *H02M 1/327* (2021.05)

(58) Field of Classification Search
CPC .... H02K 11/33; H02M 3/1563; H02M 7/003; H02M 7/538466; H02M 1/32; H02M 1/327; H01L 21/50; H01L 23/02; H01L 23/31; H02B 1/20; H05K 7/1432; H05K 7/209
USPC .......................................... 361/131; 363/131
See application file for complete search history.

(56) References Cited

U.S. PATENT DOCUMENTS

| | | | |
|---|---|---|---|
| 5,631,821 A | 5/1997 | Muso | ........................ H05K 7/20 |
| 6,313,598 B1 | 11/2001 | Tamba et al. | |

(Continued)

FOREIGN PATENT DOCUMENTS

| | | | | |
|---|---|---|---|---|
| CA | 2456671 C | * | 9/2009 | ......... H01L 25/0753 |
| EP | 2328172 | | 6/2011 | |

(Continued)

OTHER PUBLICATIONS

Patent Cooperation Treaty ~ International Search Report and Written Opinion of the International Searching Authority for International Application No. PCT/US2021/031539; dated Oct. 4, 2021; 17 pages.

(Continued)

*Primary Examiner* — Yemane Mehari

(57) ABSTRACT

A packaged power module includes a case, and a metal structure that has first and second surfaces. A transistor is also included that has first and second terminals between which current is transmitted when the transistor is activated, and a control terminal controlling the transistor, wherein the first terminal is sintered to the first surface. A first opening through the case exposes the second surface.

17 Claims, 82 Drawing Sheets

Related U.S. Application Data filed on Jun. 26, 2020, provisional application No. 63/028,883, filed on May 22, 2020.

(51) Int. Cl.
| | |
|---|---|
| H02M 1/32 | (2007.01) |
| H02M 7/00 | (2006.01) |
| H02M 7/53846 | (2007.01) |
| H05K 7/14 | (2006.01) |
| H05K 7/20 | (2006.01) |

(56) References Cited

U.S. PATENT DOCUMENTS

| | | | |
|---|---|---|---|
| 6,621,701 B2 | 9/2003 | Tamba et al. | |
| 6,707,671 B2 | 3/2004 | Yamashita et al. | |
| 7,095,098 B2 | 8/2006 | Gerbsch et al. | |
| 7,262,444 B2 | 8/2007 | Fillion et al. | |
| 7,547,966 B2 | 6/2009 | Funakoshi et al. | |
| 7,659,614 B2 | 2/2010 | Mehrotra | |
| 7,786,486 B2 | 8/2010 | Casey et al. | |
| 7,834,448 B2 | 11/2010 | Gerbsch | |
| 7,916,480 B2 | 3/2011 | Woody et al. | 361/699 |
| 7,952,875 B2 | 5/2011 | Woody et al. | |
| 7,999,369 B2 | 8/2011 | Malhan et al. | |
| 8,049,338 B2 | 11/2011 | Delgado et al. | |
| 8,063,440 B2 | 11/2011 | Yankoski et al. | |
| 8,120,153 B1 | 2/2012 | Shen | |
| 8,279,605 B2 | 10/2012 | Kawanami et al. | |
| 8,358,000 B2 | 1/2013 | Beaupre et al. | |
| 8,472,188 B2 | 6/2013 | Horiuchi et al. | |
| 9,041,183 B2 | 5/2015 | Liang et al. | |
| 9,147,622 B2 | 9/2015 | Otake et al. | |
| 9,241,428 B1 | 1/2016 | Doo et al. | |
| 9,312,782 B2 | 4/2016 | Tachibana | H02M 7/003 |
| D759,589 S | 6/2016 | Shimura et al. | |
| 9,640,617 B2 | 5/2017 | Das et al. | |
| 9,799,454 B1 | 10/2017 | Jakoubovitch et al. | |
| 9,865,398 B2 | 1/2018 | Jakoubovitch et al. | |
| 9,941,234 B2 * | 4/2018 | Liang | H01L 24/33 |
| 10,027,094 B2 | 7/2018 | Baeumel | H02B 1/20 |
| 10,034,401 B2 * | 7/2018 | Suwa | H05K 5/0247 |
| 10,037,930 B2 | 7/2018 | Kume et al. | |
| 10,178,813 B2 | 1/2019 | Boteler et al. | |
| 10,453,742 B2 | 10/2019 | Bayerer | H01L 21/768 |
| 10,483,229 B2 | 11/2019 | Osterwald et al. | |
| 10,523,094 B2 | 12/2019 | Wang | H02K 11/33 |
| 10,630,192 B2 | 4/2020 | Jojima et al. | H02M 7/003 |
| 10,779,446 B2 | 9/2020 | Bourlier et al. | |
| 10,861,775 B2 | 12/2020 | Prajuckamol et al. | |
| 10,872,846 B2 * | 12/2020 | Harel | H01L 23/49562 |
| 10,985,088 B2 | 4/2021 | Mrad et al. | |
| 10,985,089 B2 | 4/2021 | Hart et al. | |
| 11,121,059 B2 | 9/2021 | Mrad et al. | |
| 11,276,622 B2 | 3/2022 | Hart et al. | |
| 2012/0043652 A1 | 2/2012 | Ushijima | |
| 2013/0329365 A1 | 12/2013 | Hosseini et al. | |
| 2014/0098588 A1 | 4/2014 | Kaneko et al. | |
| 2017/0186572 A1 | 6/2017 | Kato et al. | |
| 2019/0006267 A1 | 1/2019 | Harel | |
| 2019/0052184 A1 | 2/2019 | Liu et al. | |
| 2019/0092175 A1 | 3/2019 | Sainsaulieu et al. | |
| 2019/0280610 A1 * | 9/2019 | Chung | H01L 25/072 |
| 2019/0355633 A1 | 11/2019 | Liu et al. | |
| 2020/0006197 A1 * | 1/2020 | Hart | H01L 23/36 |
| 2020/0144156 A1 | 5/2020 | Mrad et al. | |

FOREIGN PATENT DOCUMENTS

| | | |
|---|---|---|
| WO | WO2012107482 | 8/2012 |
| WO | 2015019160 A1 | 2/2015 |

OTHER PUBLICATIONS

Chowdhury, Shajad, et al., "Enabling Technologies for Compact Integrated Electric Drives for Automotive Traction Applications," 2019 IEEE Transportation Electrification Conference and Expo (ITEC), 2019, pp. 1-8.

Greca, Gustavo, "Evaluating Silver Sintering as a Reliable Die-Attach Material for Automotive Power Module Applications," Aug. 11, 2016, https://eepower.com/technical-articles/evaluating-silver-sintering-as-a-reliable-die-attach-material-for-automotive-power-module-applications/#.com (retrieved Mar. 29, 2021), 10 pages.

Harel, Jean-Claude, "Compact Inverter System," U.S. Appl. No. 17/191,805, filed Mar. 4, 2021; consisting of Specification, Claims, Abstract, and Drawings (137 pages).

2015 Electric Drive Technologies Annual Report, U.S. Dept. Energy, Washington DC USA, 2015.

Adlkofer.H., (Mar. 16, 2017). "Bernstein Conference on EVs and Energy Storage." Accessed: Feb. 11, 2020. [Online], Available: https://www.infineon.com/dgdl/2017-03-16++Bernstein+xEV+and+Energy+Storage+Conference++Adlkofer.pdf?fileID-5546d4615acbac61015ad290fdab0641.

Amano, H., et al., "The 2018 GaN Power Electronics Roadmap IOPscience," J. Phys. D. Appl. Phys., vol. 501, Mar. 2018, Art No. 163001.

Bajwa, A.A., New Assembly and Packaging Technologies for High-Power and High-Temperature GaN and SiC. Breisgau, Germany: Univ. Freiburg, 2015.

Boteler, L.M., et al., "Stacked Power Module With Integrated Thermal Management," in Proc. IEEE Int., Workshop Integr. Power Packag. (IWIPP), Apr. 2017, pp. 1-5.

Buttay, C., et al., "Integrated Packaging Allows for Improvement in Switching Characteristics of Silicon Carbide Devices," in Proc. PCIM Eur. Int. Exhib. Conf. Power Electron., Intell. Motion Renew. Energy Energy Manage., May 2014, pp. 20-22.

Chen, C. et al., "A Review of SiC Power Module Packaging Layout," Cpss Trans.Power Electron.Appl., vol. 2, No. 3, pp. 170-186, 2017.

Chinthavali, M. et al., "50-kW 1kV DC Bus Air-Cooled Inverter With 1.7 kV SiC MOSFETs and 3D-Printed Novel Power Module Packaging Structure for Grid Applications," 2018 IEEE Applied Power Electronics Conference and Exposition (APEC), 2018, pp. 133-140, doi: 10.1109/APEC.2018.8340999.

Chinthavali, M.S., et al., "30-KW All-SiC Inverter with 3D-Printed Air-Cooled Heatsinks for Plug-In and Full Electric Vehicle Applications," Materials Science Forum, vol. 924, Trans Tech Publications, Ltd., Jun. 2018, pp. 845-848. Crossref, doi:10.4028/www.scientific.net/msf.924.845.

Cook, G.O., et al., "Overview of Transient Liquid Phase and Partial Transient Liquid Phase Bonding," J. Mater.Sci., vol. 46, No. 16, pp. 5305-5323, Aug. 2011.

Demuth, V. (Oct. 2013). "Power Modules for Hybrid and Electric Vehicles." Automation & Controls. Accessed: Jun. 10, 2020. [Online]. Available: https://www.ee.co.za/wp-contents/uploads/legacy/Semikton power modules.pdf.

Fujihira, T., "Impact of SiC and RC-IGBT on Drive and Power Supply," in Proc. PEAC, Shen Zhen, China, 2018, 1-52.

Guth, K., et al., "New Assembly and Interconnects Beyond Sintering Methods," in Proc. Int. Exhib. Conf. Power Electron, Intell. Motion, Renew Energy Energy Manage. (PCIM), Nuremberg, Germany, 2010, pp. 232-237.

Hitachi. (2014). "Hitachi Automotive Systems Delivers Compact, High-Output Inverters and DC/DC Converters for the First Plug-in Hybrid from Mercedes Benz." [Online]. Available: https://www.hitachi.com/New/enews/month/2014/12/141203c.html.

Hitachi. (2019). "Hitachi Automotive Systems' EV Inverter Adopted for the E-Tron, Audi's First Mass Production Electric Vehicle." [Online], Available: https://www.hitachi.eu/en-gb/press/hitachi-automotive-systems-ev-inverter-adopted-e-tron-audis-first-mass-production-electric.

Horio, M., et al., "Packaging Technologies for SiC Power Modules," Fuji Electr. Rev., vol. 58, No. 2, pp. 75-78, 2012.

Hou, F. et al., "Characterization of PCB Embedded Package Materials for SiC MOSFETs," IEEE Trans. Compon., Packag., Manuf. Technol., vol. 9, No. 6, pp. 1054-1061, Jun. 2019.

(56) References Cited

OTHER PUBLICATIONS

Hou, F. et al., "Review of Packaging Schemes for Power Module," IEEE J. Emerg. Sel. Topics Power Electron., vol. 8, No. 1, pp. 223-238, Mar. 2020.

Hou, F., et al., "Fan-Out Panel-Level PCB-Embedded SiC Power," IEEE J. Emerg. Sel. Top. Power Electron., vol. 8, No. 1, pp. 367-380, Mar. 2020.

Hu, T., et al., "Die Attach Materials With High Remelting Temperatures Creating by Bonding Cu@Sn Microparticles at Lower Temperatures," Mater. Des., vol. 108, pp. 383-390, Oct. 2016.

Kane, M. (May 25, 2019)., "EVs are Switching to Silicon Carbide Power Electronics." Accessed: Feb. 11, 2020. [Online]. Available: https://insideevs.com/new/351419/evs-silicon-carbide-power-electronics/.

Kimura, T., et al., "High-power-Density Inventor Technology for Hybrid and Electric Vehicle Applications," HitachiRev., vol. 63, No. 2, pp. 96-102, 2014.

Kochhan, R. et al., (Feb. 2014). "An Overview of Costs for Vehicle Components, Fuels and and Greenhouse Gas Emissions." Accessed: Jan. 21, 2020 [Online]. Available: https://www.researchgate.net/publication/260339436_AN_Overview_of_Costs_For_Vehicle_Components_Fuels_and_Greenhouse_Gas_Emissions.

Lefranc, G. et al., "Al-SiC Improves Reliability of IGBT Power Modules," in Proc. ICCM, 1999, pp. 1335-1344.

Liang, Z., "Integrated Double Sided Cooling Packaging of Planar SiC Power Modules," in Proc. IEEE Energy Convers. Congr. Expo., ECCE, Montreal, QC, Canada, Sep. 2015, 5 pgs.

Liang, Z., "Integration of Cooling Function into 3-D Power Module Packaging," in Proc., 25th Appl. Power Electron. Conf. Expo. Sacramento, CA USA, Mar. 2014, pp. 1-25.

Liu, W., "Recent Progress in Rapid Sintering of Nanosilver for Electronics Applications," Micromachines, vol. 9, No. 7, pp. 1-17, 2018.

MacDonald, J. (2016). "Electric Vehicles to be 35% of Global New Car Sales by 2040." [Online]. Available: https://about.bnef.com/electric-vehicles-to-be-35-of-global-new-car-sales-by2040/.

Manikam, V.R., et al., "Die Attach Materials for High Temperature Applications: A Review," IEEE Trans. Compon., Packag., Manuf. Technol., vol. 1, No. 4, pp. 457-478, Apr. 2011.

Marchesini, J.-L., et al., "Improvement and Switching Behavior of a PCB-DBC IGBT Module Based on the Power Chip-on -Chip 3-D Concept," IEEE Trans. Ind., Appl., vol. 53, No. 1, pp. 362-370, Jan. 2017.

Massiot, P., "Baseplates In Metallic Matrix Composites for Power and Microwave," in Proc. Workshop Metal Ceram. Mater. Funct. Appl., Vienna, Austria, 1997, pp. 145-154.

Occhionero, M. A., et al., "AlSiC Baseplates for Power IGBT Modules: Design, Performance and Reliability," in Proc. Process Convers. Intell. Motion, May 2002, pp. 2-7.

Pahinkar, D.G., et al., "Transient Liquid Phase Bonding of AlN to AlSIC for Durable Power Electronic Packages," Adv. Eng. Mater., vol. 20, No. 10, Oct. 2018, Art No. 1800039.

Parker, E., et al., "Embedding Active and Passive Components in PCBs and Inorganic Substrates for Power Electronics," in Proc. IEEE Int. Workshop Integr. Power Packag. (IWIPP), May 2015, pp. 107-110.

Pascal, Y., et al., "Using Laminated Metal Foam as the Top-Side Contact of a PCB-Embedded Power Die," IEEE Electron Device Lett., vol. 38, No. 10, 5 pgs., 2017.

Regnat, G., et al., "Silicon Carbide Power Chip on Chip Module Based on Embedded Die Technology with Paralleled Dies," in Proc. IEEE Energy Convers. Congr. Expo (ECCE), Sep. 2015, pp. 4913-4919.

Reimers, J. et al., "Automotive Traction Inverters: Current Status and Future Trends," IEEE Trans. Veh. Technol., vol. 68, No. 4, pp. 3337-3350, Apr. 2019.

Spenke, R. et al., (Apr. 2019), "Automotive High Capacity Power Module." Accessed: Feb. 11, 2020 (Online). Available: https://www.mitsubishichips.eu/wp-content/uploads/2019/Bodos-power-systems_04-19_Mitsubishi-Electric_Semiconductor.pdf, pp. 30-33.

Strass, A., "Power Semiconductor and Packaging Trends in Vehicle Electrification," World Electr. Vehicle J., vol. 7, No. 2, pp. 250-260. May 2015.

Ugur, E., et al., "Degradation Assessment and Precursor Identification for SiC MOSFETs Under High Temp Cycling," IEEE Trans. Ind. Appl., vol. 55, No. 3, pp. 2858-2867, May 2019.

Vagnon, E., et al., "A Bus-Bar-Like Power Module Based on Three-Dimensional Power-Chip-on Chip Hybrid Integration," IEEE Trans. Ind. Appl., vol. 46, No. 5, pp. 2046-2055, Sep. 2010.

Wang, Y., et al., "Status and Trend of Power Semiconductor Module Packaging for Electric Vehicles," in Modeling and Simulation for Electric Vehicle Applications. Rejieka, Croatia: InTech, 2016, p. 24.

Yang, Y., et al., "Automotive Power Module Packaging: Current Status and Future Trends," in IEEE Access, vol. 8, pp. 160126-160144, 2020, doi: 10.1109/ACCESS.2020.3019775.

Yannou, J.M., et al., "Analysis of Innovation Trends in Packaging for Power Modules," in Proc. 7th Eur. Adv. Technol. Workshop Micropack Aging Thermal Manage, San Diego, CA USA 2012, pp. 22-25.

Yole: (Feb. 11, 2013). "Inventor Market to Grow from $45bn in 2012 to $71bn in 2020." Accessed: Jun. 1, 2021. [Online]. Available: http://www.semiconductor-today.com/news_items/2013/FEB/YOLE_110213.html.

Zhang, H., "High Temperature LTCC Based SiC Double-Sided Cooling Power Electronic Module." Fayetteville, Arkansas: Univ. Arkansas, 2014.

Zhang, L., Design, Fabrication and Test of SiC MOSFET-Gate Driver Co-Packaged Power Module. Raleigh, NC, USA: North Carolina State Univ. 2015.

Zhu, N. et al., "A Solution to Press-Pack Packaging of SiC MOSFETs," IEEE Trans. Ind. Electron, vol. 64, No. 10, pp. 8224-8234, Oct. 2017.

Buttay, Cyril, et al., "Silver Sintering for Power Electronics Integration," ICEP-IAAC, IMAPS, Apr. 2015, Kyoto, Japan, HAL Id: hal-01196525, https://hal.archives-ouvertes.fr/hal-01196525, pp. 1-6.

Yole Developpment, "Alternative Technologies: Lead Frame", Power Module Packaging 2018, www.yole.fr, p. 151.

International Search Report and Written Opinion of International Application No. PCT/US2022/076493, dated Dec. 19, 2022. 12 pages.

International Search Report and Written Opinion of International Application No. PCT/US2022/076487, dated Jan. 19, 2023, 10 pages.

Marchesini et al., "Implementation and Switching Behavior of a PCB-DBC IGBT Module Based on the Power Chip-on-Chip 3D Concept", IEEE Transactions on Industry Applications, 2016 PP (99), 10.1109/TIA.2016.2604379.hal-01373011, 9 pages.

Texas Instruments Datasheet, MG341xR070 600-V 70-mΩ GaN with Integrated Driver and Protection, LMG3410R070, LMG3411R070, SNOSD10E—Apr. 2016—Revised Oct. 2018, www.ti.com, pp. 1-33.

* cited by examiner

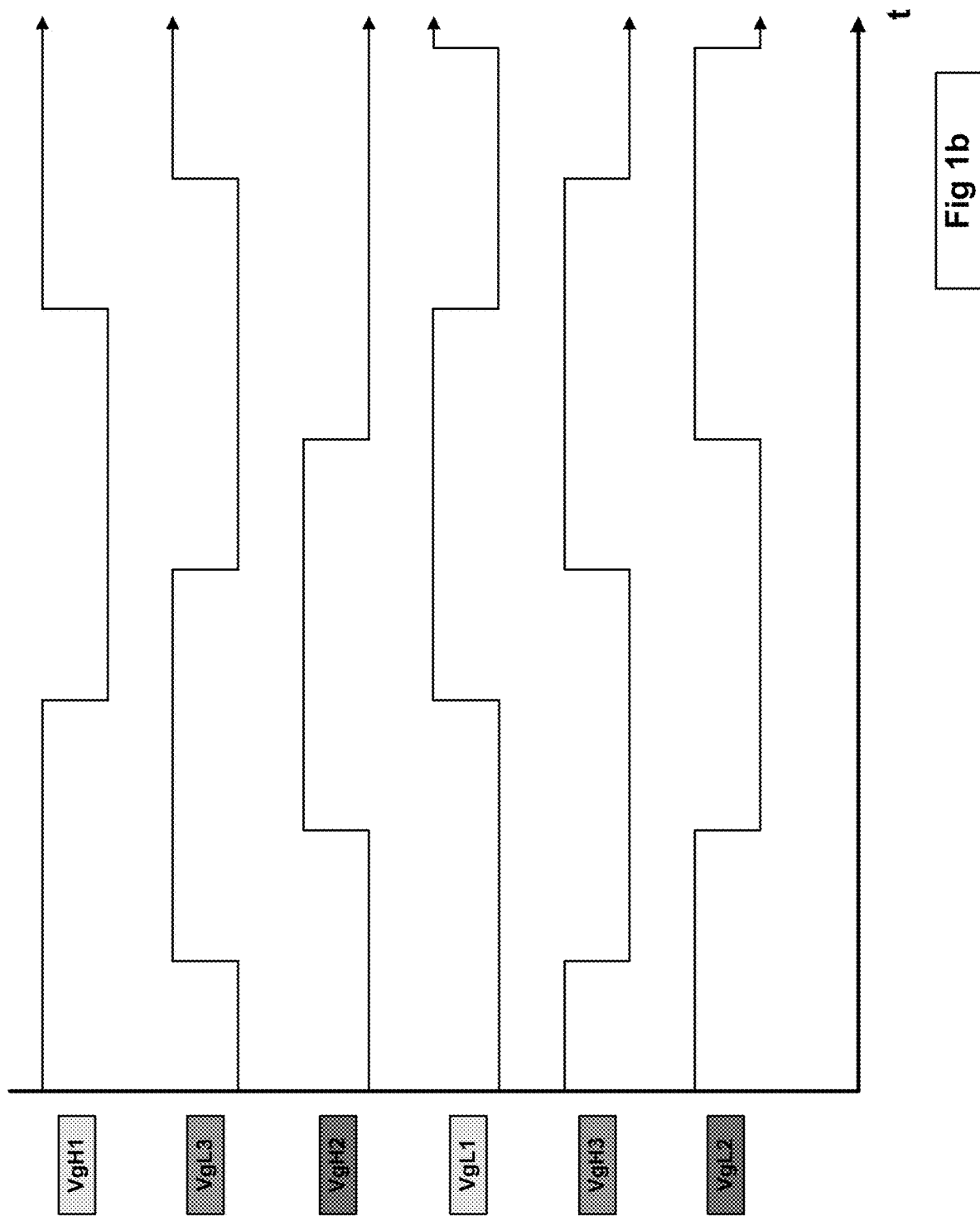

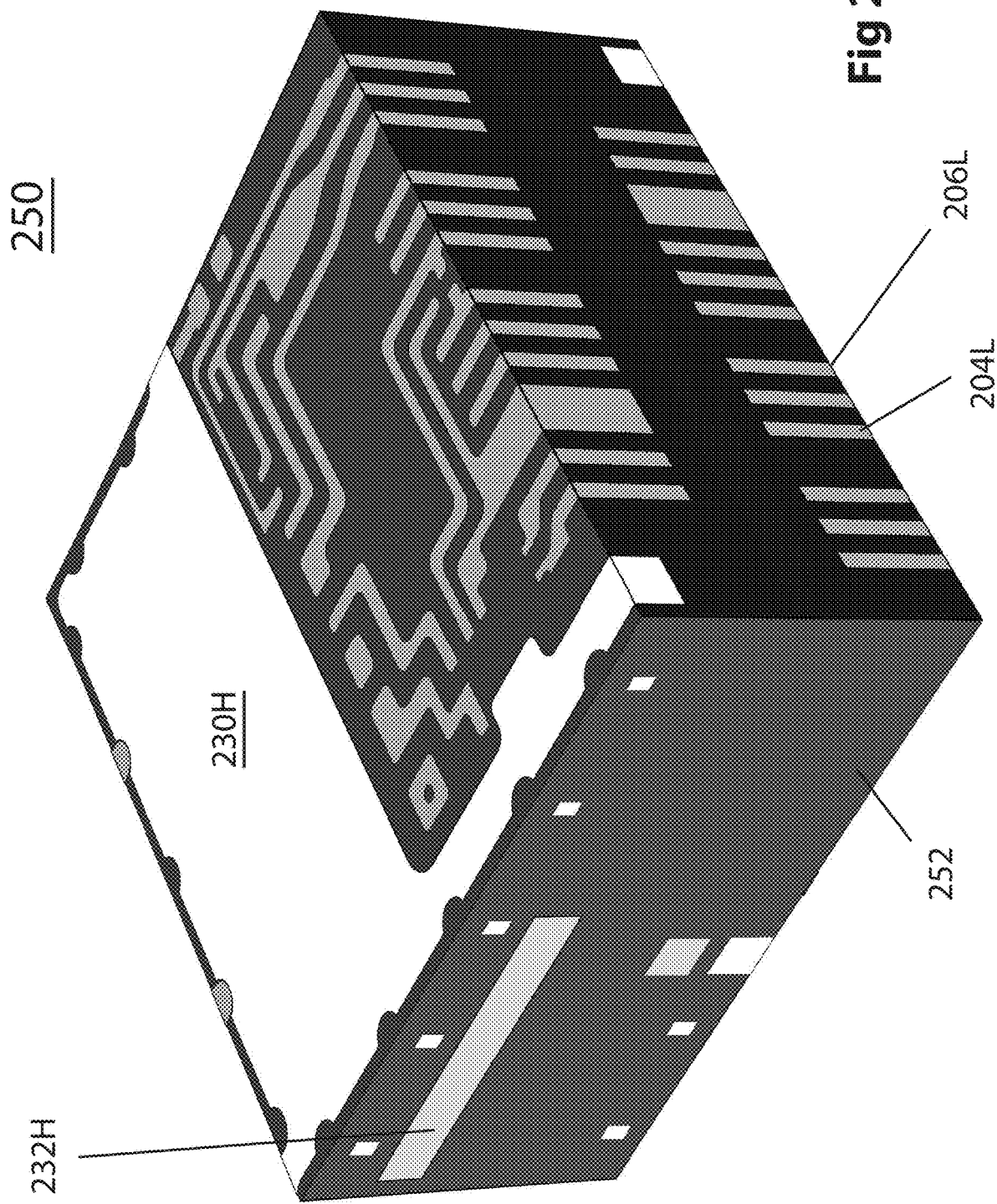

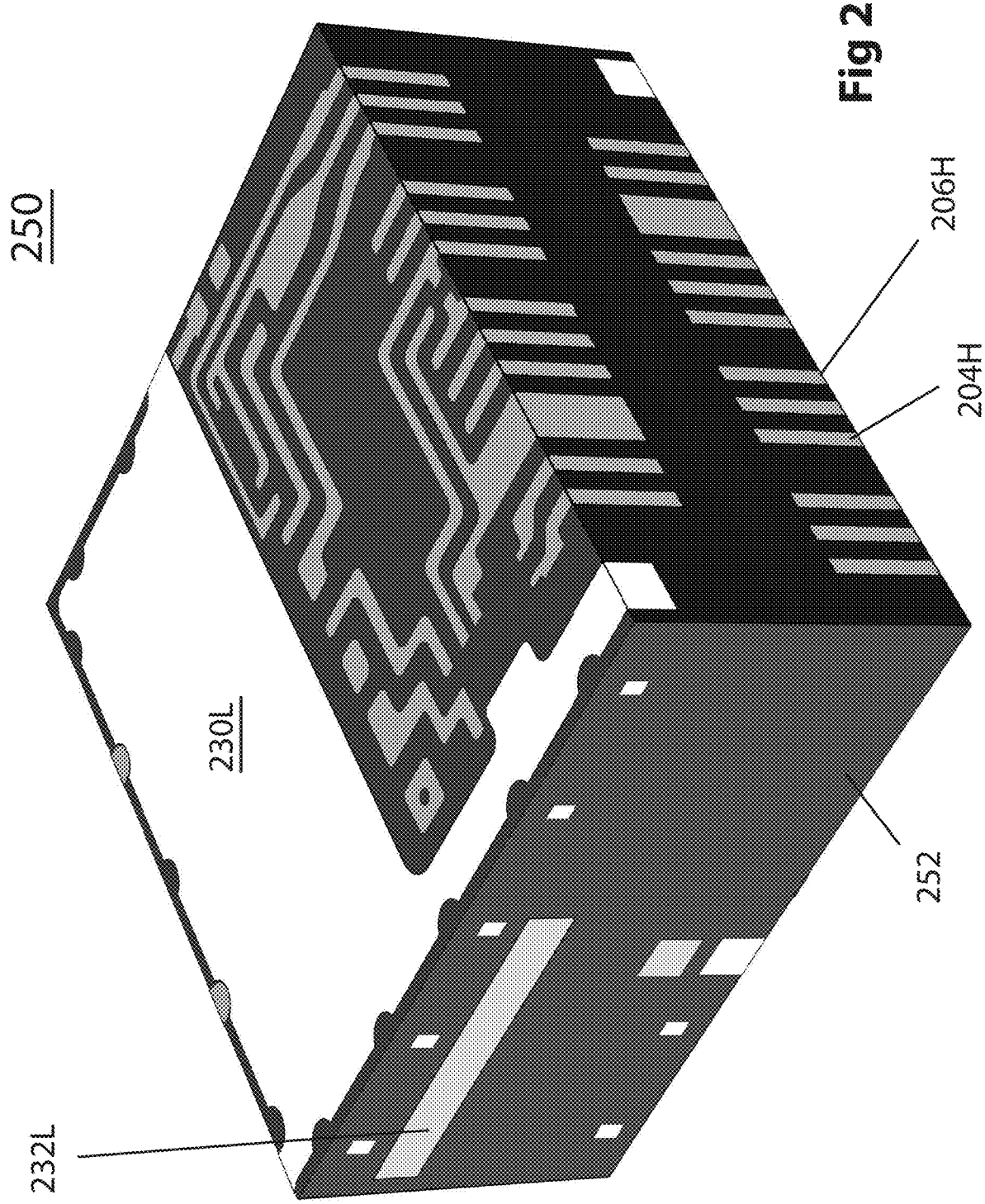

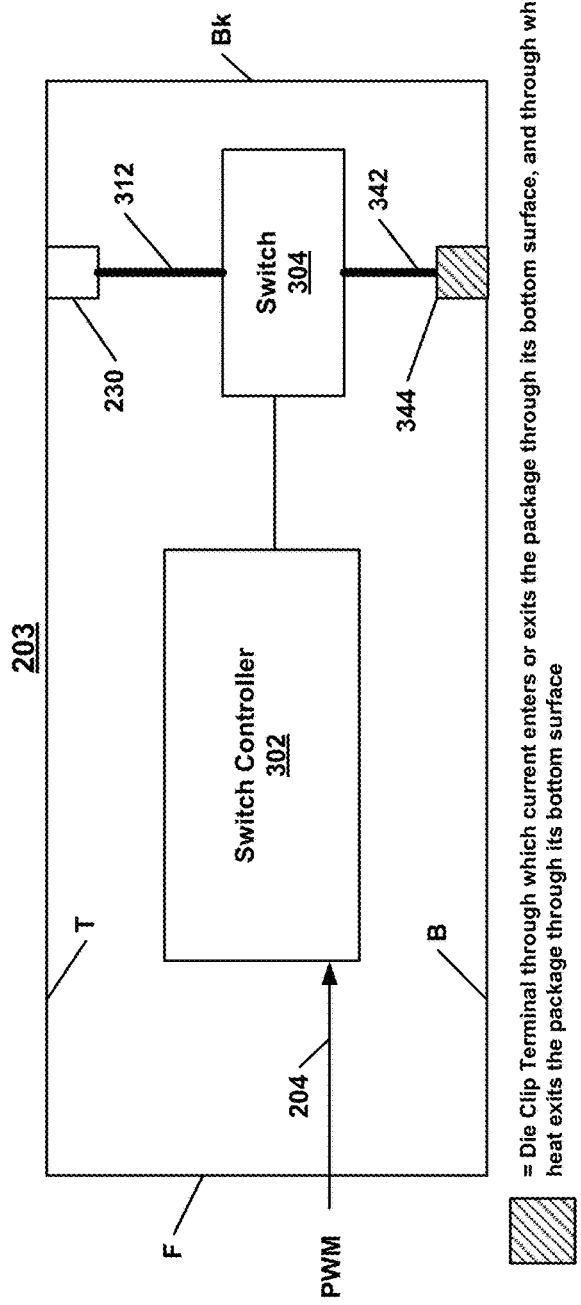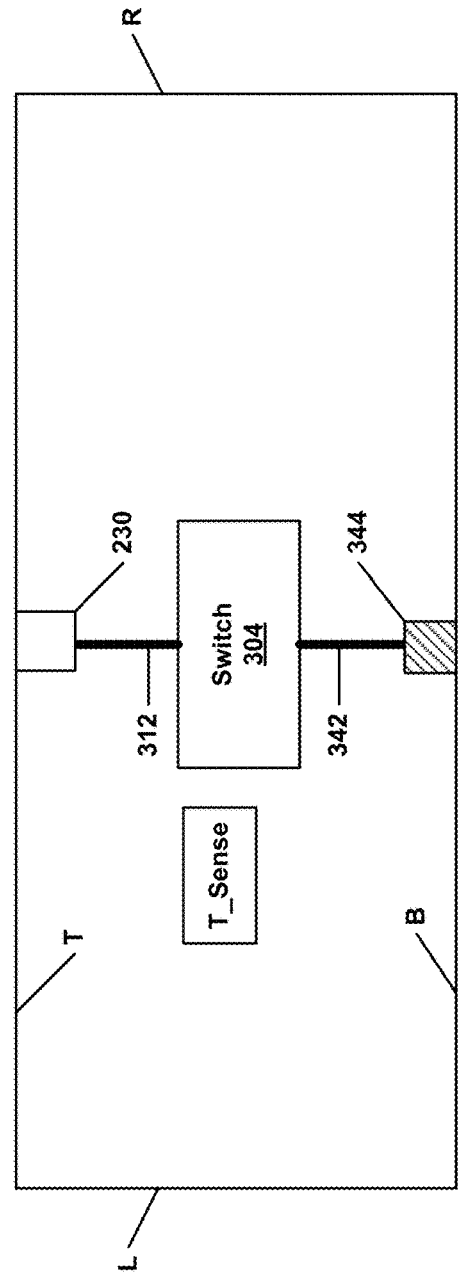
Fig 3c-1
Fig 3c-2

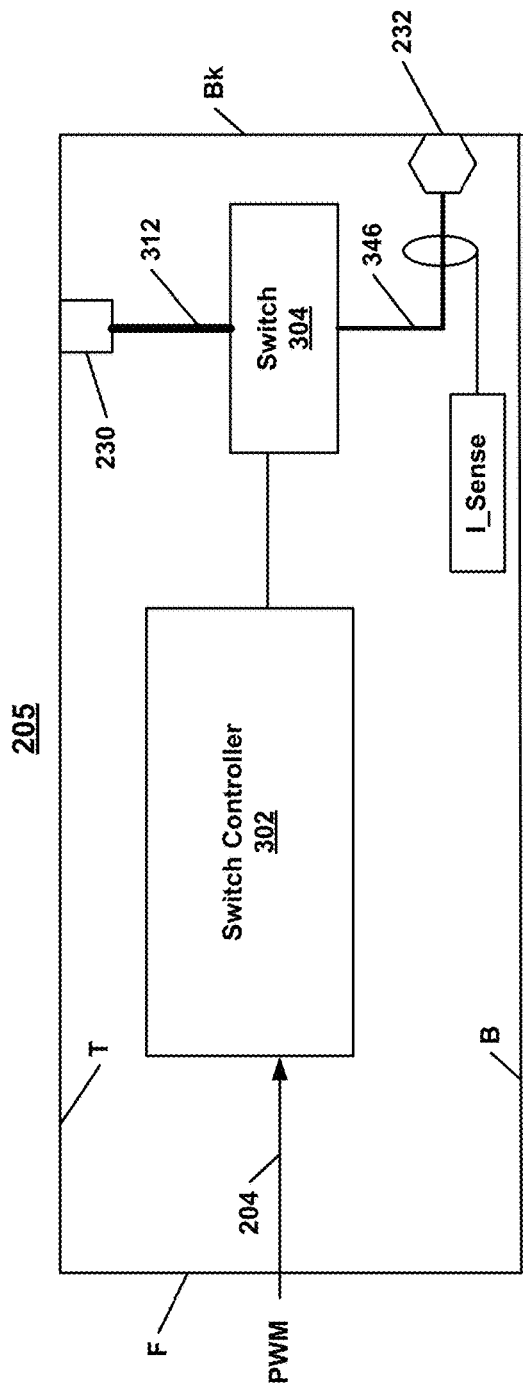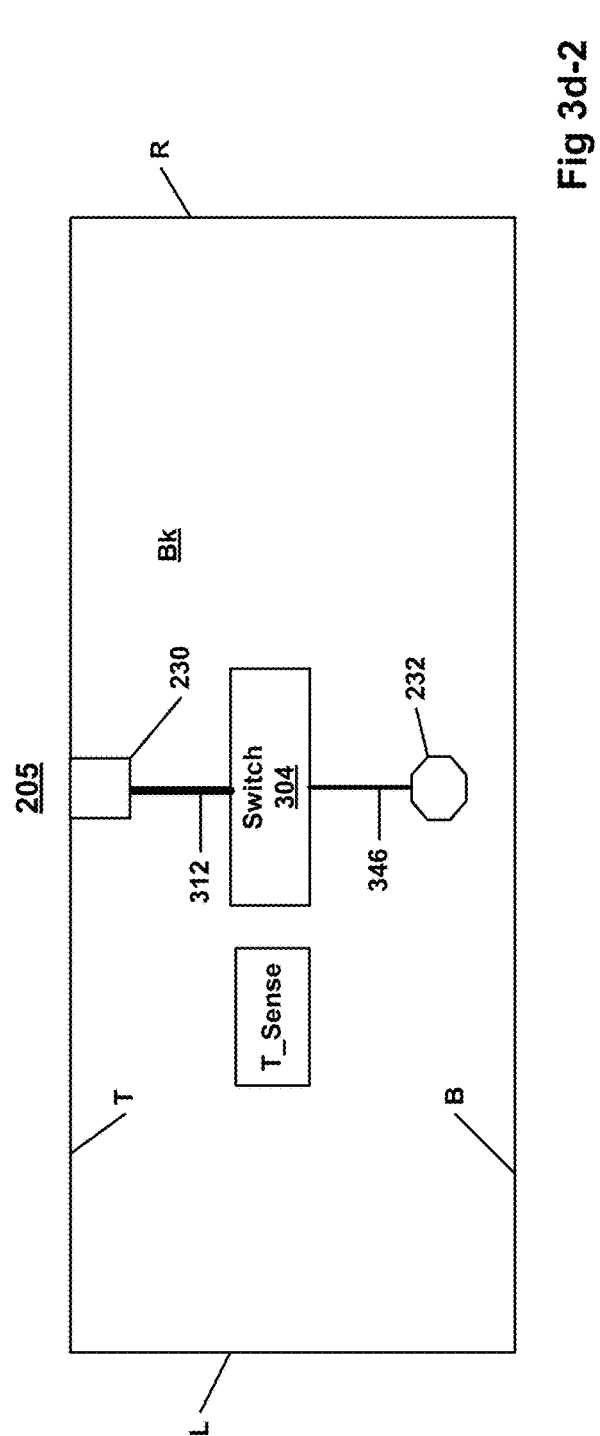

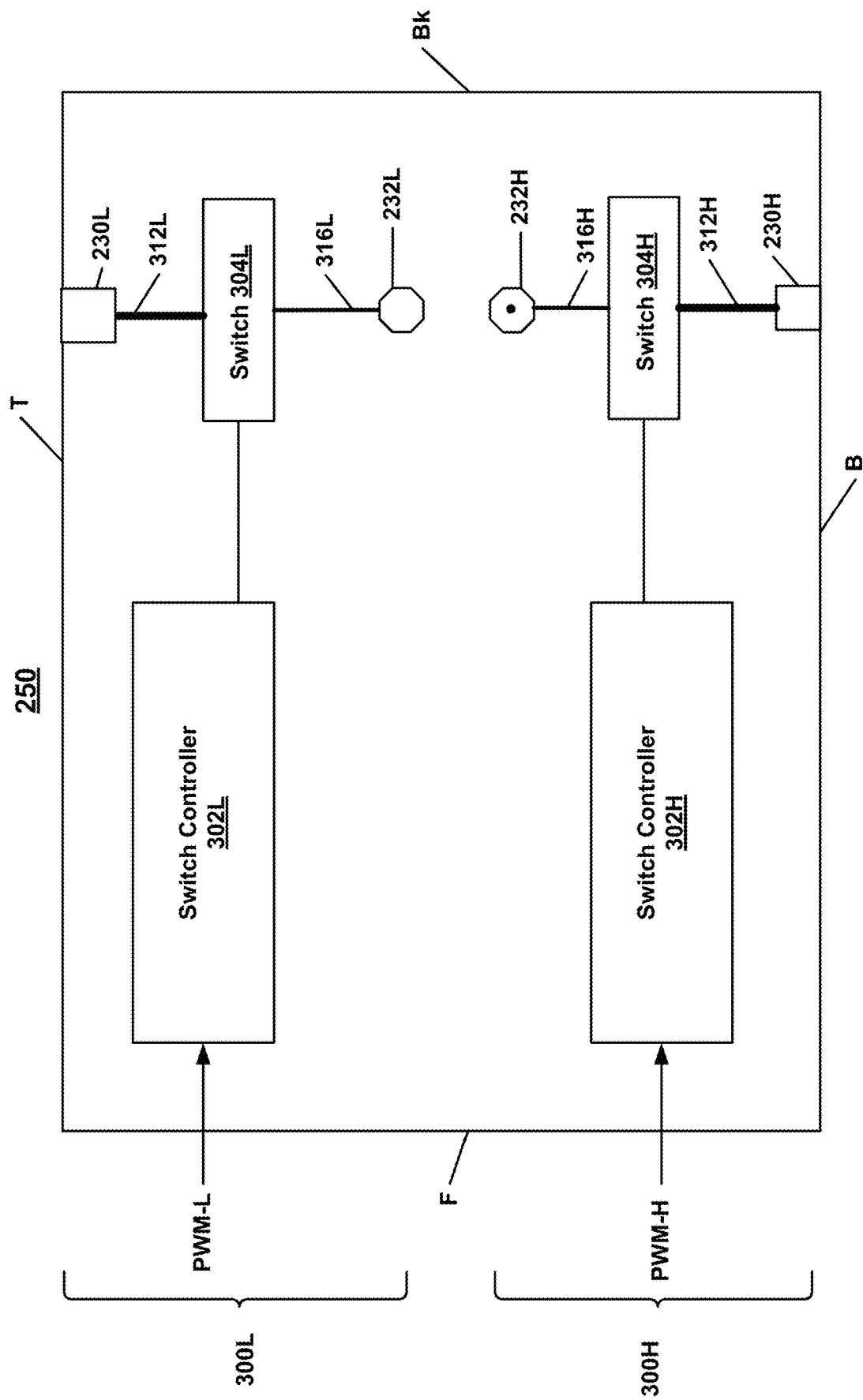

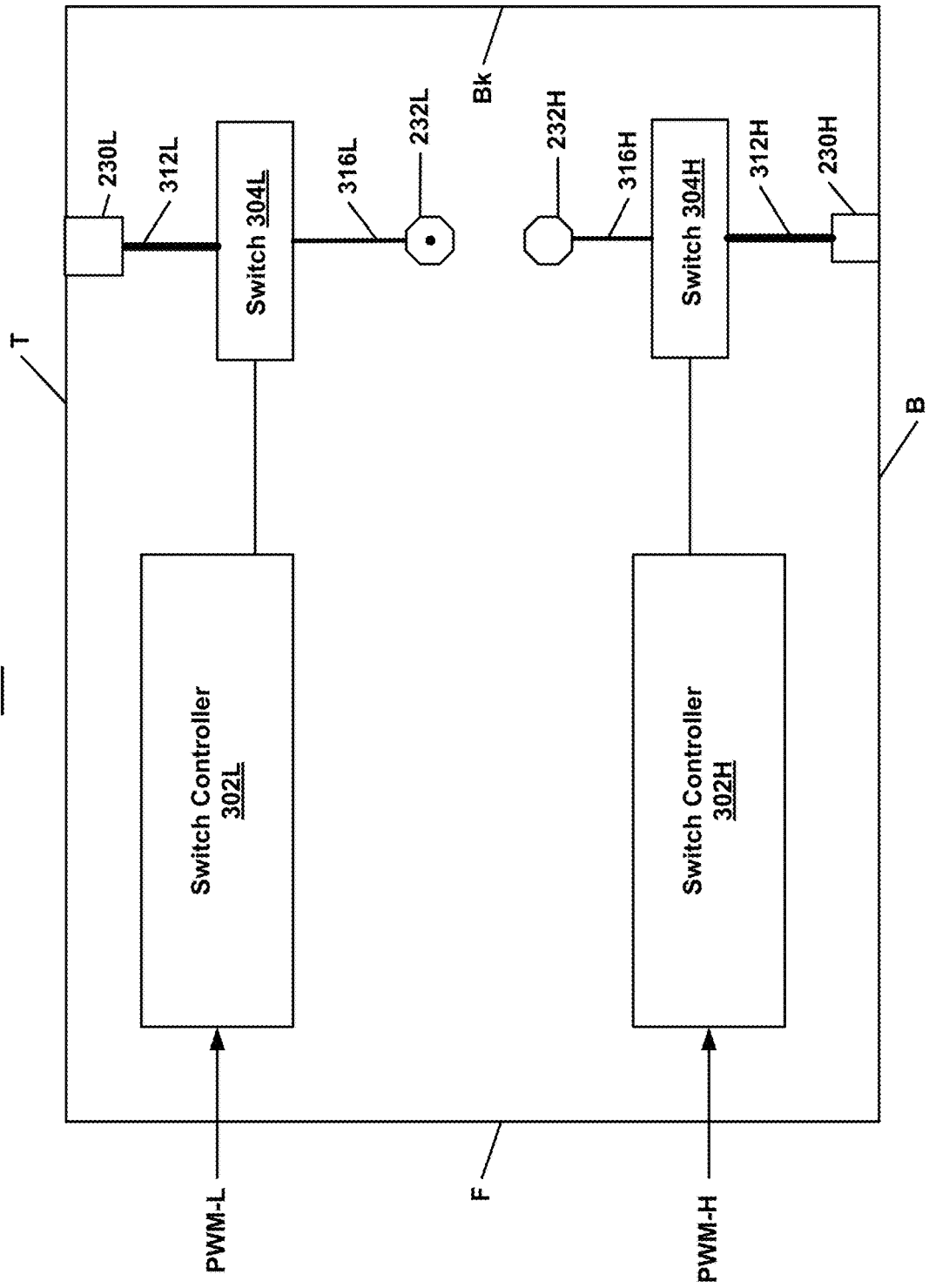

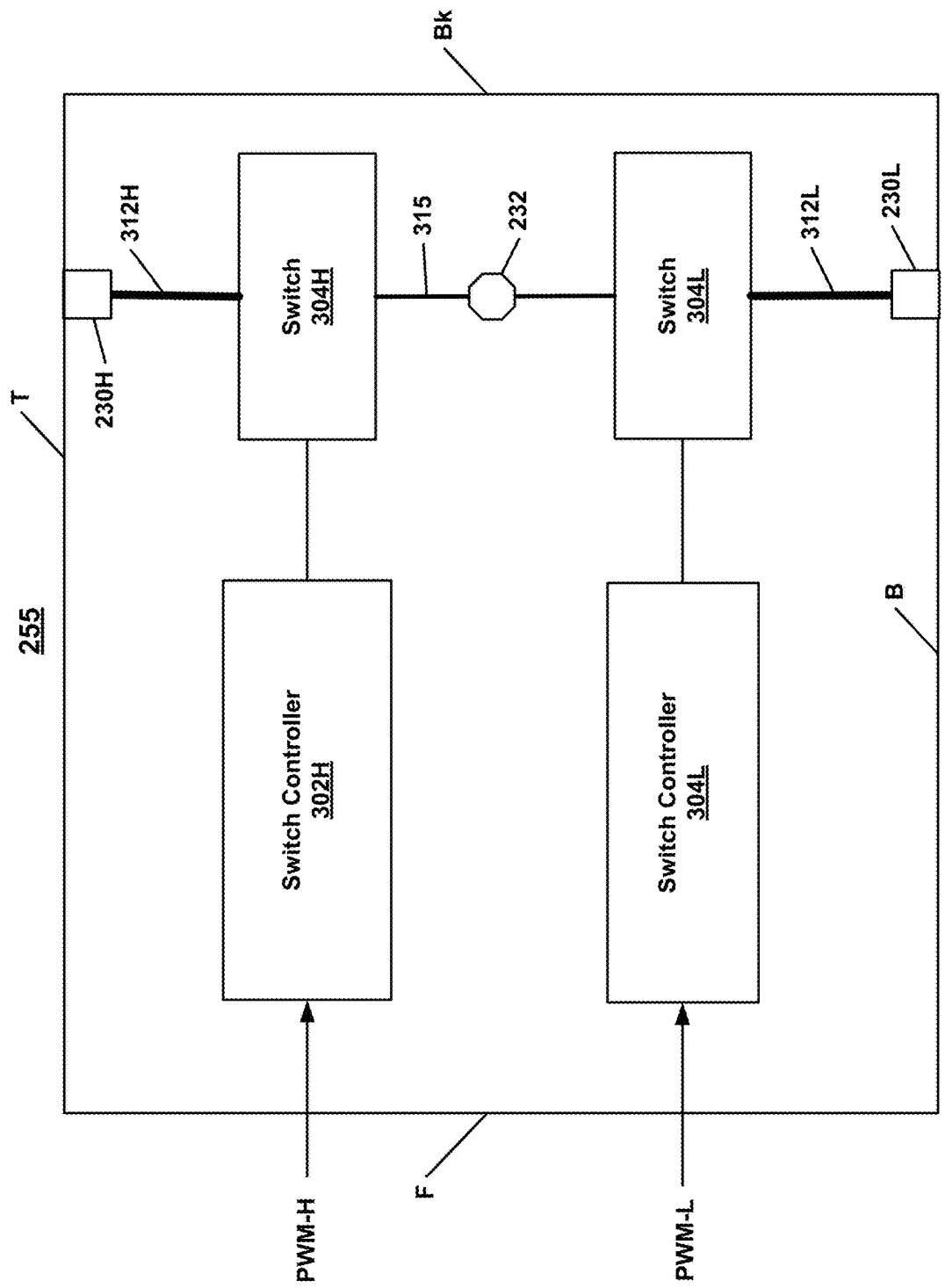

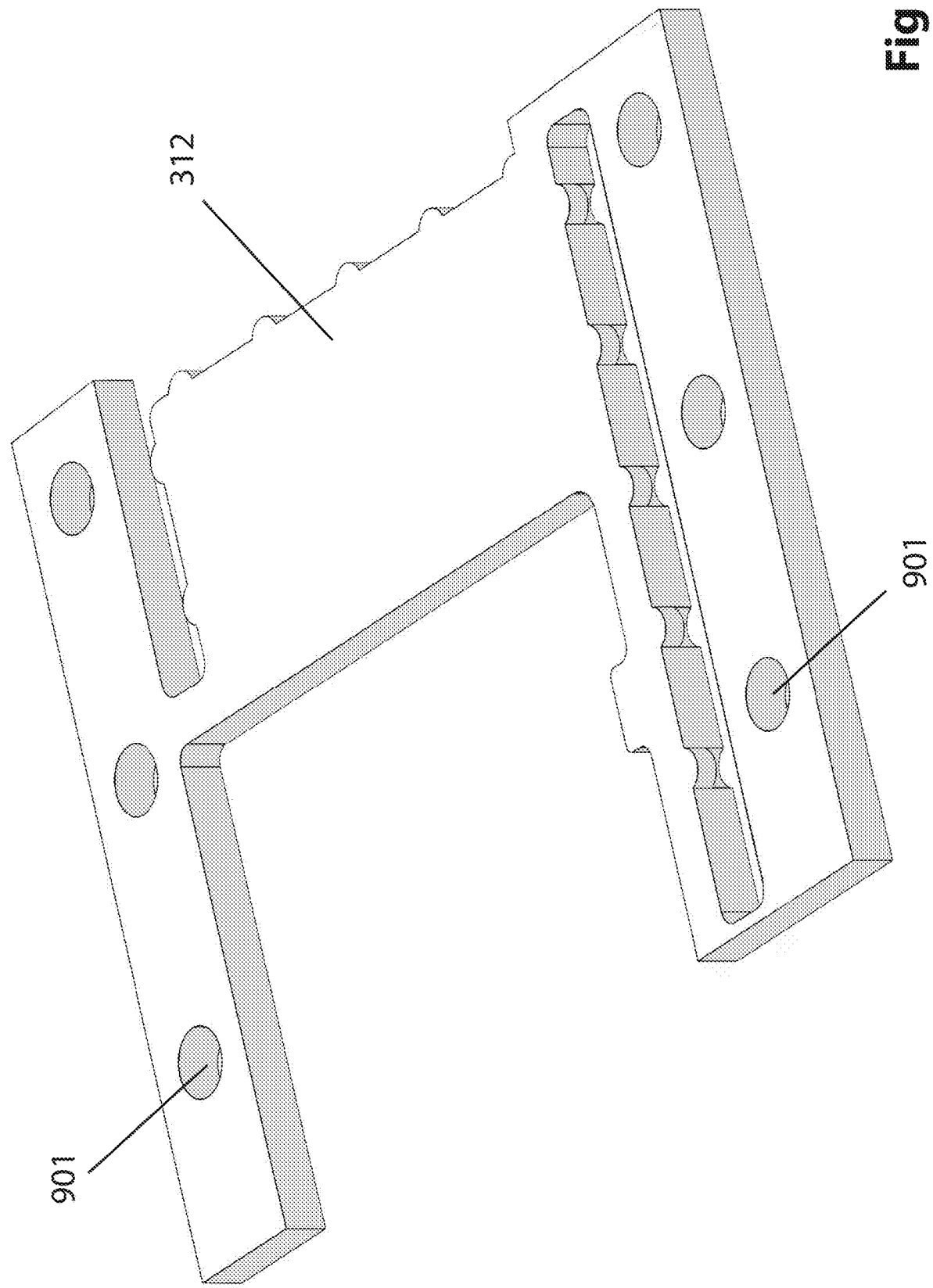

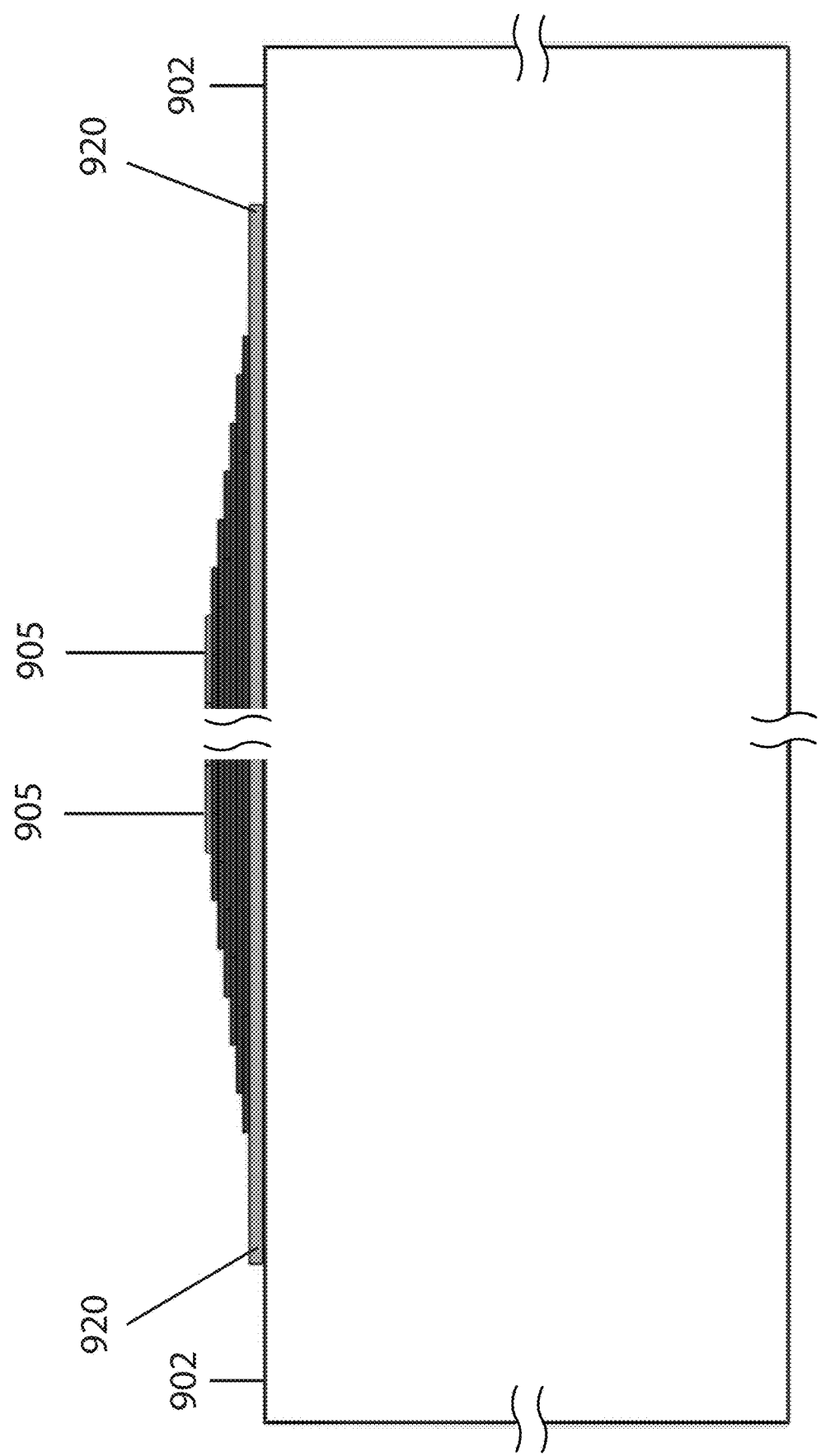

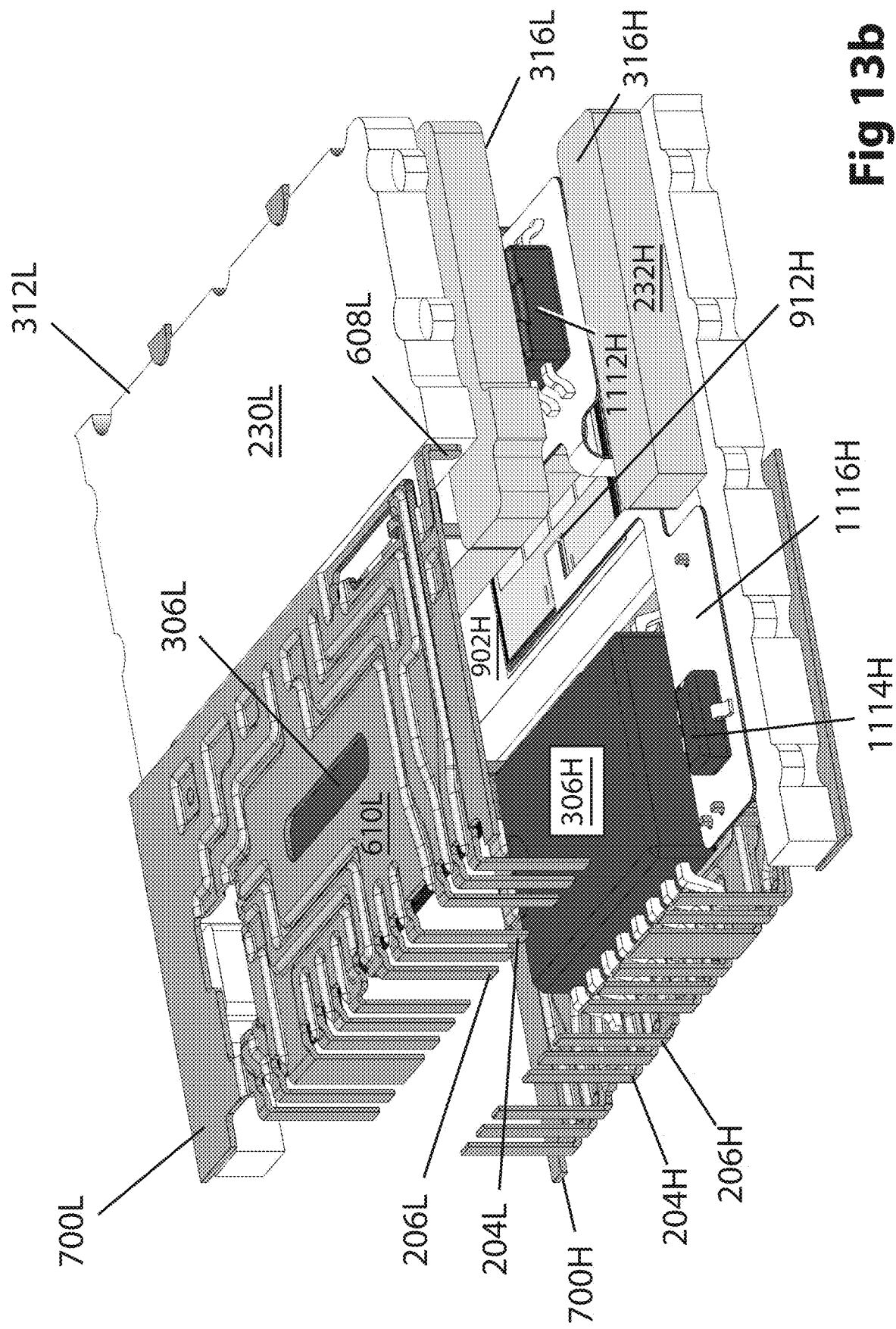

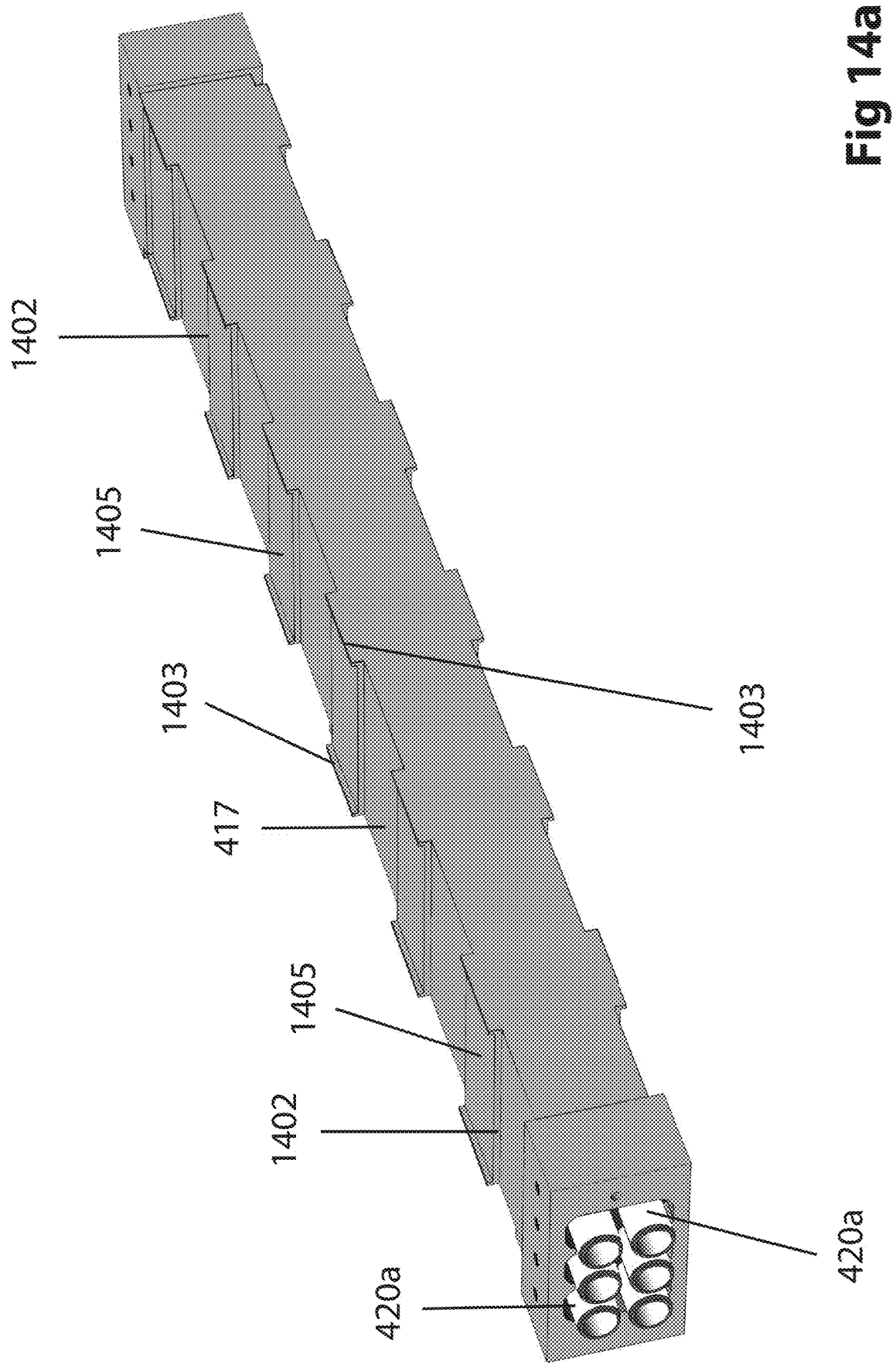

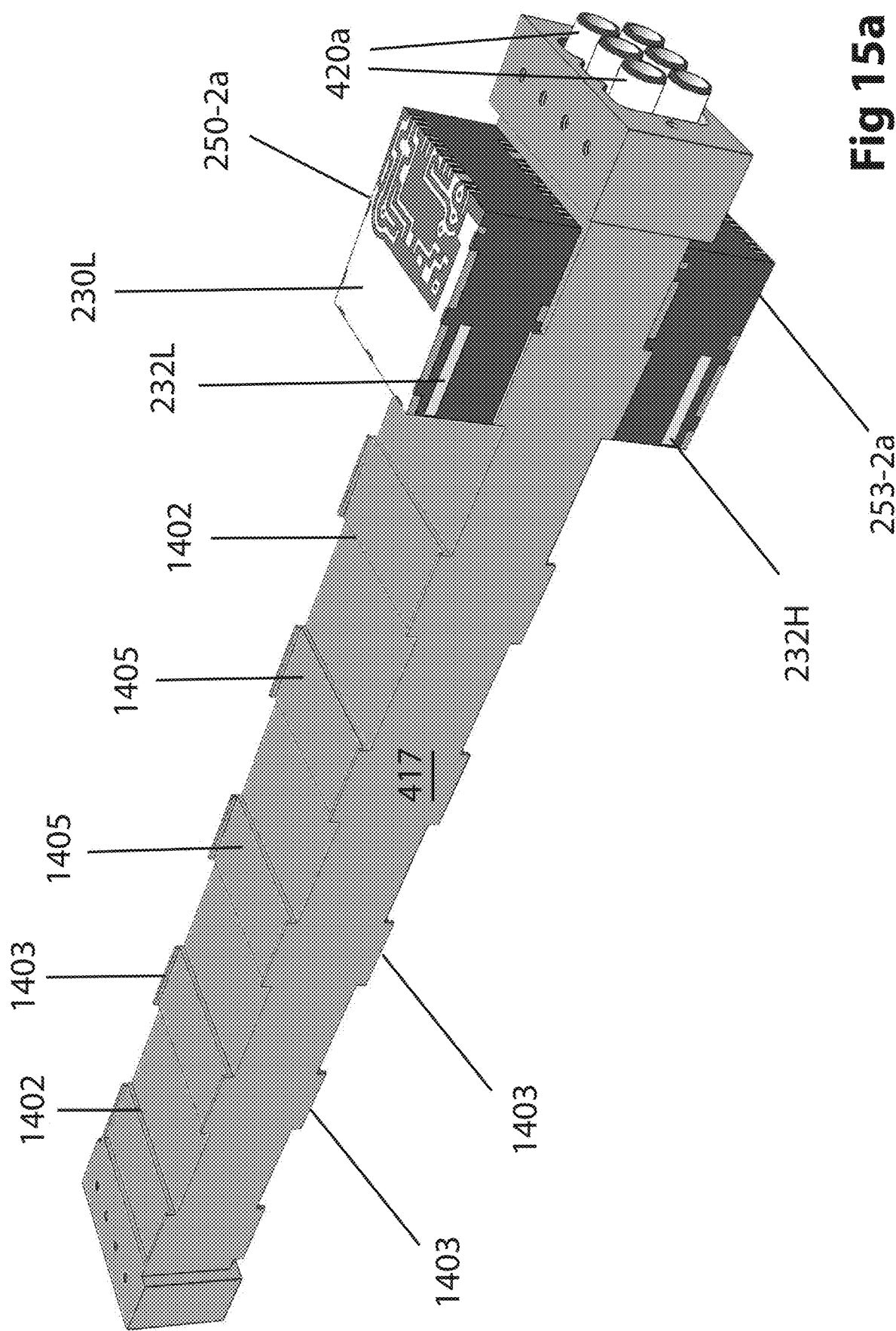

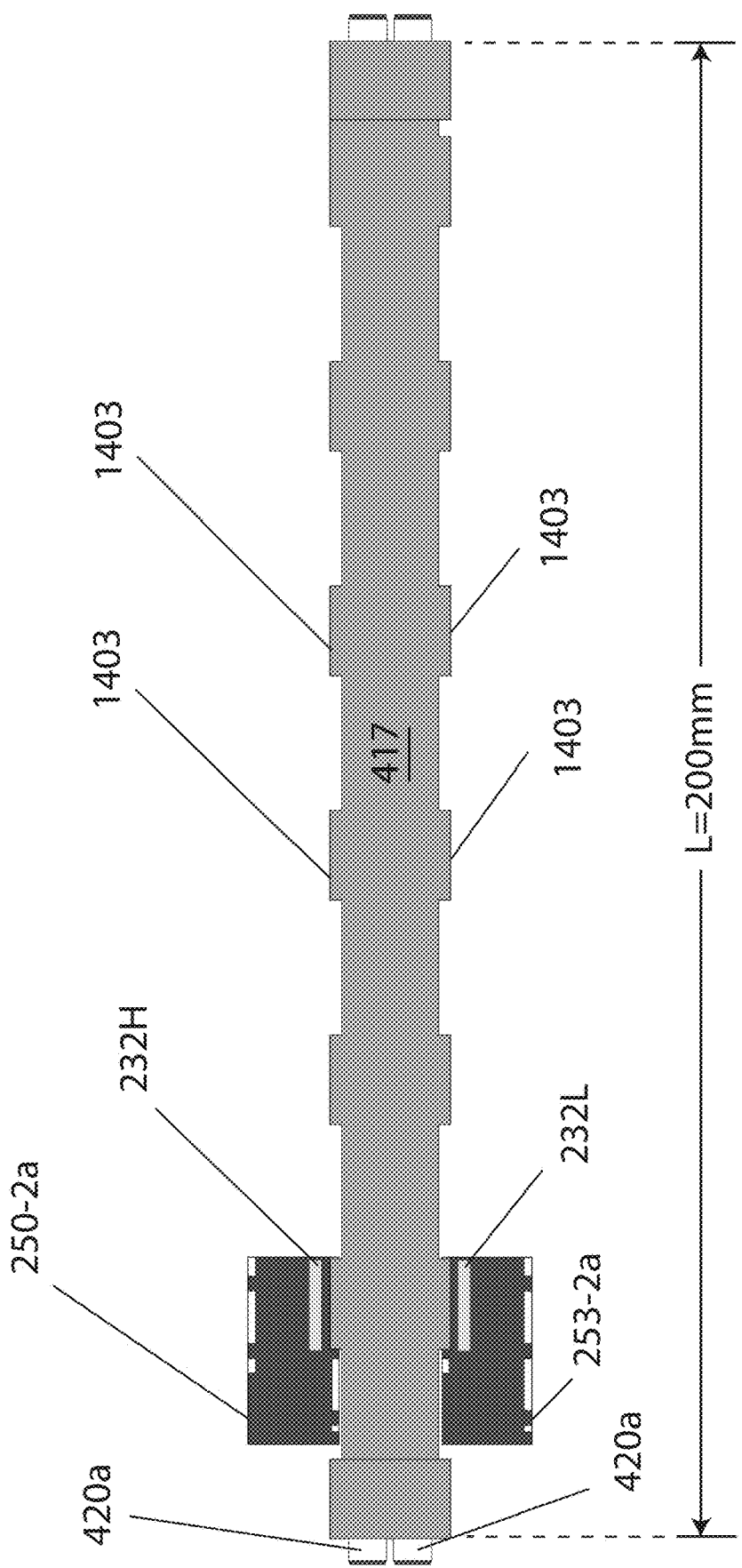

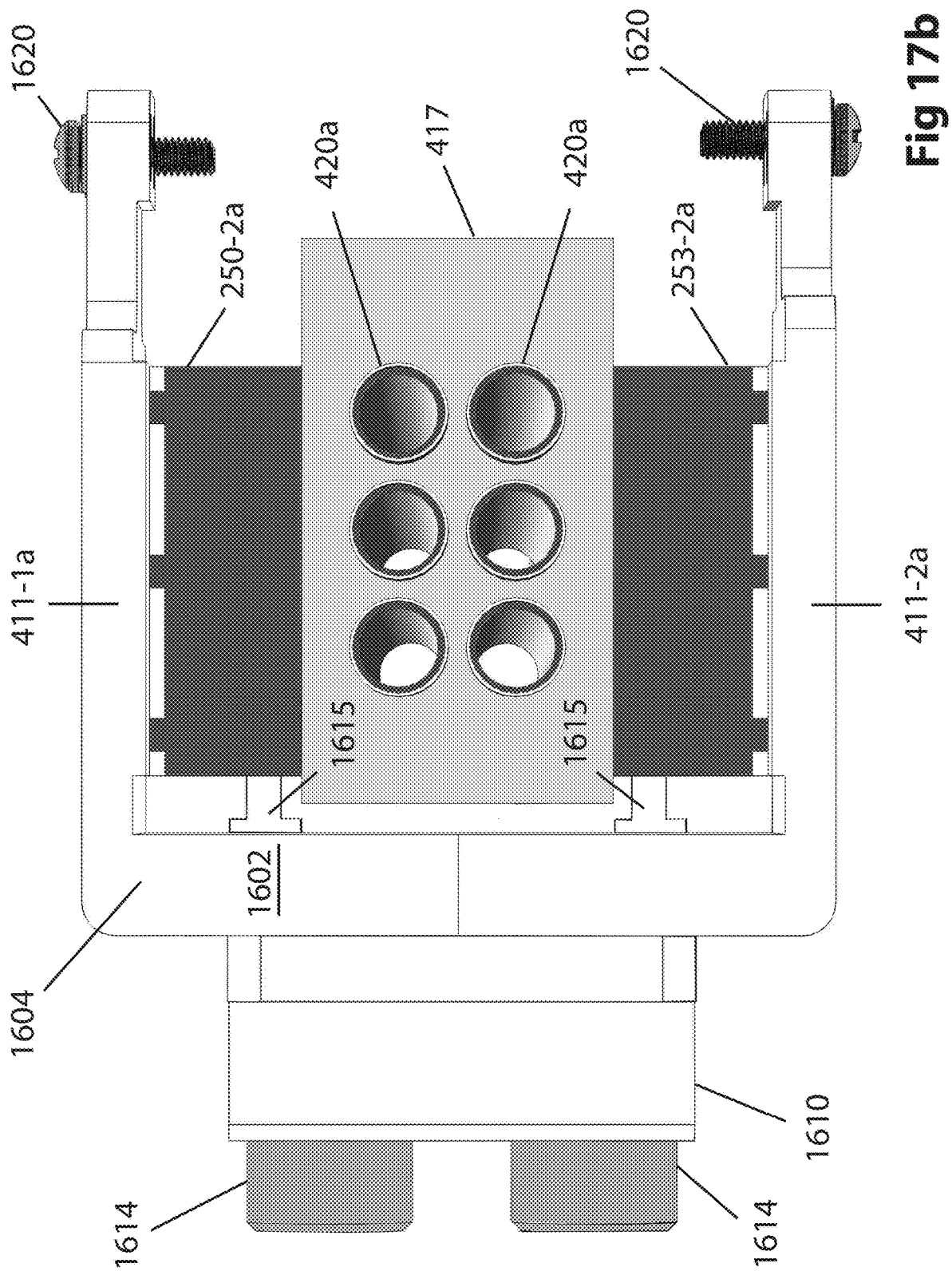

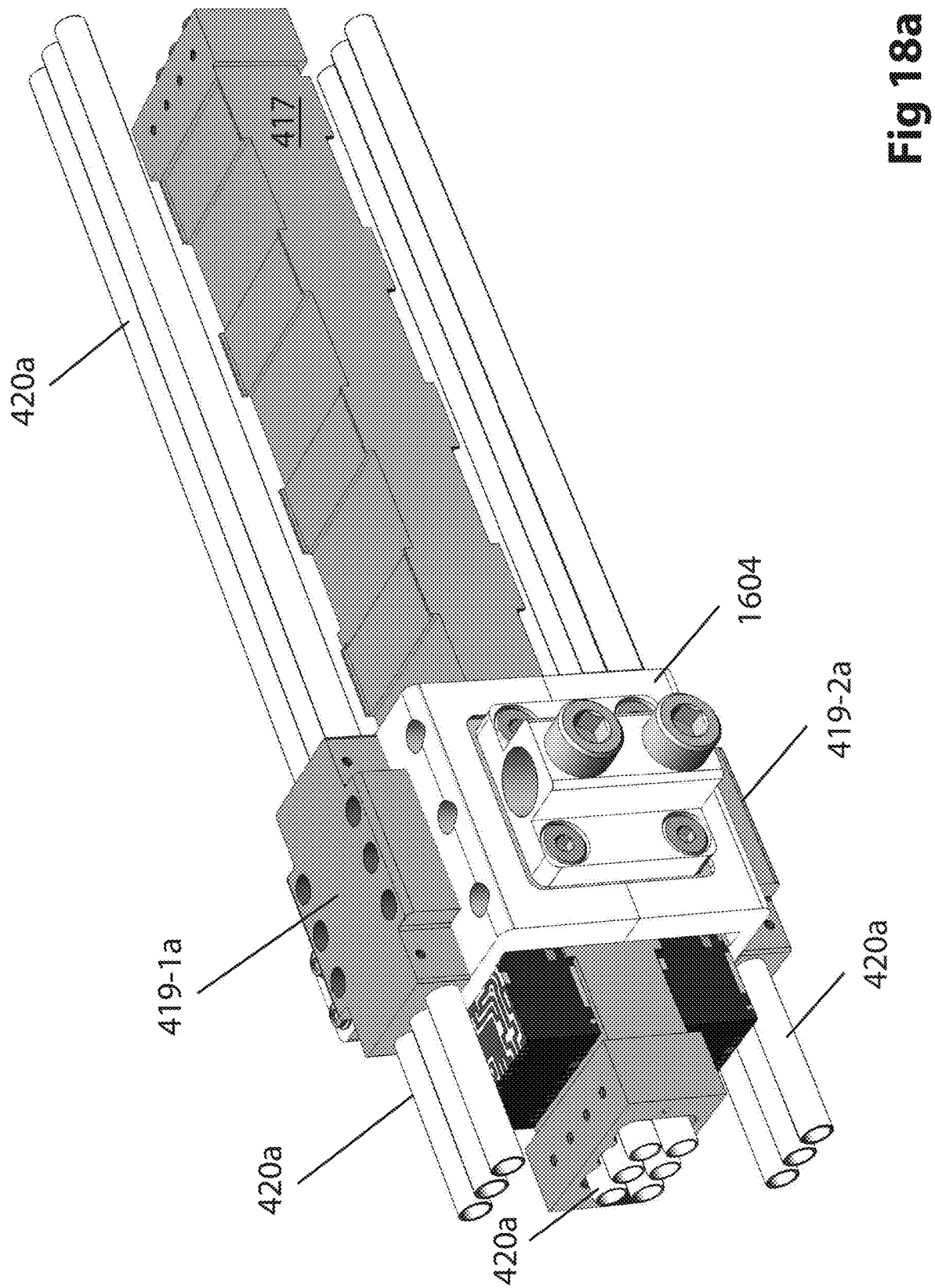

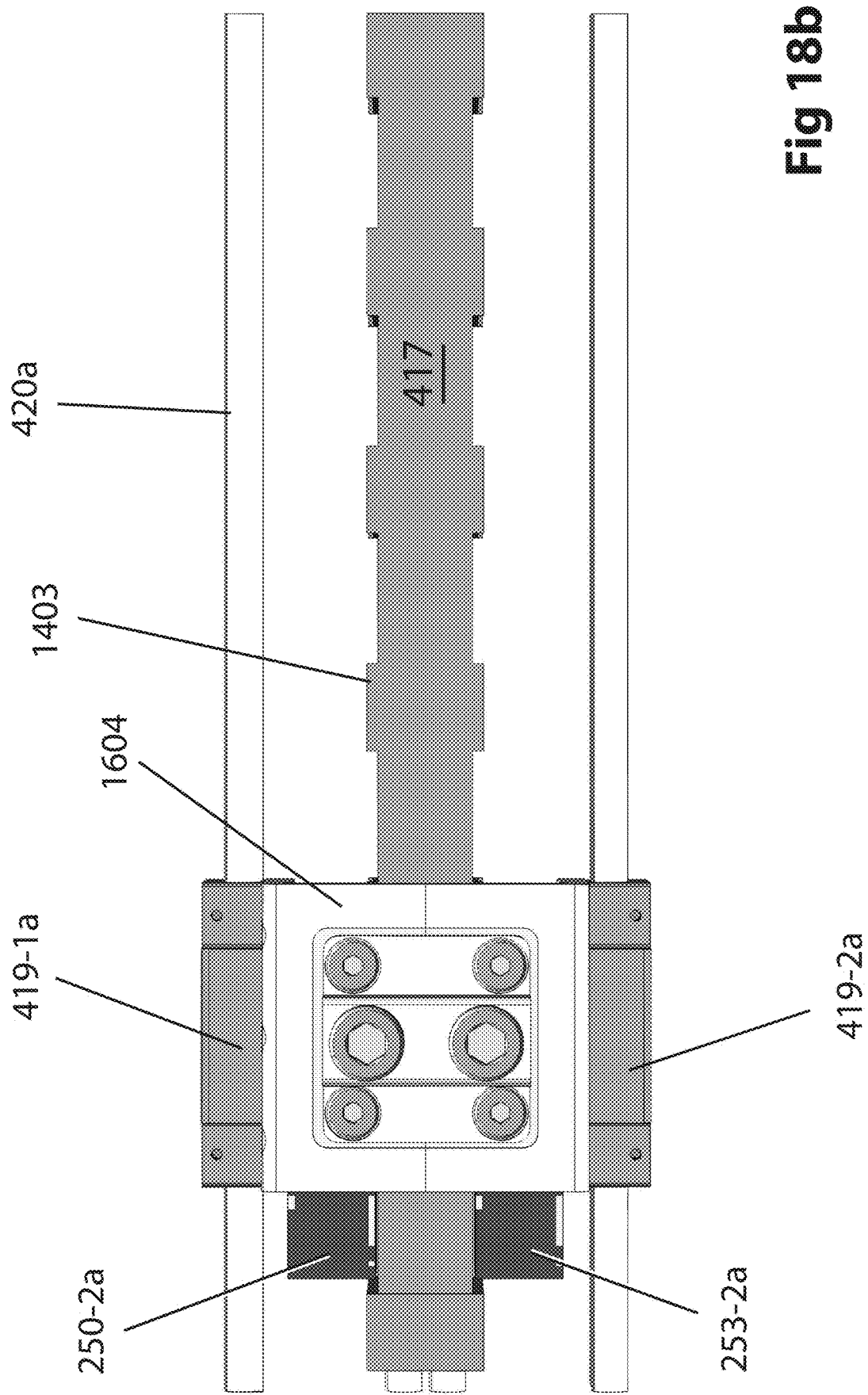

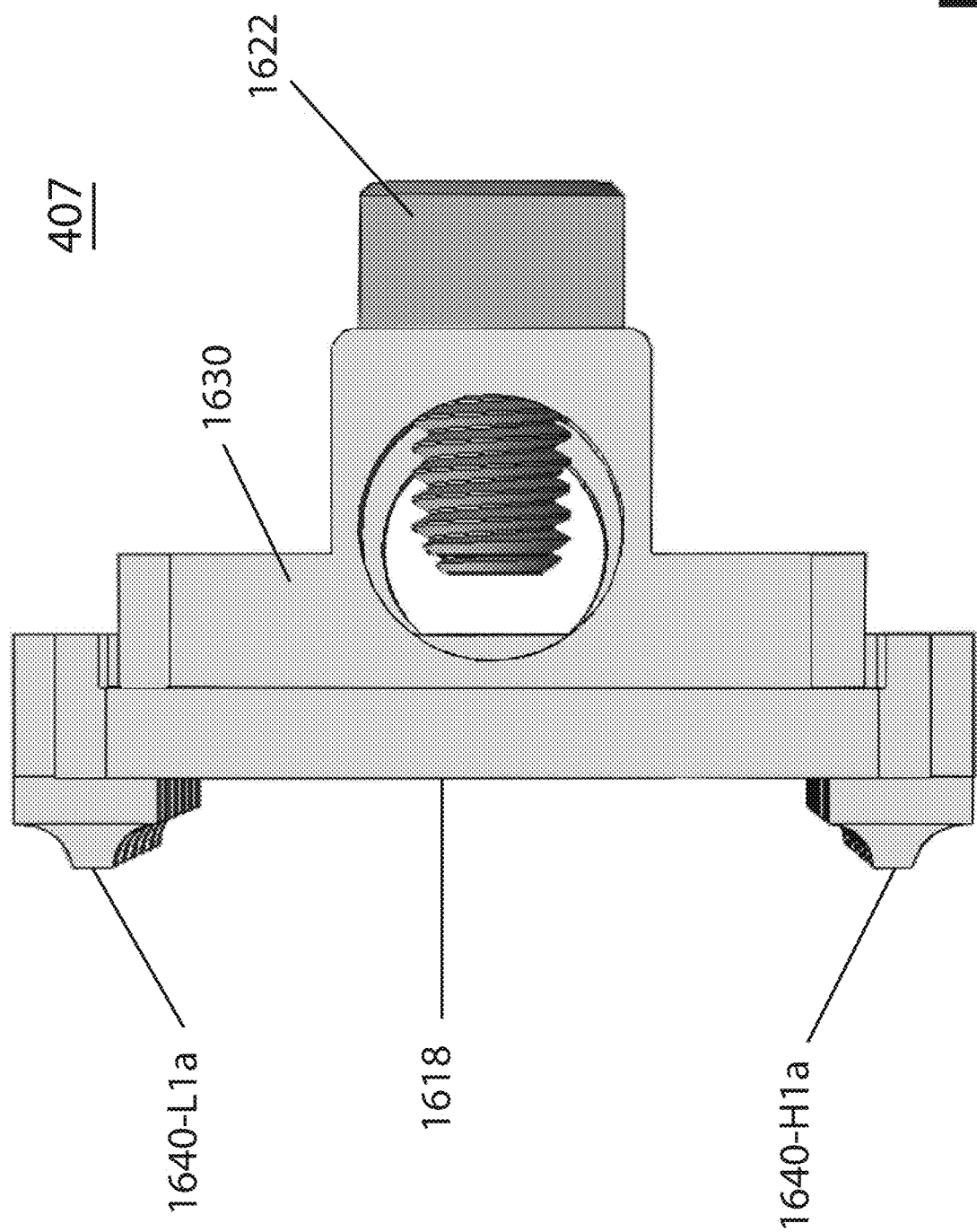

PACKAGED MODULE WITH SINTERED SWITCH

CROSS-REFERENCE TO RELATED APPLICATIONS

This application claims domestic benefit under Title 35 of the United States Code § 119(e) of U.S. Provisional Patent Application Ser. No. 63/028,883, entitled "Power Switch Package," filed May 22, 2020, U.S. Provisional Patent Application Ser. No. 63/044,763, entitled "Inverter Housing," filed Jun. 26, 2020, and U.S. Patent Application Ser. No. 63/136,406, entitled "Compact Inverter System," filed Jan. 12, 2021, all of which are incorporated by reference in their entirety and for all purposes as if completely and fully set forth here.

BACKGROUND

Electric motors (e.g., induction motors) are used in industrial fans, pumps, electric vehicles, etc. An induction motor is an alternating current (AC) electric motor in which electric current in a rotor needed to produce torque is obtained by electromagnetic induction from the magnetic field of a stator winding. In electric vehicles the torque is applied to a shaft, which propels the electric vehicle.

Microcontrollers or other data processing devices (e.g., system on a chip) control electric motors via power inverter systems. In essence a power inverter system changes direct current (DC) power from a battery, fuel cell or other source into AC power. A power inverter system can be operated in reverse to change AC power into DC power. A power inverter system may include three, six, nine, or more phases. In general each phase of a power inverter system includes at least one "high-side" switch connected to at least one "low-side" switch. A pair of connected high-side and low-side switches is called a "half bridge."

The present disclosure will be described with reference to three-phase power inverter systems for converting DC power into AC power for electrical motors of EVs, it being understood the present disclosure should not be limited thereto.

BRIEF DESCRIPTION OF THE DRAWINGS

The present technology may be better understood, and its numerous objects, features, and advantages made apparent to those skilled in the art by referencing the accompanying drawings.

FIG. 1b illustrates an example timing diagram that shows gate control signals employed in the three-phase power inverter of FIG. 1a.

FIGS. 2b-1 and 2b-2 are isometric and reverse isometric views of an example packaged half bridge.

FIG. 3a-1 is a schematic diagram that shows relevant components of the example of the packaged switch shown in FIGS. 2a-1 and 2a-2 when viewed from the top.

FIG. 3a-2 is a schematic diagram that shows relevant components of the example of the packaged switch shown in FIGS. 2a-1 and 2a-2 when viewed from the side.

FIG. 3a-3 is a schematic diagram that shows relevant components of the example of the packaged switch shown in FIGS. 2a-1 and 2a-2 when viewed from the back.

FIG. 3a-4 is a schematic diagram that illustrates relevant components of an example switch controller.

FIGS. 3a-5 and 3a-6 are schematic diagrams that illustrate relevant components of example switches.

FIG. 3a-7 is a schematic diagram that illustrates relevant components of an example gate driver.

FIG. 3b-1 is a schematic diagram that shows relevant components of another example packaged switch shown when viewed from the top.

FIG. 3b-2 is a schematic diagram that shows relevant components of the example packaged switch shown in FIG. 3b-1 when viewed from the side.

FIG. 3b-3 is a schematic diagram that shows relevant components of the example packaged switch shown in FIG. 3b-1 when viewed from the back.

FIG. 3c-1 is a schematic diagram that shows relevant components of another example packaged switch shown when viewed from the side.

FIG. 3c-2 is a schematic diagram that shows relevant components of the example packaged switch shown in FIG. 3c-1 when viewed from the back.

FIG. 3d-1 is a schematic diagram that shows relevant components of another example packaged switch shown when viewed from the side.

FIG. 3d-2 is a schematic diagram that shows relevant components of the example packaged switch shown in FIG. 3d-1 when viewed from the back.

FIG. 3e-1 is a schematic diagram that shows relevant components of another example packaged switch shown when viewed from the side.

FIG. 3e-2 is a schematic diagram that shows relevant components of the example packaged switch shown in FIG. 3e-1 when viewed from the back.

FIG. 3f-1 is a schematic diagram that shows relevant components of another example packaged switch shown when viewed from the side.

FIG. 3f-2 is a schematic diagram that shows relevant components of the example packaged switch shown in FIG. 3f-1 when viewed from the back.

FIG. 3g-1 is a schematic diagram that shows relevant components of the example packaged half bridge shown in FIGS. 2b-1 and 2b-2 when viewed from the side.

FIG. 3g-2 is a schematic diagram that shows relevant components of the example packaged half bridge shown in FIGS. 2b-1 and 2b-2 when viewed from the back.

FIG. 3h-1 is a schematic diagram that shows relevant components of another example packaged half bridge when viewed from the side.

FIG. 3h-2 is a schematic diagram that shows relevant components of the example packaged half bridge shown in FIG. 3h-1 when viewed from the back.

FIG. 3i-1 is a schematic diagram that shows relevant components of another example packaged half bridge when viewed from the side.

FIG. 3i-2 is a schematic diagram that shows relevant components of the example packaged half bridge shown in FIG. 3i-1 when viewed from the back.

FIG. 3k-1 is a schematic diagram that shows relevant components of another example packaged half bridge when viewed from the side.

FIG. 3k-2 is a schematic diagram that shows relevant components of the example packaged half bridge shown in FIG. 3k-1 when viewed from the back.

FIG. 3l-1 is a schematic diagram that shows relevant components of another example packaged half bridge when viewed from the side.

FIG. 3*l*-2 is a schematic diagram that shows relevant components of the example packaged half bridge shown in FIG. 3*l*-1 when viewed from the back.

FIG. 4*a*-1 is schematic diagram that shows relevant components of an example compact inverter system when viewed from the side.

FIG. 4*a*-2 is schematic diagram of the compact inverter system of FIG. 4*a*-1 when viewed from the back.

FIGS. 4*a*-3-4*a*-6 are cross sectional views of example pipes that can be employed in a compact inverter system.

FIG. 4*b*-1 is schematic diagram that shows relevant components of another example compact inverter system when viewed from the side.

FIG. 4*b*-2 is schematic diagram of the compact inverter system of FIG. 4*b*-1 when viewed from the back.

FIG. 4*b*-3 illustrates example signals that are received from or transmitted to a phase of the compact inverter system shown in FIG. 4*b*-1.

FIG. 4*c*-1 is schematic diagram that shows relevant components of another example compact inverter system when viewed from the side.

FIG. 4*d*-1 is schematic diagram that shows relevant components of another example compact inverter system when viewed from the side.

FIG. 4*d*-2 illustrates example signals that are received from or transmitted to a phase of the compact inverter system shown in FIG. 4*d*-1.

FIG. 5 is an isometric view of an embossed sheet of thin metal from which an example signal frame substrate can be formed.

FIG. 6 is a reverse isometric view of embossed sheet shown in FIG. 5 after it has been cut.

FIG. 7 is an isometric view of the cut sheet shown in FIG. 6 after several non-isolated signal leads are bent.

FIG. 9*a* is a top view of an example die substrate.

FIG. 9*c* shows a partial cross sectional view of the structure shown in FIG. 9*b*.

FIGS. 13*a* and 13*b* are side and isometric views of relevant components of an example packaged half bridge.

FIGS. 14*a* and 14*b* are isometric and end views, respectively, of an example V+ bus bar employed in the compact inverter system of FIG. 4*d*-1.

FIGS. 15*a* and 15*b* are isometric and side views of V+ bus bar of FIGS. 14*a* and 14*b* after it receives example packaged half bridges.

FIGS. 17*a* and 17*b* are isometric and end views of the structure shown within FIGS. 15*a* and 15*b* B with the clamp of FIGS. 16 *a-c*.

FIGS. 18*a*-18*c* are isometric, side and end views of the structure shown within FIGS. 17*a* and 17*b* with added heatsinks.

FIGS. 20*a*-2*c* are isometric, top, and end views of an example V− bus bar employed in the compact inverter system of FIG. 4*d*-1.

The use of the same reference symbols in different drawings indicates similar or identical items.

DETAILED DESCRIPTION

Figure 1A:
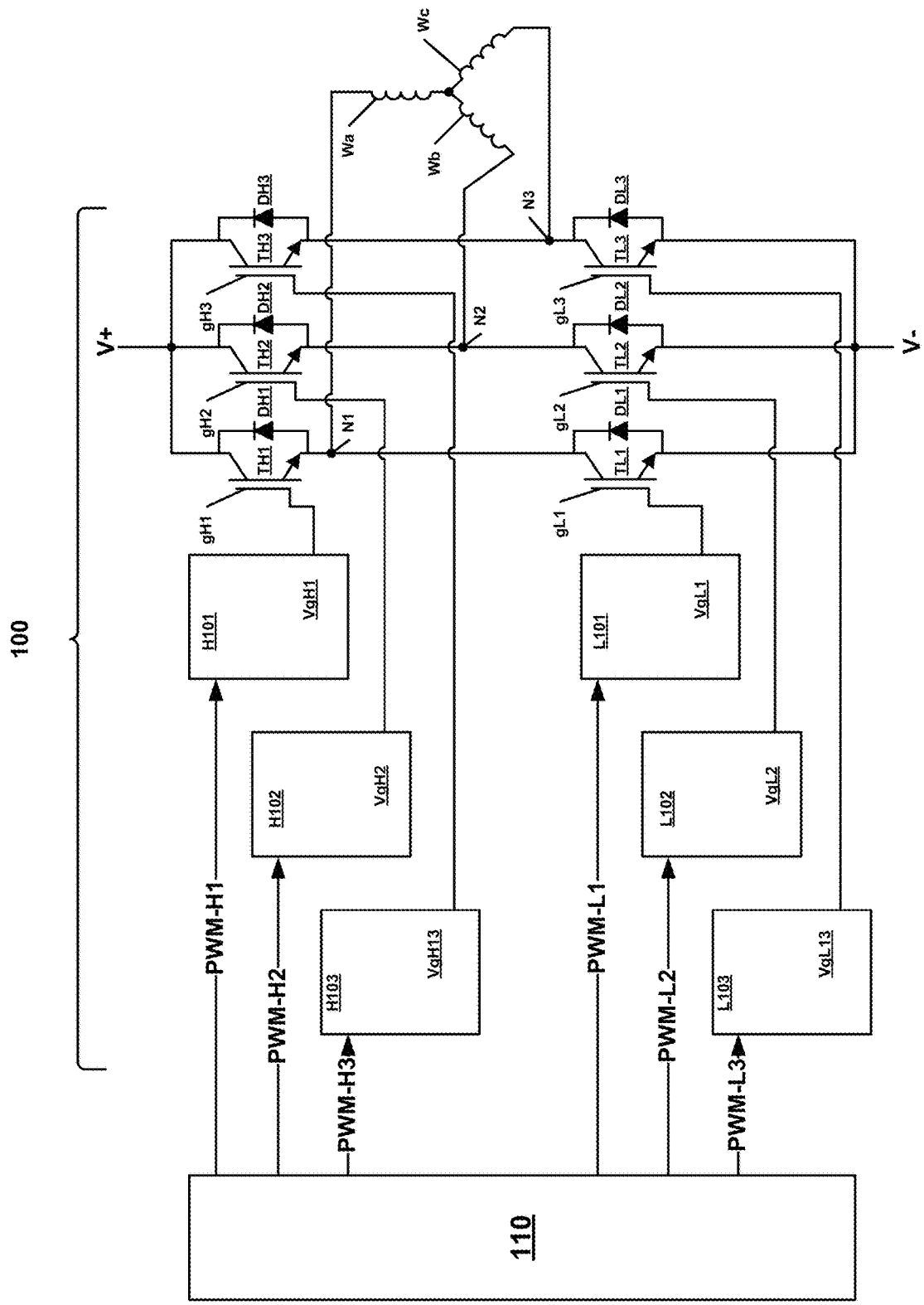
FIG. 1a illustrates relevant components of an example three-phase power inverter.

FIG. 1*a* illustrates relevant components of an example three-phase power inverter system (hereinafter inverter system) 100. Each phase includes a half bridge: a high-side switch connected to a low-side switch. Each high-side switch includes a transistor THx connected in parallel with diode DHx, and each low-side switch includes transistor TLx connected in parallel with diode DLx. Transistors TH1-TH3 and TL1-TL3 take form in insulated-gate bipolar transistors (IGBTs).

High-side transistors TH1-TH3 are connected in series with low-side transistors TL1-TL3, respectively, via nodes N1-N3, respectively, which in turn are connected to respective terminals of wire windings Wa-Wc of an electric motor. The collectors of TH1-TH3 and the cathodes of DH1-DH3 are connected together and to a terminal of a battery that provides a positive voltage V+(e.g., 50V, 100V, 200V, or higher), while the emitters of transistors TL1-TL3 and the anodes of diodes DL1-DL3 are connected together and to another terminal of the battery that provides a return or negative voltage V−.

High-side transistors TH1-TH3 and low-side transistors TL1-TL3 are controlled by microcontroller 110 via gate drivers H101-H103 and L101-L103, respectively. A gate driver is a circuit that accepts a low-power input signal from a device (e.g. a microcontroller), and produces a high-current output signal to control the gate of a transistor such as an IGBT or a metal-oxide-semiconductor field-effect transistor (MOSFET).

Control of the transistors is relatively simple. High-side gate drivers H101-H103 and low-side gate drivers L101-L103 receive low-power, driver control signals (i.e., pulse width modulation signals PWM-H1-PWM-H3 and PWM-L1-PWM-L3) from microcontroller 110. High-side gate drivers H101-H103 activate high-side transistors TH1-TH3, respectively, by asserting high-current, gate control signals VgH1-VgH3, respectively, when PWM-H1-PWM-H3 signals, respectively, are asserted. And low-side gate drivers L101-L103 activate low-side transistors TL1-TL3, respectively, by asserting high-current, gate control signals VgL1-VgL3, respectively, when PWM-L1-PWM-L3 signals, respectively, are asserted. Each of the transistors TH1-TH3 and TL1-TL3 conducts current to or from a connected winding W when activated.

Through coordinated activation of connected high-side and low-side transistors, the direction of current flow in a winding W is continuously and regularly flip-flopped (current travels into a winding, then abruptly reverses and flows back out). FIG. 1b illustrates an example timing diagram for gate control signals VgH1-VgH3 and VgL1-VgL3. An interaction between a magnetic field of a motor's rotor (not shown), which is coupled to a drive shaft (not shown), and the changing current in wire windings Wa-Wc creates a force that propels an EV.

Microcontroller 110 controls high-side transistors TH1-TH3 and low-side transistors TL1-TL3 via PWM-H1-PWM-H3 and PWM-L1-PWM-L3 signals, respectively. Microcontrollers, such as microcontroller 110, include a central processing unit (CPU), memory that stores instructions executable by the CPU, and peripherals such as timers, input/output (I/O) ports, etc. The CPU programs the timers in accordance with instructions stored in memory. Once programmed and started, these timers can autonomously generate the PWM-H1-PWM-H3 and PWM-L1-PWM-L3 signals. Gate drivers H101-H103 generate the VgH1-VgH3 signals based on the PWM-H1-PWM-H3 signals, and gate drivers L101-L103 generate the VgL1-VLH3 signals based on the PWM-L1-PWM-L3 signals. The CPU may reprogram the timers in order to adjust the duty cycle and/or period of the PWM signals, which in turn adjusts the rotational speed of the EV's drive shaft.

Prior inverter systems are large, bulky, expensive, inefficient, etc. For example, a prior inverter system that can deliver 400 kW of peak power to an electric motor, occupies a volume exceeding 11 liters. A "compact power inverter system" (hereinafter compact inverter system) is disclosed that addresses many problems of prior inverter systems. For example, a compact inverter system, which includes ceramic decoupling capacitors like those described in FIG. 20d below, can deliver 400 kW of peak power, yet occupy a volume less than 0.25 liters. The size of compact inverters may increase if thin-film decoupling capacitors are used instead of ceramic decoupling capacitors, or system requirements require thin-film decoupling capacitors, or if thin-film decoupling capacitors are added along with the ceramic decoupling capacitors. Ultimately, the power density (volume/power) of the disclosed compact converter systems far exceeds that of prior inverter systems.

Packaged Switch Modules

"Packaged switch modules" are disclosed. Compact inverter systems of this disclosure use packaged switch modules, it being understood that packaged switch modules can be used in a variety of other systems, such as AC-DC converters, DC-DC converter systems, photo voltaic conversion systems, power charging stations, etc.

As its name implies, packaged switch modules contain one or more "switch modules." A switch module includes a "switch," and a "switch controller," it being understood that a switch module may include additional components. Switch controllers control switches (i.e., activate or deactivate switches). A packaged switch module that contains only one switch module is called a "packaged switch," and a packaged switch module that contains two switch modules is called a "packaged half bridge."

Figures 1, 2A:
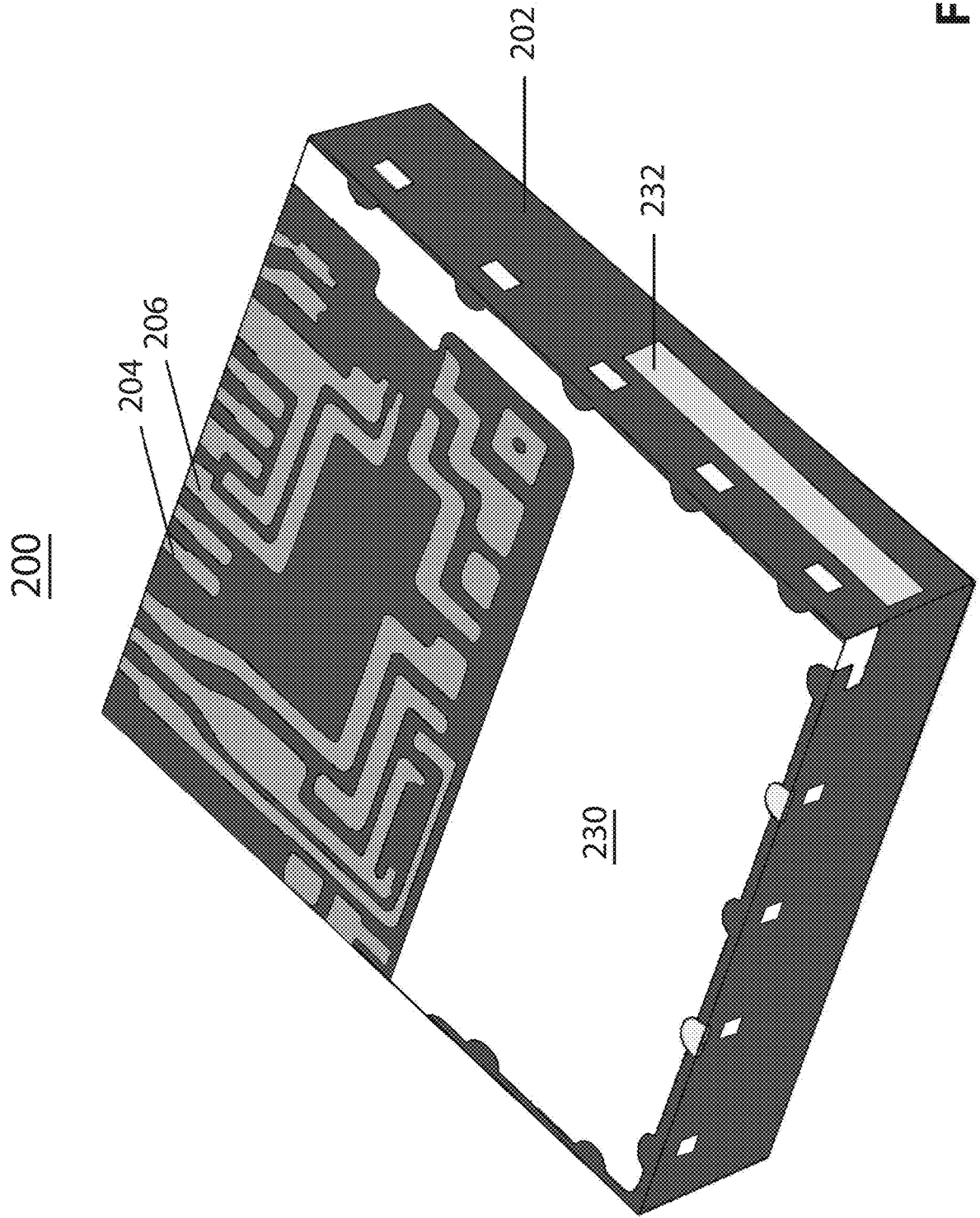
FIGS. 2a-1 and 2a-2 are isometric and reverse isometric views of an example packaged switch.
Figures 2, 2A:
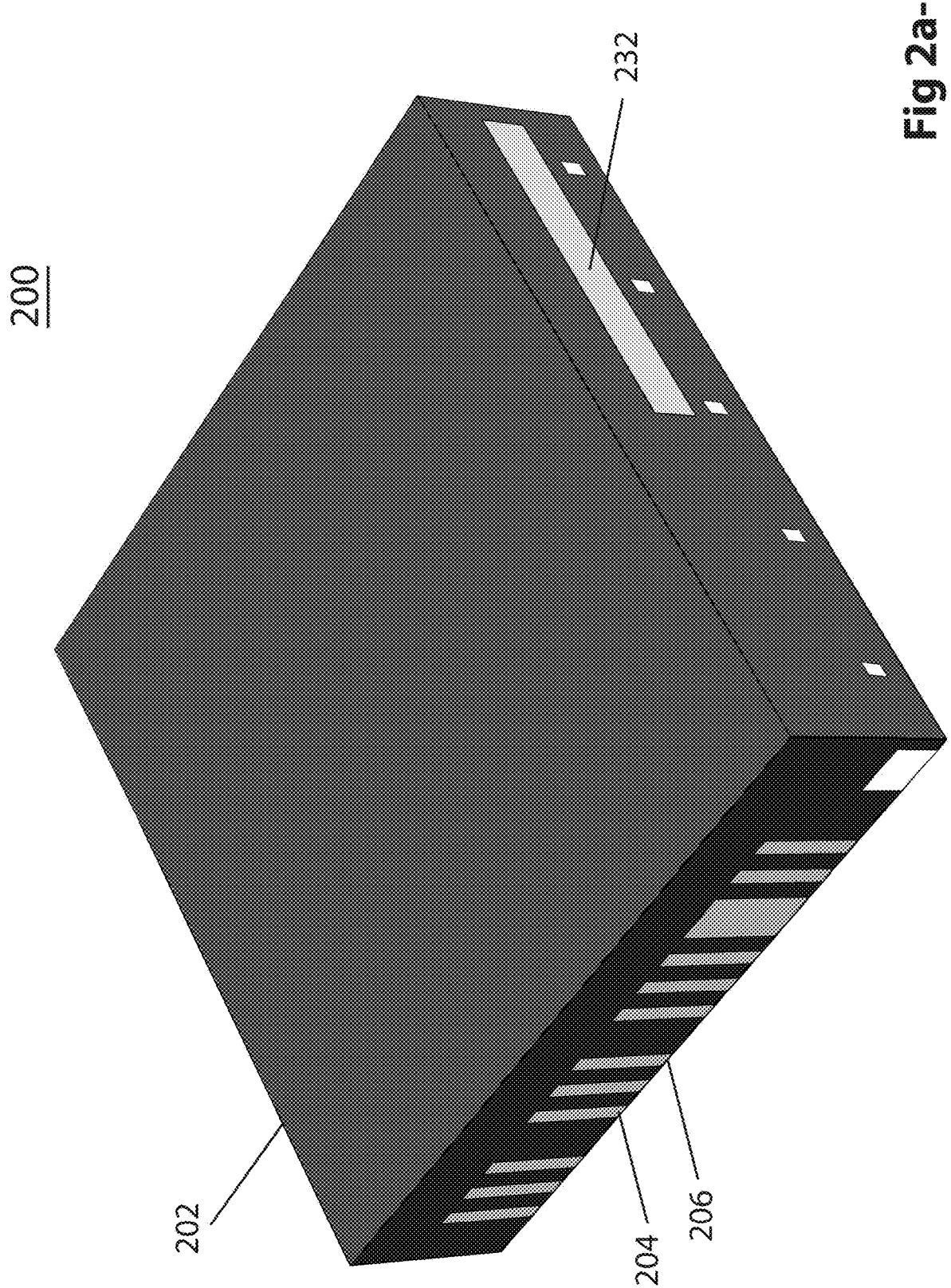

Packaged switches and packaged half bridges can be cubic shaped with six sides; top, bottom, front, back, left, and right. FIGS. 2a-1 and 2a-2 are isometric and reverse isometric views of an example packaged switch 200. FIGS. 2b-1 and 2b-2 are isometric and reverse isometric views of an example packaged half bridge 250. Packaged switches and half bridges can be manufactured with small form factors. For example, packaged switch 200 can measure 25×25×6 mm, and packaged half bridge 250 can measure 25×25×12 mm.

Packaged switches and half bridges have solid glass, plastic or ceramic cases. For the purposes of explanation only, cases are presumed to be plastic (e.g., epoxy resin). FIGS. 2a-1 and 2a-2 show packaged switch 200 with a plastic case 202, and FIGS. 2b-1 and 2b-2 show packaged half bridge 250 with a plastic case 252.

Plastic cases isolate, protect and/or support components such as switches, switch controllers, etc. Plastic cases also support "signal leads." A signal lead is an electrical connection consisting of a length of "wire" or a metal pad that is designed to connect two locations electrically. Signal leads carry signals (e.g., PWM signals, gate control signals, etc.) or voltages (e.g., supply voltages, ground, etc.) between internal components (e.g., between a switch controller and a switch), or between internal components (e.g., a switch controller) and external components (e.g., a microcontroller, voltage regulator, etc.). FIGS. 2a-1 and 2a-2 illustrate example signal leads 204 and 206. Signal lead 204 can convey a signal such as a low-power PWM signal to an internal component (e.g., a switch controller), while signal lead 206 can convey a supply voltage to the same internal component or a different internal component. Packaged half bridge 250 has similar signal leads 204H, 204L, 206H and 206L.

Signal leads have substantially flat surfaces. Unless otherwise signal lead surfaces are substantially flush with plastic case surfaces of a packaged switch or packaged half bridge. However, in other embodiments, the flat surfaces may be recessed below the surfaces of the plastic case, or the flat surfaces may protrude above the surfaces of the plastic case. FIG. 2a-1 shows example signal leads 204 and 206 with flat surfaces that are substantially flush with the top surface of packaged switch 200. FIG. 2a-2 also shows example signal leads with flat surfaces that are substantially flush with the front surface of packaged switch 200. Signal leads can provide terminals (i.e., physical interfaces). Signal leads at the front of packaged switch 200 provide terminals through which signals or voltages are received or transmitted. For example, signal lead 204 provides a terminal that can receive a signal such as a low-power PWM signal from a microcontroller, while signal lead 206 provides a terminal for receiving a supply voltage from a power management integrated circuit (PMIC). In an alternative embodiment, signal leads at the top can provide terminals for receiving or transmitting signals or voltages. For purposes of explanation, only the front of packaged switches provide signal lead terminals for receiving or transmitting signals and voltages, it being understood that signal leads on the top can provide terminals in alternative embodiments. FIGS. 2b-1 and 2b-2 show similar signal leads 204 and 206 that are substantially flush with the front, top and bottom surfaces of packaged half bridge 250. For purposes of explanation, only signal leads such as signal leads 204H, 204L, 206H and 206L at the front of packaged half bridges provide terminals through which signals or voltages can be transmitted or received, it being understood that signal leads on the top and bottom surfaces can provide terminals in alternative embodiments.

A switch includes one or more power transistors (IGBTs, MOSFETs, etc.). A power transistor has two current terminals (collector and emitter in an IGBT, source and drain in a MOSFET, etc.) and a control or gate terminal. Multiple power transistors in a switch maybe connected in parallel and controlled by a common signal at their gates. A switch can transmit substantial levels of current at high switching speeds without failure depending on the size (i.e., gate width and length), type (e.g., MOSFET), semiconductor material (e.g., GaN), and number (e.g., three) of transistors in the switch. A power transistor can transmit current at high switching speeds (e.g., up to 100 kHz for Si IGBTs, up to 500 kHz for SiC MOSFETS, up to 1.0 GHz for GaN MOSFETs, etc.). When thermally connected to heat sinks, as will be described below, power transistors can transmit more current at higher switching speeds without failure.

Switches are sandwiched between separate metal conductors called "die substrates" and "die clips." More particularly, a first current terminal (e.g., collector or drain) and a second current terminal (e.g., emitter or source) of each transistor in a switch is connected (e.g., sintered, soldered, brazed, etc.) to a die substrate and a die clip, respectively. The gate of each transistor in a switch is connected to and controlled by a switch controller.

Die Substrate and Die Clip Terminals

Die substrates and die clips conduct current. In addition to conducting current, a die substrate conducts heat. A die substrate has a terminal for transmitting heat out of a packaged switch or packaged half bridge. The same die substrate terminal can transmit current into or out of the packaged switch or packaged half bridge. A die clip has at least one terminal for transmitting current into or out of a packaged switch or packaged half bridge. This terminal may also transmit some heat out of the packaged switch or packaged half bridge, but its primary purpose is to transmit current. In some embodiments, a die clip may have an additional terminal for transmitting heat out of a packaged switch or packaged half bridge.

A die substrate terminal can extend through a surface of a packaged switch or packaged half bridge. Likewise, a die clip terminal can extend through a surface of a packaged switch or packaged half bridge. Unless otherwise noted die substrate terminals and die clip terminals have substantially flat surfaces that are substantially flush with plastic case surfaces of a packaged switch or packaged half bridge. However, in other embodiments, these flat surfaces may be recessed below the surfaces of the plastic case, or the flat surfaces may protrude above the surfaces of the plastic case.

FIG. 2a-1 shows an example die substrate terminal 230 with a substantially flat surface that is substantially flush with the top surface of packaged switch 200. FIG. 2a-1 also shows an example die clip terminal 232 with a substantially flat surface that is flush with the side surface of packaged switch 200. FIGS. 2b-1 and 2b-2 show similar die substrate terminals 230H and 230L, and die clip terminals 232H and 230L, with surfaces that are flush with the top, bottom, and side surfaces of packaged half bridge 250. A die clip terminal may include several recesses that can mate with extensions of an external conductor (e.g., a V− bus bar or clamp, which are more fully described below) to facilitate better electrical connection.

FIGS. 2a-1 and 2a-2 show example die substrate terminal 230 and die clip terminal 232 with substantially flat surfaces that are substantially flush with the surfaces of plastic case 202. FIGS. 2b-1 and 2b-2 show similar die substrate terminals 230, and die clip terminals 232 with substantially flat surfaces that are substantially flush with the surfaces of plastic case 252. It should be understood that die clip and die substrate terminals should not be limited to that shown within FIGS. 2a-1, 2a-2, 2b-1 and 2b-2. In alternative embodiments die clip and die substrate terminals may take different forms, shapes and sizes. Die clips and/or die substrates may be configured to have terminals with surfaces in planes that are substantially above or below parallel planes that contain surfaces of plastic cases 202 or 252.

Current can enter a packaged switch or half bridge via a die substrate terminal and subsequently exit via a die clip terminal, or current can flow through a packaged switch or half bridge in the reverse direction, although current flow in the reverse direction may not be as efficient. To illustrate, current can enter packaged switch 200 via die substrate terminal 230, flow-through a die substrate, an activated switch, a die clip, and then exit the packaged switch 200 via die clip terminal 232. In similar fashion current can enter packaged half bridge 250 via high-side die substrate terminal 230H, flow-through a high-side die substrate, an activated high-side switch, a high-side die clip, and then exit the packaged half bridge 250 via a high-side die clip terminal 232H. And current can enter packaged half bridge 250 via low-side die substrate terminal 230L, flow-through a low-side die substrate, an activated low-side switch, a low-side die clip, and then exit the packaged half bridge 250 via die low-side die clip terminal 232L.

Die substrates and die clips, depending on their configuration (e.g., thickness, terminal width and length, metal type, etc.), can transmit high levels of current to or from their connected switches. For example a copper based die substrate with terminal 230 having a width of 24 mm and a length of 11.2 mm, can transmit 400 A or more of current, and a copper die clip with terminal 232 having a width of 1.6 mm and a length of 11.4 mm can transmit 400 A or more of current.

Switches get hot, especially when they conduct current at high switching speed. A die substrate, depending on its configuration, including its thickness, can conduct large amounts of heat (e.g., 10, 20, 50, 100, 300-750 W or more) out of packaged switch or packaged half bridge via its die substrate terminal. Die substrates can transmit even more heat out of packaged switches or packaged half bridges when their terminals are thermally connected to heat sinks. In one embodiment as noted above, a die clip may have a terminal for conducting current into or out of a packaged switch or packaged half bridge, and a second terminal for conducting heat out of packaged switch or packaged half bridge. The second terminal can transmit even more heat out of a packaged switch or packaged half bridge when the second terminal is thermally connected to a heat sink. In general a connection between a pair of components can be direct (e.g. surfaces of the components contact each other), or a connection between a pair of components can be indirect via an intervening thermally and/or electrical material such as solder, a third metal component, combination of solder and a third metal component, conductive adhesives, sintering material such as silver, thermal grease, wire bond, etc. A connection can conduct heat, current, or both heat and current between components.

Example Packaged Switches

Figures 1, 3A:
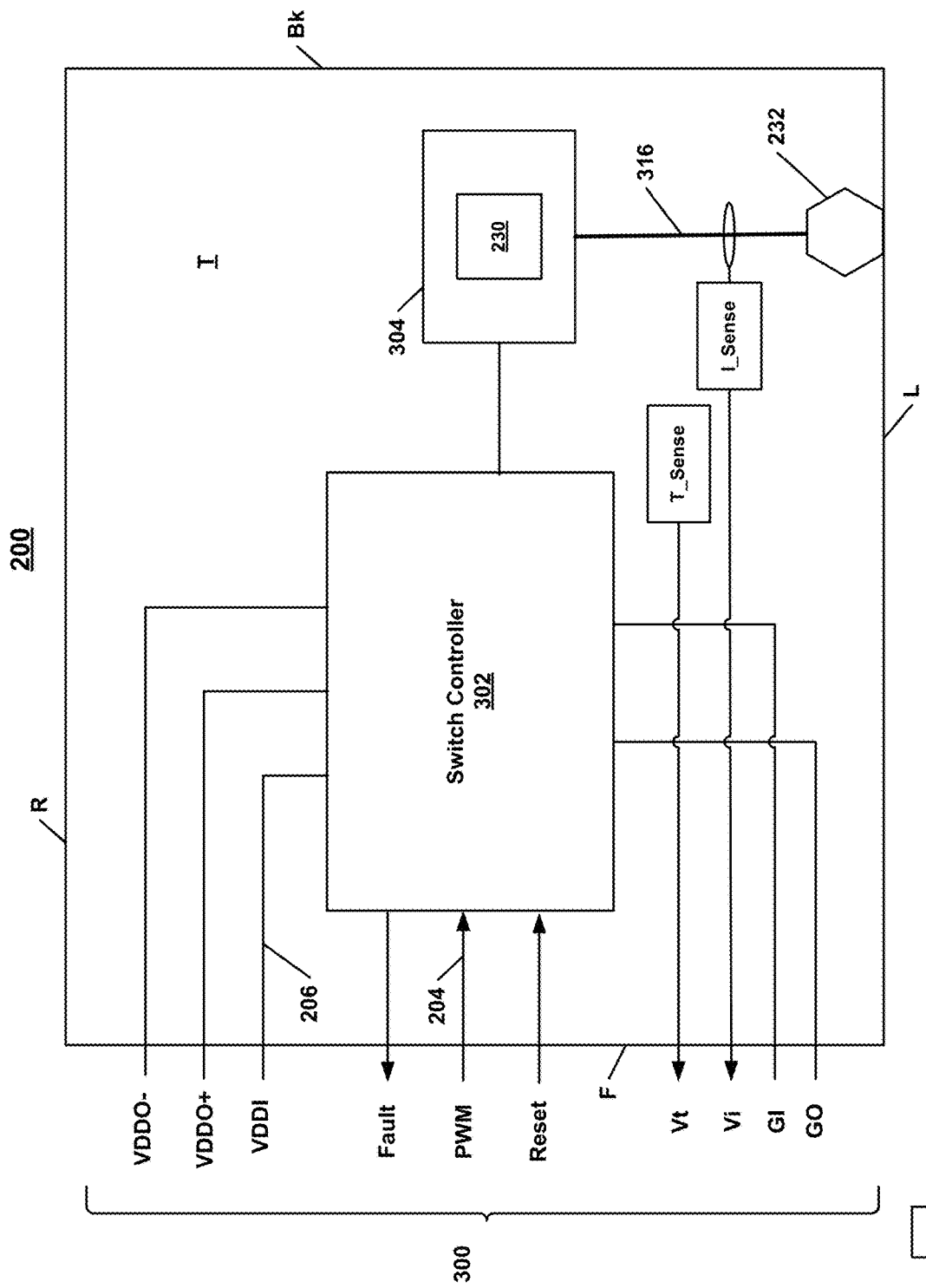
Figures 2, 3A:
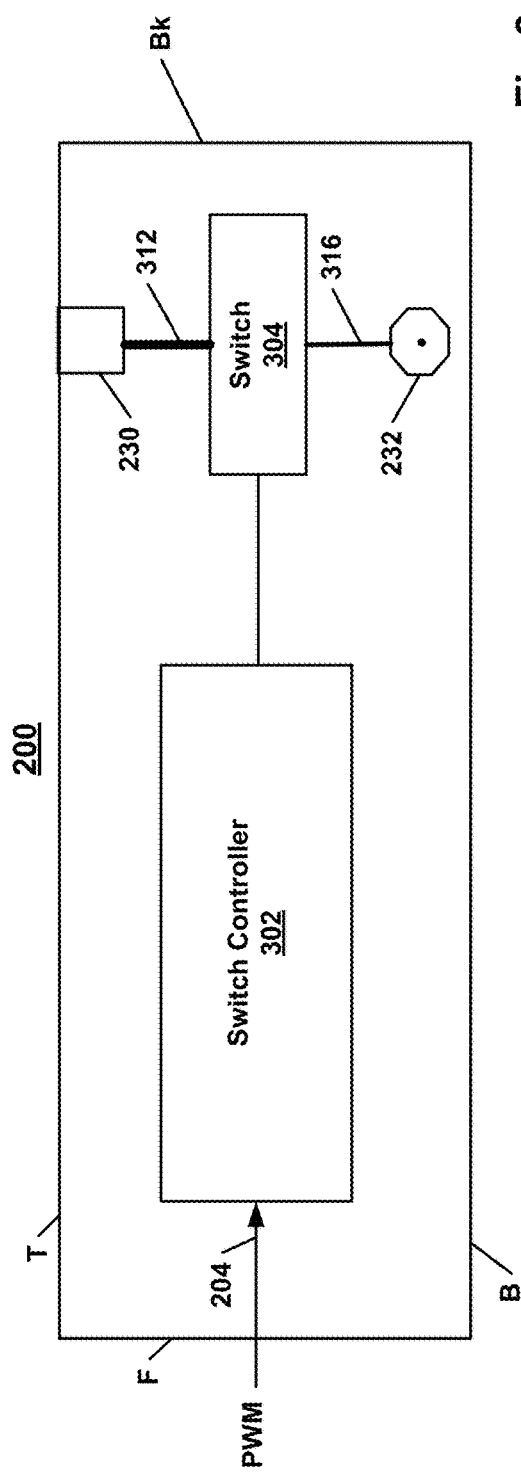

With continuing reference to FIG. 2a-1, FIGS. 3a-1, 3a-2 and 3a-3 are schematic diagrams of example packaged switch 200 that show several relevant components thereof. FIGS. 3a-1, 3a-2 and 3a-3 show relative positions of certain components when packaged switch 200 is viewed from the top, side and back, respectively. Packaged switch 200 contains example switch module 300 as shown in FIG. 3a-1. A packaged half bridge may include a pair of switch modules, such as switch module 300, as will be more fully described below.

Switch module 300 includes a switch controller 302 that controls switch 304 based on a low-power, PWM signal and/or other signals received from a microcontroller or similar processor based device. Switch 304 is connected to and positioned between die substrate 312 and die clip 316, both of which are symbolically represented. Die substrate 312 and die clip 316 conduct large current. Die Substrate 312 is represented by a thicker line in the figures to indicate that it is also configured to conduct relatively more heat out of packaged switch 200 when compared to the amount of heat transferred out by die clip 316. Switch module 300 also includes a temperature sensor circuit T_Sense for sensing temperature near switch 304, and a current sensor circuit I_sense for sensing current transmitted by switch 304. A switch module may contain fewer or more components than that shown in the figures. For example, switch module 300 may also include a voltage sensor circuit that senses the voltage across the current terminals of switch 304.

FIGS. 3a-1, 3a-2 and 3a-3, show relative positioning of components with respect to each other. As seen in FIG. 3a-2 die substrate 312, switch 304, and die clip 316 are vertically stacked between the top T and bottom B. Stacking these components reduces the height, and thus the volume of packaged switch 200. Switch controller 302 is positioned near the front F of packaged switch 200, while switch 304 is positioned near the back Bk of packaged switch 200.

For ease of illustration and explanation, die substrate terminal 230 is symbolically represented as a square in the figures. Depending on the view, die clip terminal 232 is symbolically represented as a hexagon or as an octagon in the figures. For example, in the top and back views of FIGS. 3a-1 and 3a-3, respectively, die clip terminal 232 is symbolically represented as hexagon. In the side view of FIG. 3a-2 die clip terminal 232 is represented as an octagon.

Figures 3, 3A:
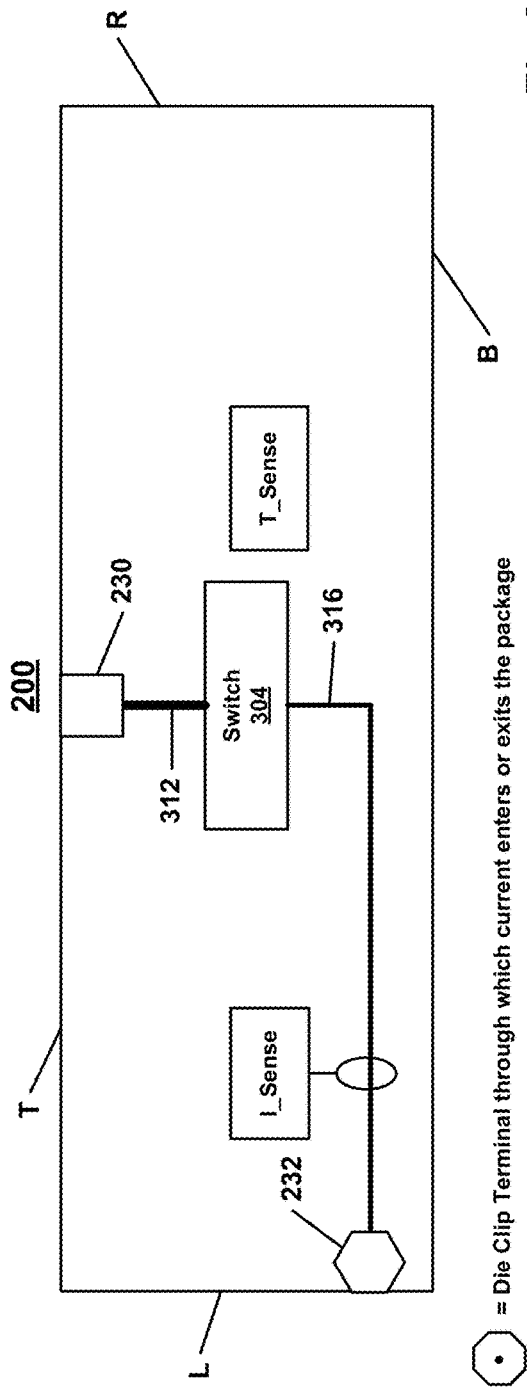

Die substrate terminal 230 is positioned in FIGS. 3a-2 and 3a-3 to indicate that it is flush with the top surface of packaged switch 200, and die clip terminal 232 is positioned in FIGS. 3a-1 and 3a-3 to indicate that it is flush with the left side surface of packaged switch 200. Die clip terminal 232 is drawn with a center dot in FIG. 3a-2 to indicate that current enters or exits packaged switch 200 through its left side. FIGS. 3b-1, 3b-2 and 3b-3 show an alternative packaged switch 201, which is similar to packaged switch 200, but with die clip terminal 232 positioned in FIGS. 3b-1 and 3b-3 to indicate that it is flush with the right side surface. Die clip terminal 232 in FIG. 3b-2 is drawn without a center dot to indicate that current enters or exits from of the right side of packaged switch 201. It is noted that die substrate terminals or die clip terminals may be recessed below or protruding above a packaged switch surface or packaged half bridge surface in other embodiments.

Figures 3, 3A, 4:
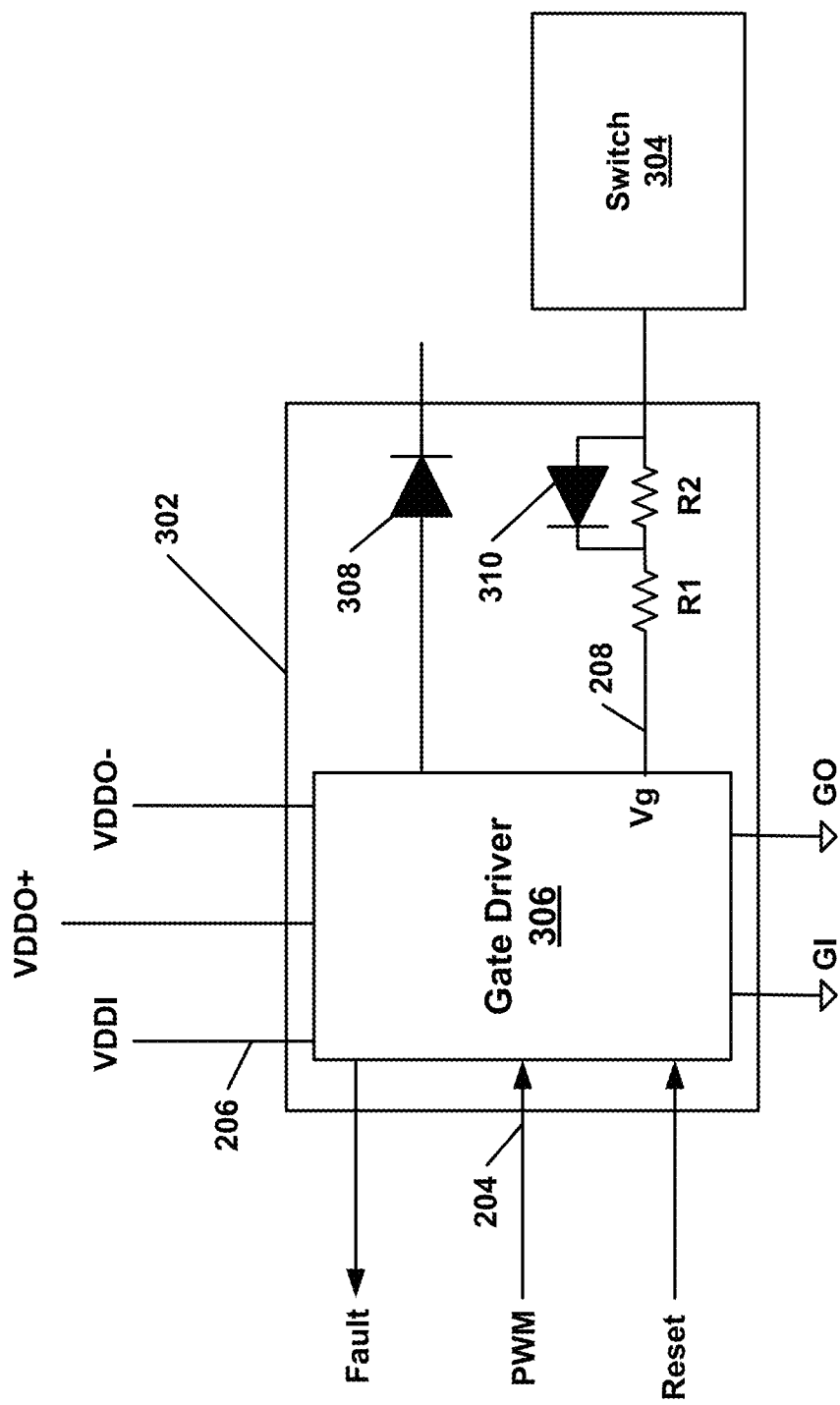

With continuing reference to FIGS. 3a-1, 3a-2 and 3a-3, FIG. 3a-4 is a schematic diagram that shows an example switch controller 302, which includes gate driver 306, resistors R1 and R2, and diodes 308 and 310. A switch controller may contain fewer or more components than that shown in the figure. FIG. 3a-4 shows switch 304, but not die substrate 312 and die clip 316. Although not shown in this figure, the cathode of diode 308 is connected to die substrate 312.

Prior art inverter systems mount gate drivers such as gate drivers H101-H103 and L101-L103 of FIG. 1a on large and expensive printed circuit boards (PCBs). Long conductive traces on these PCBs carry signals between the gate drivers and power transistors (e.g., IGBTs), which are external to the PCBs. Long traces between the gate driver and the transistors increases parasitic induction and/or capacitance, which in turn increases unwanted power consumption and signal delay. Signals transmitted on longer traces are more susceptible to noise. In contrast switch controller 302, which contains gate driver 306, is contained inside a packaged switch or packaged half bridge, and positioned near switch 304. A shorter conductive line (e.g., 5 mm or less) connects a control signal output of gate driver 306 and the gate(s) of switch 304 when compared to prior art inverter systems. The shorter conductive line reduces parasitic induction, signal delay, signal degradation due to noise, and/or other problems associated with gate drivers mounted on the aforementioned PCBs. Gate driver 306 consumes less power while driving the gate. And gate driver 306 can more quickly drive the gate of switch 304.

In general a switch 304 includes one or more transistors such as an IGBT, MOSFET, JFET, BJT, etc. A switch 304 may include additional components such as a diode. The transistors and/or additional components in switch 304 can be made from any one of many different types of semiconductor materials such as Si, SiC, GaN, etc. FIGS. 3a-5 and 3a-6 are schematic diagrams that illustrate example switches 304. In FIG. 3a-5, switch 304 includes a power IGBT connected in parallel with diode D. The collector c and diode cathode are attached (e.g., sintered, soldered, etc.) to die substrate 312, while the emitter e and diode anode are attached (e.g., sintered, soldered, etc.) to die clip 316. In some embodiments, an IGBT may have one emitter, but several emitter terminals. In those embodiments, each of the emitter terminals is attached to die clip 316. In FIG. 3a-6, switch 304 includes power MOSFETS (e.g., SiC MOSFETS, GaN MOSFETS or MOSFETS made with other semiconductor material) N1 and N2 coupled in parallel. The drains d of MOSFETs N1 and N2 are attached (e.g., sintered, soldered, etc.) to die substrate 312, while the sources s are attached (e.g., sintered, soldered, etc.) to die clip 316. Each gate g is controlled by a high-current, gate control signal Vg from driver 306. Switches other than switch 304 shown in the figures can be used in alternative embodiments.

With continuing reference to FIGS. 3a-1 and 3a-4, components are connected to signal leads (e.g., 204-208), which are symbolically shown. Signal leads connect components internal to the switch module (e.g., gate driver 306 and resistor R1). Signal leads also connect components internal to the switch module (e.g., gate driver 306) and components external to the switch module (e.g., a microcontroller, a voltage regulator, etc.). Several signal leads are not shown in FIGS. 3*a*-1 and 3*a*-4 for ease of illustration. Some components of a switch module may be connected to signal leads through additional wires. For example, wire bonding or other type of connection method may be used to connect a gate g of switch 304 to a signal lead, which in turn is connected to resistor R2.

Some switch module components may take form in packaged devices or bare semiconductor dies that can be purchased from original equipment manufacturers. The packaged devices have leads that are connected (e.g., soldered) to signal leads. Bare semiconductor dies have pads that can be wire bonded to signal leads. Unless otherwise noted, the switch module components are presumed to take form in packaged devices with leads that can be connected (e.g., soldered) to respective signal leads. For example gate driver 306 may take form in a packaged integrated circuit with leads that are soldered to signal leads such as signal leads 204 and 206. Leads of a packaged I_Sense or I_Temp circuit may be connected to signal leads via a flexible flat cable (FFC, such as a flex PCB, not shown). FFC refers to any variety of electrical cable that is both flat and flexible, with flat conductors or traces formed on a substrate. Resistors R1 and R2, and diodes 308 and 310 can be packaged components with leads that are connected to signal leads.

Signal leads (e.g., signal leads 204-208) can be constructed from a metal structure called a "signal frame substrate," which will be more fully described below. Signal leads can be made using alternative methods. For example, liquid crystal polymer can be injected into a mold to create a rigid substrate. Conductive traces can then be patterned on the substrate to form the signal leads. However, for purposes of explanation, the remaining disclosure will presume construction of signal leads from a signal frame substrate. In general a signal frame substrate is similar to a "lead frame," which is a thin metal frame to which devices are attached during semiconductor package assembly. While in the signal frame substrate, the signal leads are not electrically isolated from each other. After conductive leads of a packaged gate driver 306 (or bare semiconductor die gate driver 306), diode 308 and other components are attached to a signal frame substrate, it is encapsulated in plastic. The plastic and the signal frame substrate can be trimmed to produce, for example, packaged switch 200 or packaged half bridge 250 shown in FIGS. 2*a*-1, 2*a*-2, 2*b*-1, and 2*b*-2. More specifically portions of the signal frame substrate and plastic are trimmed after molding to yield plastic cases (e.g., cases 202 and 252) and signal leads (e.g., 204 and 206). After trimming the signal leads are isolated from each other, but held firmly in place by the plastic case. Importantly, the signal frame substrate can be designed to accommodate many different combinations, types, shapes, arrangement, etc., of components of a switch module.

With continuing reference to FIGS. 3*a*-5 and 3*a*-6, switches 304 are electrically and thermally connected to die substrates. In one embodiment a first current terminal (e.g., collector, drain, etc.) of each transistor in switch 304 is sintered to die substrate 312 via a layer of highly conductive sintering material such as silver. No dielectric exists between switch 304 and die substrate 312. Die substrate terminals are configured for direct or indirect connection to external devices. For example die substrate terminal 230 can be connected to a "V+ bus bar," which in turn is connected to a V+ battery terminal. In general a bus bar is a metal element that is used for high current distribution. The material composition and cross-sectional size of a bus bar, or elements thereof, determine the maximum amount of current that can be safely carried. A V+ bus bar may also act as a heat sink with one or more channels through which a fluid (e.g., air or a liquid such as a mixture of water and ethylene glycol) can flow. Or the die substrate terminal 230 can be connected to a "phase bus bar," which in turn is connected to a terminal of a winding W. A phase bus bar (hereinafter phase bar) may include a metal clamp that engages the die substrate terminal. A power cable can connect the metal clamp to a winding terminal. One end of the power cable is connected to the clamp, while the other end is connected to a winding terminal.

In FIG. 2*a*-1, die substrate terminal 230 has a flat surface that is exposed through an opening in the plastic case of packaged switch 200. Packaged half bridge 250 of FIGS. 2*b*-1 and 2*b*-2 have similar die substrate terminals 230L and 230H. The dimensions (e.g., width and length) of the exposed terminal 230 are configured to transmit substantial current and heat. In one embodiment, die substrate terminal 230 is parallel to, but oppositely facing (i.e., 180 degrees) at least one surface of die substrate 312 to which a first current terminal (e.g., collector, drain, etc.) is attached.

Switches 304 are electrically and thermally connected to die clips. For example a second current terminal (e.g., emitter, source, etc.) of each transistor in switch 304 is sintered to die clip 316 via a layer of highly conductive sintering material such as silver. No dielectric exists between switch 304 and die clip 232. Die clip terminals are configured for making direct or indirect connection to a device external to the packaged switch or packaged half bridge. Die clip terminal 232 can be connected to the clamp mentioned above, which in turn is connected to a terminal of a winding via a power cable. Or die clip terminal 232 can be connected to a "V− bus bar," which in turn is connected to a V− battery terminal. In some embodiments, the V− bus bar may also act as a heat sink with one or more channels through which a fluid, such as air, can flow.

With continuing reference to FIG. 2*a*-1, die clip terminal 232 has a substantially flat surface area that is exposed through an opening in the plastic case of packaged switch 200. Packaged half bridge 250 of FIGS. 2*b*-1 and 2*b*-2 have similar die clip terminals 232L and 232H. The dimensions (e.g., width and length) of the exposed terminal 232 are configured to transmit substantial current.

Gate drivers of a switch module can receive signals from a microcontroller, respective microcontrollers, or similar processor based device(s). For example gate driver circuit 306 of FIG. 3*a*-4 can receive a low-power PWM driver control signal similar to one of the PWM signals described with reference to FIG. 1*a*. In addition, gate driver 306 may receive a low-power Reset signal from the microcontroller or other device. Gate driver circuit 306 can selectively activate switch 304 in response to the assertion of the PWM signal it receives by asserting high-current, gate control signal Vg, after it receives an asserted Reset signal. The distance between the output of gate driver 306 and the gate or gates of switch 304 should be reduced in order to mitigate adverse effects on gate control signal Vg due to parasitic inductance, parasitic capacitance, noise, etc. Gate drivers can also transmit signals to a microcontroller or similar processor based device. For example gate driver circuit 306 can disable switch 304 (i.e., maintain the switch in a deactivated state) and assert the Fault signal when a fault, such as excessive current conduction through switch 304, is detected. A microcontroller or similar processor device can receive and process the Fault signal. The other components such as the I_sense circuit and the Temp_sense circuit can transmit signals representative of current flow through and temperature of switch 304. If included, a voltage sense circuit can likewise transmit a signal representative of the voltage across the switch 304. The microcontroller or similar processor device can receive process the signals provided by the other components.

FIG. 3a-7 illustrates an example gate driver 306, which includes low-voltage, input stage 320 in data communication with high-voltage, output stage 320 via galvanic isolation circuit 324. Galvanic isolation is used where two or more circuits must communicate, but their grounds are at different potentials. Galvanic isolation circuits may employ a transformer, capacitor, optical coupler, or other device to achieve isolation between circuits. For purposes of explanation only, galvanic isolation circuit 324 employs a transformer device to implement galvanic isolation. The low-voltage, input stage 322 is coupled to receive a first supply voltage VDDI and a first ground GI, and includes a logic circuit 330 that receives the PWM and Reset signals. The high-voltage, output stage 322 is coupled to receive a second supply voltage VDDO+, a third supply voltage VDDO− and second ground GO, and includes a logic circuit 332 that receives a control signal from logic circuit 330 via galvanic isolation circuit 324. High-voltage output stage 332 also includes a buffer 340 that is controlled by an output signal from logic circuit 332. Buffer asserts Vg when the control signal output of isolation circuit 324 is asserted. Other types of gate drivers 306 are contemplated.

With continuing reference to FIG. 3a-1, I_sense generates a voltage signal Vi with a magnitude that is proportional to current flow through switch 304. I_sense may include an inductive current sensor that measures a magnetic field created by the current flow through switch 304 in general and through the die clip in particular. As shown in FIG. 3a-3, example die clip 316 includes horizontal and vertical portions. The I_sense circuit can measure current flow through a narrowed portion (not shown) of the horizontal portion. I_sense conditions the signal output of the inductive current sensor for subsequent use by a microcontroller. The inductive sensor is galvanically isolated from transistor T.

T_sense may include a thermistor that can generate a voltage signal Vt with a magnitude that is proportional to the temperature near switch 304. A thermistor is a type of resistor whose resistance is dependent on temperature; the relationship between resistance and temperature is linear. T_sense conditions the signal output of thermistor for use by a microcontroller. The thermistor is galvanically isolated from transistor T.

Analog signals Vi and Vt from the I_sense and T_sense circuits, respectively, can be transmitted to a microcontroller for subsequent conversion into digital equivalents. Conductors such as traces in a flexible flat cabling (e.g., flex PCB, not shown) can be used to transmit signals, including Vi, Vt and Fault, between respective signal lead terminals of switch module 300 and the microcontroller via traces of a PCB (not shown). Other type of conductors can used to transmit signals to the microcontroller. Unless otherwise noted, this disclosure presumes use of a flexible flat cable such as a flex PCB. The flexible flat cabling can also be used to transmit other signals (e.g., PWM and Reset) and voltages (e.g., VDDI, VDDO+, GL, etc.) to switch module 300. The microcontroller can process the digital equivalents of signals (e.g., Fault, Vi and Vt) it receives in accordance with instructions stored in memory. The microcontroller can adjust the duty cycle and/or period of driver control signals PWM based on the digital equivalents of Vi and Vt. In embodiments of packaged power modules that contain a circuit for monitoring voltage across the switch, an analog signal Vv representing the voltage can be provided by the voltage monitoring circuit to the microcontroller for processing in accordance with instructions stored in memory.

FIGS. 3c-1 and 3c-2 are schematic diagrams of an alternative packaged switch 203 that show several components thereof. FIGS. 3c-1 and 3c-2 show relative positions of components of packaged switch 203 when it is seen from the side and back, respectively. Like packaged switch 200, packaged switch 203 includes a switch 304 that is controlled by switch controller 302. Switch 304 is connected (e.g., sintered) to and between die substrate 312 and die clip 342, which includes a die clip terminal 344. Die clip 342 and die clip terminal 344 are shown symbolically. Both die substrate 312 and die clip 342 are represented by thick lines to indicate they are configured to transmit substantial current and heat. The shape and form of die clip 342 and its terminal 344 is substantially different from die clip 316 and its terminal 232. Die substrate 312 and die clip 342 can be substantially identical, with substantially identical die substrate and die clip terminals 230 and 344, respectively.

FIGS. 3c-1 and 3c-2 illustrate relative positioning of components with respect to each other. Die substrate 312, switch 304, and die clip 342 are vertically stacked between the top T and bottom B of packaged switch 203. Switch controller 302 is positioned near the front F of packaged switch 203, while switch 304 is positioned near the back Bk. Die substrate terminal 230 is positioned in the figures to indicate that it is flush with the top surface of packaged switch 205, and die clip terminal 344 is likewise positioned to indicate that it is flush with the bottom surface.

FIGS. 3d-1 and 3d-2 are schematic diagrams of an alternative packaged switch 205 that show several components thereof. FIGS. 3d-1 and 3d-2 show relative positions of components of packaged switch 205 when it is seen from the side and back, respectively. Like packaged switch 200, packaged switch 205 includes a switch 304 that is controlled by switch controller 302. Switch 304 is connected (e.g., sintered) to and between die substrate 312 and die clip 346, which includes a die clip terminal 232. Die clip 346 is similar to die clip 316 of packaged switch 200, but with die clip terminal 232 flush with the back surface. Die clip 346 is shown symbolically. Die clip 346 is represented by a thin line to indicate that it is primarily configured to transmit current and not heat. Die clips 316 and 346 are substantially different in shape and form, but have similar terminals 232.

FIGS. 3d-1 and 3d-2 illustrate relative positioning of components with respect to each other. Die substrate 312, switch 304, and die clip 346 are vertically stacked between the top T and bottom B of packaged switch 205. Switch controller 302 is positioned near the front F of packaged switch 205, while switch 304 is positioned near the back Bk. Die substrate terminal 230 is positioned in the figures to indicate that it is flush with the top surface of packaged switch 203, and die clip terminal 324 is positioned in FIG. 3d-1 to indicate that it is flush with the back surface.

Figures 3, 3A, 4, 5, 6:
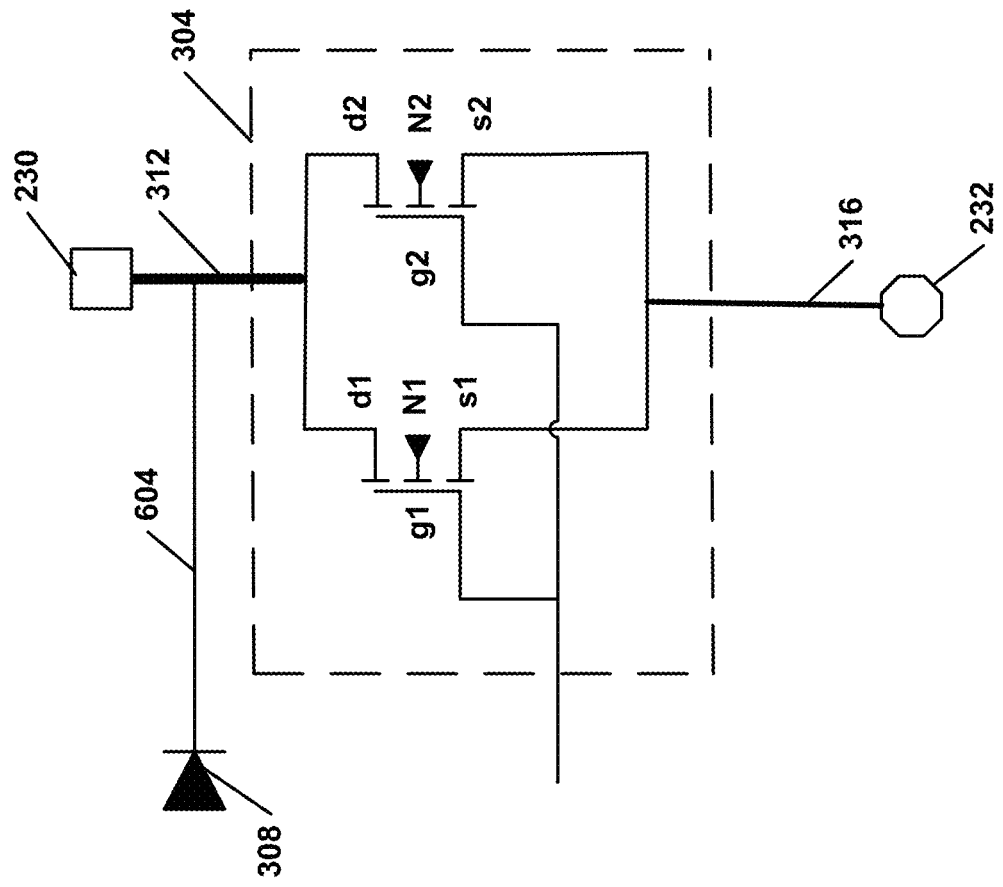
Figures 3, 3A, 4, 5:
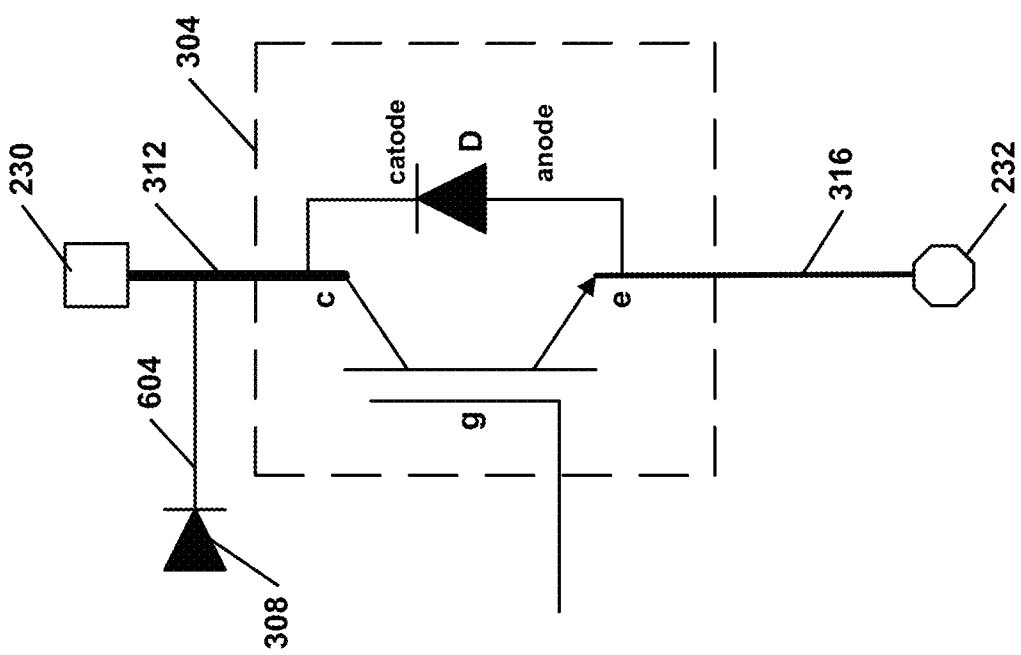
Figures 3, 3A, 4, 5, 6, 7:
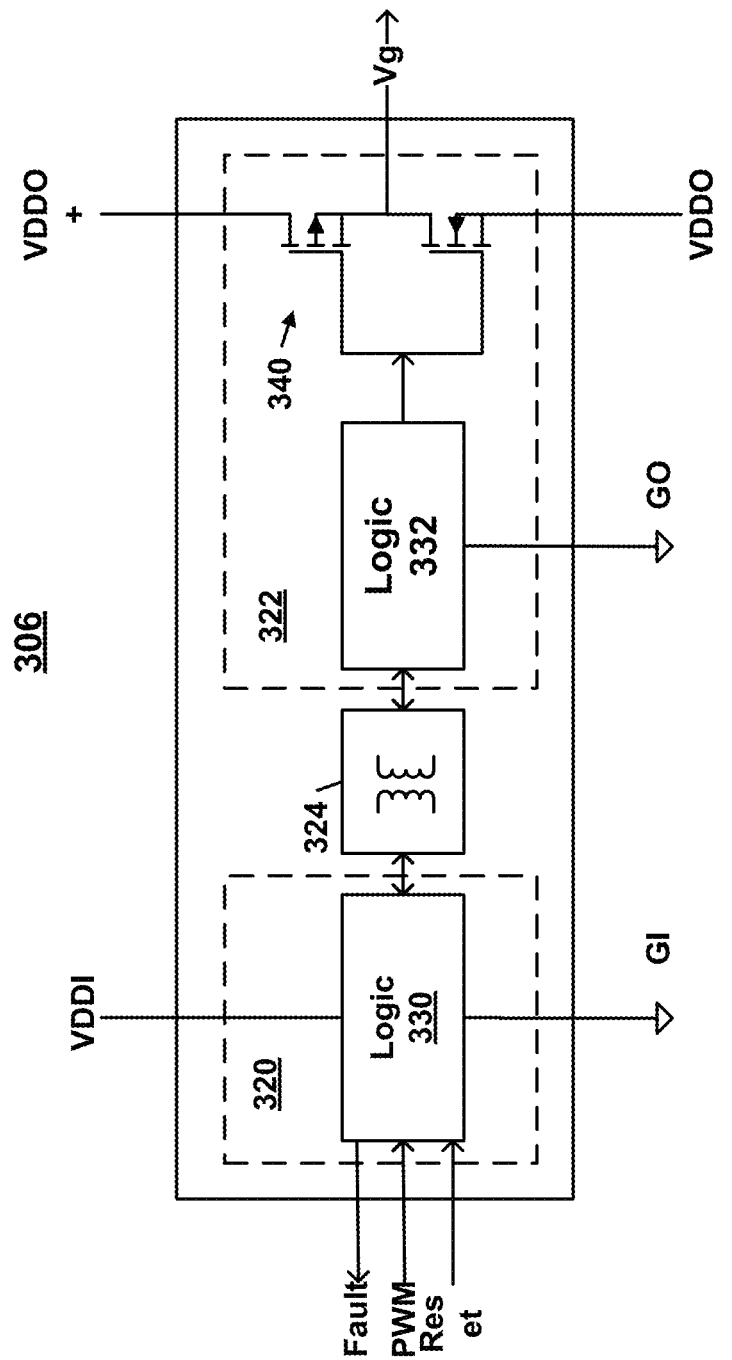
Figures 1, 3B:
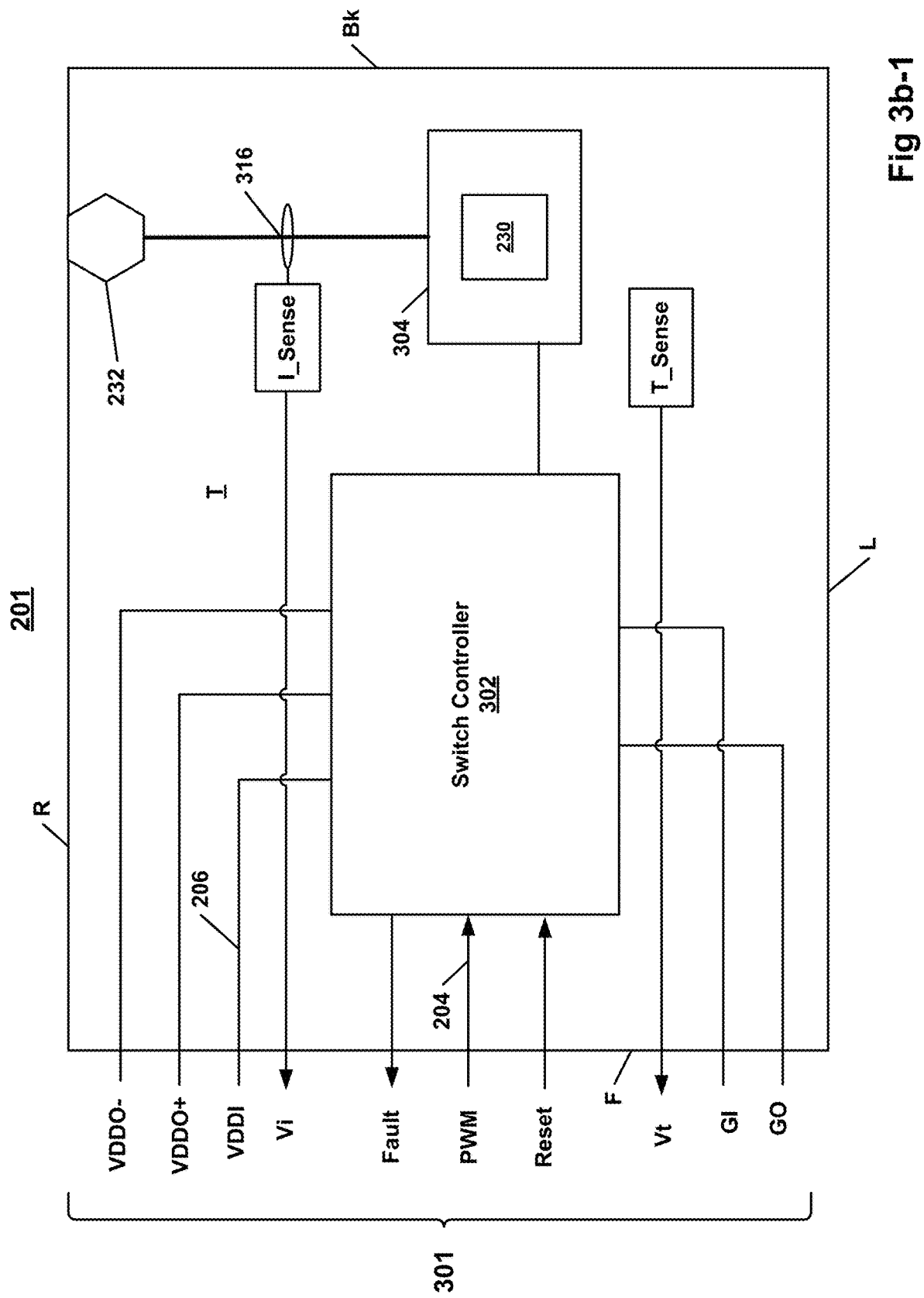
Figures 2, 3B:
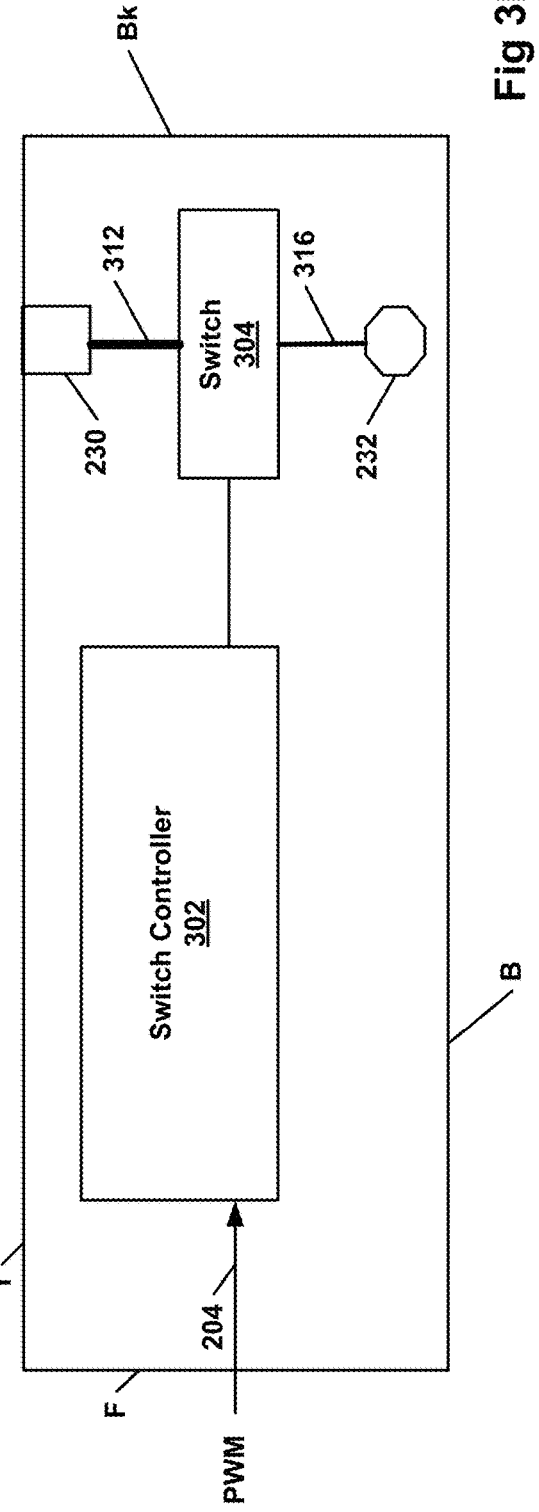
Figures 3, 3B:
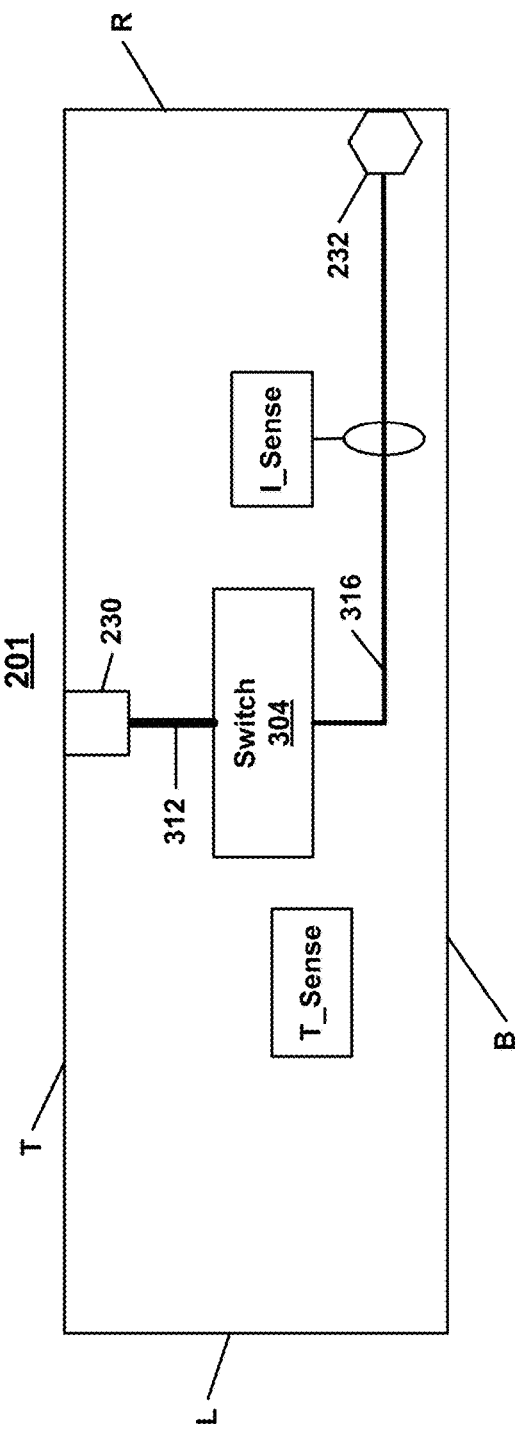
Figures 1, 3E:
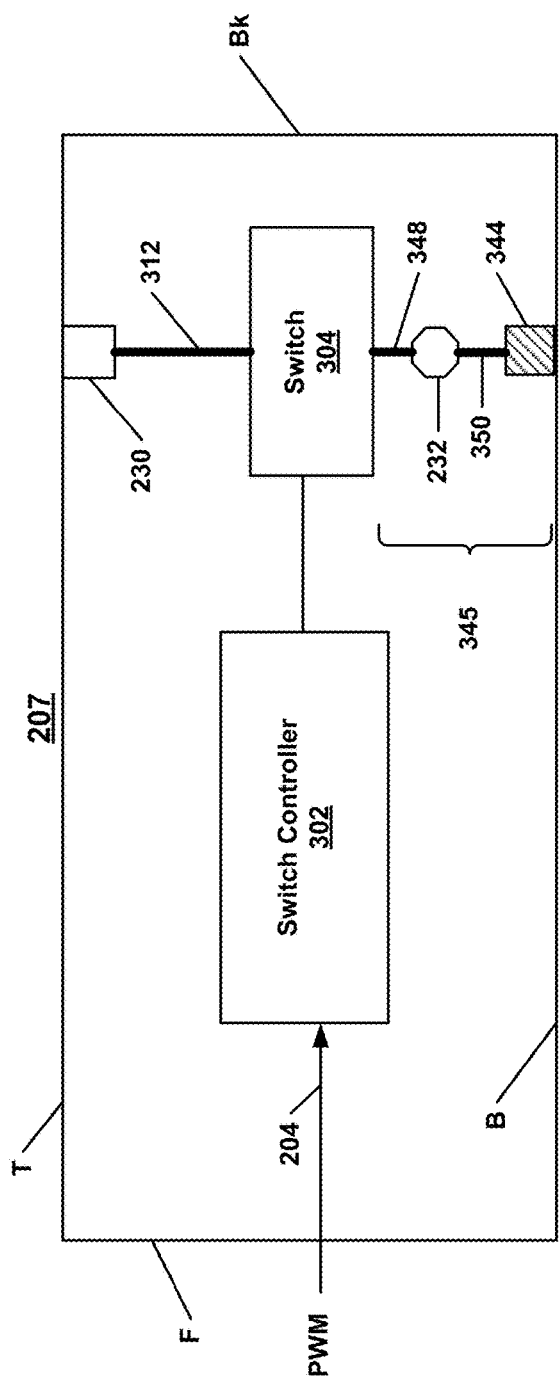
Figures 2, 3E:
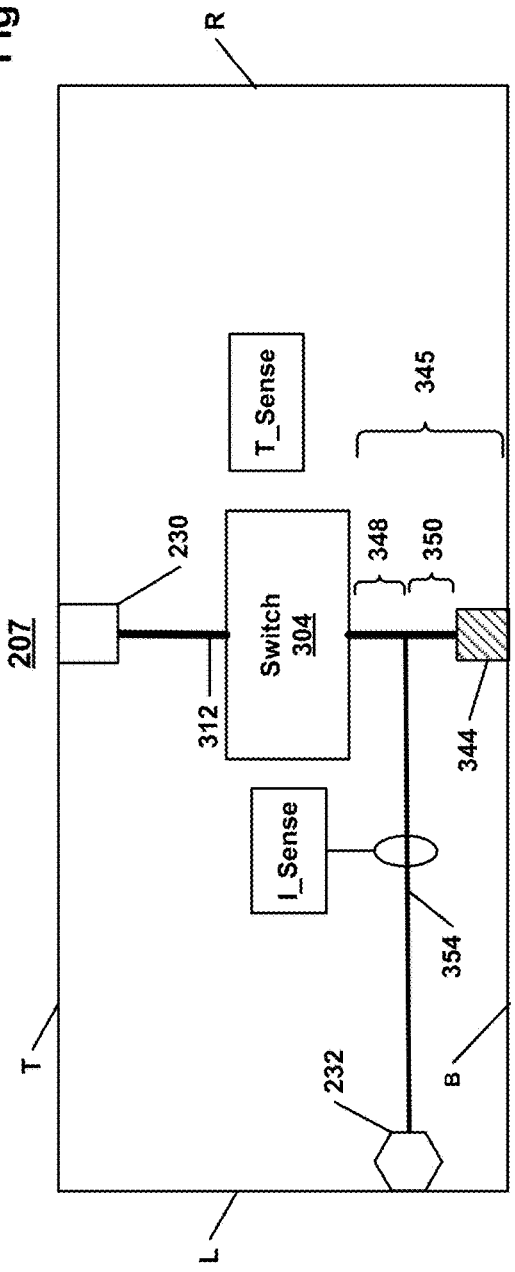

FIGS. 3e-1 and 3e-2 are schematic diagrams of an alternative packaged switch 207 that show several components thereof. FIGS. 3e-1 and 3e-2 show relative positions of components of packaged switch 205 when it is seen from the side and back, respectively. Like packaged switch 200, packaged switch 207 includes a switch 304 that is controlled by switch controller 302. Switch 304 is connected (e.g., sintered) between die substrate 312 and die clip 345, which includes a pair of die clip terminals 232 and 344. Die clip 345 and its terminals 232 and 344 are shown symbolically. Die clip 345 includes first and second portions 348 and 350, and a third portion 354 that extends perpendicularly from the first and second portions as shown. The third portion 354 is drawn thinner to indicate it is configured primarily to transmit current, while first and second portions 348 and 350 are drawn thicker line to indicate they are also configured to transmit heat. However, second portion 350 will conduct only heat if it is connected to an electrically isolated device like an electrically isolated heat sink. FIG. 3e-2 shows a current sensor circuit I_sense for sensing current transmitted through third portion 354.

FIGS. 3e-1 and 3e-2 illustrate relative positioning of components with respect to each other. Die substrate 312, switch 304, and die clip 345 are vertically stacked between the top T and bottom B of packaged switch 207. Switch controller 302 is positioned near the front F of packaged switch 207. Switch 304 is positioned near the back Bk. Die substrate terminal 230 is positioned in the figures to indicate that it is flush with the top surface of packaged switch 207, die clip terminal 232 is positioned in FIG. 3e-2 to indicate that it is flush with the left side surface, and die clip terminal 344 is positioned in the figures to indicate that it is flush with the bottom surface.

Figures 1, 3F:
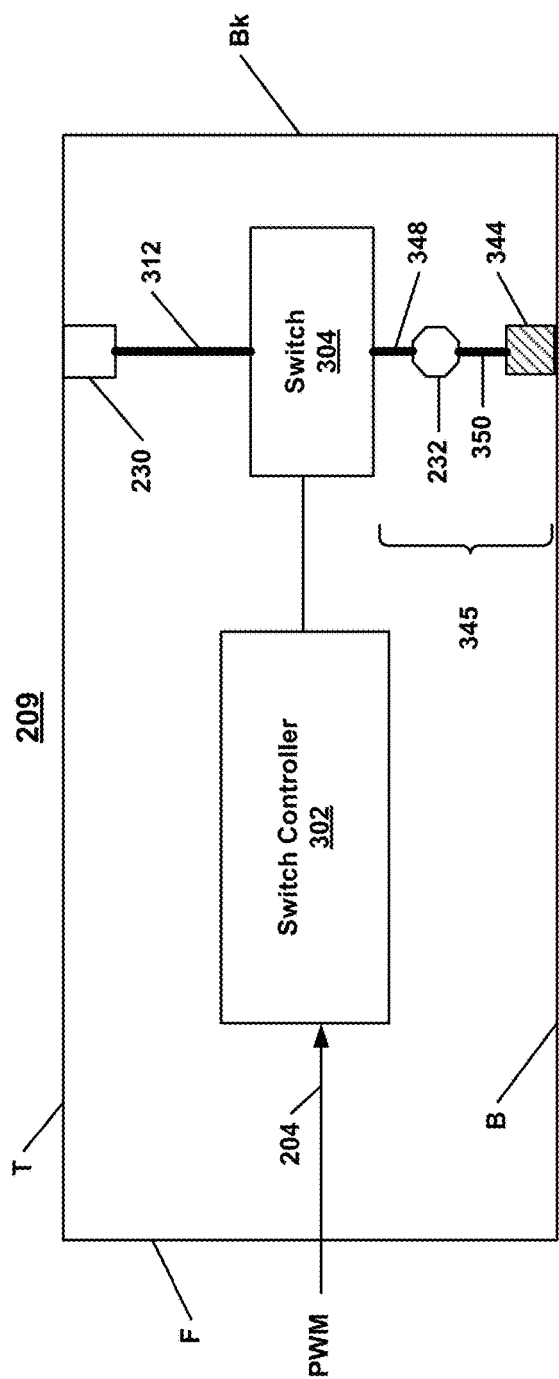
Figures 2, 3F:
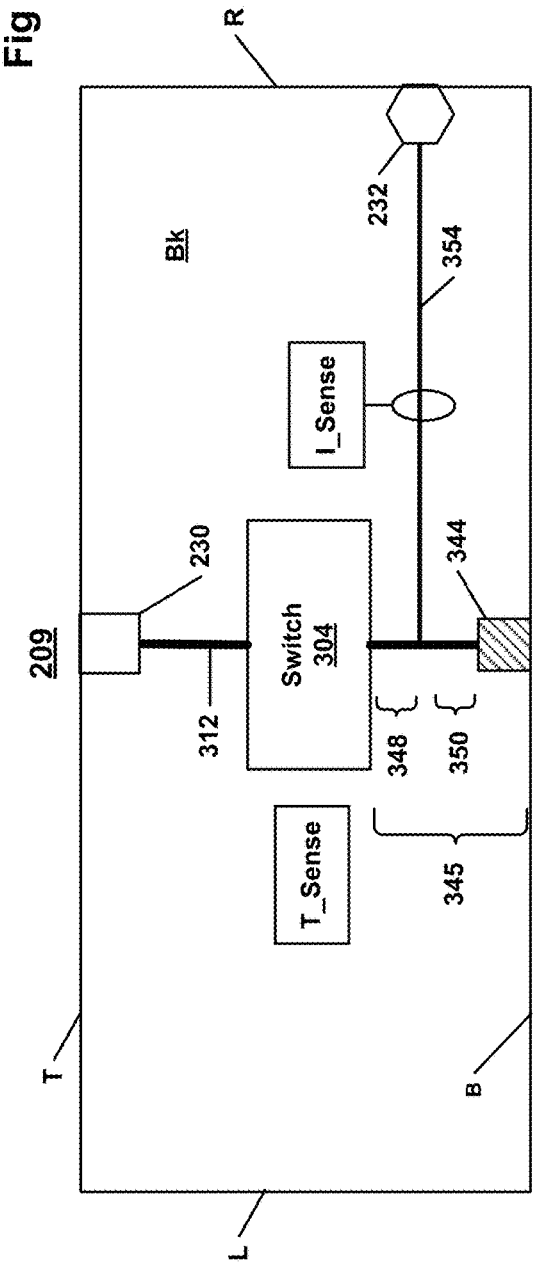

FIGS. 3f-1 and 3f-2 are schematic diagrams of an alternative packaged switch 209 that show several components thereof. FIGS. 3f-1 and 3f-2 show relative positions of components of packaged switch 209 when it is seen from the side and back, respectively. Packaged switches 207 and 209 are substantially identical to each other. However, die clip terminal 232 in packaged switch 207 is positioned to indicate it is flush with the left side surface, while die clip terminal 232 in packaged switch 209 is positioned to indicate that it is flush with the right side surface as shown in FIG. 3f-2.

Example Packaged Half Bridges

Figures 2, 3G:
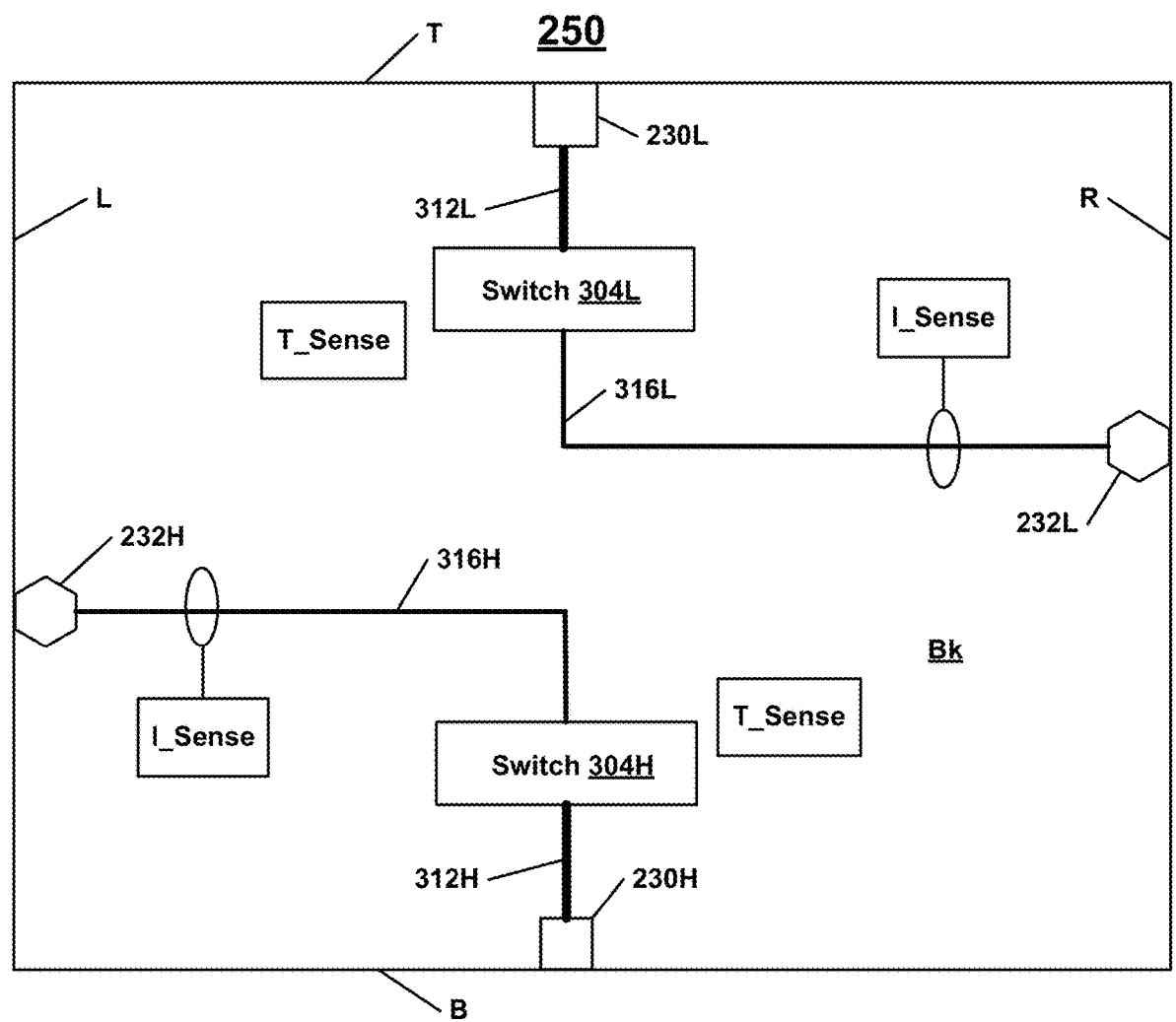

Packaged half bridges may include a pair of switch modules. With continuing reference to FIGS. 2b-1, 2b-2, FIGS. 3g-1 and 3g-2 are schematic diagrams of example packaged half bridge 250 that show several components thereof. FIGS. 3g-1 and 3g-2 show relative positions of certain components of packaged half bridge 250 when seen from the side and back, respectively. Packaged half bridge 250 contains a pair of switch modules 300 like that shown in FIG. 3a-1. More particularly packaged half bridge 250 includes high-side switch module 300H and low-side switch module 300L. The switch modules are facing each other inside packaged half bridge 250; high-side switch module 300H is flipped, and positioned below low-side switch module 300L. For ease of illustration, most signal leads shown in FIG. 3a-1 are omitted from FIGS. 3g-1 and 3g-2.

FIGS. 3g-1 and 3g-2 illustrate relative positioning of certain components of half bridge 250 with respect to each other. Die substrates 312, switches 304, and die clips 316 are stacked between the top T and bottom B. Switch controllers 302 are likewise stacked between the top T and bottom B. Switch controllers 302 are positioned near the front F of packaged half bridge 250, while switches 304 are positioned near the back Bk. Die substrate terminals 230L and 230H are accessible through the plastic case on the top T and bottom B, respectively, of packaged half bridge 250, and die clip terminals 232L and 232H are accessible through the plastic case on right and left side surfaces, respectively, of packaged half bridge 250. Die substrate terminals 230L and 230H are positioned in the figures to indicate they are flush with the top T and bottom B surfaces, respectively, and die clip terminals 232L and 232H are positioned in the FIG. 3g-2 to indicate they are flush with the right and left side surfaces, respectively.

High-side switch 304H is connected to high-side die substrate 312H, which has terminal 230H for making a connection to a device external to packaged half bridge 250. For example, terminal 230H can be connected to a V+ bus bar, or terminal 230H may be connected to a phase bar or a component (e.g., clamp) thereof. High-side switch 304H is also connected to high-side die clip 316H, which has terminal 232H for making a connection to a device external to packaged half bridge 250. For example terminal 232H can be connected to the phase bar, or a V− bus bar. Low-side switch 304L is connected to low-side die substrate 312L, which has terminal 230L for making a connection to a device external to packaged half bridge 250. For example, the low-side die substrate terminal 230L can be connected to the same phase bar to which high-side die clip terminal 232H is connected, or low-side die substrate terminal 230L can be connected to a heat sink. Low-side switch 304L is connected to die clip 316L, which has terminal 232L for making a connection to a device external to the packaged half bridge 250. For example terminal 232L can be connected to a V− bus bar or to a phase bus bar.

Figures 1, 3H:
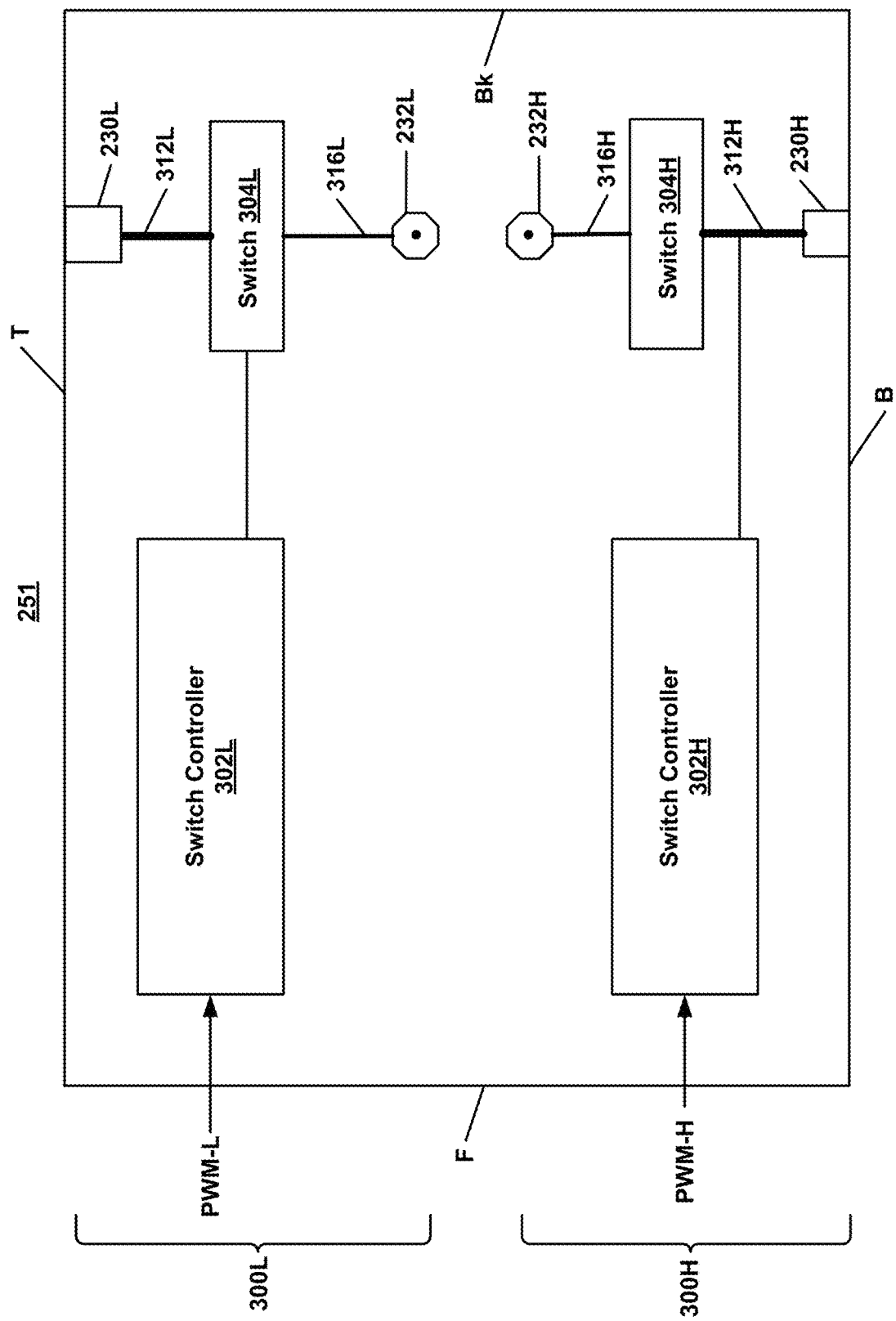
Figures 2, 3H:
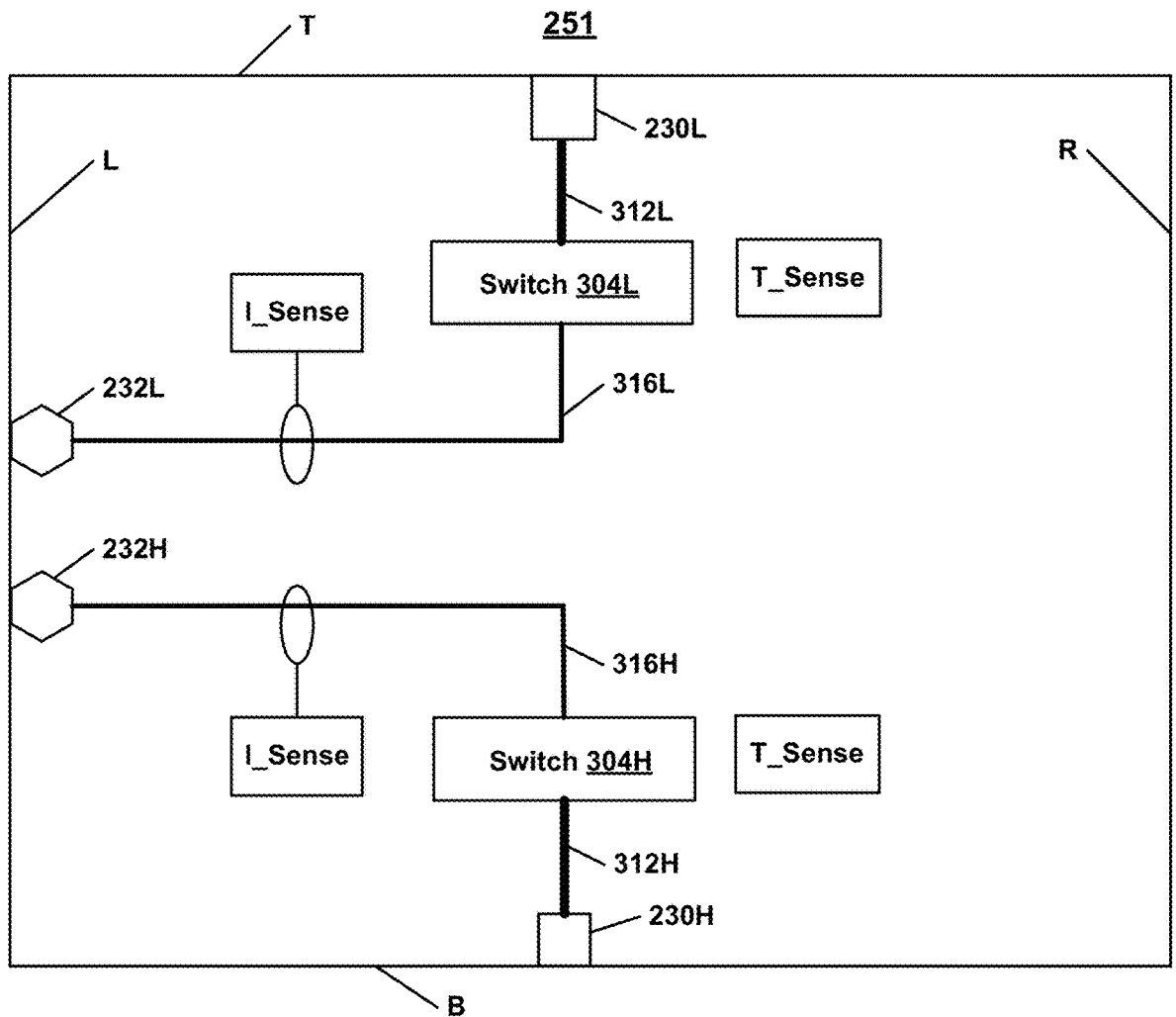

FIGS. 3h-1 and 3h-2 are schematic diagrams of an alternative packaged half bridge 251 that show several components thereof. Half bridge 251 is similar to packaged half bridge 250, but with die clip 316L rotated 180 degrees as shown. FIGS. 3h-1 and 3h-2 show relative positions of certain components of packaged half bridge 251 when seen from the side and back, respectively. Die clip 316 may be slightly modified to accommodate the 180 degree rotation. FIG. 3h-2 shows low-side die clip terminal 232L and high side die clip terminal 232H positioned to indicate they are flush with the left side surface.

Figures 2, 3I:
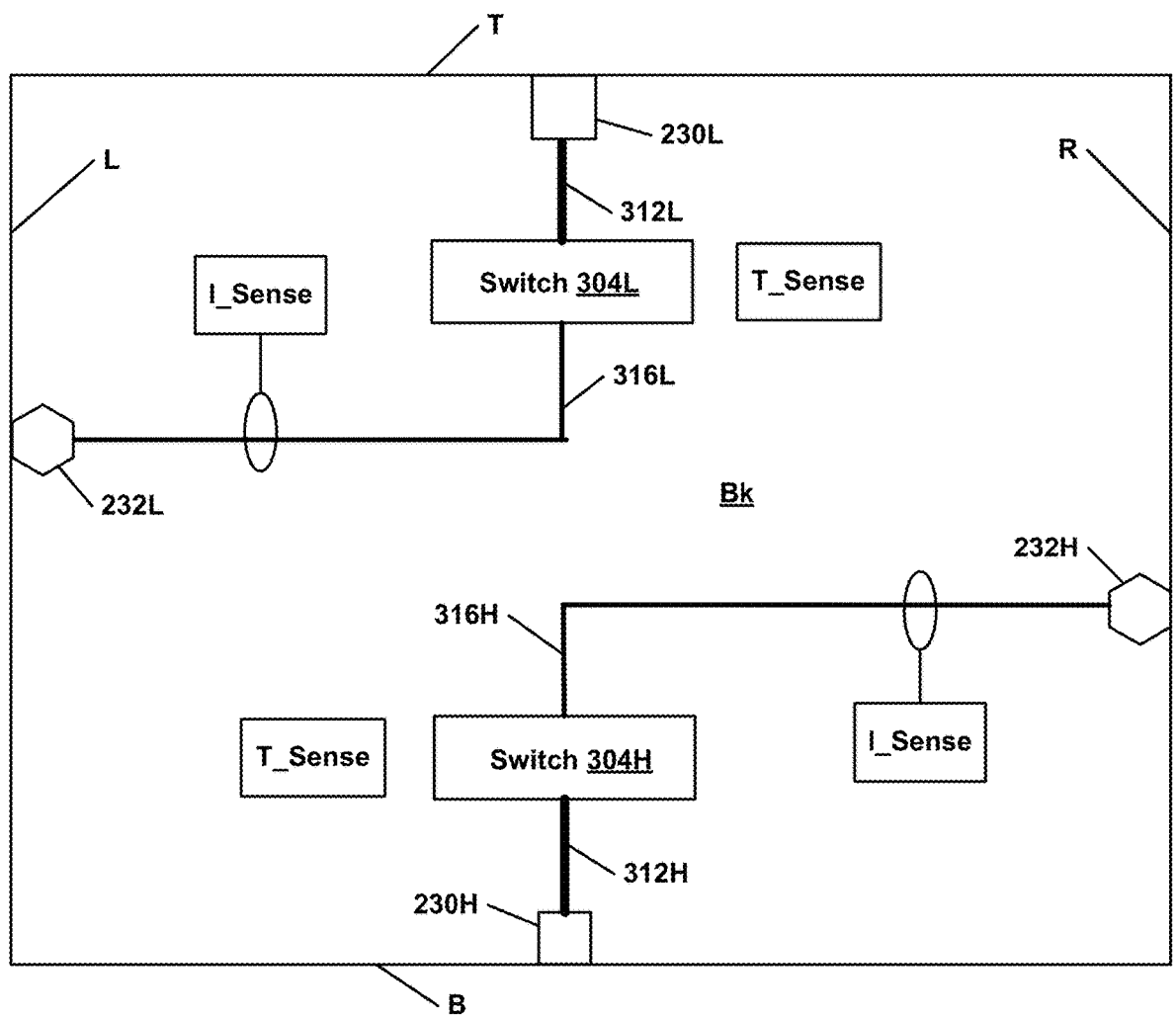

FIGS. 3i-1 and 3i-2 are schematic diagrams of yet alternative packaged half bridge 253 that show several components thereof. FIGS. 3i-1 and 3i-2 show relative positions of components of packaged half bridge 253 when seen from the side and back, respectively. Packaged half bridge 253 is similar to packaged half bridge 250, but with both die clip terminals 316 rotated 180 degrees as shown. FIG. 3i-2 shows low-side die clip terminal 232L positioned to indicate that it is flush with the right side surface, and high-side die clip terminal 232H positioned to indicate that it is flush with the left side surface.

Figure 3J:
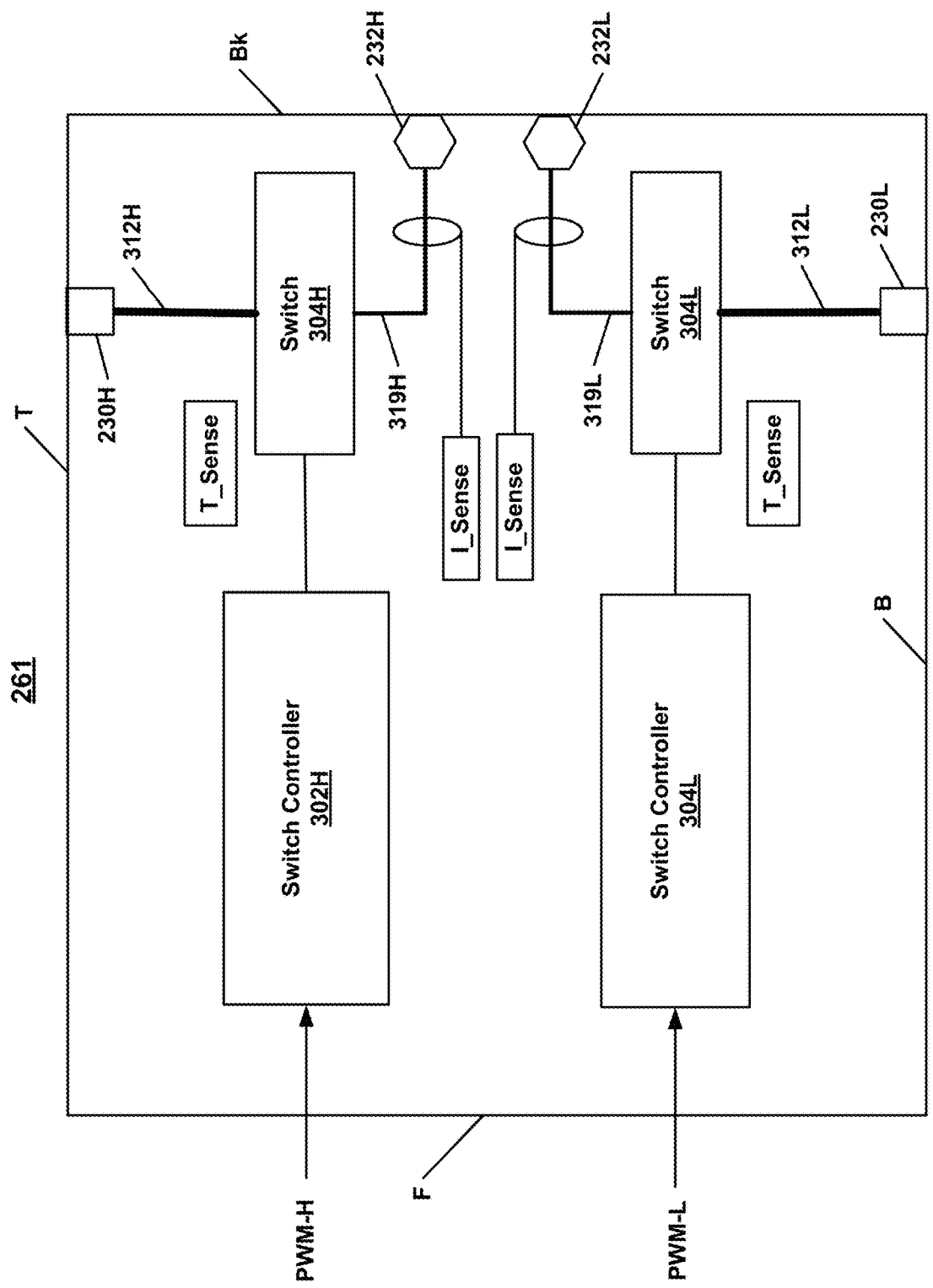
FIG. 3*j* is a schematic diagram that shows relevant components of another example packaged half bridge when viewed from the side.
Figures 2, 3K:
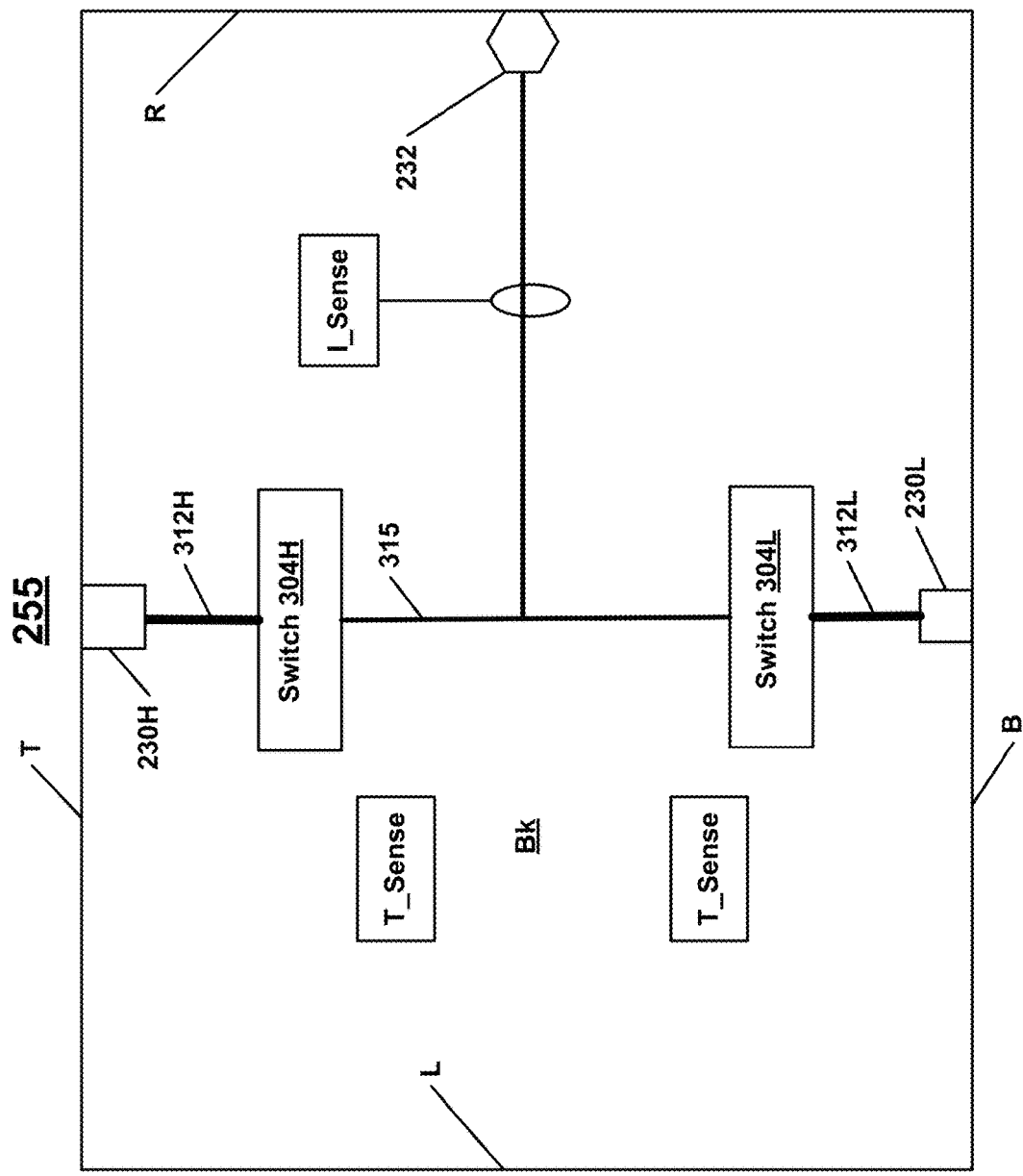
Figures 1, 3I:
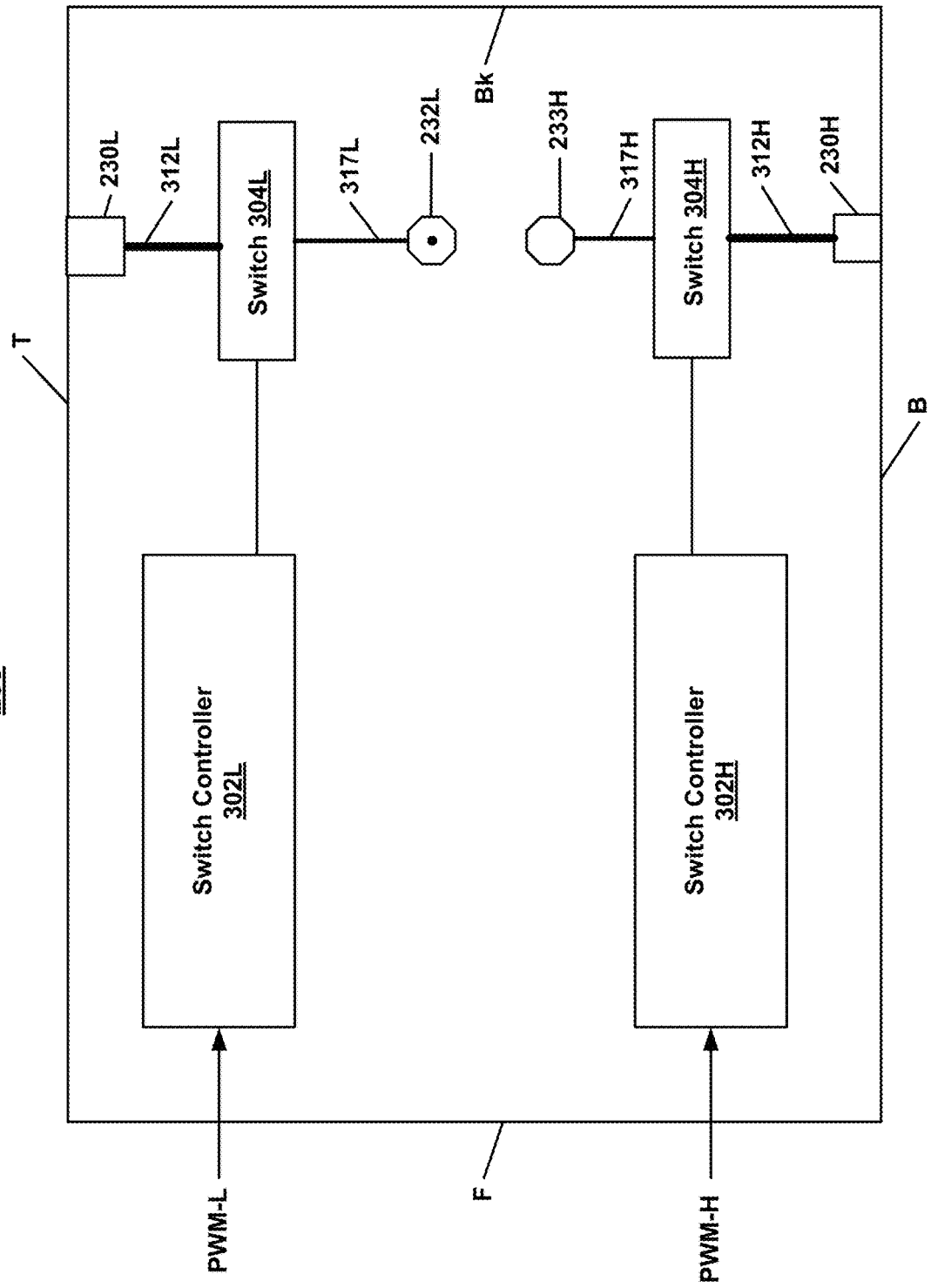
Figures 2, 3I:
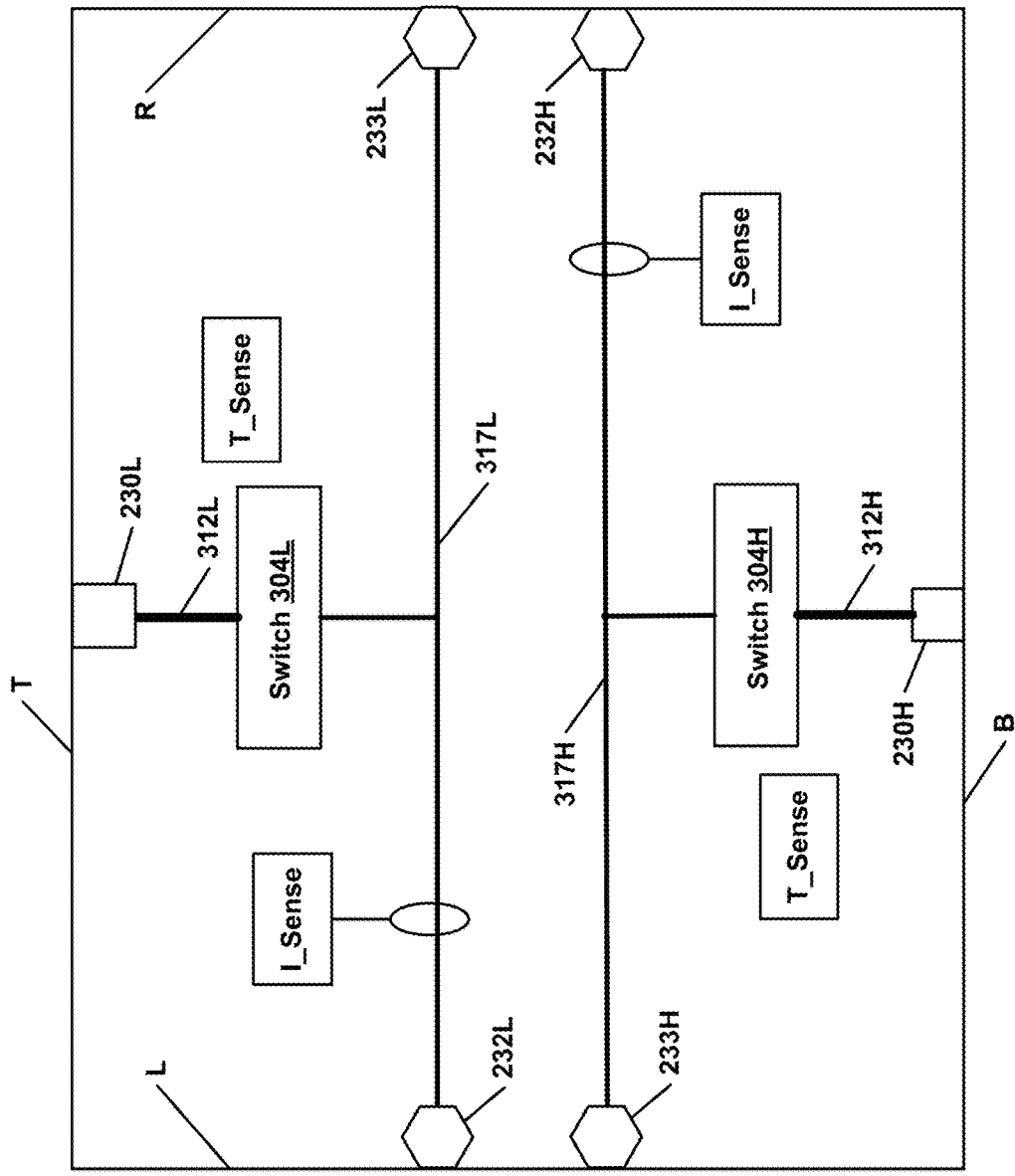

FIGS. 3k-1 and 3k-2 are schematic diagrams that show side and back views of still another packaged half bridge 255, which is similar to packaged half bridge 250, but with die clips 316H and 316L replaced by a unified die clip 315, which is attached (e.g., sintered) to switches 304H and 304L. Die clip 315 has a terminal 232 that is identical to the die clip terminal 232 of die clip 316. The die clip terminal 232 is positioned in FIG. 3k-2 to indicate that it is flush with the right side surface.

FIGS. 3l-1 and 3l-2 are schematic diagrams of another packaged half bridge 259 that show several components thereof. Half bridge 259 is similar to packaged half bridge 250, but with die clips 316L and 316H replaced by die clips 317L and 317H, respectively. FIGS. 3l-1 and 3l-2 show relative positions of certain components of packaged half bridge 259 when seen from the side and back, respectively. FIG. 3l-2 shows low-side die clip terminal 232L and high side die clip terminal 232H positioned to indicate they are flush with the right side surface. Die clips 317 and 316 are similar in many features. For example, like die clip 316, die clip 317 includes horizontal and vertical portions. FIG. 3l-1 shows only the vertical portions of die clips 317. At least one substantial difference exists between die clips 316 and 317; the horizontal portion of die clip 317 is extended and positioned between oppositely facing die clip terminals 232 and 233. Both die clip terminals 232 and 233 are accessible through the plastic case of half bridge package 259. Die clip terminals 232 and 233 are flush with opposite side surfaces of packaged half bridge 259 as shown. Die clip terminals 232 and 233 may be similar in shape and size and configured to transmit high current into or out of packaged half bridge 259. width FIG. 3j is a schematic diagram of still another packaged half bridge 261 that shows several components thereof. Half bridge 261 is similar to packaged half bridge 250, but with die clips 316L and 316H replaced by die clips 319L and 319H, respectively. FIG. 3j shows relative positions of certain components of packaged half bridge 261 when seen from the side. FIG. 3j shows low-side die clip terminal 232L and high side die clip terminal 232H positioned to indicate they are flush with the back surface.

Example Compact Inverter Systems

Compact inverter systems have high power densities compared to prior inverter systems. For example, compact inverter systems can deliver 400 kW or more of peak power to an electric motor or other device while occupying a volume of 0.25 liters or less. Space is conserved in part by arranging packaged switches, packaged half bridges, heat sinks, bus bars, etc., one on top of another.

Figures 1, 4A:
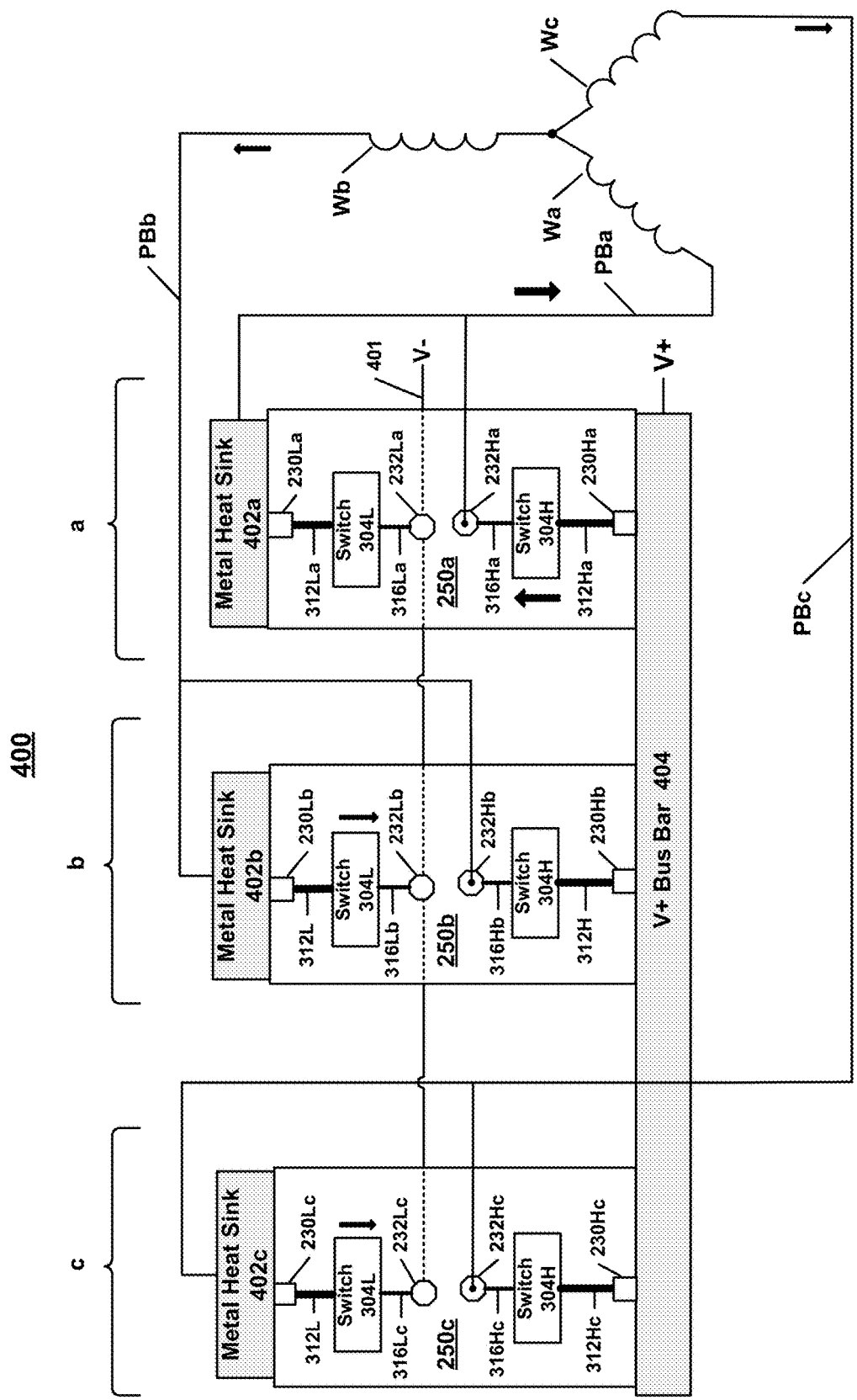
Figures 2, 4A:
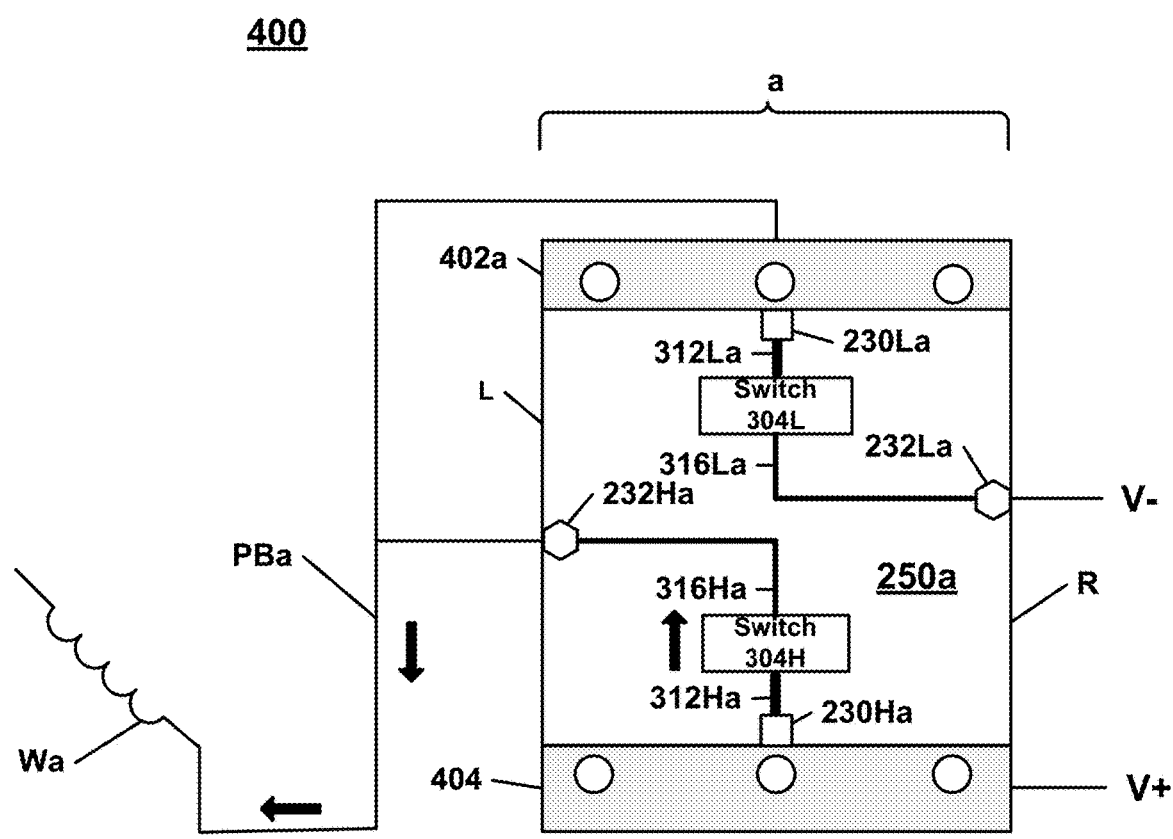
Figures 4, 4A:
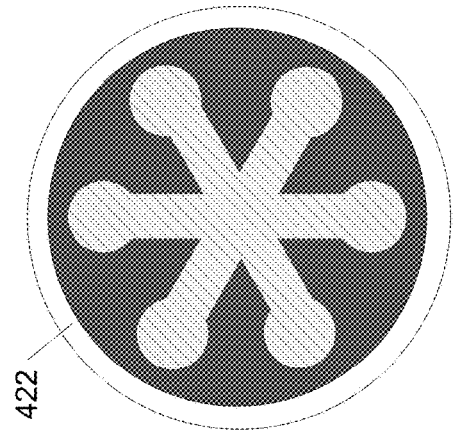
Figures 4, 4A, 5, 6:
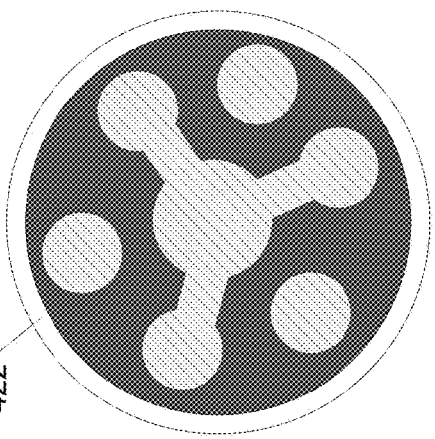
Figures 4, 4A, 5:
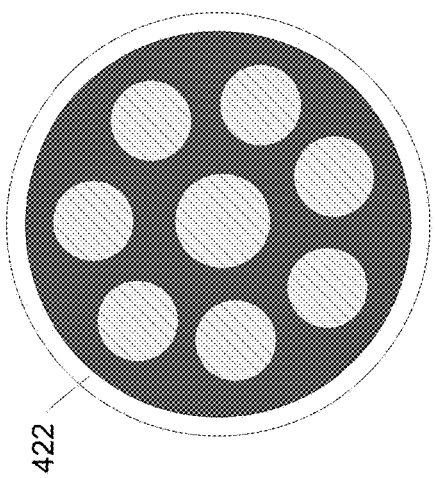

FIG. 4a-1 is schematic diagram showing a side view of an example compact inverter system 400. Inverter system 400 includes packaged half bridges 250 like that shown in FIG. 3g-1. For ease of illustration, switch controllers, T_Sense circuits, I_sense circuits, and signal leads are not shown.

Compact inverter system 400 includes three phases designated a-c. Phases a-c include packaged half bridges 250a-250c, respectively, that are connected to phase bars PBa-PBc, respectively, which in turn are connected to windings Wa-Wc, respectively. The phase bars PB in compact inverter system 400 and the phase bars PB in the other compact inverter systems described below, could have different configurations. However, for ease of explanation the differences in the phase bars of the various compact inverter system embodiments are not discussed unless otherwise noted.

Die substrate terminals 230La-230Lc are connected to heat sinks 402a-402c, respectively. Heat sinks 402a-402c are electrically isolated from each other. Each heat sink 402 has one or more channels (not shown in FIG. 4a-1) through which an electrically isolated cooling fluid can flow. Die substrate terminals 230H are connected to V+ bus bar 404, which also acts as a heat sink with one or more channels (not shown in FIG. 4a-1) through which an electrically isolated cooling fluid can flow. FIG. 4a-2 is a view of phase-a from the back. This view shows example channels of heat sink 402a and V+ bus bar 404. To enhance heat transfer, the channels in each can be positioned closer to the surface that contacts the die substrate terminals 230 as shown.

In general heat sinks and/or V+ bus bars employed in disclosed compact inverter systems, like those shown in FIGS. 4a-1 and 4a-2, contain channels. Some V− bus bars may also contain channels. The channels are configured to hold conduits (e.g., pipes), which in turn have their own channels through which a cooling fluid may flow. For the purposes of explanation, all heat sinks and V+ bus bars are presumed to have channels that contain conduits. And all V− bus bars that also act as heat sinks are also presumed have channels that contain conduits. Further, it is presumed that channels are cylindrical in cross section, and that the conduits are pipes, it being understood the present disclosure should not be limited thereto.

FIGS. 4a-3-4a-6 are cross sectional views of example cylindrical pipes 420a-420d, respectively. Outer surfaces of pipes 420a-420d contact surfaces of the cylindrical channels of any one or more of the heat sinks, V+ bus bars, or certain V− bus bars disclosed herein. Each of the illustrated example pipes 420a-c includes a thin layer (e.g., 0.1-1.0 mm) 422 of dielectric material (e.g., aluminum oxide, aluminum nitride, silicon nitride, chemical vapor deposited diamond coating, etc.) that coats the pipe's outer surface. In an alternative embodiment, the line layer of dielectric coats the pipe's inner surface. For purposes of explanation, this disclosure presumes that all thin layers thin layers 422 are applied to and coat the pipe's outer surface.

The dielectric material in layer 422 should have a strength of 0-10 kV. Dielectric layer 422 is presumed to be 0.2 mm in FIGS. 4a-3-4a-6. The thickness and material of dielectric layer 422 affects the heat transfer of the pipe.

The table below includes calculated heat transfer W for dielectric layer 422 formed from different materials and thicknesses. W is proportional to k·A·(T1−T2)/d, where k is the thermal conductivity, A is area, T1−T2=70 is the temperature difference across the dielectric layer, and d is the thickness in micrometers.

| | Thermal Conductivity | Dielectric Strength | Thickness Requirement (@4000 V) | | Heat Transfer (W) (@ΔT-° C., area-cm$^2$) | |
|---|---|---|---|---|---|---|
| | (W/mK) | (kV/mm) | (μm) | (mils) | (W) ΔT = 70 | A = 1 |
| Al$_2$O$_3$ | 24.0 | 16.9 | 236.7 | 9.3 | 710 | |
| Si$_3$N$_4$ | 90.0 | 12.0 | 333.3 | 13.1 | 1,890 | |
| AlN | 170.0 | 16.7 | 239.5 | 9.4 | 4,968 | |
| BN-Hex | 30.0 | 40.0 | 100.0 | 3.9 | 2,100 | |
| AlN + AO (50/50) | 92.0 | 26.6 | 150.5 | 5.9 | 4,279 | |
| AlN + AO (75/25) | 126.0 | 21.7 | 184.7 | 7.3 | 4,775 | |
| HBN + AO (50/50) | 27.5 | 35.7 | 112.0 | 4.4 | 1,718 | |
| Diamond | 1500.0 | 1000.0 | 4.0 | 0.2 | 2,625,000 | |
| Epoxy | 4.0 | 19.7 | 203.0 | 8.0 | 138 | |
| Teflon | 0.3 | 60.0 | 66.7 | 2.6 | 34 | |
| HDPE | 0.2 | 20.0 | 200.0 | 7.9 | 7 | |
| Nylon | 0.3 | 14.0 | 285.7 | 11.2 | 6 | |
| Rubber | 0.1 | 12.0 | 333.3 | 13.1 | 3 | |
| Phenolic | 0.2 | 6.9 | 579.7 | 22.8 | 2 | |
| Polyamide | 0.3 | 55.0 | 72.7 | 2.9 | 29 | |
| Polycarbonate | 0.2 | 38.0 | 105.3 | 4.1 | 15 | |
| Liquid Crystal Polymer | 1.6 | 25.6 | 156.3 | 6.2 | 72 | |

Dielectric 422 directly engages the channel surface of the bus bar or heat sink in which the pipe is contained. Each pipe includes one or more channels through which a cooling fluid can flow. The pipe channels have different cross sectional shapes as shown. Pipes 420*a* and 420*b* include a single channel, while pipes 420*c* and 420*d* include multiple channels. Dielectric layer 422 electrically isolates the pipe and thus the fluid in the pipe's channels. Dielectric layer 422, however, transfers heat to the cooling fluid flowing through the pipe channel. In an alternative embodiment, no dielectric (e.g., layer 422) exists between the cooling fluid and switch 304*s*. However, in this alternative embodiment, the cooling fluid should be a dielectric.

Although not shown in the schematic figures of compact inverter systems, all die substrate terminals 230 are connected to corresponding pedestals on heat sinks, V+ bus bars, phase bars, or V− bus bars. The pedestals can have substantially flat surfaces. More specifically each pedestal can have a flat surface that is connected to a die substrate terminal. The pedestal surface is substantially similar in size and shape to the die substrate terminal to which it is connected. Heat and/or current is transferred between a die substrate terminal and its connected pedestal. Although not required, a thin layer of thermally and/or electrically conductive grease can connect a die substrate terminal to a pedestal surface to enhance thermal and/or electrical conductivity therebetween. The pedestals can be configured to create an air gap between signal leads of packaged switches or packaged half bridges, and, V− bus bars, heat sinks, phase bars, or V+ bus bars. The air gaps electrically isolate signal leads from the heat sinks, V− bus bars, phase bars, or V+ bus bars. In an alternative embodiment, a layer of dielectric material can be placed in the air gaps to further ensure electrical isolation of signal leads from heat sinks, V− bus bars, phase bars, or V+ bus bars. Clamps, bolts, and other such fasteners may be used to releasably connect packaged switches or packaged half bridges to pedestals so that malfunctioning packaged switches or packaged half bridges of a compact invertor system can be more easily replaced.

Returning to FIG. 4*a*-1, phase bars PBa-PBc are symbolically shown. Phase bars PBa-PBc conduct current between windings Wa-We, respectively, and packaged half bridges 250*a*-250*c*, respectively. Phase bars PBa-PBc have terminals that are connected to high-side die clip terminals 232Ha-232Hc, respectively, and phase bars PBa-PBc have separate terminals that are connected to heat sinks 402*a*-402*c*, respectively. The low-side die clip terminals 232La-232*c* are connected to a V− bus bar 401, which in turn is coupled to a V− battery terminal. Although compact inverter system 400 is shown schematically, half bridge 250, heat sink 402, and V+ bus bar 404 of each phase are shown in side view to illustrate the vertical positioning of these components with respect to each other. The V− bus bar 401 is symbolically shown and positioned behind packaged half bridges 250 in the figure.

FIG. 4*a*-1 includes current symbols that represent current flow through inverter system 400 at an instant in time. More particularly, FIG. 4*a*-1 shows current flow through activated high-side switch 304H of phase-a, while low-side switches 304L of phases b and c are activated and conducting current to V− via the V− bus bar 401. All other switches are deactivated in the figure. Importantly, all die substrate terminals 230 are thermally and electrically connected to V+ bus bar heat sink, heat sink 402*a*, heat sink 402*b*, or heat sink 402*c*.

Figures 1, 4B:
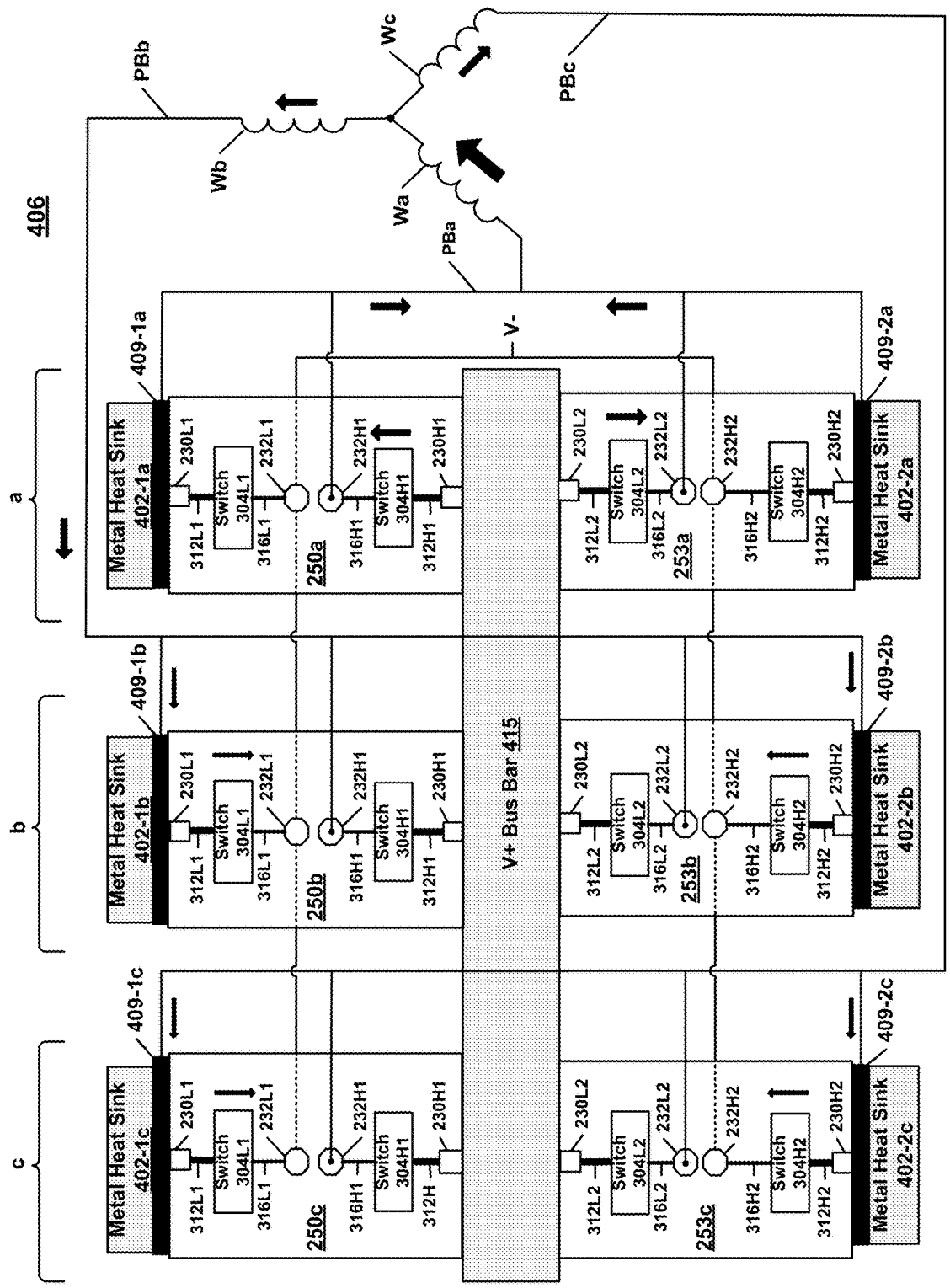
Figures 2, 4B:
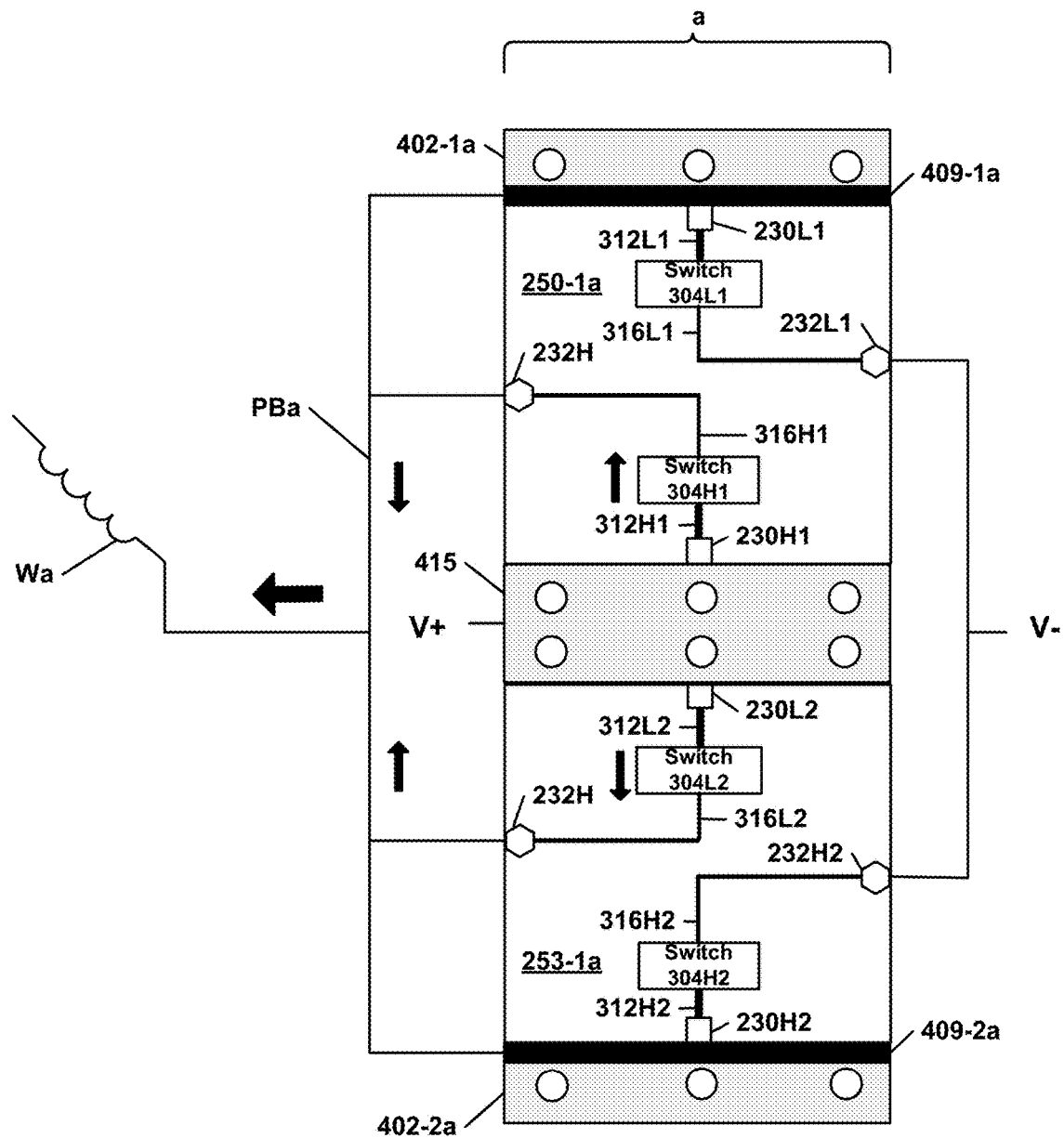
Figures 3, 4B:
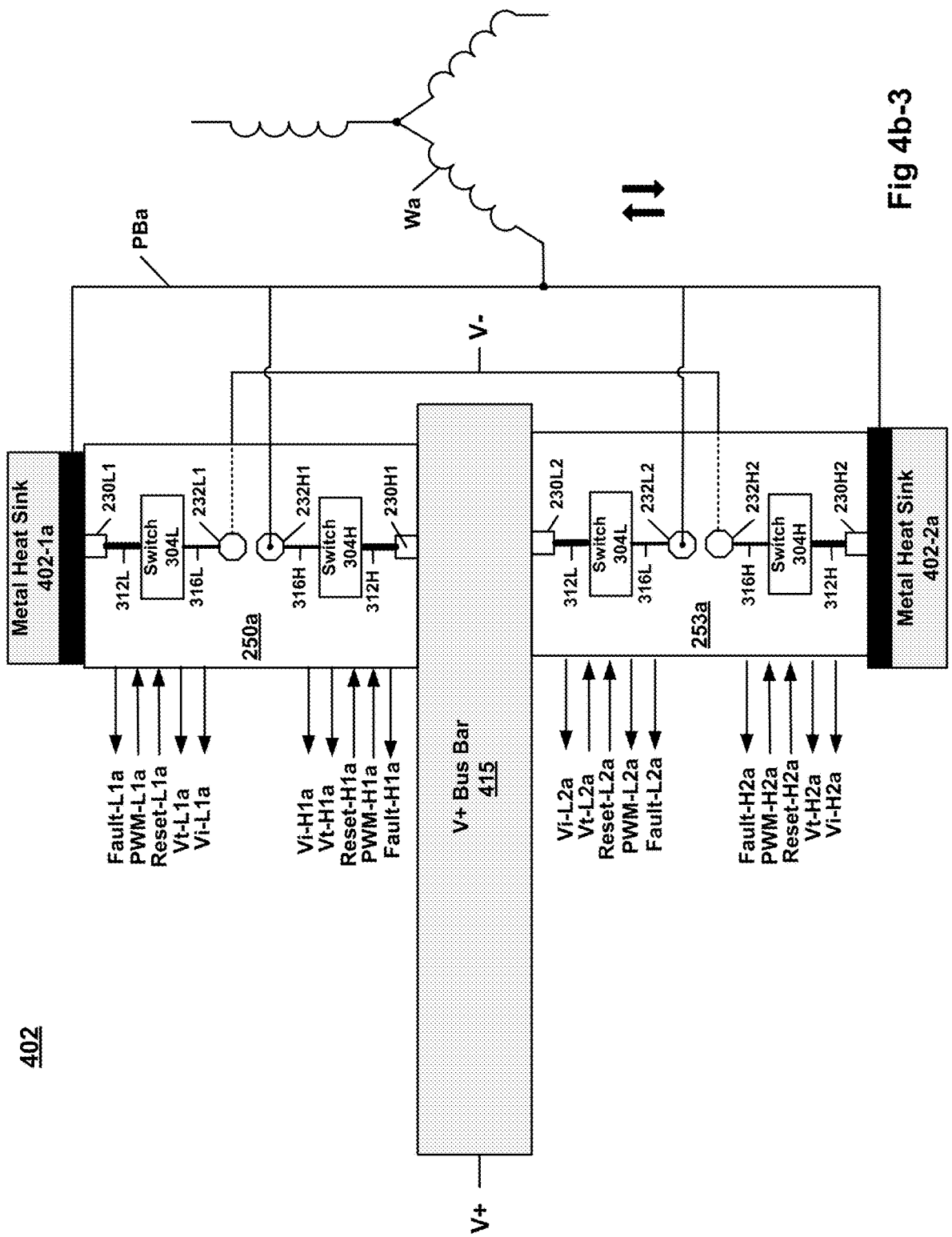

FIG. 4*b*-1 is a schematic diagram showing a side view of another compact inverter system 406. Each of the phases a-c in this system includes a packaged half bridge 250 like that shown in FIG. 3*g*-1, and a packaged half bridge 253 like that shown in FIG. 3*i*-1. For ease of illustration, switch controllers, T_Sense circuits, I_sense circuits, and signal leads are not shown.

Packaged half bridges 250 and 253 in each phase are connected to a respective phase bar PB. Phase bars PBa-PBc conduct current between windings Wa-We, respectively, and the packaged half bridges in phases a-c, respectively. Each phase bar PB includes metal extensions 409-1 and 409-2. Die substrate terminals 230L1 and 230H2 are connected to extensions 409-1 and 409-2, respectively, in each phase. And metal heat sinks 402-1 and 402-2 are connected to extensions 409-1 and 409-2, respectively, in each phase. The phase bar extensions 409 are formed of thermally and electrically conductive metal. Phase bar extensions 409-1 and 409-2 in each phase conduct heat from die substrate terminals 230L1 and 230H2, respectively, to heat sinks 402-1 and 402-2, respectively. The phase bar PB also has extensions or terminals that are connected to the die clip terminals 232H1 and 232L2 in each phase. Die substrate terminals 230H1 and 230L2 in each phase are connected to V+ bus bar 415. Die clip terminals 232L1 and 232H2 in each phase are connected to a V− bus bar.

FIG. 4*b*-2 is a view of phase-a from the back. This view shows example channels within heat sink 402-1*a*, 402-2*a* and V+ bus bar 415 through which cooling fluid can flow. To enhance heat dissipation, the channels in the heat sinks are positioned closer to the surface that contacts extensions 409 in the embodiment shown. In alternative embodiments, the channels can be positioned elsewhere. V+ bus bar 415 in FIG. 4*b*-2 has more channels than V+ bus bar heat sink shown in FIG. 4*a*-2. Although compact inverter system 406 is shown schematically, packaged half bridges 250 and 253, heat sinks 402, and V+ bus bar 415 of each phase are shown in FIGS. 4*b*-1 and 4*b*-2 to illustrate the vertical positioning of these components with respect to each other.

Figures 1, 4C:
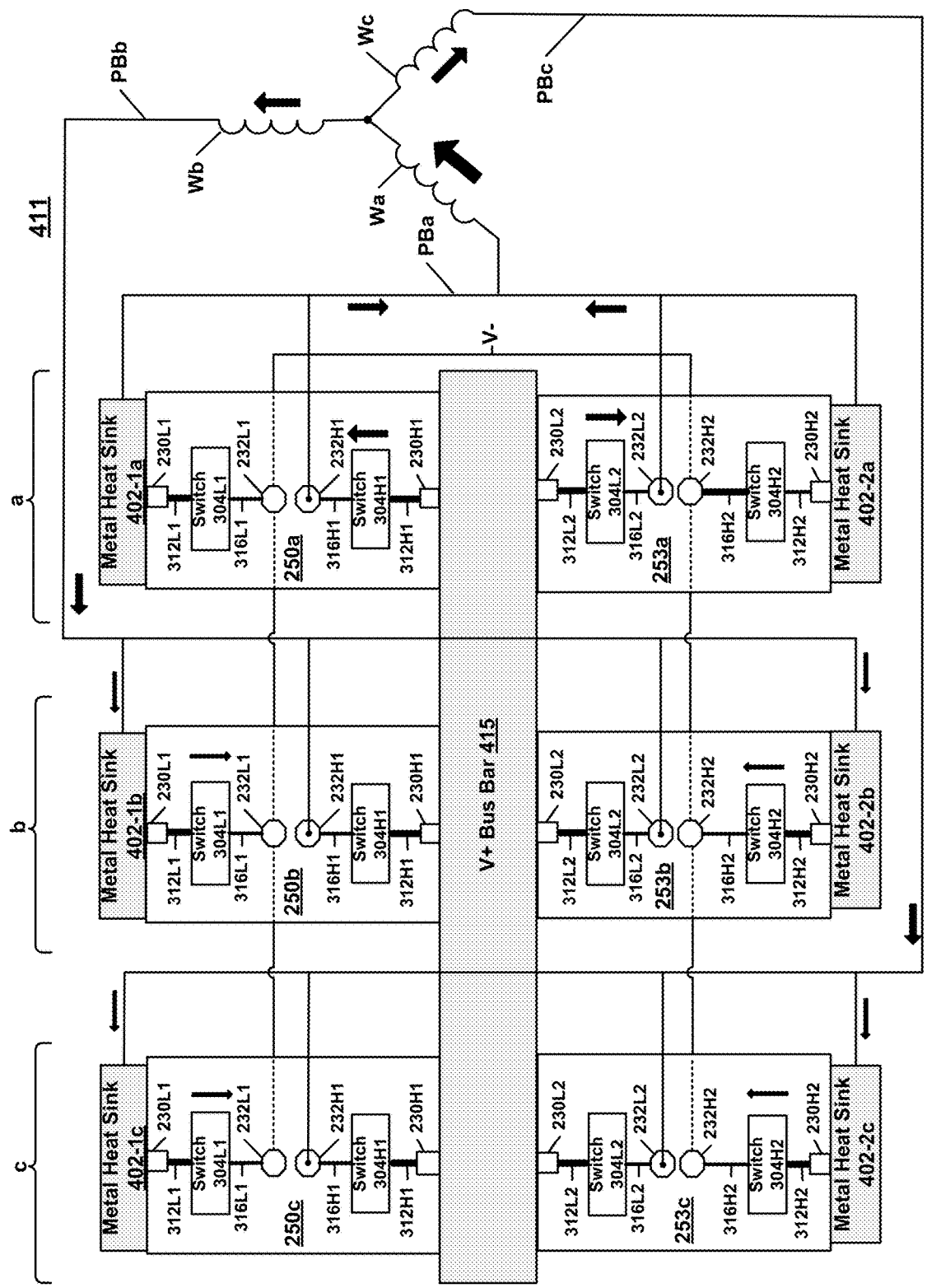

FIG. 4*c*-1 is a schematic diagram showing a side view of another compact inverter system 411. Compact inverter systems 406 and 411 are similar. However, one substantial difference exists; the phase bar PB in each phase of FIG. 4*c*-1 lacks extensions 409-1 and 409-2 that are positioned between half bridge packages and heat sinks 40. In this embodiment, each phase bar PB is connected die substrates 230L1 and 230H1 via heat sinks 402-1 and 402-2, respectively.

FIGS. 4*b*-1 and 4*c*-1 include current symbols that represent current flow through inverter system 406 and 411 at an instant in time. More particularly, each figure shows current flow when switches 304H1 and 304L2 of phase-a are activated and conducting current from V+ bus bar 415, and when all switches 304L1 and 304H2 in phases b and c are activated and conducting current to V− via the V− bus bar. All other switches are deactivated in these figures.

FIG. 4*b*-3 shows PWM and Reset signals received by phase-a of FIG. 4*b*-1. FIG. 4*b*-3 also shows Fault, Vi, and Vt outputs from phase-a. Each packaged half bridge 250 or 253 in a phase is controlled by separate sets of PWM and Reset signals. In an alternative embodiment, the high-side gate driver and low-side gate driver of packaged half bridges 250 and 253, respectively, may be controlled by a first PWM signal from the microcontroller, and the low-side gate driver and high-side gate driver of packaged half bridges 250 and 253, respectively, may controlled by a second PWM signal from the microcontroller.

Each phase of example compact inverter systems in FIGS. 4*a*-1, 4*b*-1, and 4*c*-1 has one or two packaged half bridges.

Figures 1, 4D:
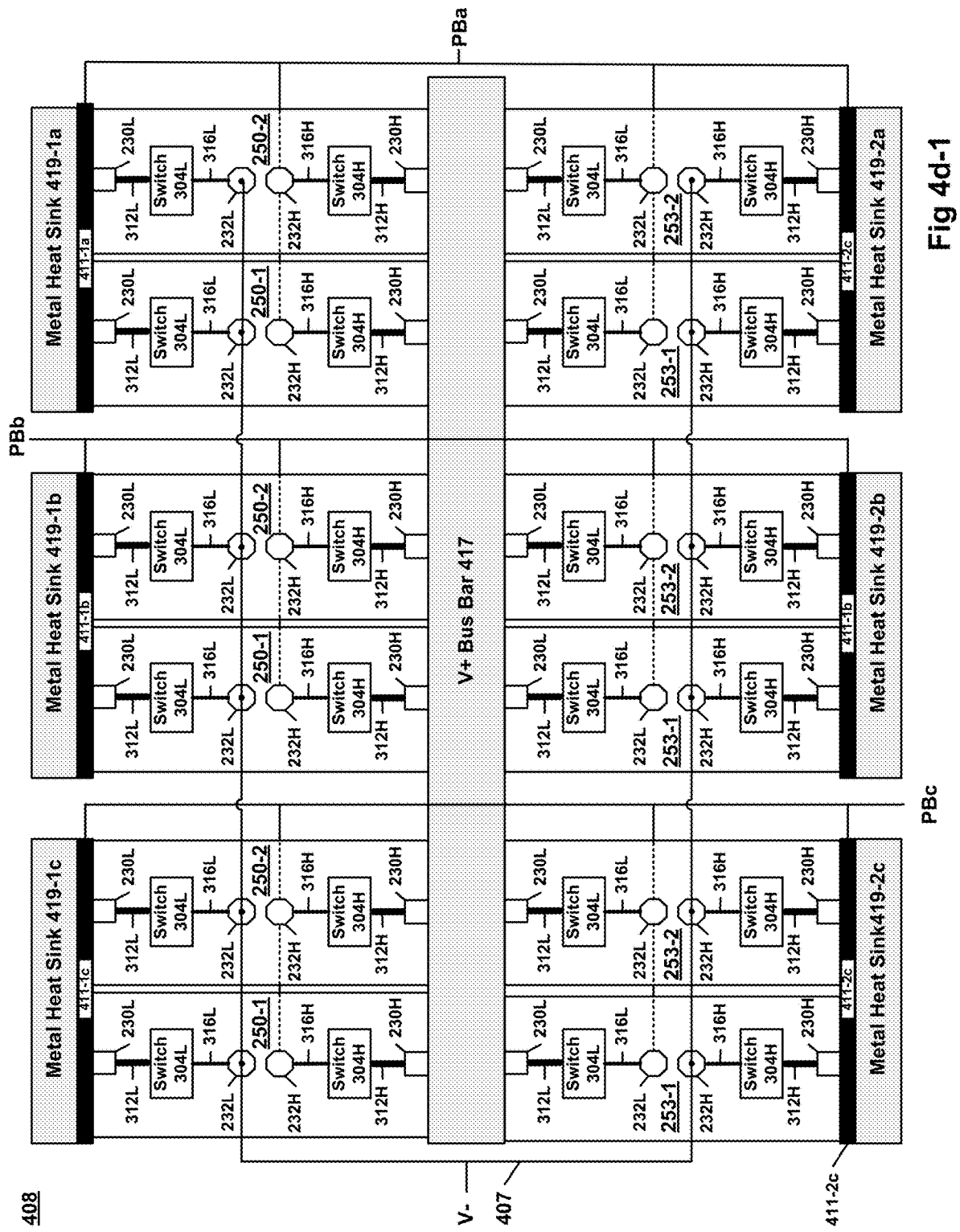
Figures 2, 4D:
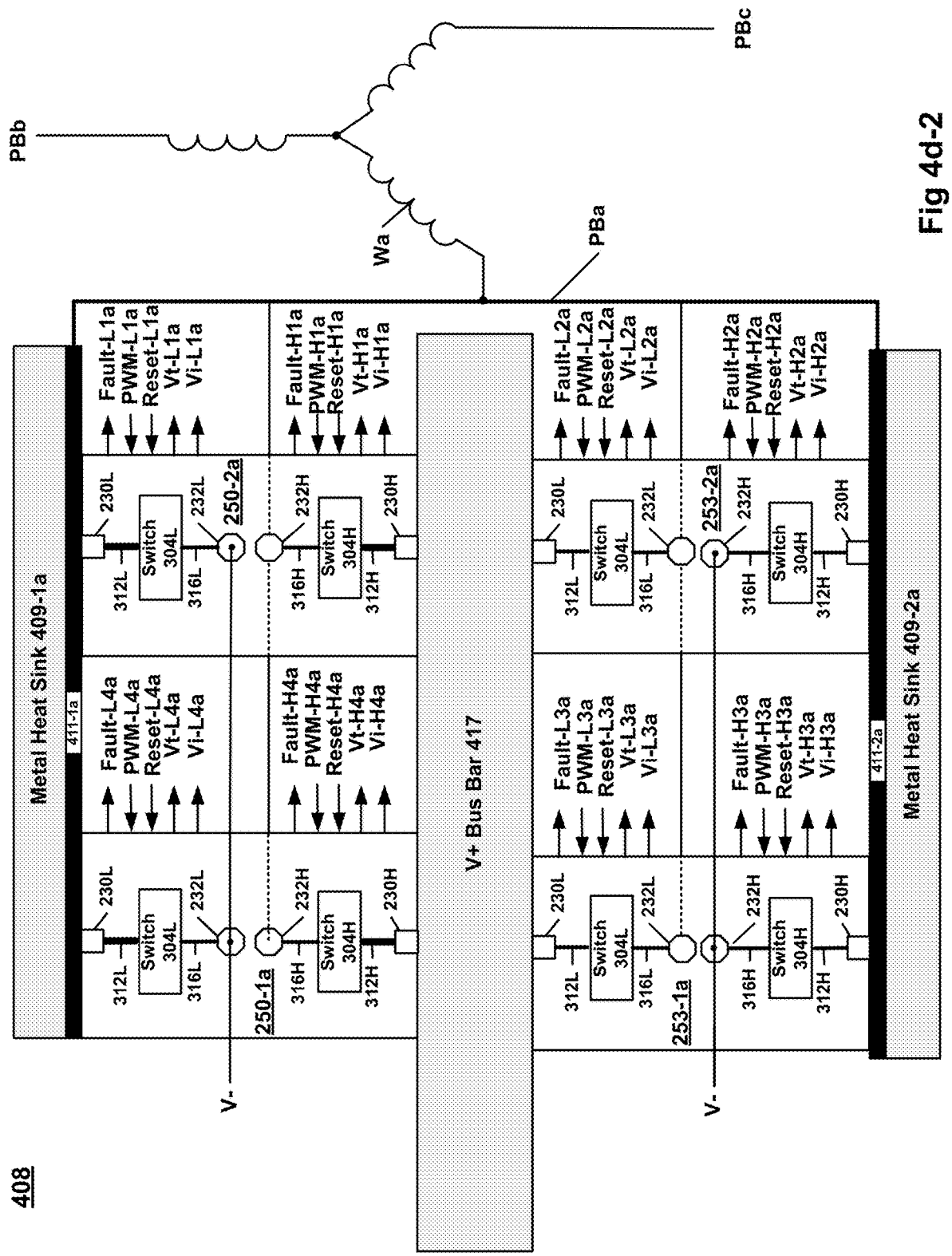

Compact inverter systems should not be limited thereto. Compact inverter systems can have phases with three, four or more packaged switches or packaged half bridges. Further compact inverter systems can be stacked and connected in parallel. FIG. 4d-1 is schematic diagram that shows a side view of yet another compact inverter system 408. In this embodiment, each of the phases a-c includes four packaged half bridges: two packaged half bridges 250-1 and 250-2, and two packaged half bridges 253-1 and 253-2. For ease of illustration, switch controllers, T_Sense circuits, I_sense circuits, and signal leads are not shown in FIG. 4d-1.

Phase bars PBa-PBc are symbolically shown. Phase bars PBa-PBc conduct current between windings Wa-We, respectively, and packaged half bridges in phases a-c, respectively. Each phase bar includes metal extensions 411-1 and 411-2. Die substrate terminals 230L of packaged half bridges 250 in each phase are connected to extension 411-1, which in turn is connected to metal heat sink 419-1. And die substrate terminals 230H of packaged half bridges 253 are connected to extension 411-2, which in turn is connected to metal heat sink 419-2. The phase bar extensions 411 are formed of thermally and electrically conductive metal. Phase bar extension 411-1 in each phase conducts heat from die substrate terminals 230L of packaged half bridges 250 to heat sinks 419-1, and phase bar extension 411-2 in each phase conducts heat from die substrate terminals 230H of packaged half bridges 253 to heat sinks 419-2. The phase bar in each phase also includes terminals that are connected to die clip terminals 232H in packaged half bridges 250, and die clip terminals 232L in packaged half bridges 253. The die substrate terminals 230H of packaged half bridges 250, and the die substrate terminals 230L of packaged half bridges 253 in each phase are connected to V+ bus bar 417, which is an elongated version of the V+ bus bar shown in FIG. 4b-1.

Threaded bolts or other such fasteners can be used to releasably connect packaged half bridges 250, 253, V+ bus bar 417, extensions 411 and heat sinks 419 together as shown. Sintering can also be used to fixedly connect packaged half bridges 250, 253, V+ bus bar 417, extensions 411 and heat sinks 419 together in an alternative embodiment. However, it will be presumed that the components are releasably connected, and as a result malfunctioning packaged half bridges can be more easily replaced. In one embodiment, each phase bar PB may include a C-shaped clamp, which include extensions 411-1 and 411-2. Half bridges 250, 253, and V+ bus bar 417 in each phase are releasably connected together by the C-shaped clamp and fasteners. In this embodiment, die substrates 230 directly contact surfaces of extensions 411 or surfaces of V+ bus bar 417. Heat sinks 419 in FIG. 4d-2 are elongated versions of the heat sinks 402 in FIG. 4a-1. Threaded bolts or other such fasteners can be used to connect heat sinks 419 to extensions 411. In this embodiment, surfaces of metal heat sinks 409 directly contact surfaces of extensions 411. In another embodiment, packaged half bridges 250, 253, V+ bus bar 417, extensions 411 and heat sinks 419 can be soldered or sintered together.

Although compact inverter system 408 is shown schematically, packaged half bridges 250 and 253, heat sinks 419, PB extensions 411, and V+ bus bar 417 of each phase are shown in side view to illustrate the vertical and horizontal positioning of these components with respect to each other.

FIG. 4d-2 shows PWM and Reset signals received by phase-a of FIG. 4d-1. FIG. 4d-2 also shows Fault, Vi, and Vt outputs from phase-a. Each packaged half bridge 250 or 253 in a phase is controlled by respective and distinct sets of PWM and Reset signals. In an alternative embodiment, the high-side gate drivers of packaged half bridges 250-1 and 250-2, and the low-side gate drivers of packaged half bridges 253-1 and 253-2 may be controlled by a single high-side PWM-H signal from a microcontroller, while the low-side gate drivers of packaged half bridges 250-1 and 250-2, and the high-side gate drivers of packaged half bridges 253 may controlled by a single low-side PWM-L signal from the microcontroller. In still another embodiment, the high-side gate drivers of packaged half bridges 250-1 and 250-2 may be controlled by a first high-side PWM-H signal, while low-side gate drivers of packaged half bridges 253-1 and 253-2 are controlled by a second high-side PWM-H; and the low-side gate drivers of packaged half bridges 250-1 and 250-2 may be controlled by a first low-side PWM-L signal, while the high-side gate drivers of packaged half bridges 253-1 and 253-2 are controlled by a second low-side PWM-L signal.

Figure 4E:
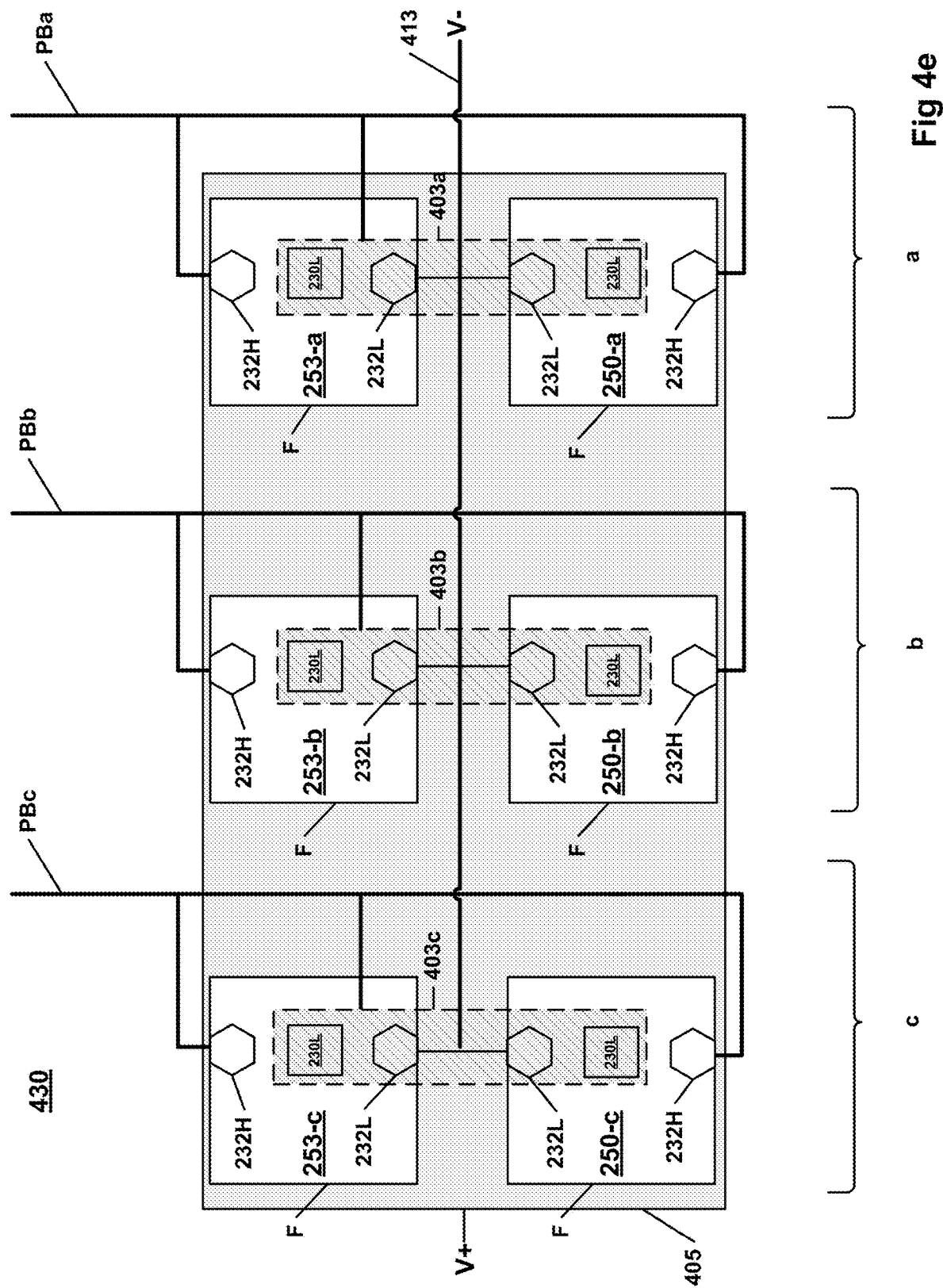
FIG. 4*e* is schematic diagram that shows relevant components of another example compact inverter system when viewed from the top.

FIG. 4e is schematic diagram showing a top view of still another compact inverter system 430 that includes packaged half bridges 250 and 253. Compact inverter system 430 includes three phases a-c connected to phase bars PBa-PBc, respectively. Each phase includes a packaged half bridge 250 and a packaged half bridge 253 that are connected between metal heat sink 403 (shown in transparency) and V+ bus bar 405. More specifically die substrate terminals 230H (not show) and 230L in each phase are connected to V+ bus bar 405 and a corresponding heat sink 403, respectively. Phase bar PB in each phase is connected to a heat sink 403 and high-side die clip terminals 232H. The low side-die clip terminals 232L are connected to V− bus bar 413. Heat sinks 403a-403c are electrically isolated from each other, each having one or more channels (not shown) through which an electrically isolated cooling fluid can flow. V+ bus bar 405 acts as a heat sink with one or more channels (not shown) through which an electrically isolated cooling fluid can flow.

Figure 4F:
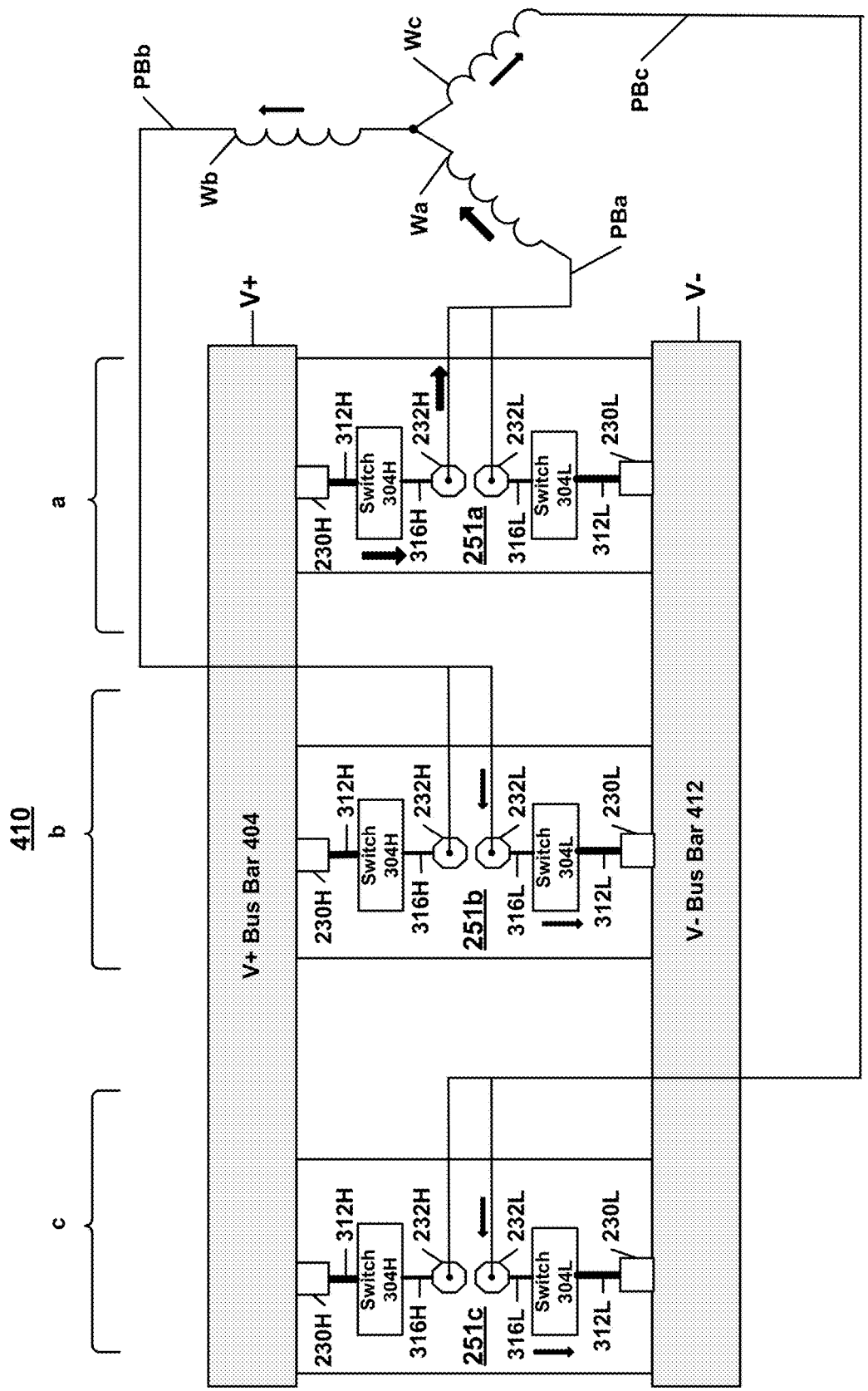
FIG. 4*f* is schematic diagram that shows relevant components of another example compact inverter system when viewed from the side.

FIG. 4f is schematic diagram showing a side view of yet another compact inverter system 410 that uses packaged half bridges 251 shown in FIG. 3h-1. There are many similarities between inverter systems 400 and 410. However, several differences exist. Phases a-c include three packaged half bridges 251a-251c, respectively. Low-side die substrate terminals 230L and high-side die substrate terminals 230H are connected to V− bus bar 412 and V+ bus bar 404, respectively. V− bus bar 412 also acts as a heat sink with one or more channels (not shown in FIG. 4f) through which a cooling fluid can flow. The phase bars PBa-PBc are connected to die clip terminals 232 in phases a-c, respectively, as shown. Although inverter system 410 is shown schematically, half bridge 251, V+ bus bar 404, and V− bus bar 412 of each phase are shown in side view to illustrate the vertical positioning of these components with respect to each other.

FIG. 4f includes current symbols that represent current flow through inverter system 410 at an instant in time. More particularly, FIG. 4f shows current flow through inverter system 410 when the high-side switch 304H of phase-a is activated and conducting current, while low-side switches 304L of phases b and c are activated and conducting current. All other switches are deactivated in the figure. Importantly, the activated switches are thermally connected to V+ bus bar 404 or V− bus bar 412.

Figure 4G:
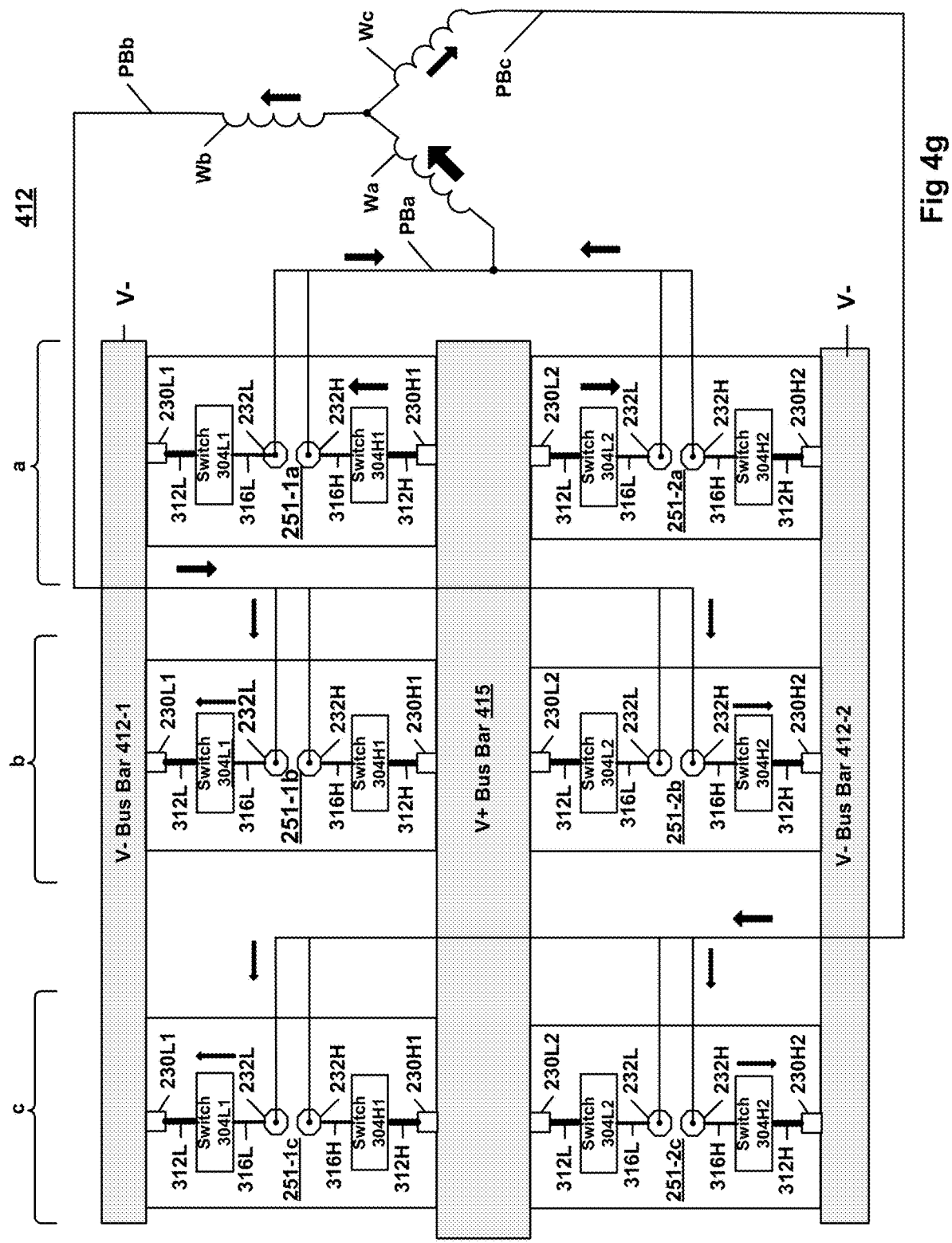
FIG. 4*g* is a schematic diagram that shows relevant components of another example compact inverter system when viewed from the side.

FIG. 4g is a schematic diagram showing a side view of still another compact inverter system 412 that uses packaged half bridges 251 like that shown in FIG. 3h-1. Each of the phases a-c includes a corresponding phase bar PB that is connected to the die clip terminals 232. Die substrate terminals 230L1 and 230H2 in each phase are connected to metal V– bus bars 412-1 and 412-2, respectively. V– bus bars 412-1 and 412-2 may include channels through which a cooling fluid can flow. Die substrate terminals 230H1 and 230L2 in each phase is connected to V+ bus bar 415. Although compact inverter system 412 is a schematic diagram, the half bridges 251, heat sink/bus bars 412, and heat sink/bus bar 415 of each phase are shown in side view to illustrate the vertical positioning of these components with respect to each other.

FIG. 4g includes current symbols that represent current flow through inverter system 412 at an instant in time. More particularly, FIG. 4g shows current flow through inverter system 412 when switches 304H1 and 304L2 of phase-a are activated and conducting current, while switches 304L1 and 304H2 of phases b and c are activated and conducting current to V–. All other switches are deactivated in the figure. Importantly, the activated switches are thermally and electrically connected to V+ bus bar 415, V– bus bar 412-1, or V– bus bar 412-2.

Figure 4H:
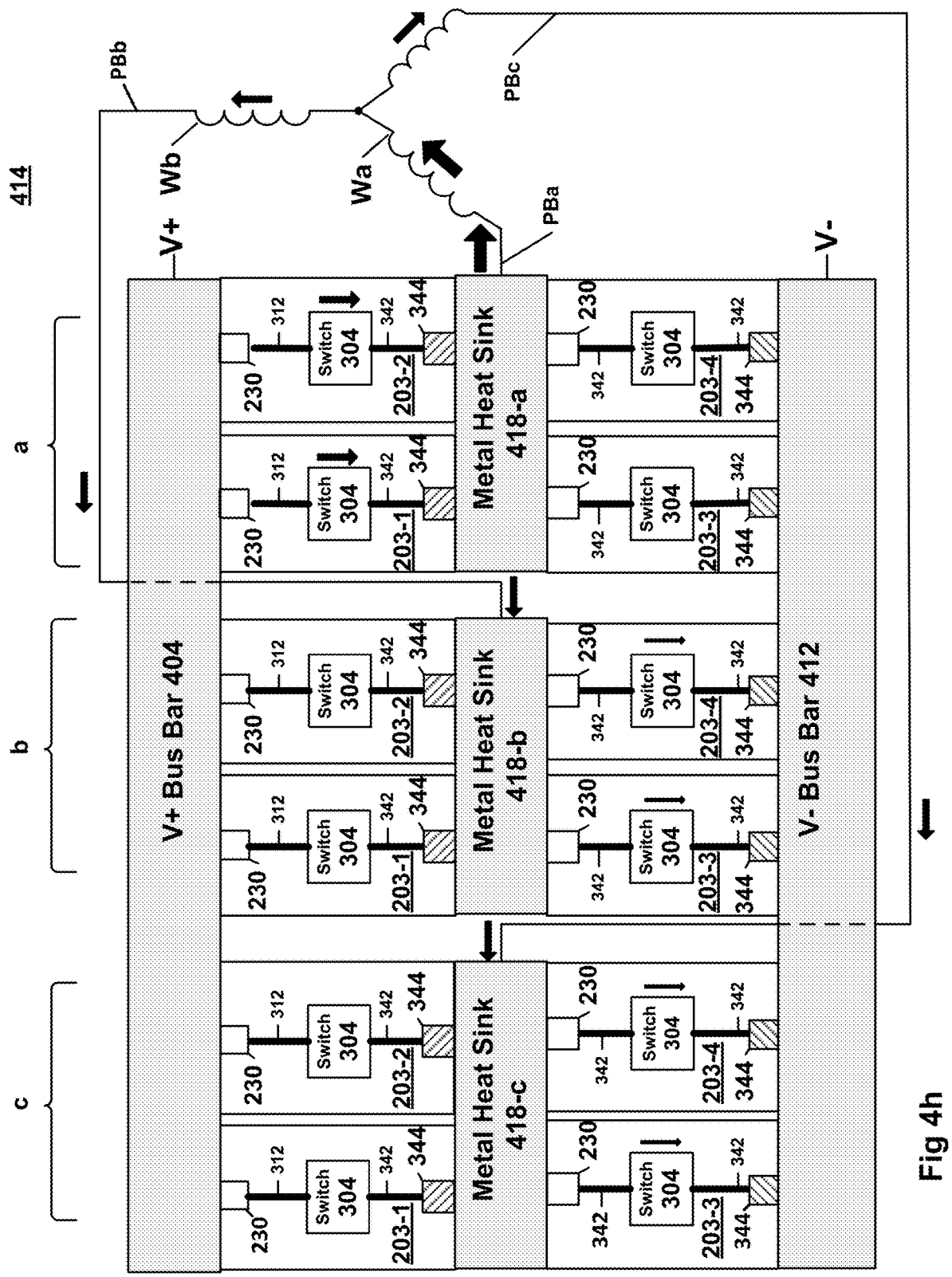
FIG. 4*h* is a schematic diagram that shows relevant components of another example compact inverter system when viewed from the side.

FIG. 4h is a schematic diagram that shows a side view of yet another compact inverter system 414. Each of the phases a-c includes four packaged switches 203 like that shown in FIG. 3c-1. Heat sinks 418-a-418-c are connected to phase bars PBa-PBc, respectively, which in turn are connected to windings Wa-Wc, respectively. Heat sinks 418-a-418-c are electrically isolated from each other and have one or more channels (not shown) through which an electrically isolated cooling fluid can flow. Die substrate terminals 230 of packaged switches 203-1 and 203-2 in each phase are connected to V+ bus bar 404, and die substrate terminals 230 of packaged switches 203-3 and 203-4 are electrically connected to respective heat sinks 418-a-418-c. Die clip terminals 344 of packaged switches 203-1 in 203-2 in each phase are connected to respective heat sinks 418-a-418-c, and die clip terminals 344 of packaged switches 203-3 and 203-4 in each phase are connected to V– bus bar 412. Each of the bus bars 404 and 412 includes one or more channels through which cooling fluid flows. Although compact inverter system 414 is shown schematically, the packaged switches 203, V+ bus bar 404, heat sinks 418, and V– bus bar 412 of each phase are shown in side view to illustrate the vertical positioning of these components with respect to each other.

FIG. 4h includes current symbols that represent current flow through inverter system 414 at an instant in time. More particularly, FIG. 4h shows current flow through inverter system 414 when switches 203-1 and 203-2 of phase-a are activated and conducting current from V+ bus bar 404, while switches 203-3 and 203-4 of phases b and c are activated and conducting current to V– via V– bus bar 412.

Figure 4I:
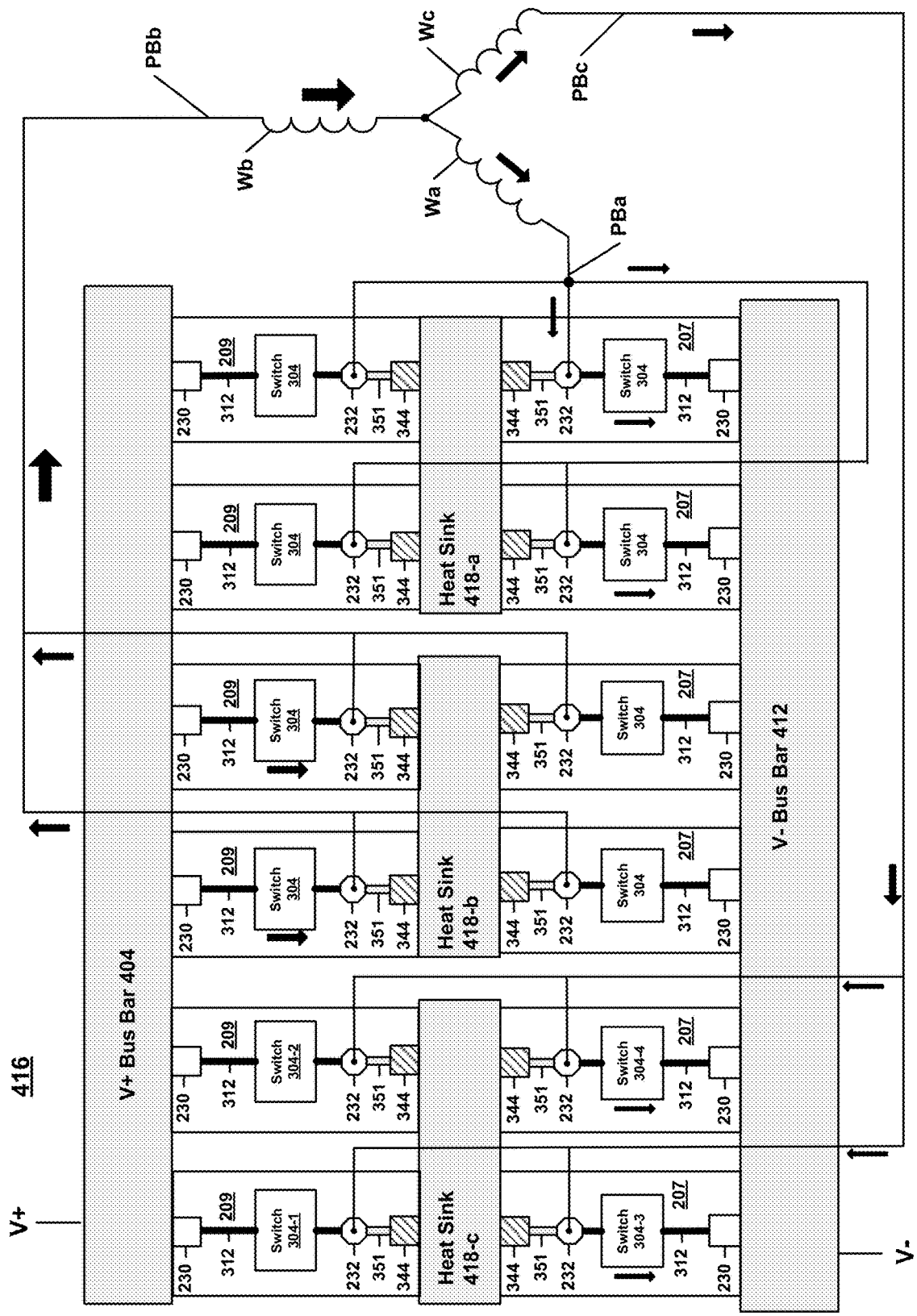
FIG. 4*i* is a schematic diagram that shows relevant components of another example compact inverter system when viewed from the side

FIG. 4i is a schematic diagram that shows a side view of still another compact inverter system 416 that uses packaged switches 207 shown in FIG. 3e-1, and packaged switches 209 shown in FIG. 3f-1. Each of the phases a-c includes a pair of packaged switches 209 and a pair of packaged switches 207. The die clip terminals 344 in each phase are connected to a corresponding heat sink 418. Heat sinks 418-a-418-c are electrically isolated from each other and have one or more channels (not shown) through which an electrically isolated cooling fluid can flow. Current does not flow through heat sinks 418 since they are electrically isolated. In each phase terminals 230 in packaged switches 209 are connected to V+ bus bar 404, and terminals 230 in packaged switches 207 are connected to V– bus bar 412. Phase bars PBa-PBc are connected to die clip terminals 232 in phases a-c, respectively. Although compact inverter system 416 is shown schematically, heat sinks 418, packaged switches 207 and 209, V+ bus bar 404, and V– bus bar 412 are shown in side view to illustrate the vertical and horizontal positioning of these components with respect to each other.

FIG. 4i includes current symbols that represent current flow through inverter system 416 at an instant in time. More particularly, FIG. 4i shows current flow through inverter system 416 when switches 304 of packaged switches 209 in phase-b are activated and conducting current, while switches 304 of packaged switches 207 in phases a and c are activated and conducting current to V– via V– bus bar 412.

Figure 4J:
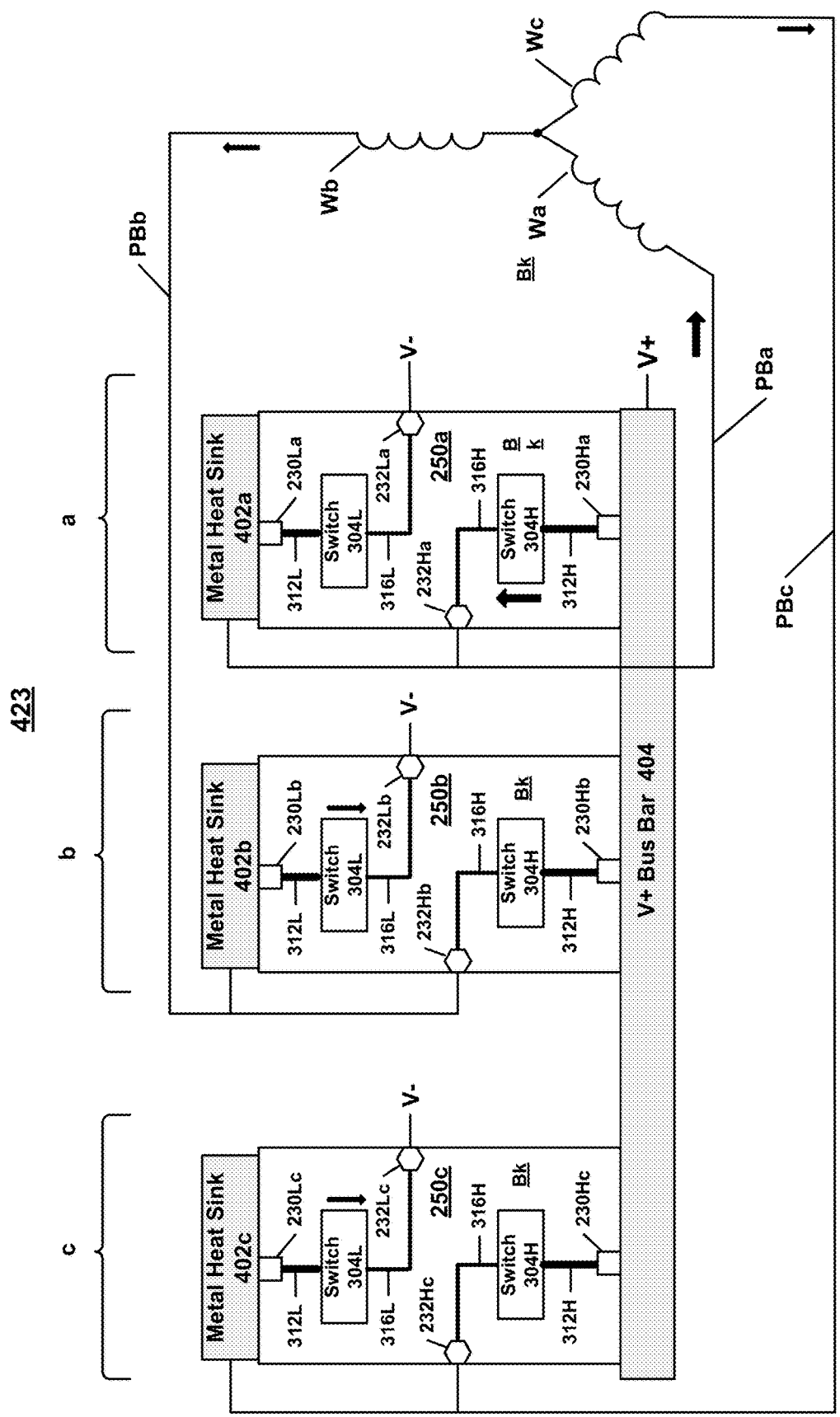
FIG. 4*j* is a schematic diagram that shows relevant components of another example compact inverter system when viewed from the side.

FIG. 4j is a schematic diagram that shows a side view of yet another compact inverter system 423. Similarities exist between compact inverter system 423 and compact inverter system 400 shown in FIG. 4a-1. One substantial difference exists; half bridges 250 are rotated 90 degrees so that the backs Bk and fronts F of the half bridges 250 face out from respective sides of inverter system 423.

Figure 4K:
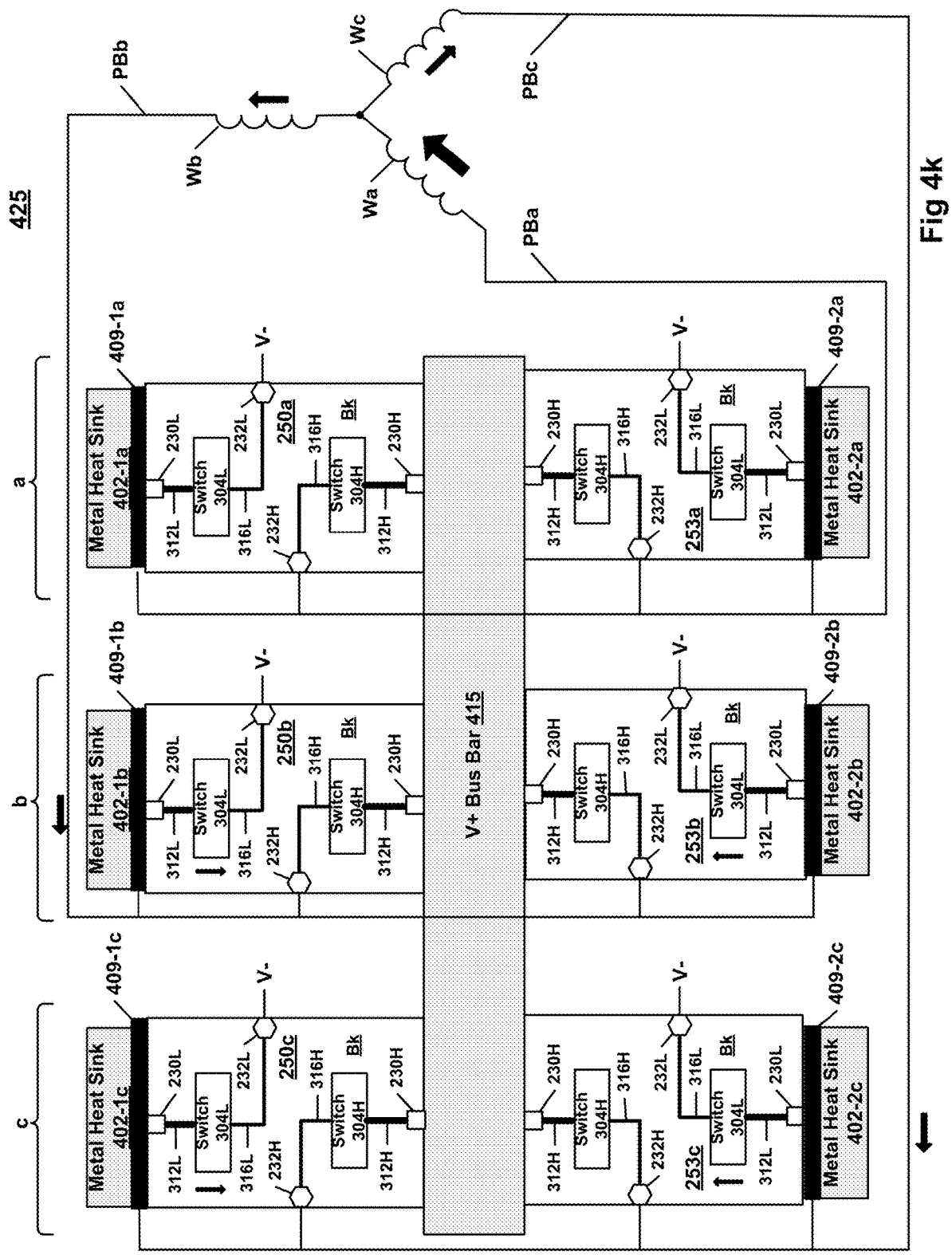
FIG. 4*k* is a schematic diagram that shows relevant components of another example compact inverter system when viewed from the side.
Figure 5:
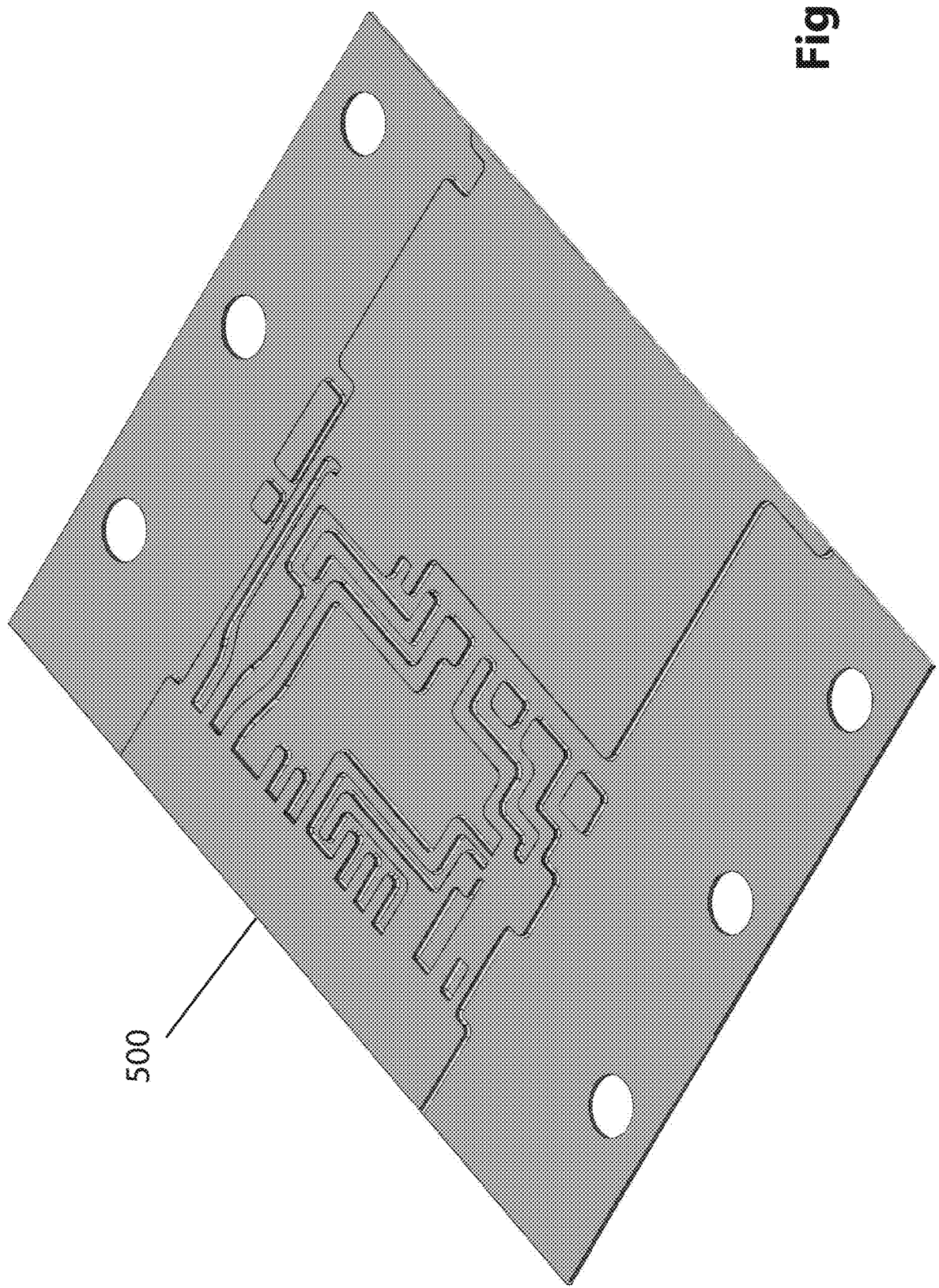
Figure 6:
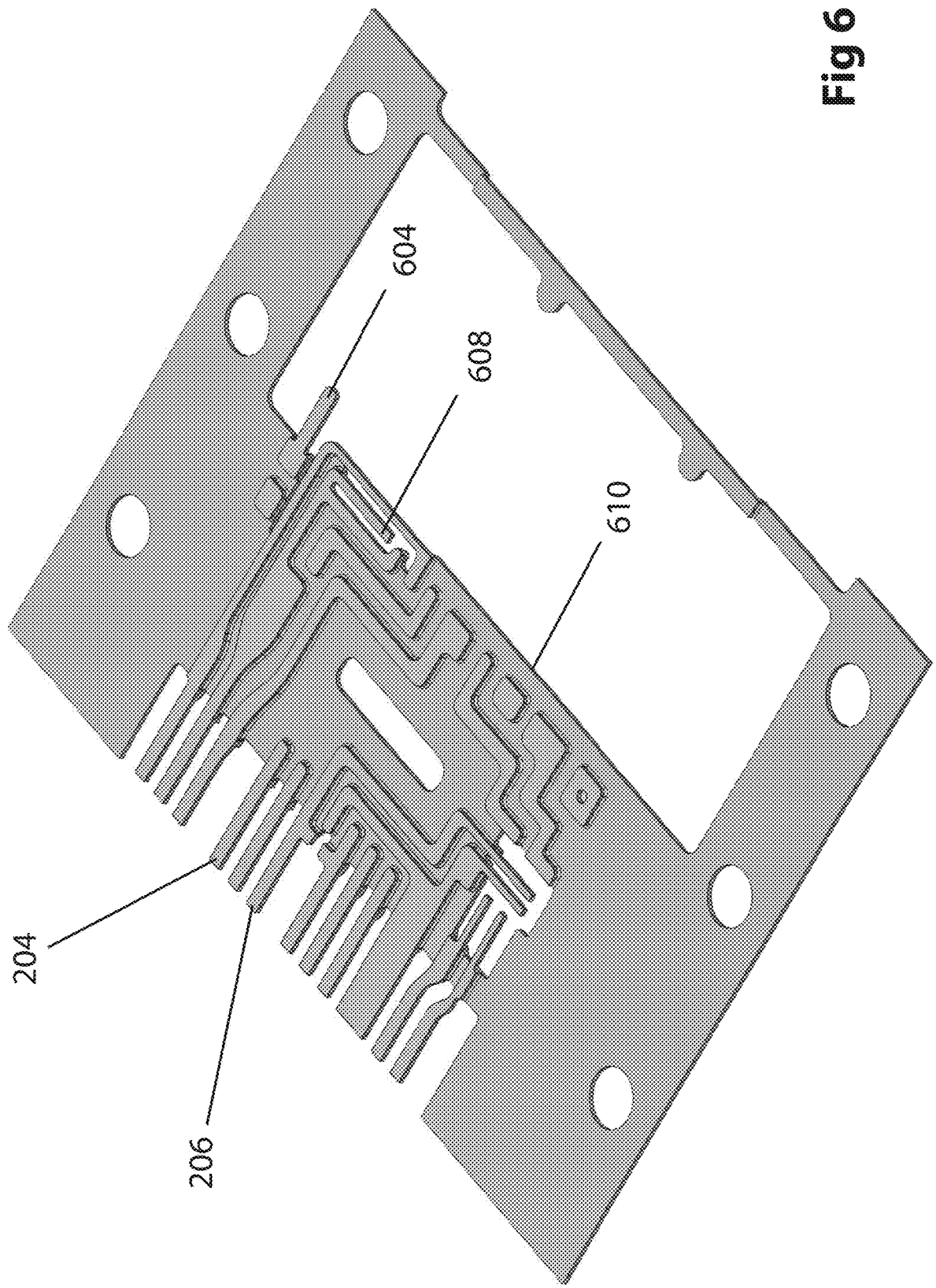
Figure 7:
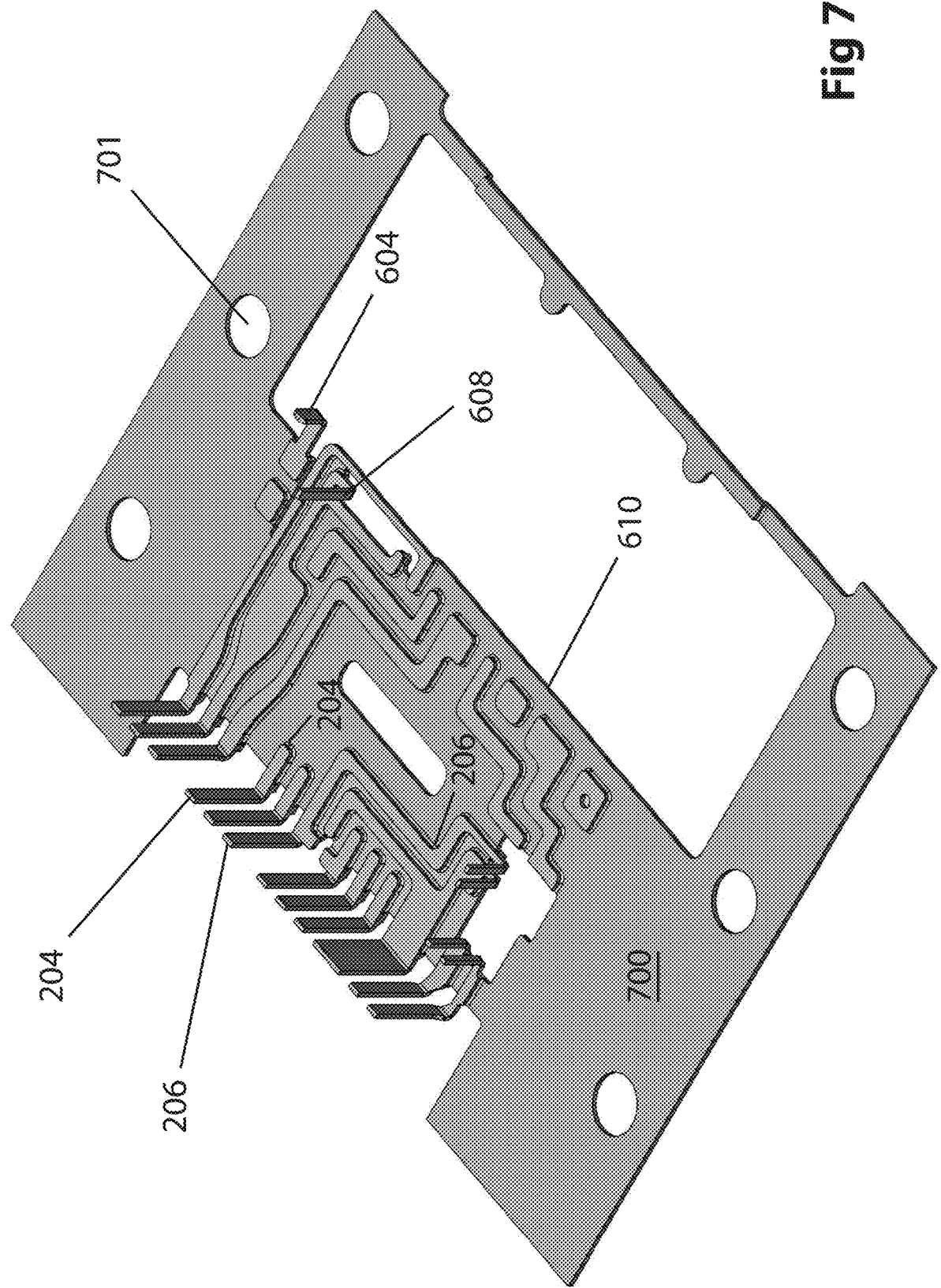
Figure 8:
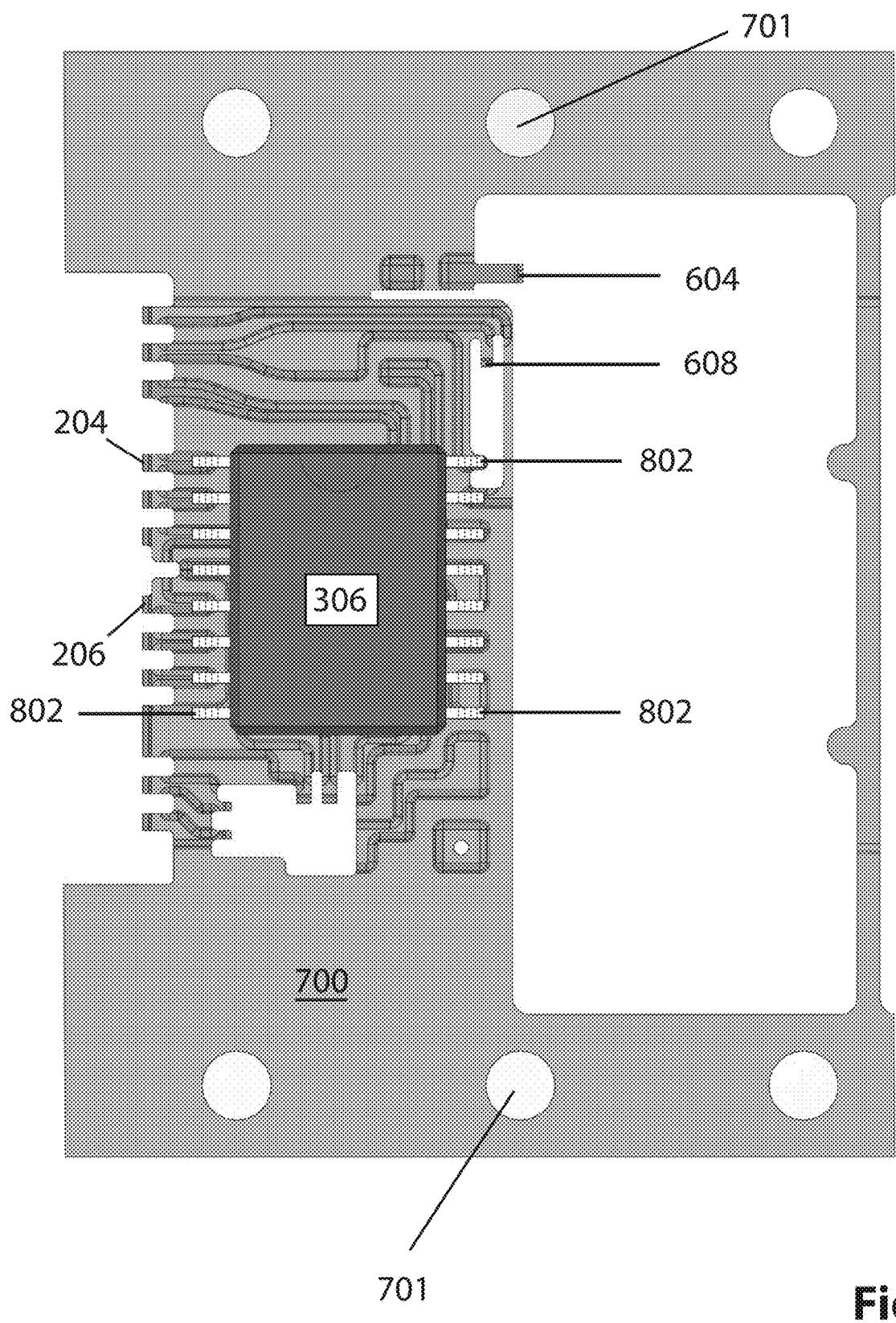
FIG. 8 is a top view of signal frame substrate of FIG. 7 after leads of gate driver circuit are connected thereto.

FIG. 4k is a schematic diagram that shows a side view of yet another compact inverter system 425. Similarities exist between compact inverter system 425 and compact inverter system 406 shown in FIG. 4b-1. One substantial difference exists; half bridges 250 and 253 are rotated 90 degrees so that the backs Bk and fronts F of the half bridges 250 and 253 face out from respective sides of inverter system 423.

Example Packaged Switch 200

Example Signal Frame Substrate

Packaged switches contain switch modules, which in turn contain components such as switches connected between die clips and die substrates, gate drivers, etc. Example packaged switch 200 includes switch module 300 shown in FIG. 3a-1.

During assembly switch module components such as gate drivers are attached (bonded, soldered, etc.) to a signal frame substrate. FIG. 5 is an isometric view of an embossed sheet 500 of thin (e.g. 0.1 mm-1.0 mm) metal (e.g., copper) from which an example signal frame substrate can be formed. For purposes of explanation only, embossed sheet 500 is formed from a sheet of copper that is 0.25 mm thick. The embossed sheet 500 is created by pressing the flat metal sheet between a female metal die and a counter male metal die. The embossing creates non-isolated signal leads. FIG. 6 is a reverse isometric view of embossed sheet 500 after it is cut. FIG. 6 more clearly shows non-isolated signal leads 204, 206, 604, and 608. Signal leads such as signal leads 204, 206, 604 and 608 in FIG. 6 are non-isolated because they are connected through un-embossed portion 610. The non-isolated signal leads are contained in a plane that is parallel to the plane that contains un-embossed portion 610, which is also referred to as the "negative layer." Eventually, the negative layer 610 will be removed by the trimming process mentioned above, which electrically isolates signal leads from each other.

Several non-isolated signal leads can be bent to create signal frame substrate 700 shown in FIG. 7. Signal frame substrate 700 includes framing with alignment apertures 701. The apertures aid in aligning signal frame substrates, die substrates, die clips during construction of switch module 300 shown in FIG. 3a-1.

With continuing reference to FIGS. 3a-1 and 3a-4, FIG. 8 is a top view of signal frame substrate 700 after leads 802 of gate driver circuit 306 are connected (e.g., solder bonded) to respective non-isolated signal leads. Signal frame substrate 700 can receive additional components (e.g., resistors R1 and R2, and diodes 308 and 310 of FIG. 3a-4) of switch module 300. For ease of illustration, the additional components are not shown in FIG. 8.

Example Die Substrates and Die Clips

As seen in FIGS. 3a-2 and 3a-3, switch module 300 contains switch 304, which is sandwiched between die substrate 312 and die clip 316. Die substrates and die clips can be formed from separate thin sheets of metal such as copper using a punch press machine or similar tool. FIG. 9a is an isometric view of an example die substrate 312 formed from a thin sheet (e.g., 0.1 mm-6.0 mm) of copper. Certain types of switches (MOSFET based switches) heat up faster than other types of switches (e.g., IGBT based switches). The thickness of the die substrate may depend on the type of switch to accommodate the differences in the rates at which they heat up. In one embodiment a 1.6 mm thick die substrate may be used for switches that employ SiC MOSFETs, while a 4.0 mm thick die substrate may be used for switches that employ IGBTs. Die substrate 312 is connected between frames that include apertures 901, which are configured for alignment with respective signal frame substrate apertures 701 as will be more fully described below. Die substrate 312 has oppositely facing flat surfaces. A switch can be mounted on one surface, while the oppositely facing surface forms die substrate terminal 230.

Figure 9B:
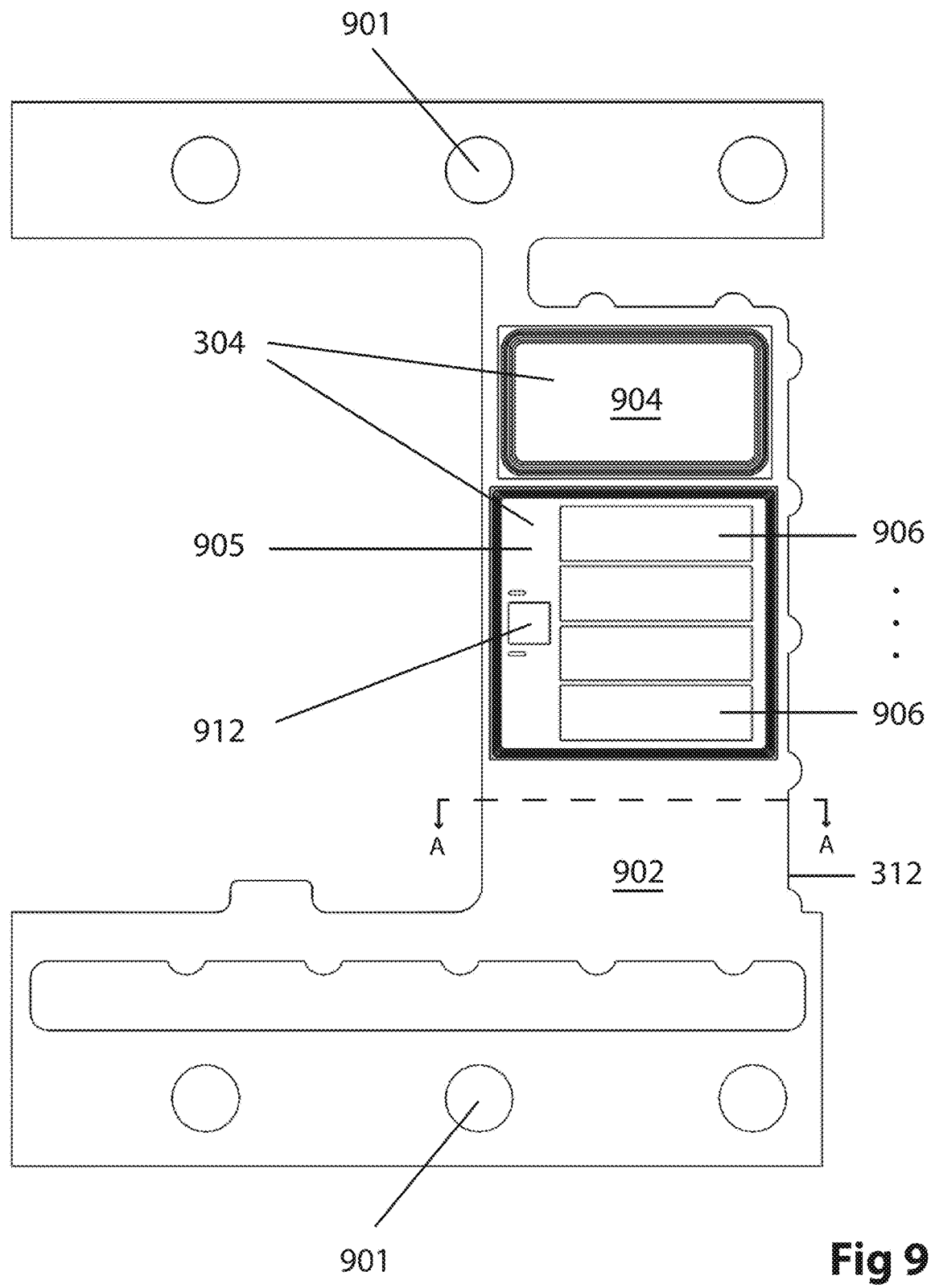
FIG. 9*b* shows an example switch received on a surface of the die substrate shown in FIG. 9*a*.

FIG. 9b shows die substrate 312 with switch 304 (i.e., IGBT and diode D of FIG. 3a-5) sintered to surface 902. For purposes of explanation only, it will be presumed that all switches are sintered to die substrates and die clips. A switch can be sintered to a die clip before or after the switch is sintered to a die substrate, or vice versa. For purposes of explanation, die clips and switches are sintered together after the switches are sintered to die substrates.

Sintering is a process of forming a solid mass by the application of heat and/or pressure without melting a sintering material to the point of liquefaction. Before a switch is sintered to a die substrate or die clip, a thin layer of sintering material (e.g., silver) is applied to the surface of the die substrate or die clip. During the sintering process the atoms in the sintering material diffuse across boundaries of the items to be sintered, fusing them together and creating one solid piece. The sintering temperature does not have to reach the melting point of the sintering material, nor does the sintering reach the melting point of the items (e.g., a die substrate and the collector of an IGBT) to be sintered together. And as a result sintering, unlike soldering, does not create bubbles or other voids that can adversely affect thermal and electrical conductivity between the items (e.g., switch and die substrate). In other words, sintering can provide a better thermal and electrical connection between a switch and its die substrate and/or die clip. While other methods of attaching switches to die substrates or die substrates can be employed, sintering is preferred since it creates a mechanically stronger bond, especially when compared to solder bonding. A strong bond is particularly important when it is subjected to stress (e.g., thermal and mechanical stress) of an extreme environments. For example, the bond can be subjected to severe mechanical stress caused by road vibrations of moving electric vehicles. Moreover, since the melting point of the sintering material is higher than the temperature used in soldering, brazing, epoxy bonding, sintering, or other processes used in the construction of a packaged switch or packaged half bridge, those processes will not disturb the sintered connection between a switch and a die substrate, or between a switch and a die clip.

Returning to FIG. 9b, diode D includes anode terminal 904. An oppositely facing cathode terminal (not shown) is sintered to die substrate surface 902 via a thin layer of sintering material. IGBT 905 has one emitter, but several emitter terminals 906 in the embodiment shown. IGBT also includes gate terminal 912. An oppositely facing collector terminal(s) (not shown) is sintered to die substrate surface 902 via a thin layer of sintering material. FIG. 9c shows an expanded cross sectional view of die substrate surface 902 and IGBT 905 taken along line A-A of FIG. 9b. A thin layer of sintering material 920 is positioned between and integrates into a collector terminal of IGBT 905 and die substrate surface 902. Anode terminal 904 and emitter terminals 906 shown in FIG. 9b are configured to be connected (e.g., sintered) to a die clip. Gate 912 is configured for connection to a non-isolated signal-lead of signal frame substrate 700, which in turn is coupled to an output of gate driver 306. The type of connection may depend on the characteristics of gate 912. For example, gates formed from aluminum or a composite with base aluminum (e.g., Al/Cu(0.5%)/Si(1%)) may quickly oxidize. The oxidation may preclude use of a solder bond. If gate 912 is formed from aluminum or a composite with base aluminum, the connection may require a wire bond, one end of which is connected to gate 912. A solder bond connection to gate 912 may be used if gate 912 is formed from silver, copper or gold, or a composite with these metals.

Figure 10:
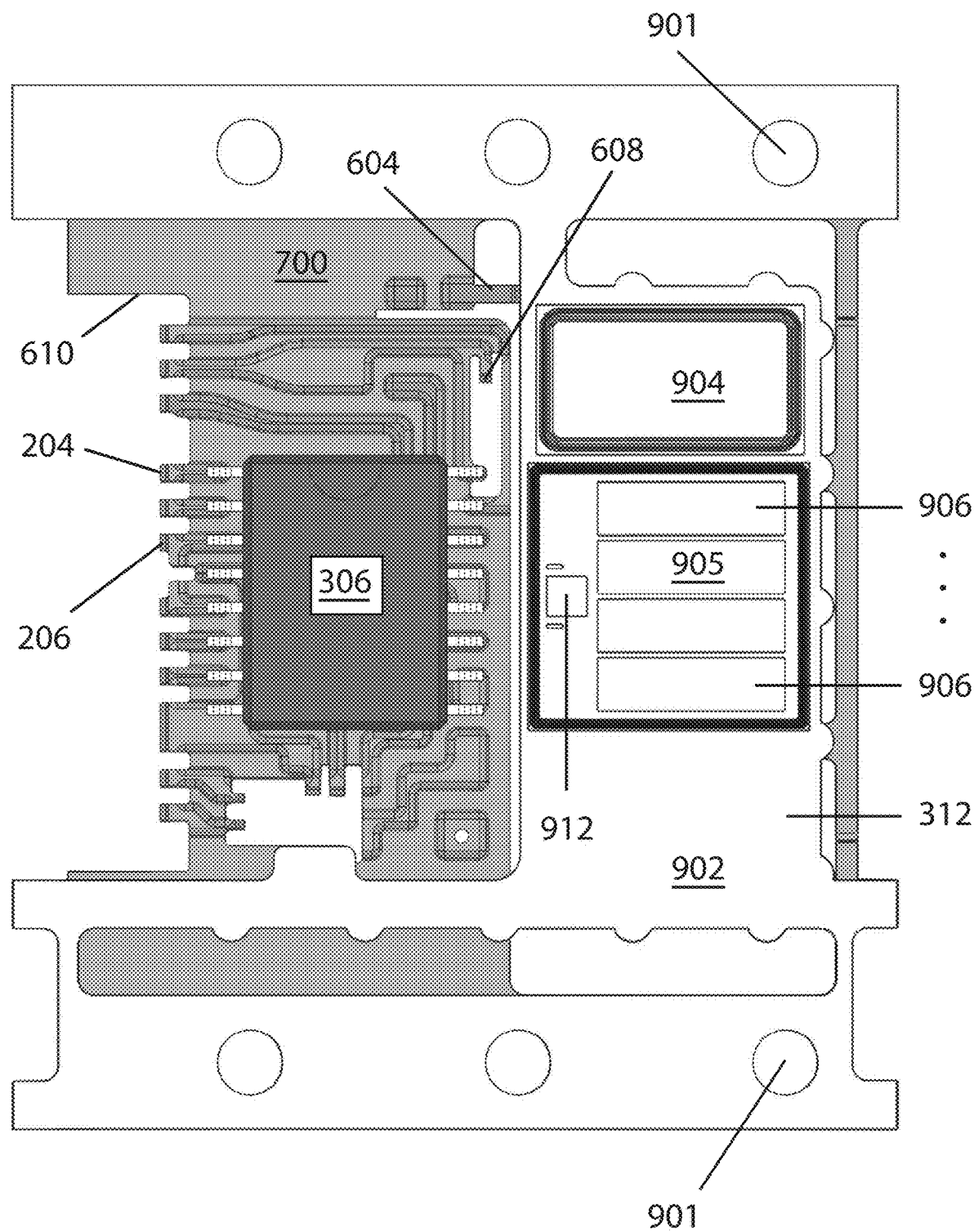
FIG. 10 is top view of die substrate of FIG. 9*a* aligned with the signal frame substrate shown in FIG. 8.

The die substrate 312 can be connected to the signal frame substrate 700. FIG. 10 is top view of die substrate 312 aligned with the signal frame substrate 700 shown in FIG. 8. With apertures 901 aligned with apertures 701, die substrate 312 can be connected to signal frame substrate 700. For example, a side wall of die substrate 312 can be soldered to bent signal lead 604. This connection creates the electrical path between diode 308 (see, FIG. 3a-5) and collector c of IGBT 905. Gate 912 can be connected to gate driver 306 via a signal lead. For example, a wire bond and/or other conductor (e.g., a flat flexible cable) can be added to connect gate 912 to a signal lead of signal frame substrate 700, which in turn is also connected to an output lead of gate driver 306.

Figure 11A:
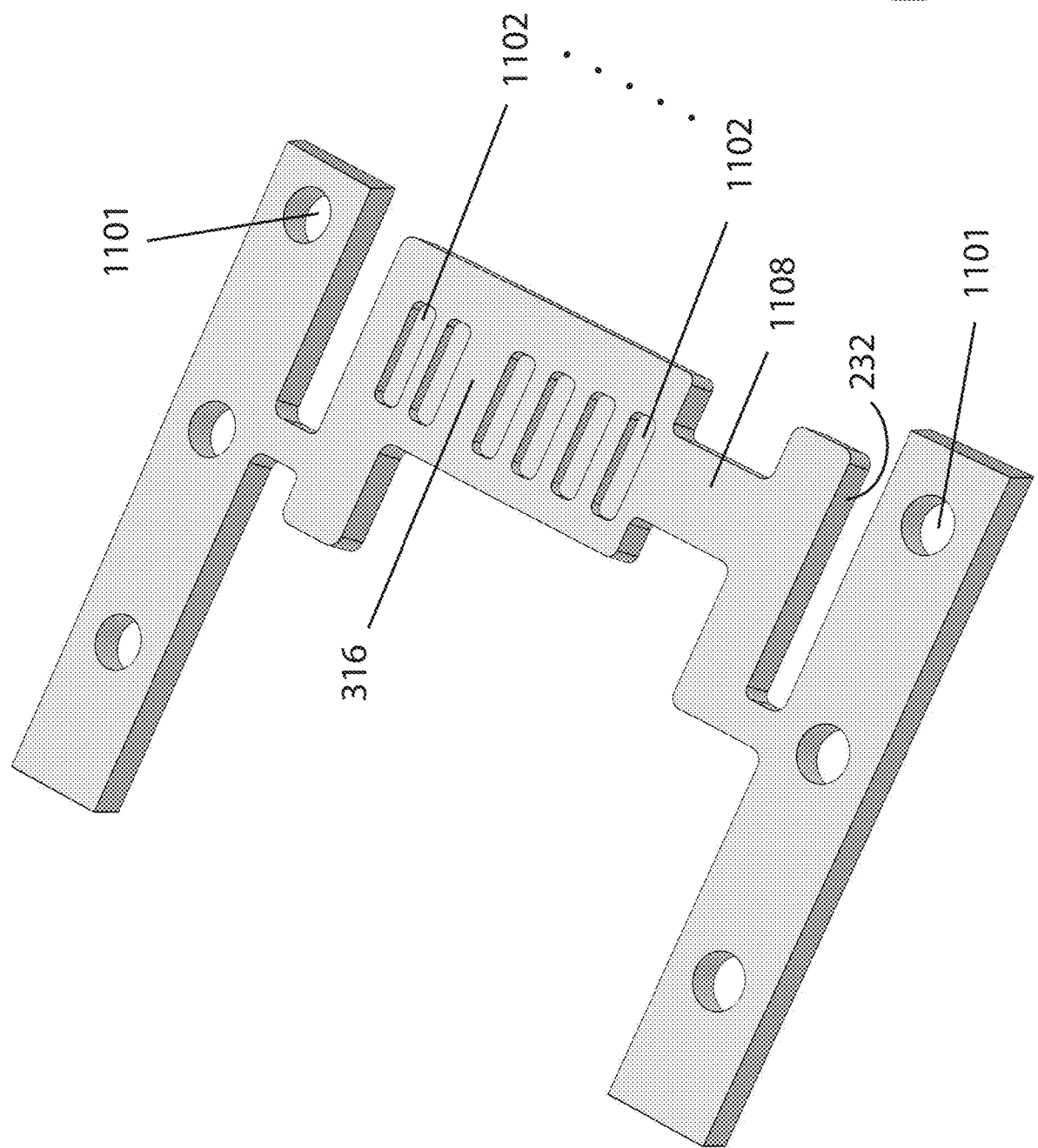
FIGS. 11*a* and 11*b* are isometric and reverse isometric views of an example die clip.
Figure 11B:
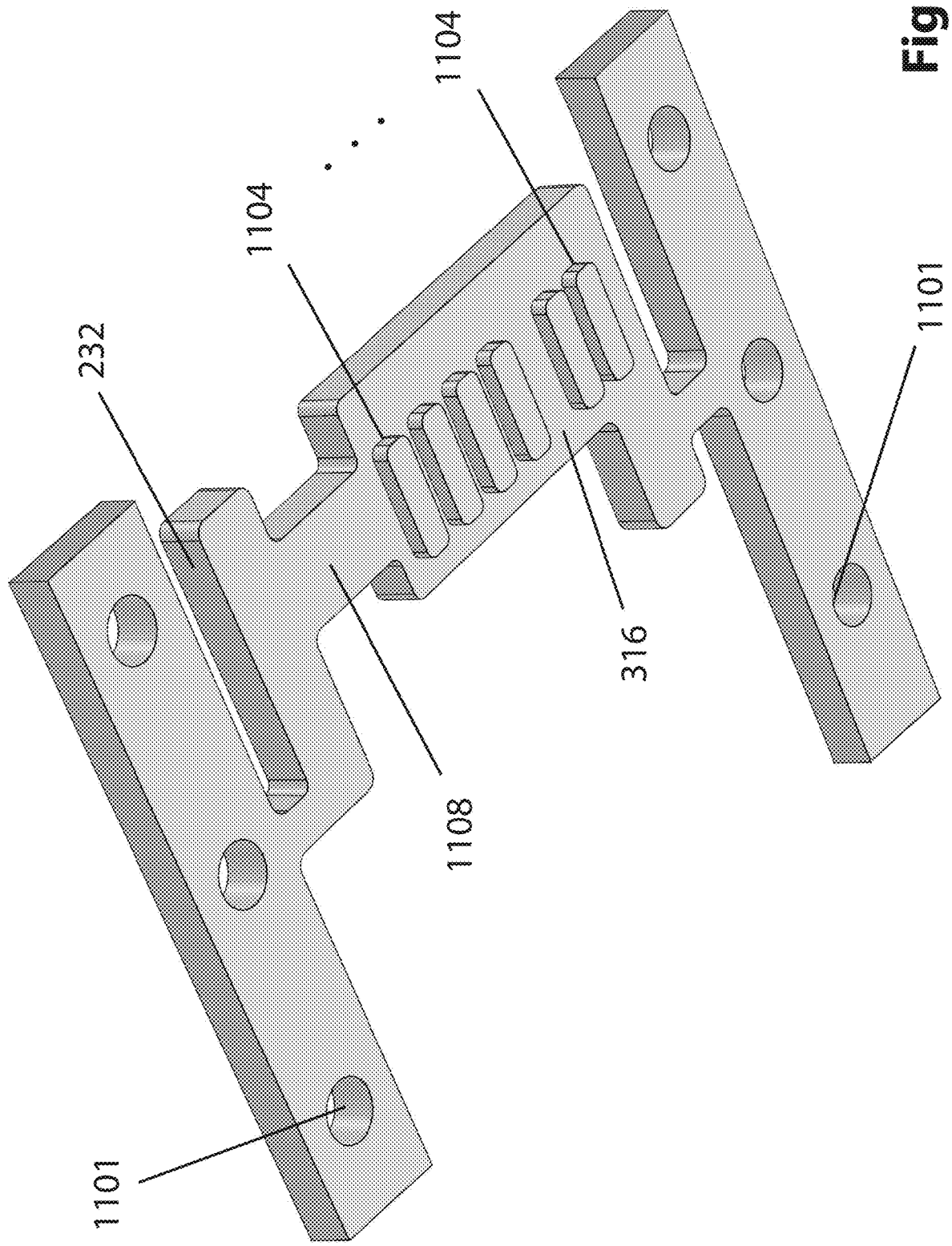

FIGS. 11a and 11b are isometric and reverse isometric views of an example die clip 316 formed from a thin (e.g., 0.1 mm-4.0 mm) sheet of copper. Die clip 316 is connected between frames that include alignment apertures 1101. Die clip 316 includes pedestals 1104 that can be formed using a punch press or similar tool. In one embodiment, the recesses 1102 remaining by the creation of the 1104 pedestals, can be filled with a thermally and electrically conductive material. Die clip 316 includes a surface that forms die clip terminal 232. Further die clip 316 includes a narrowed portion 1108 positioned between recesses 1102 and terminal 232. I_Sense circuit can be positioned over narrowed portion 1108 for measuring current flow to or from a switch 304 when it is connected to die clip 316.

With continuing reference to FIGS. 10, 11a, and 11b, the end surfaces of pedestals 1104 can be sintered to respective emitter terminals 906 and anode terminal 904. The end surfaces of pedestals 1104 should be flat with a shape and size that is substantially similar to, but slightly smaller than the surfaces of emitter terminals 906. This ensures the pedestals 1104 do not contact and possibly damage IGBT 905 outside the areas occupied by emitter terminals 906. The size and shape of the end surfaces of pedestals 1104 also reduces the chance that unwanted hot spots are created due to concentrated current flow through an a narrowed point connection between pedestal 1104 and emitter terminal 906. When sintered together the pedestals create an air gap between IGBT 905 and die clip 316. When alternating current flows through the die clip, it creates an electromagnetic field that may adversely affect operation of IGBT 905. The air gap reduces adverse electromagnetic effects on the operation of IGBT 905.

Figure 11C:
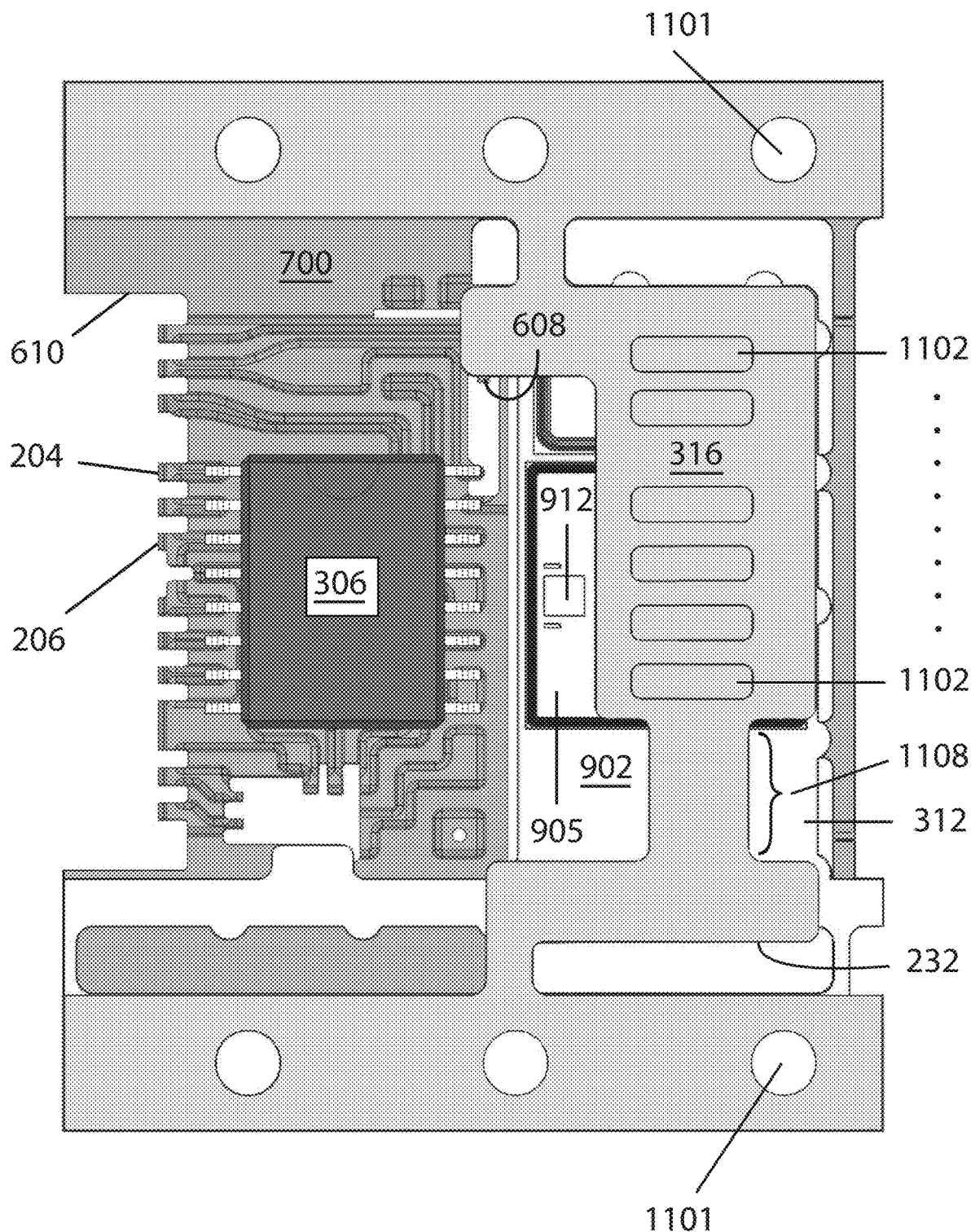
FIGS. 11*c* and 11*d* are top and bottom views of die clip shown in FIGS. 11*a* and 11*b* when aligned with die substrate and signal frame substrate of FIG. 10.
Figure 11D:
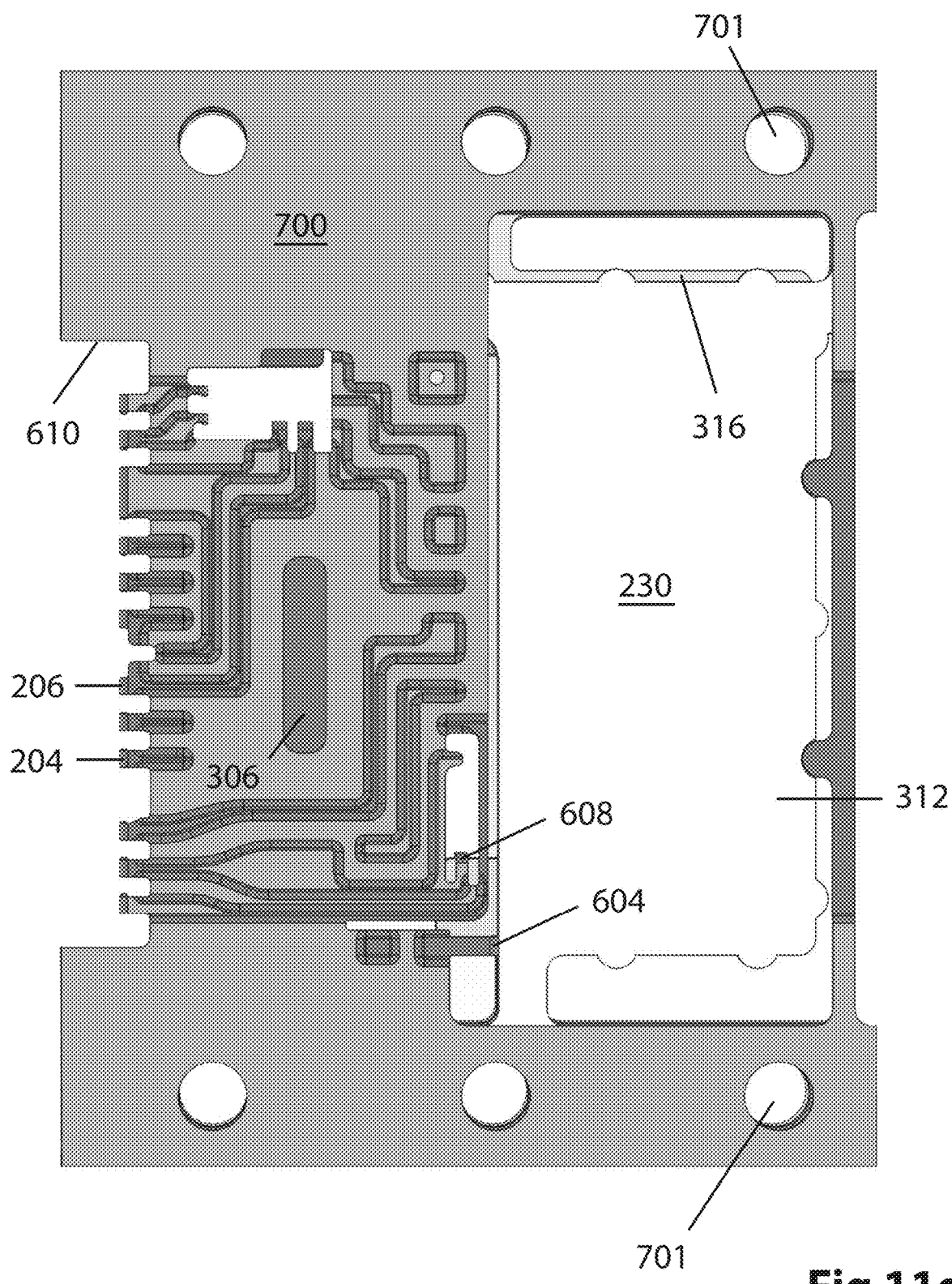
Figure 11E:
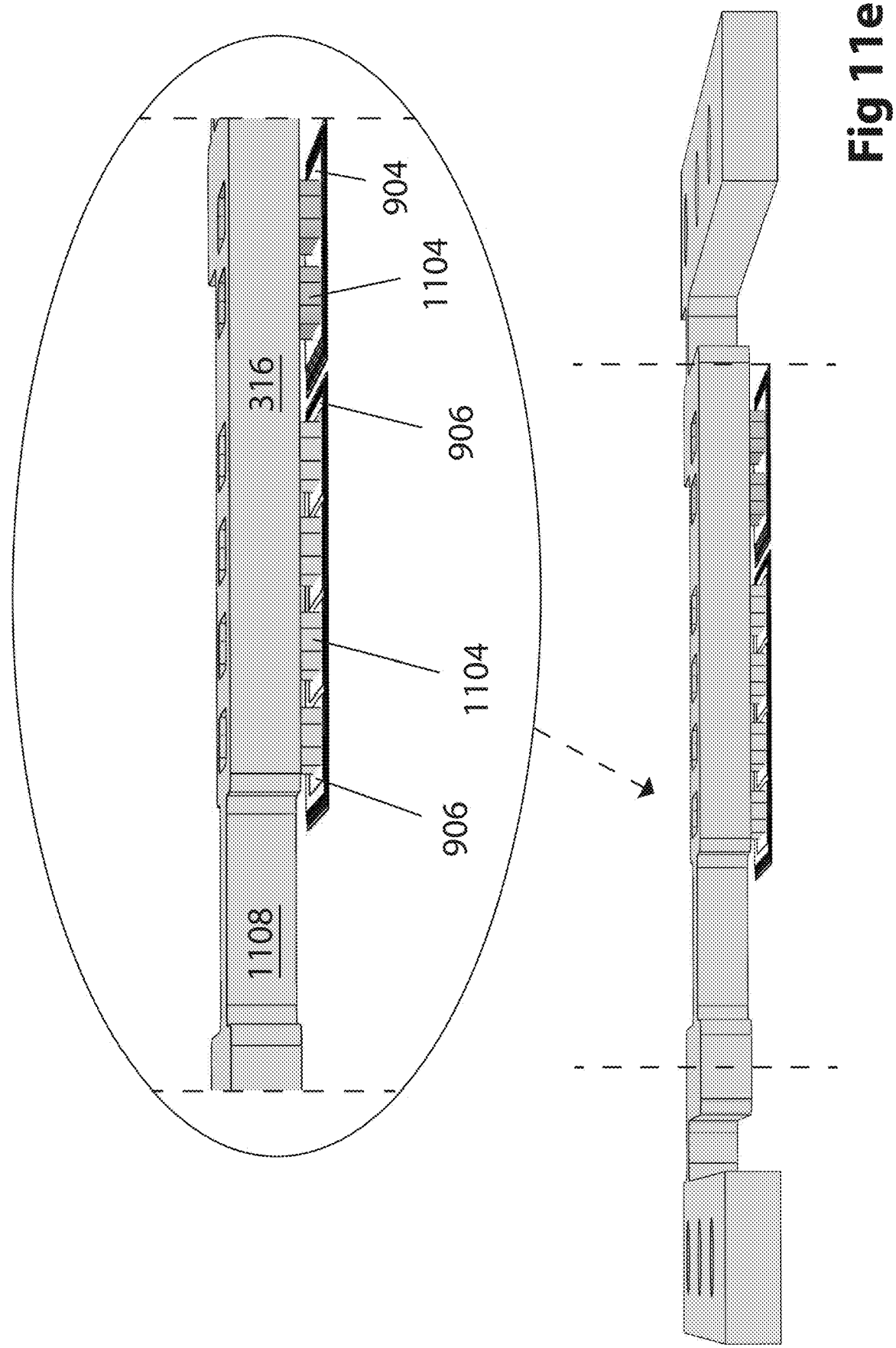
FIG. 11*e* is isometric view partially showing the structure of FIGS. 11*c* and 11*d* when viewed from the side.

FIGS. 11c and 11d show top and bottom views of die clip 316, die substrate 312 and signal frame substrate 700 in alignment. More particularly, apertures 1101 are aligned with respective die substrate apertures 901 and signal frame substrate apertures 701. While aligned, the end surfaces of pedestals 1104 of die clip 316 can be sintered to respective terminals of the switch (e.g., emitter terminals 906 of IGBT 905 and anode terminal 904 of diode 904). FIG. 11e is partial isometric view showing anode 904 and emitter terminals 906 sintered to ends of pedestals 1104. Additionally die clip 316 can be connected to signal frame substrate 700. For example, a side surface of die clip 312 can be soldered to signal lead 608.

Figure 11F:
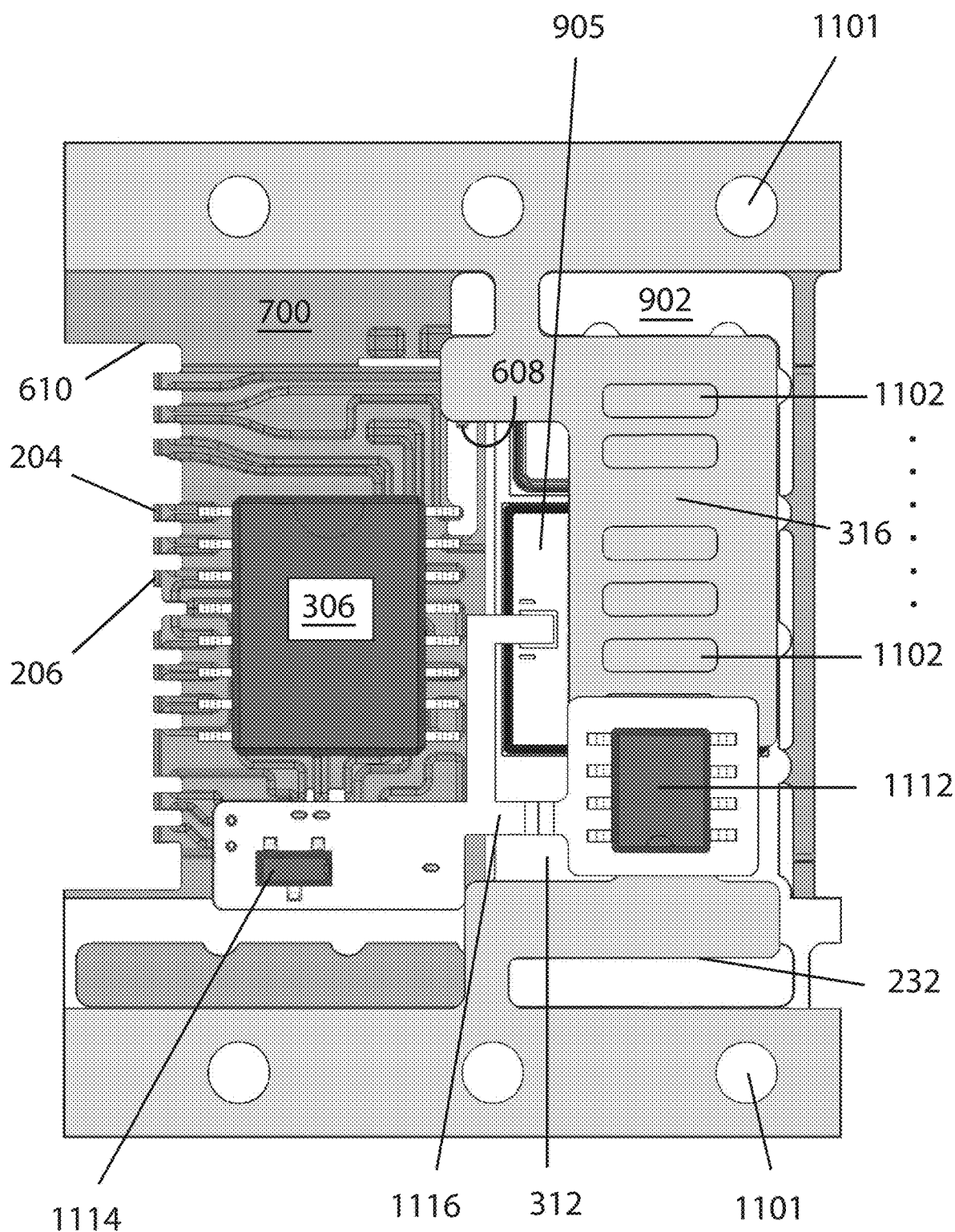
FIGS. 11*f* and 11*g* are top and isometric views of the structure shown in FIGS. 11*c* and 11*d* with additional components.
Figure 11G:
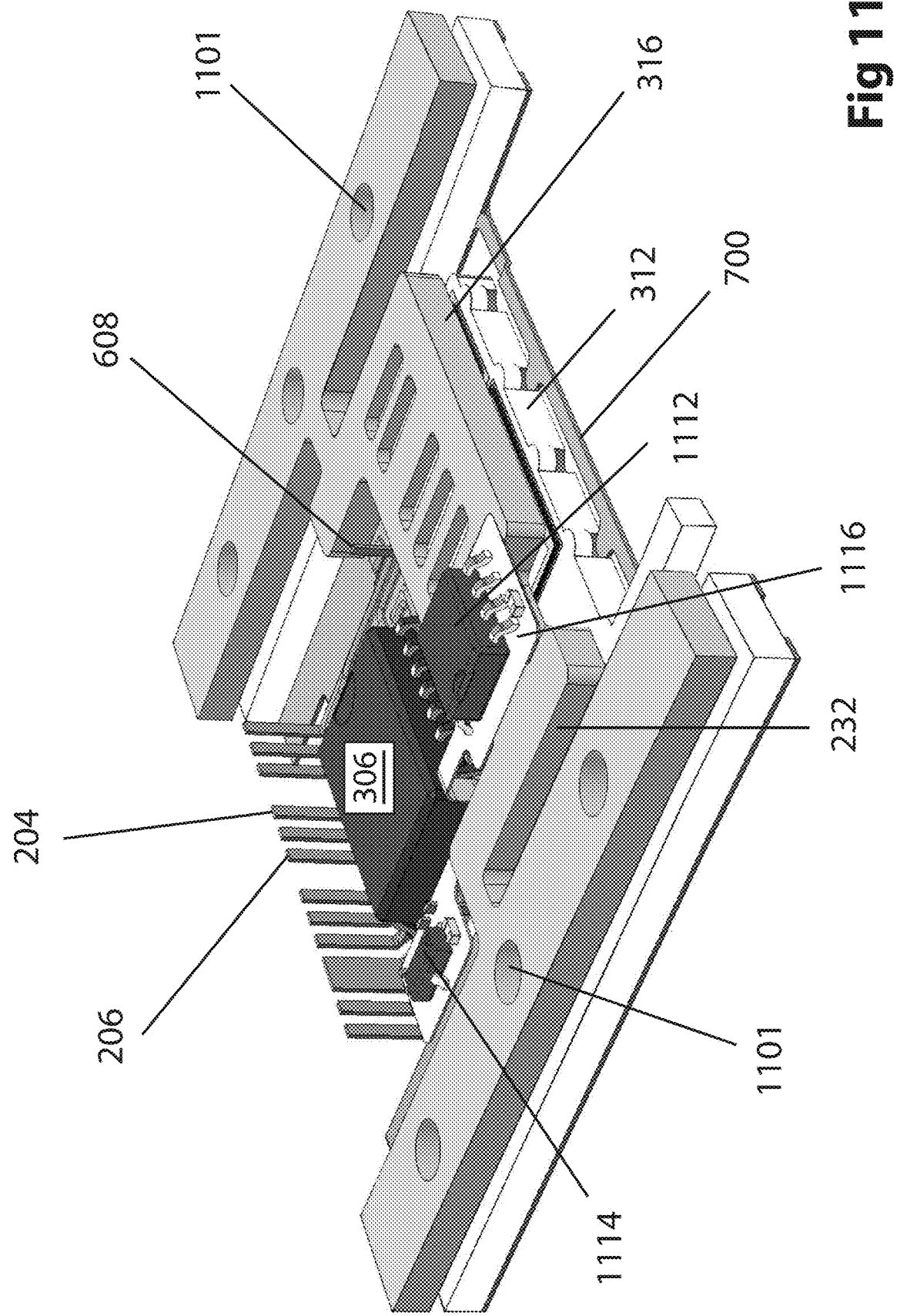

The T_Sense circuit and the I_Sense circuit of FIG. 3a-1 can be added to the partially constructed switch module 300 shown in FIG. 11c. A FFC can be used for connecting the T_Sense and I_Sense circuits to signal leads of the signal frame substrate. The FFC can also be used to connect an output of the gate driver 306 to the gate of the switch via a signal lead. FIG. 11f shows partially constructed switch module 300 with packaged I_sense circuit 1112 and packaged T_sense circuit 1114 mounted on FFC 1116. One portion of FFC 1116 is positioned over gate 912. I_sense circuit 1112 is positioned on another portion of FFC 1116, which in turn is positioned over narrowed section 1108 of die clip 312. FIG. 11g is an isometric view of the switch module 300 shown in FIG. 11f.

FFC 1116 includes conductive traces extending between first and second terminals. First trace terminals can be soldered to bent signal leads, respectively, of signal frame substrate 700. Second trace terminals can be soldered to respective leads of packaged I_Sense circuit 1112 and packaged T_sense circuit 1114. In addition to transmitting output analog signals Vi and Vt from I_Sense circuit 1112 and T_sense circuit 1114, respectively, FFC 1116 can provide supply and ground voltages to these components.

FFC 1116 includes at least one trace, a second terminal of which is soldered to gate 912 of IGBT 905. This FFC trace can transmit gate control signal Vg between gate driver 306 and gate 912. The embodiment shown presumes gate 912 is compatible with solder bonding, and as a result gate 912 is soldered to one or more traces of FFC 1116. In an alternative embodiment, gate 912 is wire bonded to a trace terminal of FFC 1116, which extends to but does not cover gate 912. Other methods are contemplated for connecting gate 912 to a signal lead that is also connected to gate driver 306.

Figure 12A:
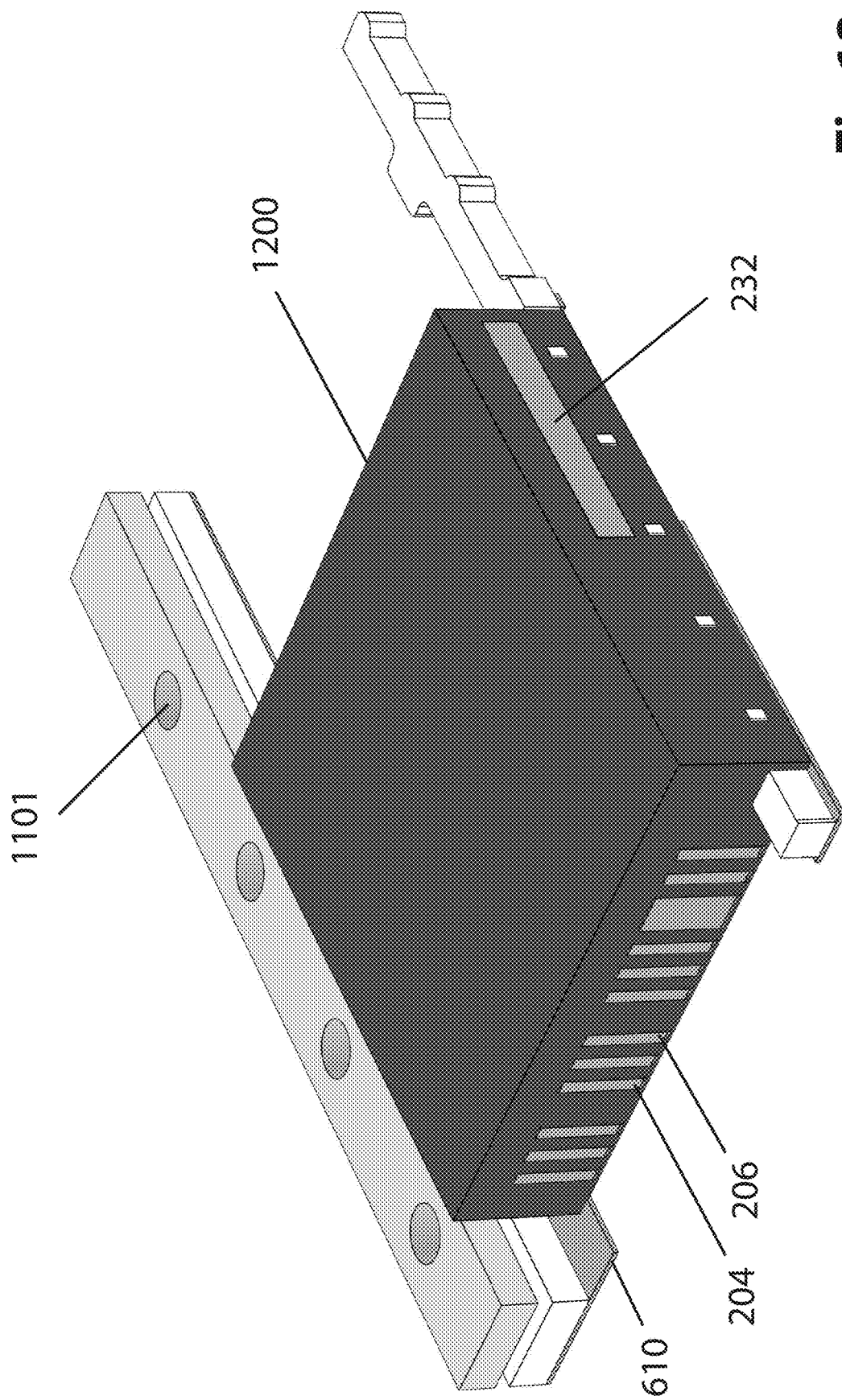
FIGS. 12*a* and 12*b* are isometric and revere isometric views of the structure shown in FIGS. 11*f* and 11*g* with a molded plastic body.
Figure 12B:
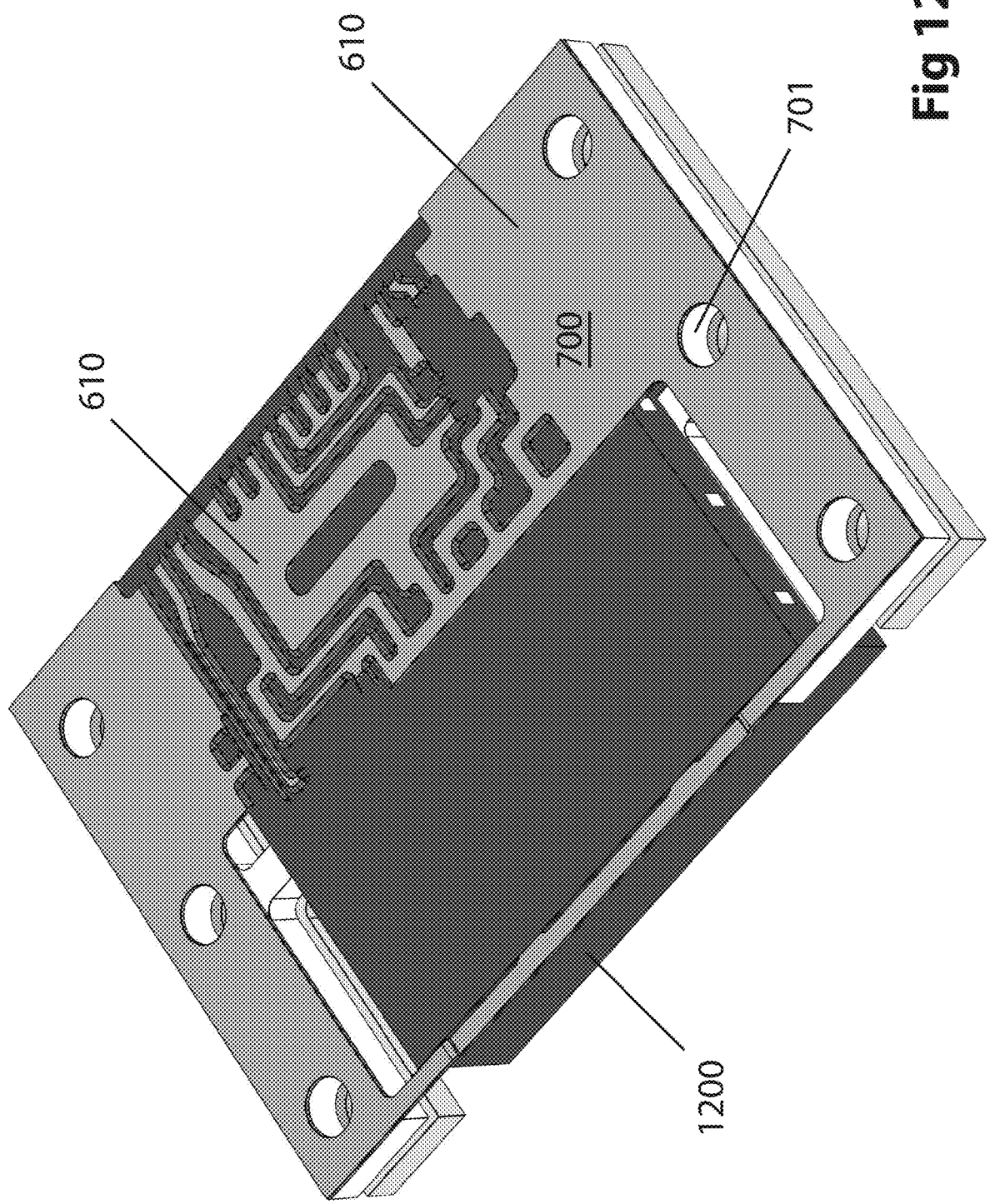

The switch module 300 shown in FIG. 11f can be placed in a mold. Then liquid plastic (e.g., epoxy resin) poured into the mold. Once hardened, the liquid plastic forms a plastic body. The switch module 300 and hardened plastic body are removed from the mold and trimmed. FIG. 12a is an isometric view of the switch module 300 with molded plastic body 1200 after removal from the mold. In an alternative embodiment, transfer molding could be used to create the plastic body. In either embodiment bent signal leads of signal frame substrate 700, including signal leads 204 and 206, are exposed through the front of molded plastic body 1200. FIG. 12a also shows die clip terminal 232, which is exposed through the side of molded plastic body 1200. FIG. 12b is a reverse isometric view, which shows negative layer 610 of signal frame substrate 700. Negative layer 610 and a portion of molded plastic body 1200 can be trimmed away using any one of many different trimming tools or techniques (e.g., grinding). The die substrate terminal 230 is exposed and signal leads are isolated by the trimming process. FIGS. 2a-1 and 2a-2 show the packaged switch after the trimming process.

Example Packaged Half Bridge 250

Figure 13A:
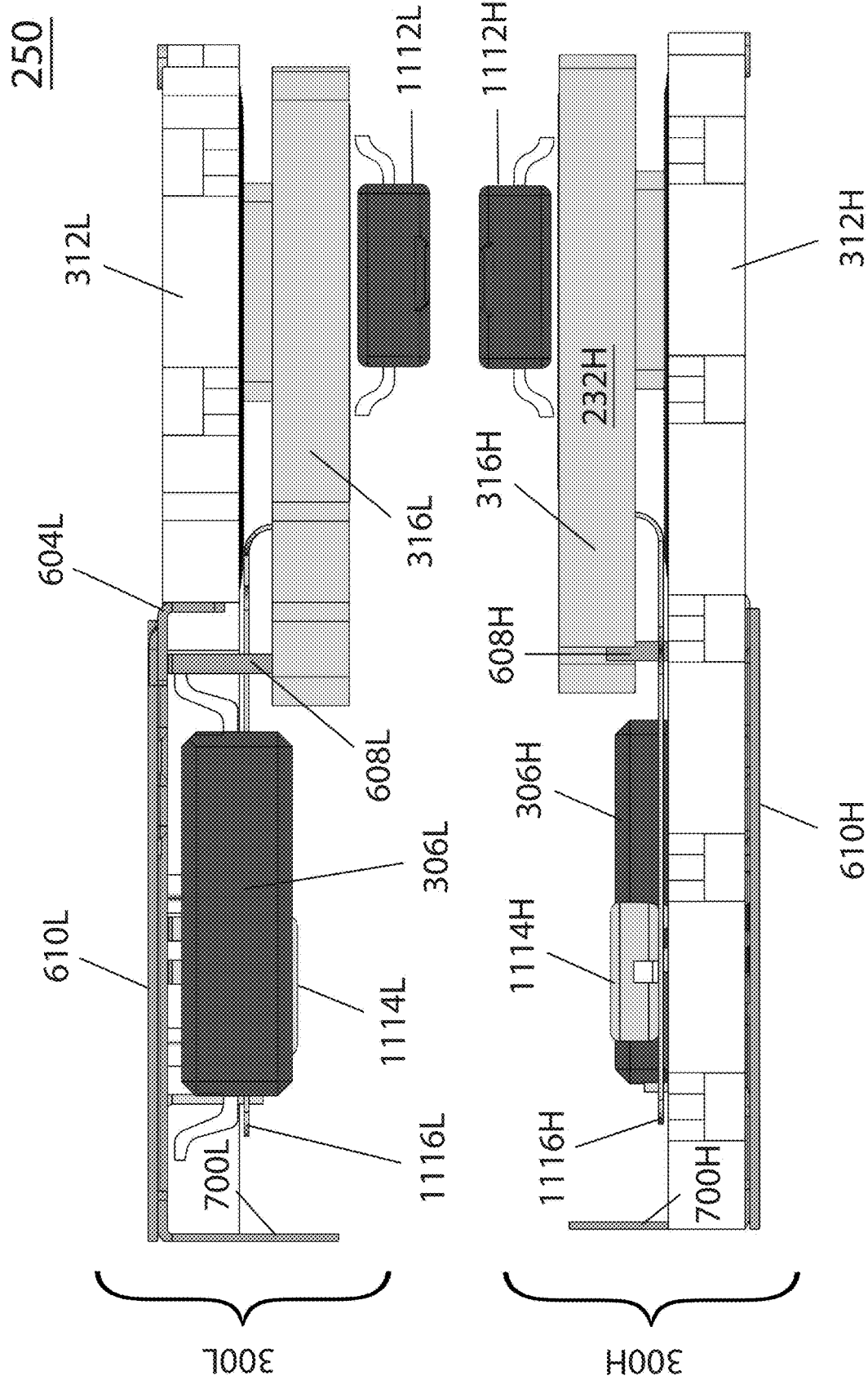

Switch modules like that shown in FIG. 11f can be stacked to create example packaged half bridge 250. FIGS. 13a and 13b are side and isometric views of two switch modules 300 shown in FIG. 11f. More particularly FIGS. 13a and 13b show a high-side switch module 300H, and low-side switch module 300L. Switch module 300H is flipped and positioned above switch module 300L inside a mold (not shown). Frames with apertures 701, 901, and 1101 are not shown in FIGS. 13a and 13b for ease of illustration. However, these apertures can be used to align the oppositely facing switch modules 300H and 300L while they are positioned inside the mold. Liquid plastic can be poured into the mold and hardened to form a plastic body. The oppositely faced switch modules 300H and 300L and hardened plastic body are removed from the mold and trimmed. Portions of the plastic body, and negative layers 610L and 610H can be removed using any one of many different trimming tools or techniques. The die substrate terminals 230H and 230L are exposed, and signal leads are isolated by the trimming process. Die substrate terminals 230H and 230L may protrude from the plastic surface of the top and bottom depending on the amount of plastic body that is trimmed away. FIGS. 2b-1 and 2b-2 show the packaged half bridge after the trimming process.

Example Compact Inverter System 408

Compact inverter systems include vertically stacked components. For example, FIG. 4d-1 shows compact inverter system 408 that includes packaged half bridges 250 and 253, heat sinks 419, phase bar extensions 411, and V+ bus bar 417, which are stacked one on top of the other.

Figure 14B:
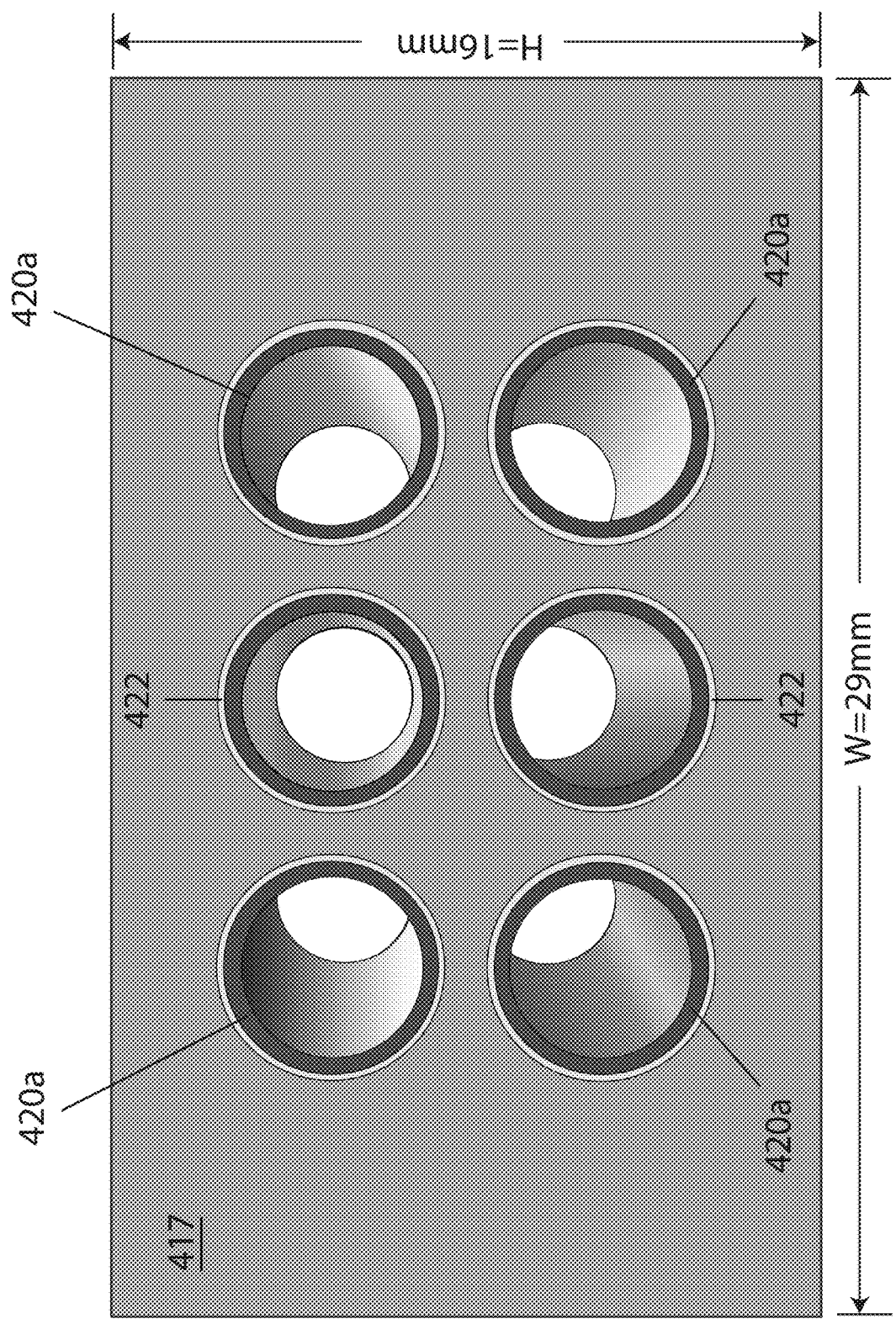

FIGS. 14a and 14b are isometric and end views, respectively, of an example V+ bus bar 417, which can be formed from a metal such as copper. V+ bus bar 417 conducts current between packaged half bridges and a battery. Although not shown, a metal cable can connect a V+ terminal of the battery to one or more terminal structures of V+ bus bar 417. The Width W and height H shown in end view 14b can vary depending on the embodiment. In the illustrated embodiment H=16 mm, and W=29 mm.

Pedestals on oppositely facing surfaces of V+ bus bar 417 receive packaged half bridges 250 and 253. FIGS. 14a and 14b show example pedestals 1402, which have substantially flat surfaces 1405 for engaging die substrate terminals 230 of packaged half bridges 250 and 253. Each pedestal 1402 can be positioned between short, oppositely-facing stop walls 1403 that can engage left and right sides of packaged half bridge 250 or 253. Stop walls 1403 inhibit lateral movement of packaged half bridges 250 or 253 when they are received by the pedestals 1402. In the illustrated embodiment, pedestal surfaces 1405 extend fully between stop walls 1403. In an alternative embodiment, the pedestals 1402 may have flat surfaces that are shaped similar to, but smaller than die substrate terminals 230 so that the pedestals can engage die substrate terminals that are flush with or recessed below the plastic case surfaces of packaged half bridges. For purposes of explaining example inverter system 408, packaged half bridges 250 and 253 are presumed to have die substrate terminals 230 that protrude slightly from their plastic case surfaces. Moreover die substrate terminals 230 are presumed to be directly connected to pedestal surfaces 1405, it being understood die substrate terminals 230 can be indirectly connected to pedestal surfaces 1405 via a thermally and electrically conductive material such as solder or grease in other embodiments. Air gaps are created between signal leads (see, e.g., signal leads of FIGS. 2b-1) of the packaged half bridges and V+ bus bar 417 when die substrate terminals 230 are received by surfaces 1405 of pedestals 1402.

With reference to FIG. 14b, V+ bus bar 417 includes channels that receive pipes 420a shown in FIG. 4a-3. Other pipes, including as pipes 420b-420d shown in FIGS. 4a-4-4a-6, respectively, can be used in alternative embodiments. As noted earlier the outer cylindrical surface of each pipe 420a is coated with a thin layer 422 of dielectric material such as aluminum oxide. The dielectric layer 422 electrically insulates fluid in pipe 420a from V+ bus bar 417. The dielectric layer 422 conducts substantial heat between the fluid and V+ bus bar 417.

With continuing reference to FIGS. 4d-1 and 14a, FIG. 15a is an isometric view of V+ bus bar 417 with packaged half bridges 250 and 253. Although not shown in this figure, die substrates 230H and 230L of packaged half bridges 250 and 253, respectively, are in direct contact with surfaces 1405 of respective pedestals 1402 on opposite sides of V+ bus bar 417. FIG. 15b is a side view, which reveals small air gaps between V+ bus bar 417 and signal leads (see, e.g., signal leads of FIGS. 2b-1) of packaged half bridges 250 and 253. The partial air gaps separate V+ bus bar 417 and signal leads on the bottom and top surfaces of packaged half bridges 250 and 253, respectively. The length L shown in side view of FIG. 15b can vary depending on the embodiment. In the illustrated embodiment L=200 mm.

With continuing reference to FIG. 4d-1, phase bars PBa-PBc of inverter system 408 conduct current between windings Wa-We, respectively, and packaged half bridges in phases a-c, respectively. Each phase bar includes metal extensions 411-1 and 411-2 connected between heat sinks 419-1 and 419-2, respectively, and die substrate terminals 230L and 230H, respectively, of packaged half bridges 250 and 253, respectively. In one embodiment, each phase bar PB may include a C-shaped clamp and a metal cable. The clamp includes metal extensions 411-1 and 411-2 and a terminal structure. One end of the cable is connected to the terminal structure, while the other end of the cable is connected to a wire winding.

Figure 16A:
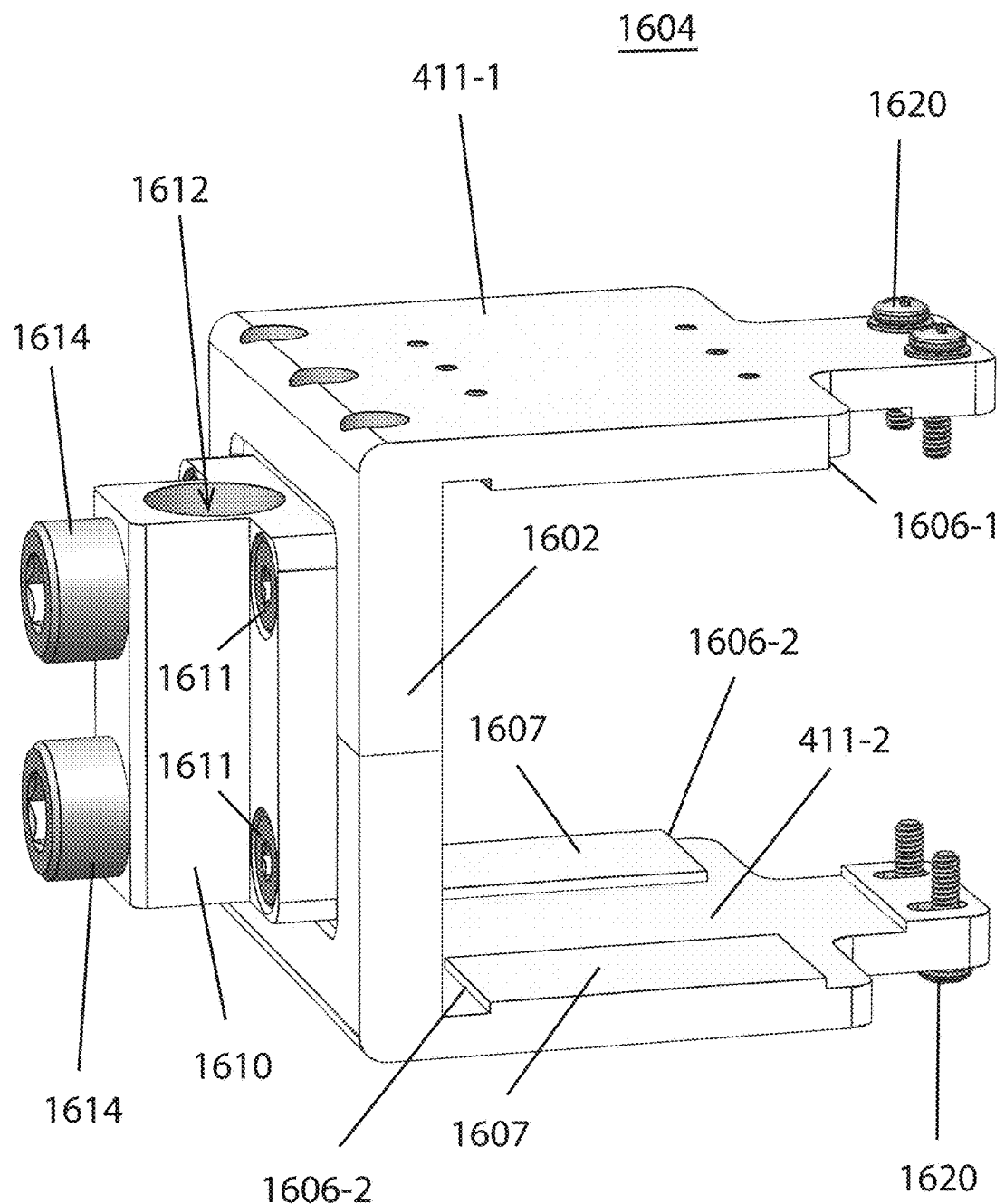
FIG. 16*a* is an isometric view of an example clamp that can be employed in the compact inverter system of FIG. 4*d*-1.
Figure 16B:
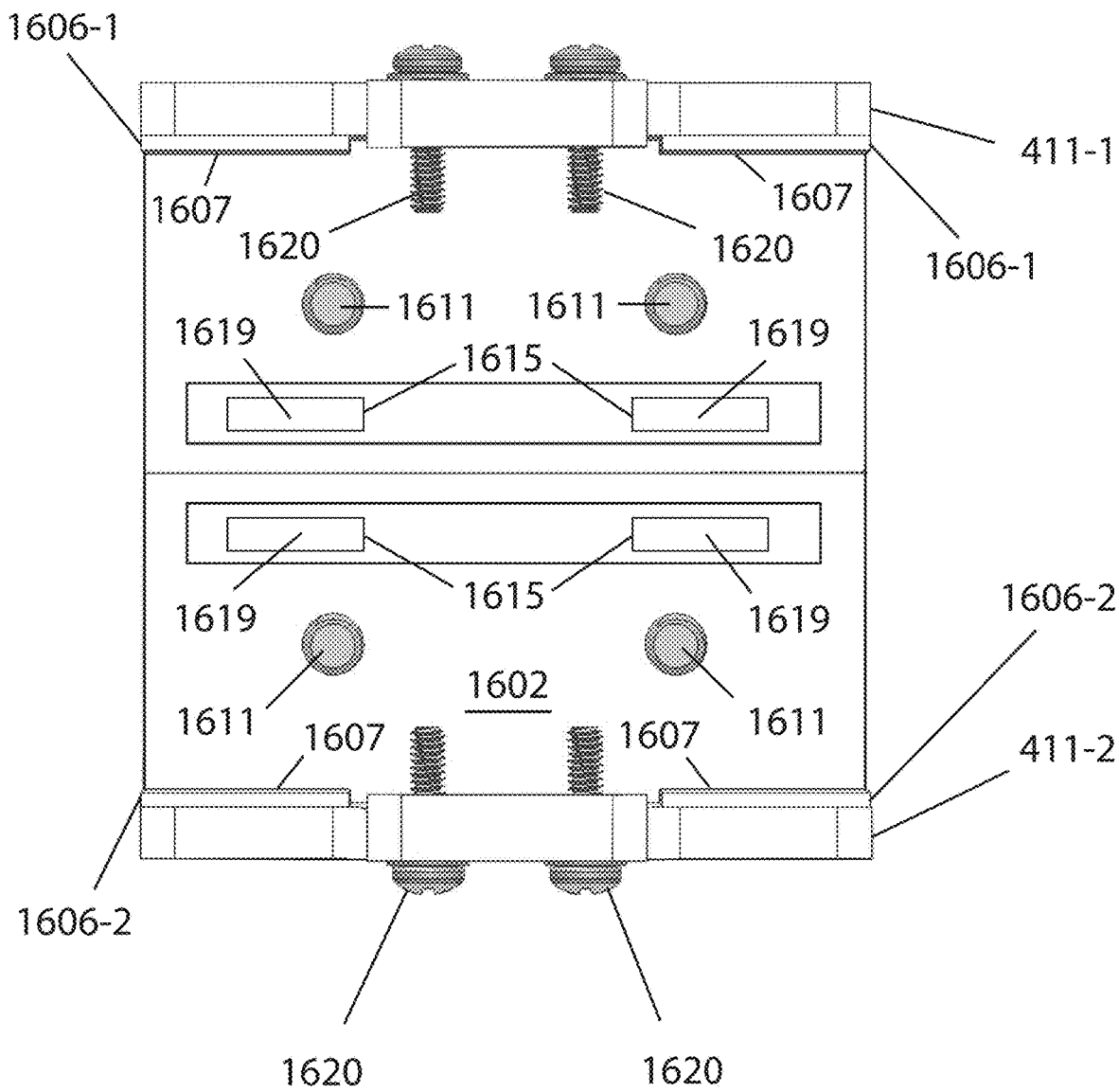
FIGS. 16*b* and 16*c* are end views of the clamp shown in FIG. 16*a*.
Figure 16C:
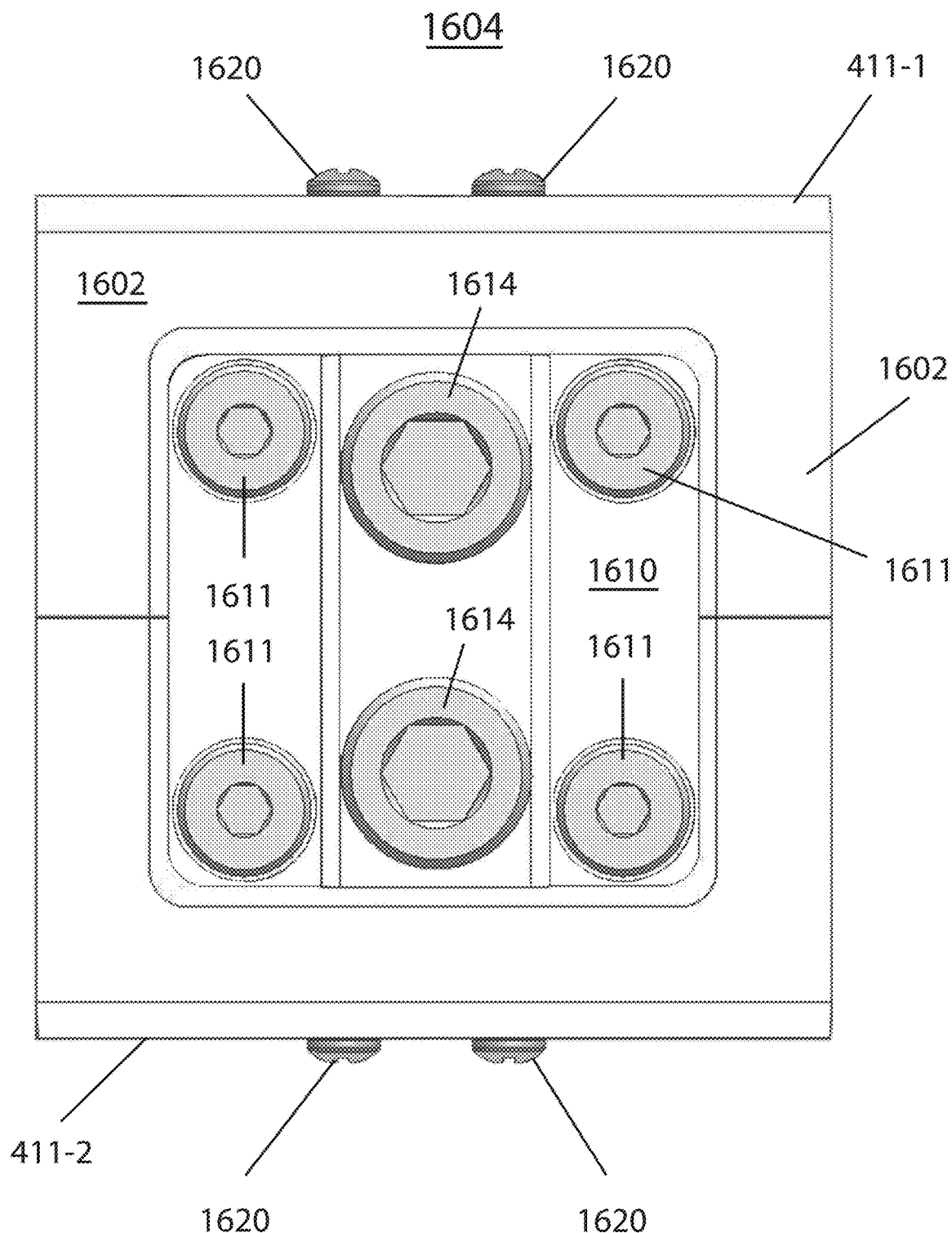

FIGS. 16a, 16b and 16c are isometric and end views of an example C-shaped clamp 1604. Extensions 411-1 and 411-2 extend from a common base 1602 as shown in FIG. 16a. Each extension 411 includes a pair of pedestals 1606 with surfaces 1607 configured to engage corresponding die substrate terminals 230L and 230H of packaged half bridges 250 and 253, respectively. In an alternative embodiment, pedestals 1606 may have flat surfaces 1607 that are shaped similar to, but smaller than die substrate terminals so that the pedestal surfaces can engage die substrate terminals that are flush with or slightly recessed below the plastic surfaces of packaged half bridges. Air gaps are created between clamp 1604 and signal leads (see, e.g., signal leads of FIGS. 2b-1) of packaged half bridges 250 and 253 and when die substrate terminals 230 are received by surfaces 1607 of pedestals 1606

With continuing reference to FIG. 16a, clamp 1604 also includes a metal terminal structure 1610 that is mechanically connected to base 1602 by fasteners 1611 (e.g. threaded bolts). Fasteners 1611 secure electrical connection between the base 1602 and terminal structure 1610. Terminal structure 1610 includes a channel 1612, which is configured to receive one end of the aforementioned metal cable. Fasteners 1614 extend through apertures of terminal structure 1610, and are configured to press the cable against the wall of channel 1612 in order to secure electrical connection therebetween.

With reference to FIG. 16b, clamp 1604 includes terminals 1615 that are connected to and extend from base 1602. The terminals have substantially flat end surfaces 1619 that can engage die clip terminals 232H and 232L of packaged half bridges 250 and 253, respectively, and establish electrical connection therebetween. Clamp 1604 conducts substantial current between the cable to which it is attached and packaged half bridges 250 and 253 via terminals 1615.

Clamp 1604 includes fasteners (e.g. threaded bolts) 1620 at the lateral ends of extensions 411. These fasteners extend through apertures of extensions 411 and are configured to secure clamp 1604 to a dielectric block (not shown). With the dielectric block positioned between the ends of extensions 411 and fasteners 1620 tightened, the clamp presses die substrate terminals 230 against pedestal surfaces 1405 and 1607 of V+ bus bar 417 and clamp 1604, respectively.

Figure 17A:
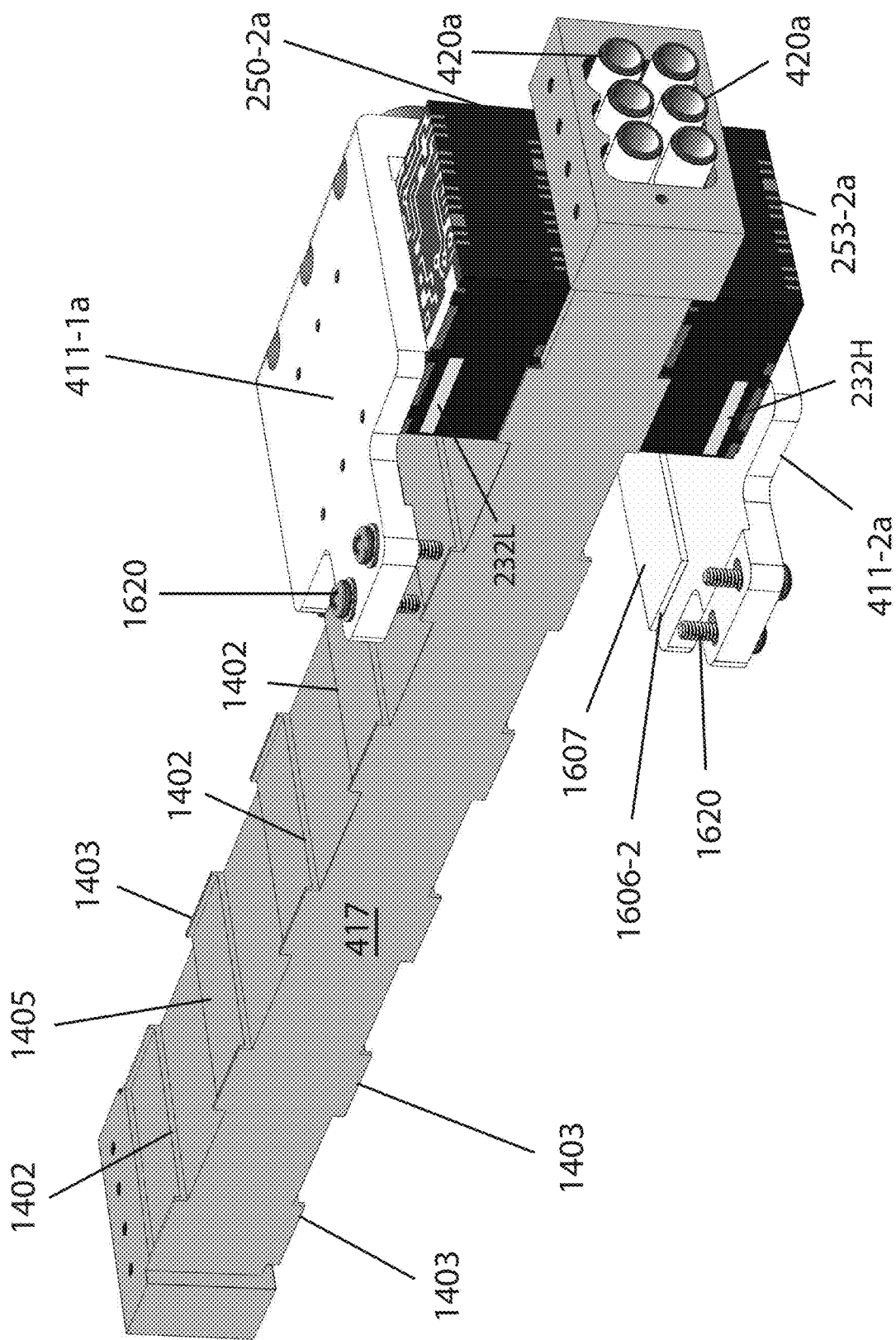

FIG. 17a shows packaged half bridge 250-2, V+ bus bar 417, and packaged half bridge 253-2 positioned between extensions 411-1 and 411-2 of clamp 1604. Although not shown in this figure, die substrate terminals 230L and 230H of packaged half bridge 250 are releasably connected to respective pedestal surfaces 1607 and 1405 of clamp 1604 and V+ bus bar 417, respectively, and die substrate terminals 230L and 230H of packaged half bridge 253 are releasably connected to respective surfaces of pedestal surfaces 1405 and 1607 of V+ bus bar 417 and clamp 1604, respectively. With fasteners 1620 engaging the above-mentioned dielectric block (not shown), clamp 1604 maintains the die substrate terminals and pedestal surfaces in firm contact with each other. FIG. 17b is an end view of the assembly shown in FIG. 17a. Although not clearly shown in this figure, the end surfaces 1619 of terminals 1615 engage respective die clip terminals 232H and 232L of packaged half bridges 250 and 253.

FIG. 4d-1 shows heat sinks 419-1 and 419-2 connected to extensions 411-1 and 411-2, respectively, in each phase. With continuing reference to FIG. 4d-1, FIGS. 18a-18c show isometric, side and end views, respectively, of the assembly shown in FIGS. 17a and 17b with example heat sinks 419-1 and 419-2 added thereto. The heat sinks 419-1 and 419-2 are substantially similar in this embodiment. Each of these heat sinks has channels that receive pipes such as pipes 420a. Heat sinks 419-1 and 419-2 are releasably connected to clamp 1604. More particularly, fasteners (e.g., threaded bolts, not shown) extend through apertures and fasten heat sinks 419-1 and 419-2 to clamp 1604. Surfaces of heat sinks 419-1 and 419-2 and clamp 1604 are maintained in firm connection by these fasteners. The connection enables heat transfer from packaged half bridges 250-2 and 253-2 to heat sinks 419-1 and 419-2, respectively, via extensions 411-1 and 411-2, respectively, of clamp 1604. In another embodiment solder, sintering, or thermal grease be used between heat sinks 419-1 and 419-2 and clamp extensions 411-1 and 411-2, respectively.

Figure 18C:
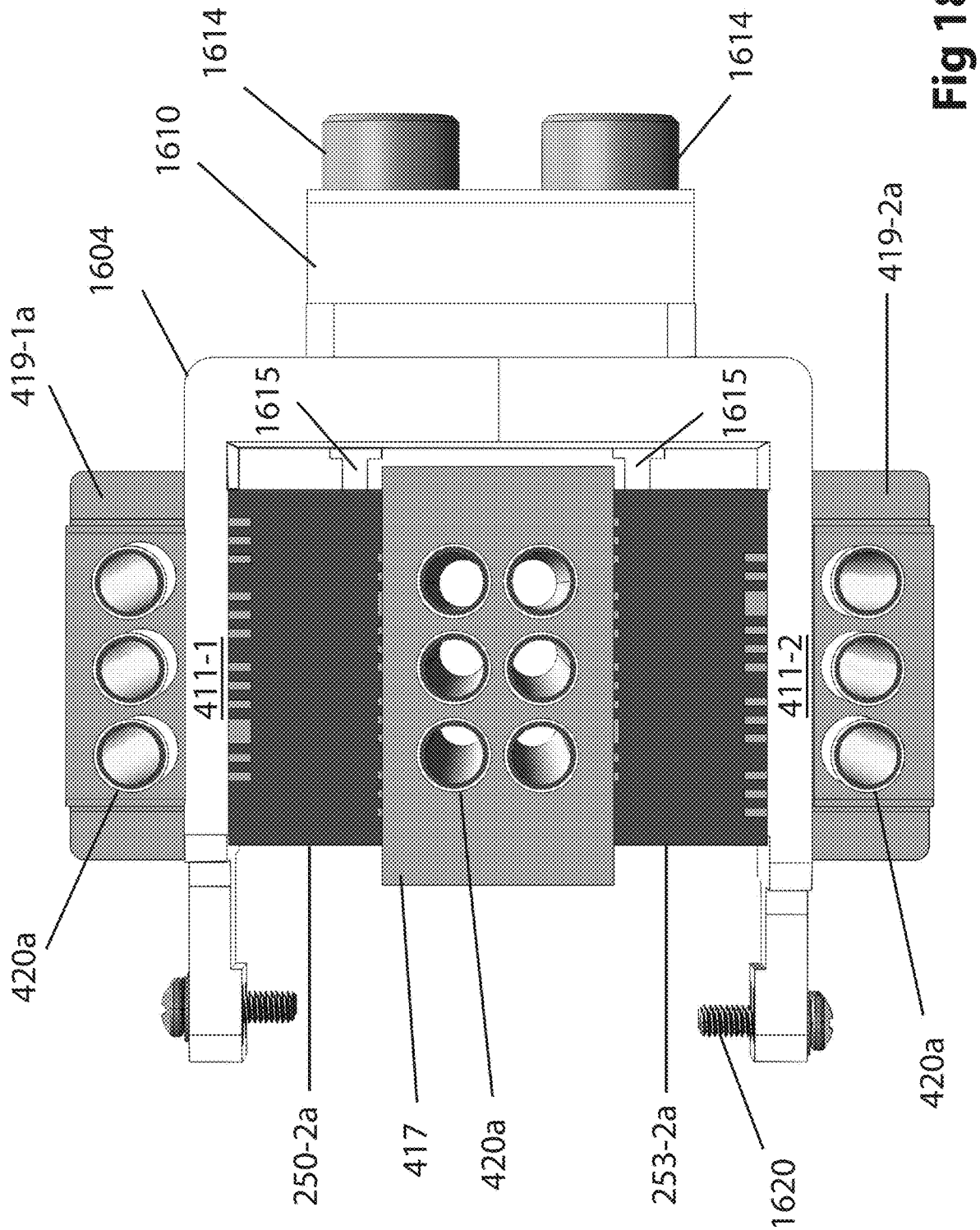
Figure 19A:
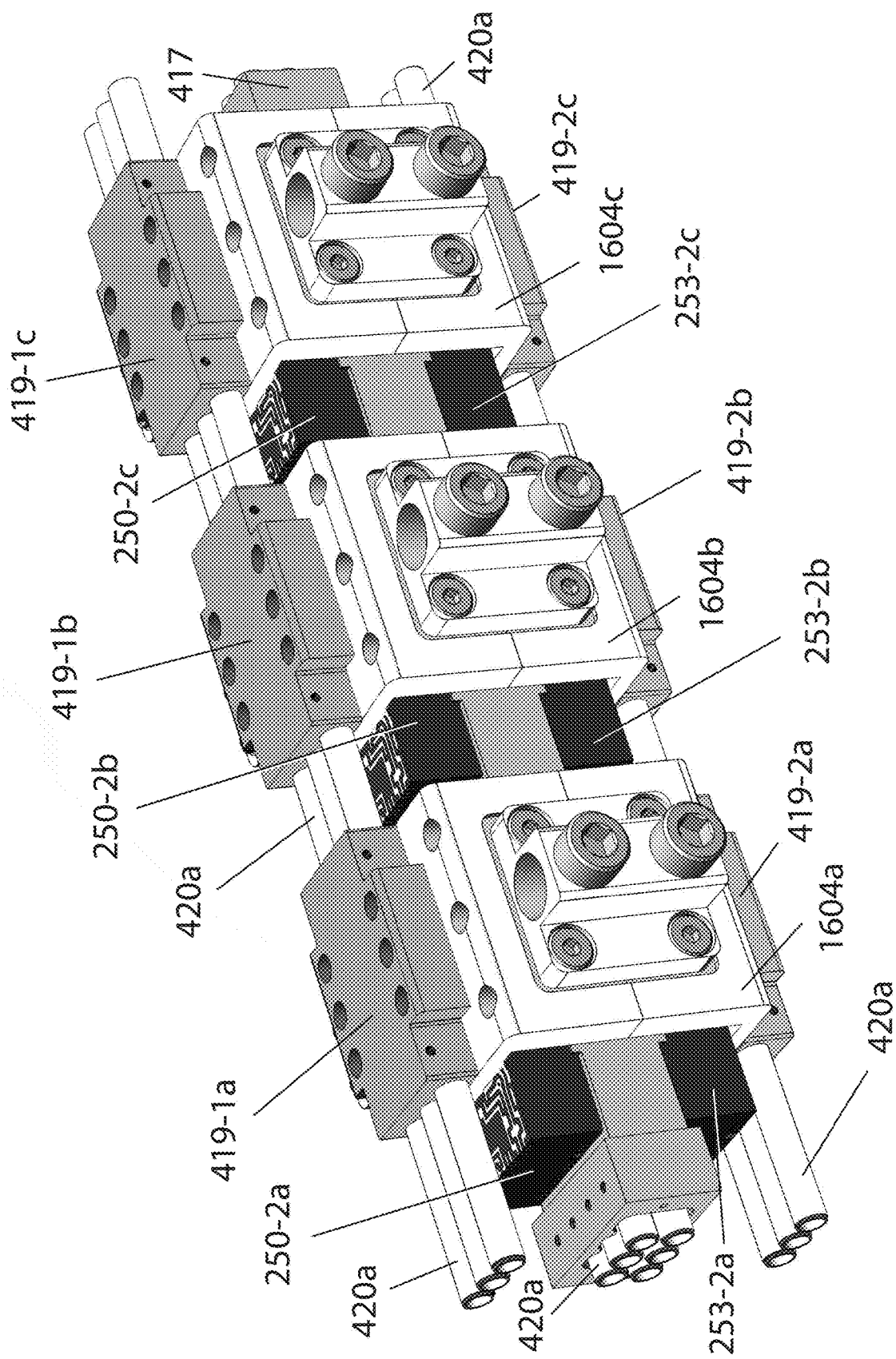
FIGS. 19*a* and 19*b* are isometric and side views of the structure shown with in FIGS. 18*a*-18*c* with additional clamps, half bridges, and heatsinks.
Figure 19B:
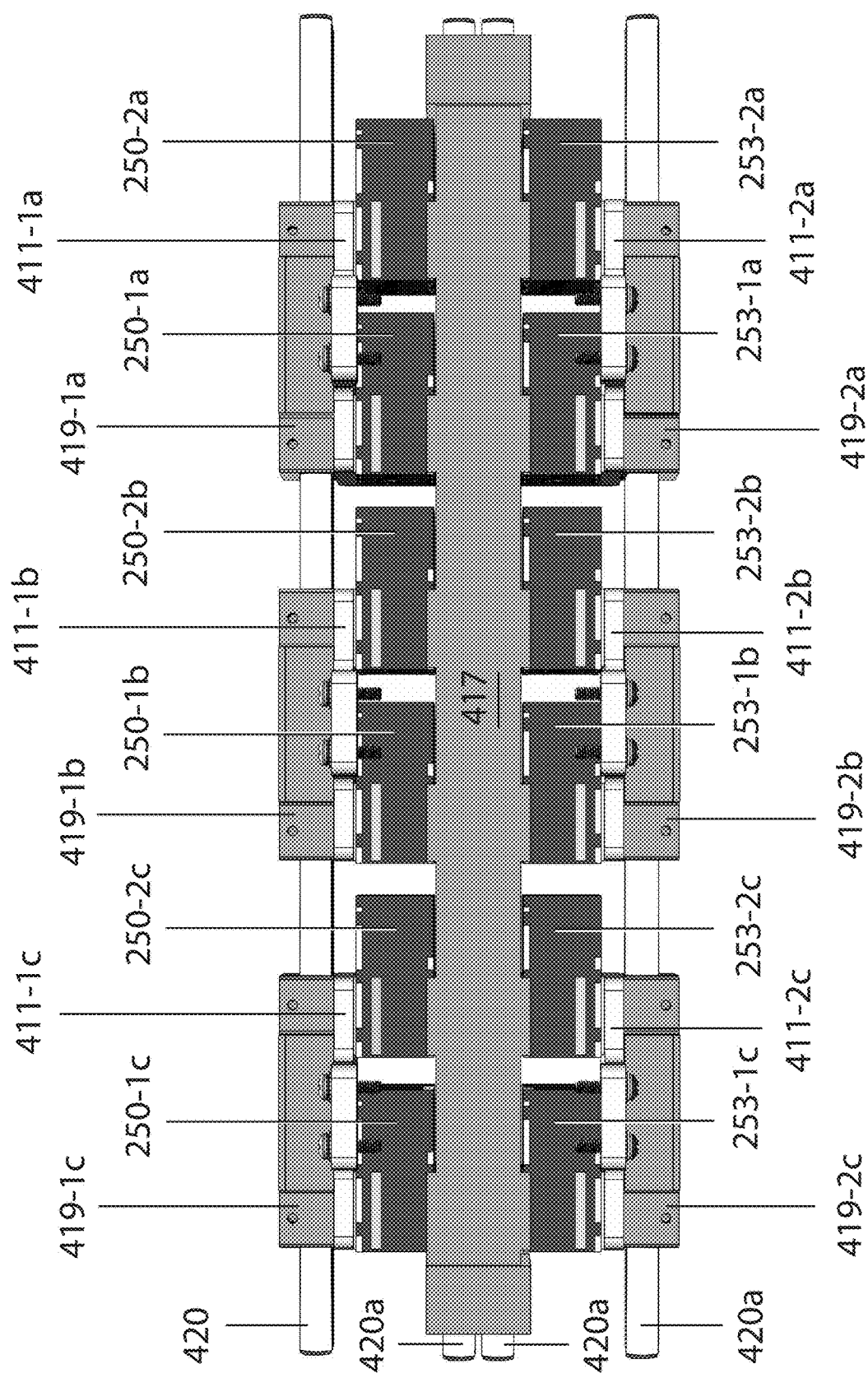

FIGS. 19a and 19b show isometric and side views of the structure of FIG. 18a-18c with additional, clamps 1604, heat sinks 419, and packaged half bridges 250 and 253. Heat sinks 419-1a-419-1c and 419-2a-419-2c are similar to each other. Likewise clamps 1604a-1604c are similar to each other and to that shown in FIGS. 16a-16c. Pipes 420a received by heat sinks 419-1a-419-1c move fluid through them. Pipes 420a received by heat sinks 419-1a-419-1c move fluid through them. Heat sinks 419-1a-419-1c are separated from each other to maintain electrical isolation.

Likewise sinks 419-2a-419-2c are separated from each other to maintain electrical isolation. Heat sinks 419-1a-419-1c, however, are thermally connected together by fluid in common pipes 420a. Likewise heat sinks 419-2a-419-2c are thermally connected together by fluid in common pipes 420a.

FIG. 4d-1 shows V− bus bar 407. Die clip terminals 232L of packaged bridges 250 and die clip terminals 232H packaged half bridges 253 are connected to V− bus bar 407. With continuing reference to FIG. 4d-1, FIGS. 20a, 20b, and 20c show isometric, top and end views of an example V− bus bar 407 formed from a metal such as copper. Fasteners (e.g., threaded bolts) 1616 mechanically connect terminal structures 1630 to ends of base 1618. The fasteners maintain electrical connection between terminal structures 1630 and base 1618. Terminal structures 1630 have channels 1617 that are configured to receive ends of metal cables (not shown). The other ends of these metal cables can be connected to a V− battery terminal (not shown). Fasteners 1622 (e.g., threaded bolts) extend through apertures of terminal structure 1630 and are configured to engage with and press the end of the received metal cable against the wall of channel 1617. Fasteners 1622 ensure electrical connection between the metal cable and V− bus bar 407. Openings 1634 are configured to receive PCBs, each with an X by Y array of decoupling capacitors mounted thereon. FIG. 20d is a side view of V-bus bar 407 with PCBs 1636 received in openings 1634. Each PCP 1636 includes an array of 3×13 capacitors 1638. In the depicted embodiment ceramic capacitors are mounted on PCBs 1636. In other embodiments, thin film or electrolytic capacitors can be used. In still other embodiments, a combination of capacitor types can be used. Ceramic capacitors are smaller than thin film capacitors, and use of ceramic capacitors can be advantageous in that they can reduce the overall volume occupied by example compact inverter system 408. Each decoupling capacitor 1638 can be contained in a package with a pair of leads, one of which is connected to V− bus bar 407, while the other is connected to V+ bus bar 417. Traces of PCBs 1636 enable the connections to V− bus bar 407 and the V+ bus bar 417. A ceramic capacitor 1638 can fail and create a short between its terminals, which in turn creates a short between V− bus bar 407 and V+ bus bar 417. PCB 1636 with ceramic capacitors 1638 should include one or more fused or fusible links, each of which is positioned to interrupt current flow between V− bus bar 407 and V+ bus bar 417 if a ceramic capacitor fails. The arrays of decoupling capacitors 1638 can provide a collective decoupling capacitance of 78 µF or more, it being understood that less decoupling capacitance can be used in other compact inverter system embodiments.

Decoupling capacitors 1638 reduce voltage spikes, ripple currents or other unwanted AC voltage components at the current terminals of switches (e.g., IGBTs) 304 in packaged half bridges 250 and 253. Conductors connected between switches and terminals of a battery, or conductors between switches and windings of an electric motor have parasitic inductance. Narrow and long conductors have more parasitic inductance than shorter and wider conductors. Parasitic inductance also increases with an increase in the current carried by the conductor. Parasitic inductance presents several risks to switches 304. In the process of turning off switches 304, for example, voltage spikes will occur at the current terminals of switches due to the sharp decrease of current. This voltage spike is due to the release of energy stored in the parasitic inductance of the conductor between the switch and the battery. Switch 304 could be subjected to a voltage spike that is outside its normal operating range. As such it may be necessary to use a switch with a higher voltage level, but a switch with higher voltage level will be less efficient and more expensive. Positioning the PCBs 1636 in the openings 1634, places the decoupling capacitors 1638 close (e.g., 1 cm or less) to the current terminals of switches in packaged half bridges 250 and 253. This ensures that more of the current released by the parasitic induction of the conductive line is received and stored by the decoupling capacitors 1638, which in turn reduces the voltage spike at the terminal of the switch. As a result of the proximity of the decoupling capacitors 1638 to switches 304, smaller and more efficient switches 304 can be employed in packaged half bridges 250 and 253.

Figure 20A:
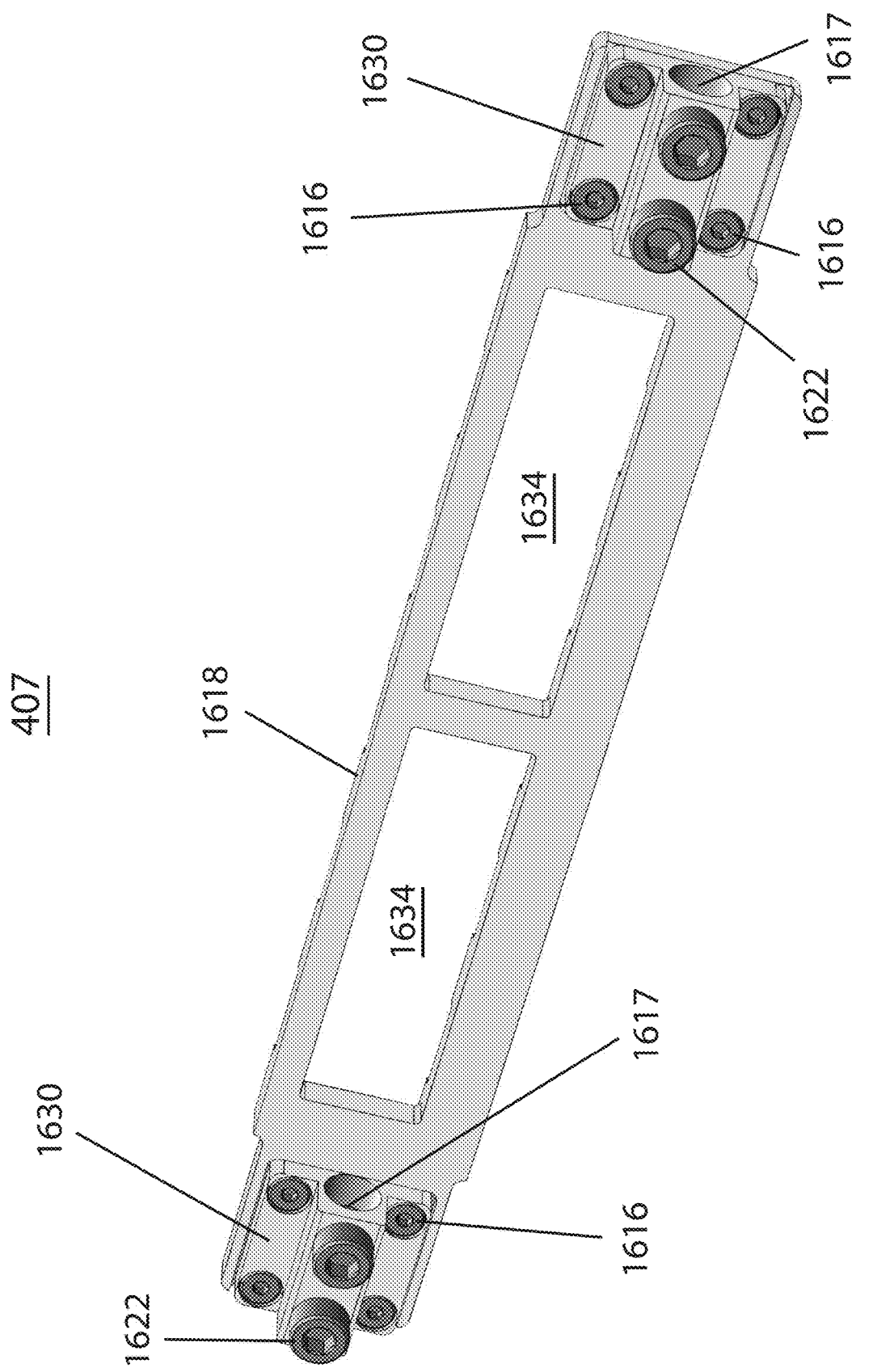
Figure 20B:
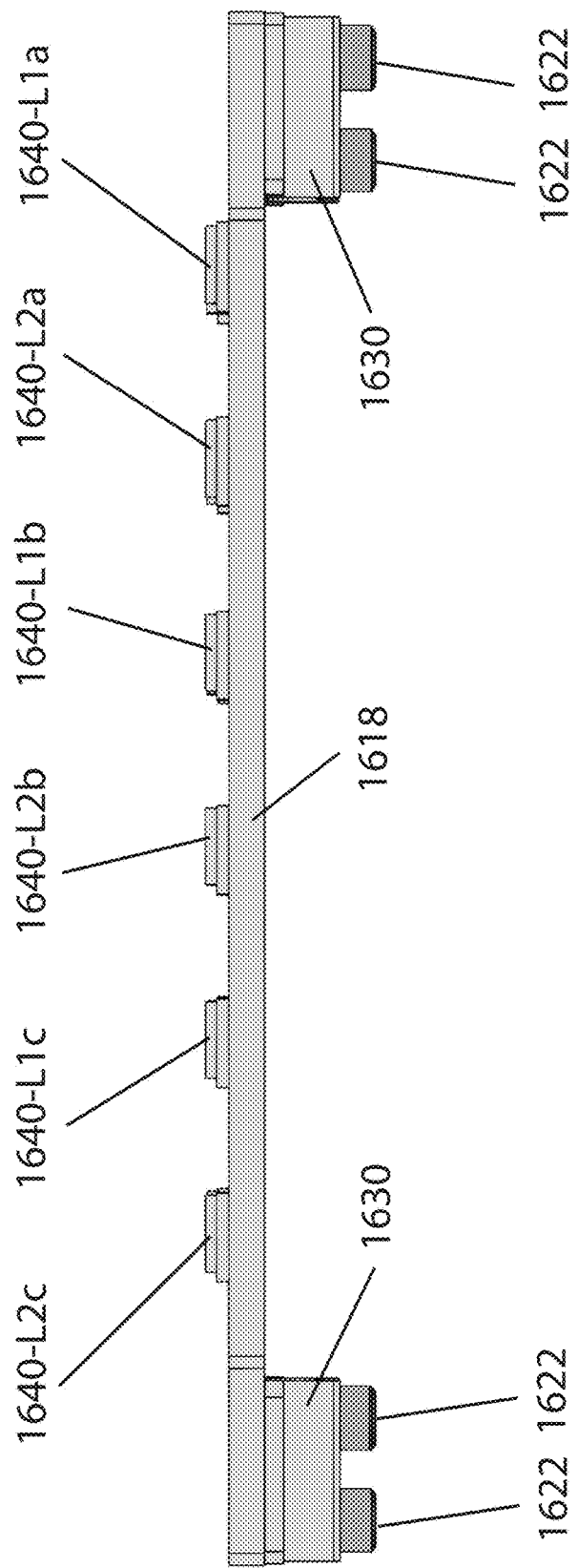
Figure 20D:
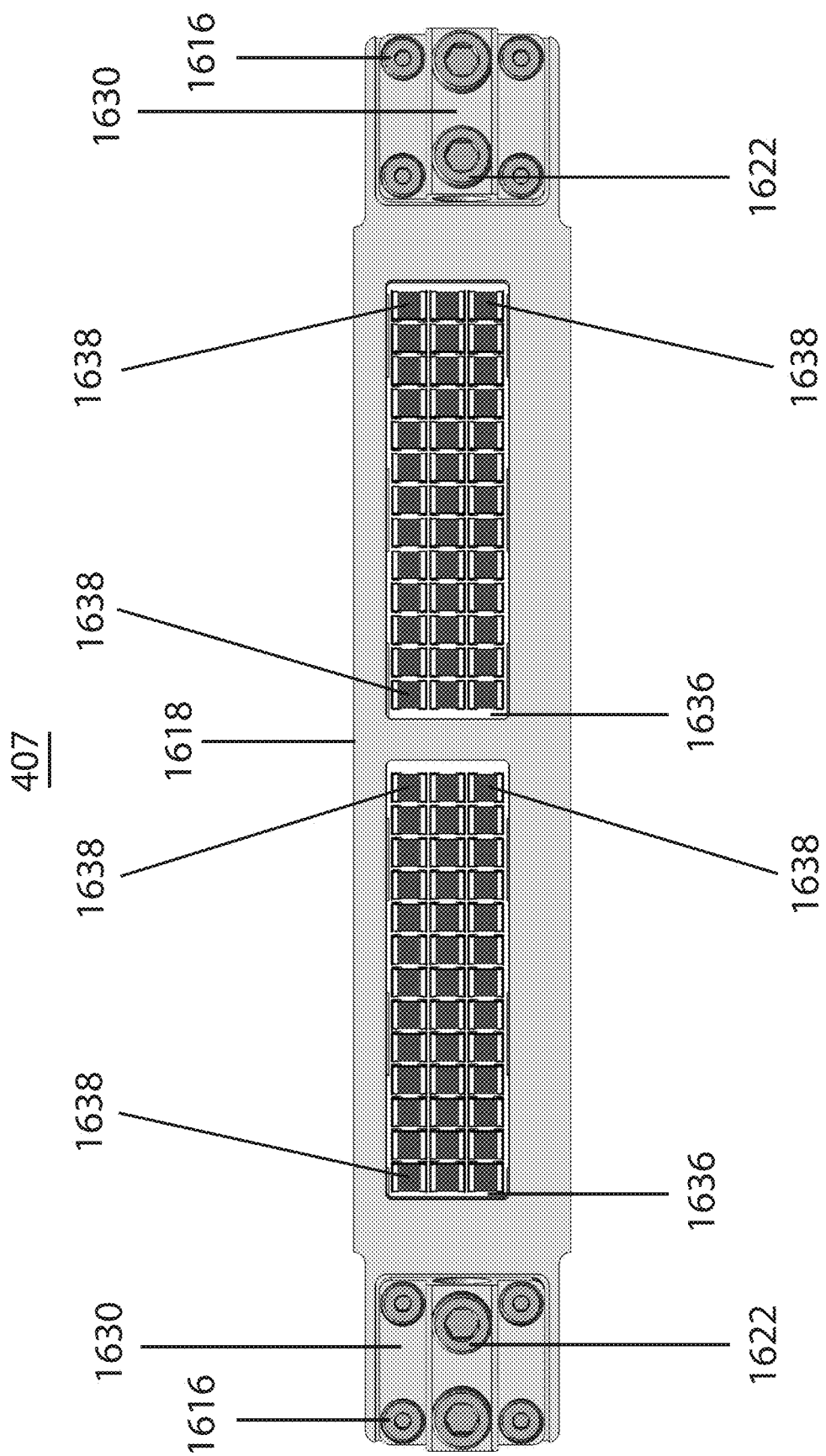
FIG. 20*d* is a side view of the example V− bus bar shown in FIGS. 20*a*-2*c* with arrays of decoupling capacitors received therein.
Figure 21:
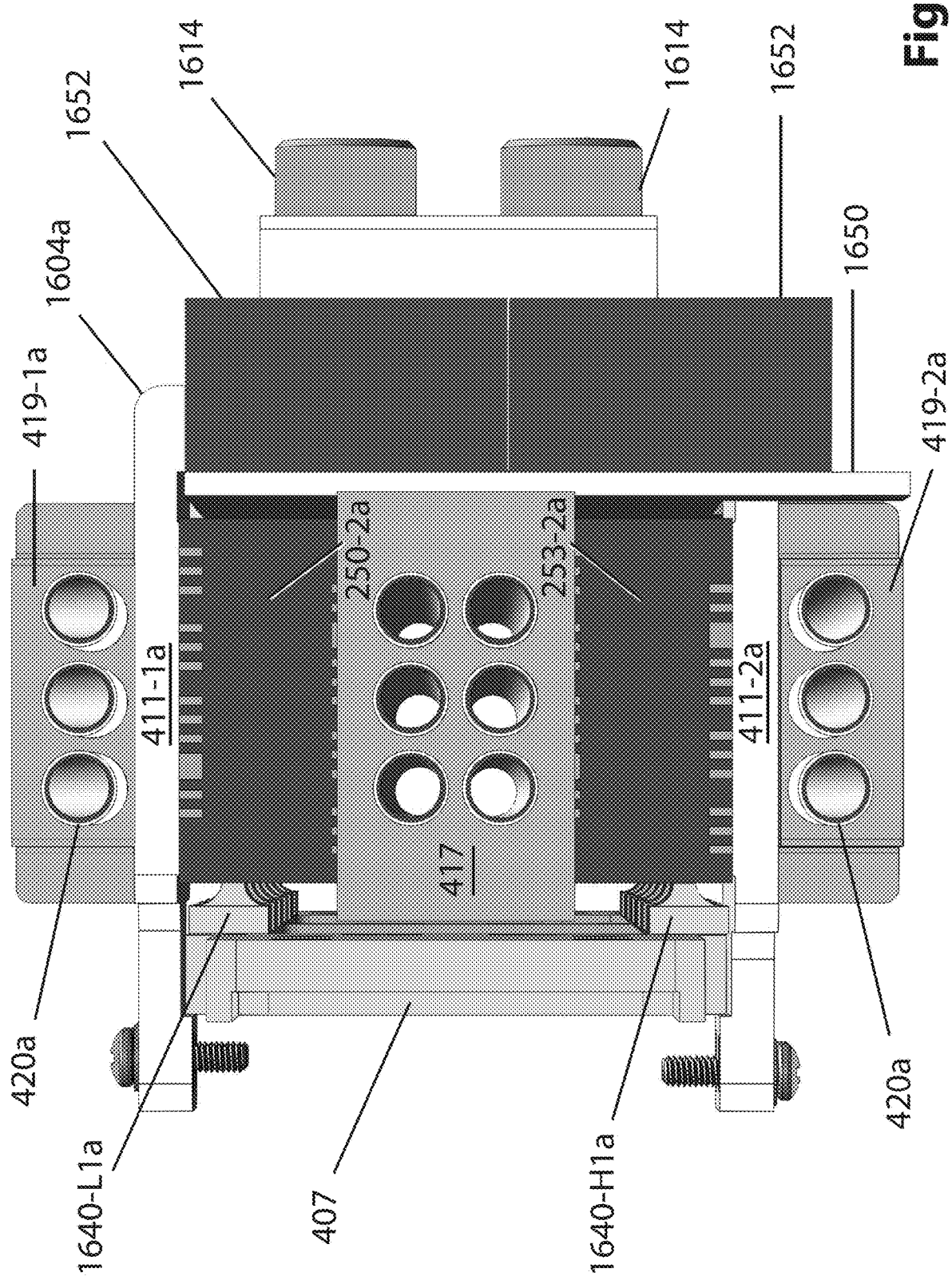
FIG. 21 is an end view of the structure shown with in FIGS. 19*a* and 19*b* with the V− bus and additional components.

As shown in FIGS. 20b and 20c V− bus bar 407 have terminals 1640 connected to and extending from base 1618. Terminals 1640-L have flat end surfaces for engaging die clip terminals 232L of packaged half bridges 250, and terminals 1640-H for engaging die clip terminals 232H of packaged half bridges 253. V− bus bar 407 and V+ bus bar should be electrically isolated from each other. FIG. 21 is an end view of the assembly shown in FIG. 19 with V− bus bar 407 added thereto. An air gap exists between extensions 411 of clamp 1604a and V− bus bar 407 to ensure electrical isolation therebetween. Although not visible in this figure, end surfaces of terminals 1640 are releasably connected to corresponding die clip terminals 232L and 232H, respectively.

A compact inverter system may include one or more control PCBs, or may be connected to one or more control PCBs. For example, components such as a packaged power management integrated circuit (PMIC), one or more microcontrollers, etc., can be mounted (e.g. soldered) on control PCBs. PMICs contain voltage regulators that provide stable supply voltages for components (e.g., gate drivers) of packaged switches or packaged half bridges. A microcontroller provides control signals (e.g., PWM signals) to one or more packaged switches or packaged half bridges. The microcontroller also receives signals (e.g., fault signals) from one or more packaged switches or packaged half bridges. The control PCB can be connected to the packaged switches or packaged half bridges of a compact inverter system via respective FFCs. The FFCs convey voltages and signals between the control PCB and packaged switches or packaged half bridges.

The control PCB can have several interfaces, each of which is configured for connection to a respective first interface of a corresponding FFC. Second interfaces of the FFCs are configured for connection to respective packaged switches or packaged half bridges. In one embodiment, the second interfaces of the FFCs connect with signal leads of respective packaged half bridges or packaged switches. FIG. 21 shows an example control PCB 1650 with PMICs 1652 mounted thereon.

Although the present invention has been described in connection with several embodiments, the invention is not intended to be limited to the specific forms set forth herein. On the contrary, it is intended to cover such alternatives, modifications, and equivalents as can be reasonably included within the scope of the invention as defined by the appended claims.

What is claimed is:
1. An apparatus comprising:
    a first device comprising:
    a first case;
    a first metal structure comprising first and second surfaces between which current can be transmitted;

a first transistor comprising first and second terminals between which current is transmitted when the first transistor is activated, and a first control terminal for controlling the first transistor, wherein the first terminal is sintered to the first surface via a conductive layer that comprises a sintering material;

a first opening through the first case that exposes the second surface;

a second metal structure comprising first and second surfaces between which current can be transmitted;

a second transistor comprising first and second terminals between which current is transmitted when the second transistor is activated, and a second control terminal for controlling the second transistor, wherein the first terminal of the second transistor is sintered to the first surface of the second metal structure;

a second opening through the first case for exposing the second surface of the second metal structure;

a first metal element comprising first and second surfaces between which current can be transmitted, wherein the second terminal of the first transistor is sintered to the first surface of the first metal element;

a second metal element comprising first and second surfaces between which current can be transmitted, wherein the second terminal of the second transistor is sintered to the first surface of the second metal element;

a third opening through the first case for exposing the second surface of the first metal element;

a fourth opening through the first case for exposing the second surface of the second metal element.

2. The apparatus of claim 1 further comprising a first bus bar thermally and electrically connected to the second surface of the first metal structure.

3. The apparatus of claim 2 wherein the first bus bar comprises a channel through which fluid can flow, and a dielectric layer that electrically insulates the fluid from the first bus bar.

4. The apparatus of claim 1 further comprising:
a first bus bar connected to the second surface of the first metal structure, wherein the first bus bar comprises a channel through which fluid can flow;
a heat sink connected to the second surface of the second metal structure, wherein the heat sink comprises a channel through which fluid can flow;
a first dielectric layer that electrically insulates the first bus bar from fluid flowing through its channel;
a second dielectric layer that electrically insulates the heat sink from fluid flowing through its channel.

5. The apparatus of claim 4 further comprising another bus bar electrically connected to the heat sink.

6. The apparatus of claim 1 wherein the first device further comprises a first circuit for controlling the first transistor.

7. The apparatus of claim 1 wherein the first device further comprises:
a first circuit for controlling the first transistor, and;
a second circuit for controlling the second transistor.

8. The apparatus of claim 1 further comprising:
a second device comprising:
a second case;
a third metal structure comprising oppositely facing first and second surfaces between which current can be transmitted;
a third transistor comprising first and second terminals between which current is transmitted when the third transistor is activated, and a third control terminal for controlling the third transistor, wherein the first terminal of the third transistor is sintered to the first surface of the third metal structure;

a first opening through the second case that exposes the second surface of the third metal structure;

a fourth metal structure comprising first and second oppositely facing surfaces between which current can be transmitted;

a fourth transistor comprising first and second terminals between which current is transmitted when the fourth transistor is activated, and a fourth control terminal for controlling the fourth transistor, wherein the first terminal of the fourth transistor is sintered to the first surface of the fourth metal structure;

a second opening through the second case for exposing the second surface of the fourth metal structure;

a first bus bar directly connected to the second surface of the first metal structure, and directly connected to the second surface of the third metal structure.

9. The apparatus of claim 8:
wherein the second device further comprises:
a third metal element comprising first and second surfaces between which current can be transmitted, wherein the second terminal of the third transistor is connected to the first surface of the third metal element;
a fourth metal element comprising first and second surfaces between which current can be transmitted, wherein the second terminal of the fourth transistor is connected to the first surface of the fourth metal element;
a third opening through the second case for exposing the second surface of the third metal element;
a fourth opening through the second case for exposing the second surface of the fourth metal element.

10. An apparatus comprising:
a first device comprising:
a first metal structure comprising first and second oppositely facing surfaces;
a first metal element comprising a first surface;
a first switch positioned between the first metal structure and the first metal element;
wherein the first switch is sintered to the first surfaces of the first metal structure and the first metal element, wherein the first switch is configured to transmit 1 amp of current or more between the first metal structure and the first metal element when the first switch is activated;
wherein the first and second oppositely facing surfaces are electrically and thermally connected together;
wherein the second surface of the first metal structure is configured for electrical and thermal connection to a surface of a heat sink.

11. The apparatus of claim 10 wherein the first device further comprises:
a first plastic case;
wherein the first switch comprises first and second oppositely facing current terminals between which current is transmitted when the first switch is activated, and a first control terminal for controlling the first switch;
wherein the first current terminal is sintered to the first surface of the first metal structure;
wherein the second current terminal is sintered to the first surface of the first metal element;
a first opening through the first plastic case that exposes the second surface of the first metal structure.

12. The apparatus of claim 10 wherein the second surface is substantially flat with a surface area that exceeds 100 mm$^2$.

13. The apparatus of claim 10 wherein the first surfaces of the first metal structure and the first metal element are facing each other.

14. The apparatus of claim 13 wherein the first device further comprises:
- a second metal structure comprising oppositely facing first and second surfaces;
- a second metal element comprising a first surface;
- a second switch comprising first and second oppositely facing terminals between which current is transmitted when the second switch is activated, and a second control terminal for controlling the second switch;
- wherein the first terminal of the second switch is sintered to the first surface of the second metal structure;
- wherein the second terminal of the second switch is sintered to the first surface of the second metal element;
- wherein the first and second switches are positioned between the first and second metal structures.

15. A method comprising:
- sintering a first current terminal of a first switch to a first surface of a first metal structure, wherein the first metal structure comprises the first and a second surface, wherein the first and second surfaces are oppositely facing;
- after sintering the first current terminal to the first surface of the first metal structure, sintering a second current terminal of the first switch to a first surface of a first metal element;
- wherein the first and second oppositely facing surfaces are electrically and thermally connected to each other;
- wherein the second surface of the first metal structure is configured for electrical and thermal connection to a surface of a heat sink.

16. The method of claim 15 further comprising:
- connecting a control terminal of the first switch to an output of an integrated circuit before sintering the second current terminal of the first switch to the first surface of the first metal element.

17. The method of claim 15 further comprising:
- encapsulating the first metal structure, the first metal element, and the first switch in a plastic compound after the sintering the second current terminal to the first surface of the first metal element;
- trimming the plastic compound after the encapsulation to re-expose the second surface of the first metal structure for electrical and thermal connection to the surface of the heat sink.

* * * * *